US009762132B2

(12) United States Patent
Freeman et al.

(10) Patent No.: US 9,762,132 B2
(45) Date of Patent: *Sep. 12, 2017

(54) ELECTRICAL CIRCUIT FOR DELIVERING POWER TO CONSUMER ELECTRONIC DEVICES

(71) Applicant: Advanced Charging Technologies, LLC, Tulsa, OK (US)

(72) Inventors: Michael H. Freeman, Tulsa, OK (US); W. J. "Jim" Weaver, Jr., Broken Arrow, OK (US); Mitchael C. Freeman, Sapupla, OK (US); Robert Dieter, Owasso, OK (US); Andrea Baschirotto, Tortona (IT); Piero Malcovati, Pavia (IT); Marco Grassi, Tulsa, OK (US); Glenn Noufer, Manitou Springs, CO (US); Randall L. Sandusky, Divide, CO (US); Neaz Farooqi, Colorado Springs, CO (US); Jim Devoy, Florissant, CO (US); Silvia Jaeckel, Tulsa, OK (US); Madison Hayes Yarbro Freeman, Tulsa, OK (US)

(73) Assignee: Advanced Charging Technologies, LLC, Tulsa, OK (US)

(*) Notice: Subject to any disclaimer, the term of this patent is extended or adjusted under 35 U.S.C. 154(b) by 0 days.

This patent is subject to a terminal disclaimer.

(21) Appl. No.: 14/925,863

(22) Filed: Oct. 28, 2015

(65) Prior Publication Data
US 2016/0118906 A1 Apr. 28, 2016

Related U.S. Application Data

(60) Provisional application No. 62/069,672, filed on Oct. 28, 2014, provisional application No. 62/074,525,
(Continued)

(51) Int. Cl.
*H02M 3/335* (2006.01)
*G05F 1/46* (2006.01)
(Continued)

(52) U.S. Cl.
CPC ........ *H02M 3/33546* (2013.01); *G05F 1/462* (2013.01); *H02M 1/08* (2013.01);
(Continued)

(58) Field of Classification Search
CPC ............. H02M 3/335; H02M 3/33507; H02M 3/33523; H02M 3/33592;
(Continued)

(56) References Cited

U.S. PATENT DOCUMENTS 5,008,795 A 4/1991 Parsley et al.
5,179,508 A 1/1993 Lange et al.
(Continued)

OTHER PUBLICATIONS

The International Search Report and the Written Opinion (PCT/US15/57895); Date of Mailing: Jan. 29, 2016.
(Continued)

*Primary Examiner* — Yemane Mehari
(74) *Attorney, Agent, or Firm* — Maschoff Brennan

(57) ABSTRACT

An electrical circuit for providing electrical power for use in powering electronic devices, such as monitors, televisions, white goods, data centers, and telecom circuit boards, is described herein. The electrical circuit includes an input terminal configured to receive an input power signal, an output terminal configured to provide an output power signal, and a forward converter coupled to the input and output terminals. The forward converter includes a transformer, and a primary side regulation circuit coupled to a primary side of the transformer. The primary side regulation circuit includes a switching device coupled to the primary side, a current sense circuit configured to sense a current
(Continued)

level on the primary side, and a controller configured to generate a pulse-width modulated control signal delivered to the switching device as a function of the sensed current level to regulate the transformer to deliver the output power signal at a desired voltage level.

24 Claims, 72 Drawing Sheets

Related U.S. Application Data filed on Nov. 3, 2014, provisional application No. 62/094,884, filed on Dec. 19, 2014, provisional application No. 62/175,972, filed on Jun. 15, 2015, provisional application No. 62/180,549, filed on Jun. 16, 2015, provisional application No. 62/208,520, filed on Aug. 21, 2015, provisional application No. 62/236,731, filed on Oct. 2, 2015.

(51) Int. Cl.
| | |
|---|---|
| *H02M 1/08* | (2006.01) |
| *H02M 1/32* | (2007.01) |
| *H02M 1/36* | (2007.01) |
| *H02M 3/07* | (2006.01) |
| *H02M 3/156* | (2006.01) |
| *H02M 7/06* | (2006.01) |
| *H02M 1/00* | (2006.01) |

(52) U.S. Cl.
CPC .............. *H02M 1/32* (2013.01); *H02M 1/36* (2013.01); *H02M 3/073* (2013.01); *H02M 3/156* (2013.01); *H02M 3/33515* (2013.01); *H02M 3/33553* (2013.01); *H02M 7/06* (2013.01); *H02M 2001/007* (2013.01); *H02M 2001/0009* (2013.01); *H02M 2001/0025* (2013.01); *H02M 2001/0032* (2013.01); *H02M 2001/0045* (2013.01); *H02M 2003/072* (2013.01); *Y02B 70/16* (2013.01)

(58) Field of Classification Search
CPC ... H02M 2001/007; H02M 2001/0009; H02M 2001/0025; H02M 2001/0032; H02M 2001/0045; H02M 2003/072; Y02B 70/1433
USPC ........................................... 363/21.01–21.18
See application file for complete search history.

(56) References Cited

U.S. PATENT DOCUMENTS

| | | | |
|---|---|---|---|
| 5,884,086 A | 3/1999 | Amoni et al. | |
| 6,055,168 A | 4/2000 | Kotowski et al. | |
| 6,069,802 A * | 5/2000 | Priegnitz .................. | H02M 1/34 323/907 |
| 6,509,721 B1 | 1/2003 | Liebler | |
| 6,538,906 B1 | 3/2003 | Ke et al. | |
| 6,812,818 B2 | 11/2004 | Lee | |
| 7,456,677 B1 | 11/2008 | Rao et al. | |
| 8,049,553 B2 | 11/2011 | Kim et al. | |
| 8,330,436 B2 | 12/2012 | Oraw et al. | |
| 8,422,253 B2 | 4/2013 | Chang et al. | |
| 8,842,449 B1 | 9/2014 | Tong | |
| 2004/0075600 A1 | 4/2004 | Vera et al. | |
| 2004/0136207 A1 | 7/2004 | Havanur | |
| 2007/0273430 A1 | 11/2007 | Akashi et al. | |
| 2008/0042722 A1 | 2/2008 | Dornbusch | |
| 2009/0121697 A1 | 5/2009 | Aiura et al. | |
| 2009/0121781 A1 | 5/2009 | Oyama et al. | |
| 2009/0278520 A1 | 11/2009 | Perreault et al. | |
| 2009/0315615 A1 | 12/2009 | Likhterov | |
| 2009/0322414 A1 | 12/2009 | Oraw et al. | |
| 2010/0124084 A1 | 5/2010 | Chang et al. | |
| 2010/0202161 A1 | 8/2010 | Sims et al. | |
| 2010/0244935 A1 | 9/2010 | Kim et al. | |
| 2010/0253154 A1 | 10/2010 | Yeates | |
| 2011/0050190 A1 | 3/2011 | Avrutsky | |
| 2013/0175992 A1 | 7/2013 | Tinaphong et al. | |
| 2013/0229832 A1* | 9/2013 | Patel .................. | H02M 3/33507 363/21.12 |
| 2013/0229841 A1 | 9/2013 | Giuliano | |
| 2014/0307493 A1 | 10/2014 | Chevalier | |
| 2015/0145497 A1 | 5/2015 | Torres et al. | |
| 2016/0126852 A1* | 5/2016 | Freeman ........... | H02M 3/33546 363/21.05 |

OTHER PUBLICATIONS

The International Search Report and the Written Opinion (PCT/US15/57898); Date of Mailing: Mar. 31, 2016.
Non-Final Office Action (U.S. Appl. No. 14/996,576); Notification Date: Apr. 14, 2016.
Non-Final Office Action (U.S. Appl. No. 14/925,860); Notification Date: Apr. 21, 2016.
Non-Final Office Action (U.S. Appl. No. 14/996,565); Notification Date: Apr. 21, 2016.
Non-Final Office Action (U.S. Appl. No. 14/996,558); Notification Date: May 4, 2016.
Non-Final Office Action (U.S. Appl. No. 14/925,855); Notification Date: May 26, 2016.
Final Office Action (U.S. Appl. No. 14/996,558); Notification Date: Oct. 26, 2016.
Final Office Action (U.S. Appl. No. 14/996,565); Notification Date: Aug. 18, 2016.
The International Search Report and the Written Opinion (PCT/US15/57899); Date of Mailing: Mar. 4, 2016.
Final Office Action (U.S. Appl. No. 14/925,855), Notification Date: Jan. 26, 2017.
Mengzhe Ma, Design of High Efficiency Step-Down Switched Capacitory DC/DC Converter, A Thesis submitted to Oregon State University, Presented May 21, 2003, pp. 1-71.
Michael Douglas Seeman, A Design Methodology for Switched-Capacitor DC-DC Converters, Technical Report No. UCB/EECS-2009-78 (http://www.eecs.berkeley.edu/Pubs/TechRpts/2009/EECS-2009-78.html), May 21, 2009, pp. 1-249, Electrical Engineering and Computer Sciences at the University of California at Berkeley.

* cited by examiner

| Switch Name | Phase 1 | Phase 2 (Phi2) | Phase 3 (Phi2) | Phase 4 (Phi1) |
|---|---|---|---|---|
| S1 | On | Off | Off | Off |
| S2 | Off | On | On | On |
| S3 | Off | Off | Off | On |
| S4 | On | Off | Off | Off |
| S5 | Off | On | Off | Off |
| S6 | Off | Off | On | Off |
| S7 | On | Off | Off | On |
| S8 | On | Off | Off | Off |
| S9 | Off | On | On | Off |

Charge Phase (Phi1)        Discharge Phase (Phi2)

Switched Capacitor Gain: 1x

POR Threshold Voltages

| Switch | CR=1 | CR=2/3 | CR=1/2 |
|---|---|---|---|
| $S_1$ | $\Phi_1$ | $\Phi_1$ | $\Phi_1$ |
| $S_2$ | $\Phi_2$ | $\Phi_2$ | $\Phi_2$ |
| $S_3$ | $\Phi_2$ | OFF | OFF |
| $S_4$ | $\Phi_1$ | $\Phi_1$ | $\Phi_1$ |
| $S_5$ | OFF | OFF | $\Phi_2$ |
| $S_6$ | OFF | $\Phi_2$ | OFF |
| $S_7$ | ON | $\Phi_1$ | $\Phi_1$ |
| $S_8$ | $\Phi_1$ | $\Phi_1$ | $\Phi_1$ |
| $S_9$ | OFF | $\Phi_2$ | $\Phi_2$ |

Figure 69

| Vline | Vout | Pout (W) | Iout | No. of Stages | Gain Settings ||||| 
|---|---|---|---|---|---|---|---|---|---|
| | | | | | CP-1 | CP-2 | CP-3 | CP-4 | CP-5 |
| 127 | 3.13 | 1.5 | 0.50 | 5 | 0.66 | 0.5 | 0.5 | 0.5 | 0.5 |
| 127 | 19.3 | 3.86 | 0.20 | 4 | 1.0 | 0.66 | 0.5 | 0.5 | 0.5 |
| 375 | 5 | 2.5 | 0.50 | 5 | 0.5 | 0.5 | 0.5 | 0.5 | 0.5 |
| 375 | 12 | 6 | 0.50 | 4 | 1.0 | 0.5 | 0.5 | 0.5 | 0.5 |

Figure 70

| Value Window No. | Current Range (iload) | Winlow |
|---|---|---|
| 1 | 4.500 / 4.360 | 3294 |
| 2 | 4.359 / 4.219 | 2576 |
| 3 | 4.218 / 4.078 | 2561 |
| 4 | 4.077 / 3.937 | 2554 |

Figure 78

| Value Window No. | Current Range (iload) | Gain Factor (gain_N) | Offset (offset_N) |
|---|---|---|---|
| 1 | 4.500 / 4.360 | -3 | 3815 |
| 2 | 4.359 / 4.219 | 1 | 2318 |
| 3 | 4.218 / 4.078 | 2 | 2242 |
| 4 | 4.077 / 3.937 | 1 | 2305 |
| 5 | 3.936 / 3.796 | 1 | 2365 |

Figure 79

ELECTRICAL CIRCUIT FOR DELIVERING POWER TO CONSUMER ELECTRONIC DEVICES

CROSS-REFERENCES TO RELATED APPLICATIONS

This application claims priority to U.S. Provisional Patent Application Ser. No. 62/069,672, filed on Oct. 28, 2014, claims priority to U.S. Provisional Patent Application Ser. No. 62/074,525, filed on Nov. 3, 2014, claims priority to U.S. Provisional Patent Application Ser. No. 62/094,884, filed on Dec. 19, 2014, claims priority to U.S. Provisional Patent Application Ser. No. 62/175,972, filed on Jun. 15, 2015, claims priority to U.S. Provisional Patent Application Ser. No. 62/180,549, filed on Jun. 16, 2015, claims priority to U.S. Provisional Patent Application Ser. No. 62/208,520, filed on Aug. 21, 2015, claims priority to U.S. Provisional Patent Application Ser. No. 62/236,731, filed on Oct. 2, 2015, all of which are hereby incorporated by reference in their entirety for all purposes.

COPYRIGHT NOTICE

The figures included herein contain material that is subject to copyright protection. The copyright owner has no objection to the facsimile reproduction by anyone of this patent document as it appears in the U.S. Patent and Trademark Office, patent file or records, but reserves all copyrights whatsoever in the subject matter presented herein.

FIELD OF THE INVENTION

The present invention relates generally to electrical power circuits and, more particularly, to an electrical power circuit for providing electrical power for use in charging and/or powering consumer electronic devices.

BACKGROUND OF THE INVENTION

The Energy Crises Requires Demand Side Response That Lowers Current Loads. The Energy Crisis is upon us worldwide. For instance, the U. S. Department of Energy predicts that by 2015 there will not, on the average, be enough electric power to supply average demand in the U.S.

One of the controllable offenders is "Vampire Loads". Also called "Wall Wart Power" or "Standby Power", this electricity waste is estimated by the U.S. Department of Energy (DOE) to be in excess of 100 Billion kW annually, costing over Ten Billion Dollars in wasted energy. Vampire Load producers includes cell phone chargers, lap top chargers, notebook chargers, calculator chargers, small appliances, and other battery powered consumer devices.

The U.S. Department of Energy said in 2008:

"Many appliances continue to draw a small amount of power when they are switched off. These "phantom" loads occur in most appliances that use electricity, such as VCRs, televisions, stereos, computers, and kitchen appliances. This can be avoided by unplugging the appliance or using a power strip and using the switch on the power strip to cut all power to the appliance."

According to the U.S. Department of Energy, the following types of devices consume standby power:

1. Transformers for voltage conversion. (Including cell phone, lap top and notepad, calculators and other battery powered devices that use wall chargers).
2. Wall wart power supplies powering devices which are switched off. (Including cell phone, lap top and notepad, calculator, battery powered drills and tools, all of which have wall chargers and have either completely charged the batteries or are actually disconnected from the device).
3. Many devices with "instant-on" functions which respond immediately to user action without warm-up delay.
4. Electronic and electrical devices in standby mode which can be awakened by a remote control, e.g., some air conditioners, audio-visual equipment such as a television receiver.
5. Electronic and electrical device which can carry out some functions even when switched off, e.g., with an electrically powered timer. Most modern computers consume standby power, allowing them to be awakened remotely (by Wake on LAN, etc.) or at a specified time. These functions are always enabled even if not needed; power can be saved by disconnecting from mains (sometimes by a switch on the back), but only if functionality is not needed.
6. Uninterruptible power supplies (UPS)

All this means that even when a cell phone, lap top or like device is completely charged, current is still flowing, but not accomplishing anything and wasting electricity. More recently manufactured devices and appliances continue to draw current all day, every day—and cost you money and add to the Energy Crisis Worldwide.

The National Institute of Standards and Technology (NIST) (a division of the U.S. Department of Commerce) through its Buildings Technology Research and Development Subcommittee in 2010 stated its goals for reducing "plug loads," stating:

"The impact of plug loads on overall consumption is quite significant. For commercial buildings, plug loads are estimated at 35% of total energy use, for residential 25%, and for schools 10%.

Opportunities for lowering plug loads include:
1) more efficient plugged devices and appliances,
2) automated switching devices that turn off unused appliances and reduce "vampire" loads from transformers and other small but always on appliances, or
3) modifying occupant behaviors.

The DOE Level VI Energy Efficiency Regulations are set to go into effect in 2016 requiring that power supplies under 49 watts be no less than 86% efficient across all loads, and have a standby power draw of less than 100 milliwatts. The European Commission is predicting similar external power supply regulations in 2016.

One of the problems experienced by virtually all modern electronics is that power supplies, whether external or embedded "power modules", are not energy efficient. This is true for a number of reasons, one of which dates back to 1831 when Michael Faraday invented the transformer. Transformers are inherently inefficient because, as an analog device, they can only produce one power output for each specific winding. So if two power outputs are necessary, two secondary windings are necessary. Moreover, there are often over 50 parts and pieces that are necessary to work with a transformer to create a common modern external power supply, the numbers only get somewhat lower with internal or embedded power modules. The number of parts in a power supply is inherently inefficient because current must travel in, around and through the various parts, each with different power dissipation factors; and even the circuit traces cause resistive losses creating energy waste.

Further, the way a transformer works is creating and collapsing a magnetic field. Since all of the electrons cannot be "recaptured" by the magnetic field creation/collapse, those that escape often do so as heat, which is why cell phone, lap top and tablet chargers feel warm or hot to the touch. It is also the primary reason why all consumer electronics create heat, which not only wastes energy/electricity, but causes eventual detrition through heating of other associated electronic parts.

Another inefficiency found in current electronics is the need for multiple internal power supplies to run the different parts. For instance, in the modern world power modules, MOSFETS have become a more and more important part of the "real world" interfaces in circuitry.

Metal-oxide-semiconductor field-effect transistors (MOSFETs) enable switching, motor/solenoid driving, transformer interfacing, and a host of other functions. At the other end of the spectrum is the microprocessor. Microprocessors are characterized by steady reduced operating voltages and currents, which may be 5 volts, 3.3 volts, 2.7 volts or even 1.5 volts. In most systems the MOSFETS and microprocessors are used together or in combination to make the circuitry work. However, most often the microprocessor and the drivers for the MOSFETS operate at different voltages, causing the need for multiple power supplies within a common electrical device circuit.

A standard high-voltage NMOS MOSFET requires a driver that can deliver a gate voltage of 5-20 volts more than that rail voltage to successfully turn it on and off. In the case of turn on, there is actually a requirement that the gate driver voltage exceed the rail power to be effective. The other main function of the high-voltage MOSFET gate driver is to have a reduced input drive requirement making it compatible with the output drive capability of modern CMOS processor.

This MOSFET/driver arrangement, common in most external power supplies, like chargers, actually requires three separate power supplies. The first power supply needed is the main power rail, which is normally composed of the rectified Line voltage in the range of 127 VDC to 375 VDC supplied to the MOSFET. The second power supply needed is the 15 volts (or higher) required by the MOSFET drivers. Finally, the microprocessors require another isolated power supply for their many different and varying voltages.

A good example of the current inefficiencies and energy waste is found in a typical television, which requires as many as four to six different power supply modules to run the screen, backlighting, main circuit board, and sound and auxiliary boards. This current system requires multiple transformers and dozens of parts for each power supply needed. The transformers and the parts (including MOSFETS) multiply heat through their duplicated inefficiencies, which is one reason the back of a television is always hot to the touch. In addition, the more transformers that are needed for various power outputs, the more parts are needed, and more causation for energy waste is created.

In addition to the heat problem, the multiple transformer based power supplies all need typically from forty to sixty parts to operate, requiring dozens of parts for a typical transformer based television power supply module which increases costs and total component size while decreasing reliability. With the multiplicity of parts comes increased system resistance which ends up in wasted energy as heat.

The present invention is aimed at one or more of the problems identified above to provide better efficiencies and create more control over electrical inrush currents from rail sources.

SUMMARY OF THE INVENTION

In one aspect of the present invention, an electrical circuit for providing high efficiency electrical power for use in powering electronic devices, such as monitors, televisions, white goods, data centers, and telecom circuit boards, is provided. The electrical circuit includes an input terminal configured to receive an input power signal, an output terminal configured to provide an output power signal, and a plurality of voltage reduction circuit cells coupled between the input terminal and the output terminal. Each of the voltage reduction circuit cells includes a pair of flyback capacitors, a switching circuit, and a hold capacitor. The switching device is configured to operate the corresponding voltage reduction circuit cell at a charging phase and at a discharging phase. The plurality of voltage reduction circuit cells are configured to deliver the output power signal having a voltage level that is less than the voltage level of the input power signal.

In another aspect of the present invention, a method of operating an electrical circuit for powering electronic devices with high efficiency and low standby draw is provided. The electrical circuit includes an input terminal configured to receive an input power signal, an output terminal configured to provide an output power signal, and a plurality of voltage reduction circuit cells coupled between the input terminal and the output terminal. Each of the voltage reduction circuit cells includes a pair of flyback capacitors, a switching circuit including a plurality of switching devices, and a hold capacitor. The method includes determining a voltage level of the input power signal, determining a voltage level of the output power signal, determining a gain setting for each of the plurality of voltage reduction circuit cells as a function of the voltage level of the input power signal and the voltage level of the output power signal, and regulating the plurality of voltage reduction circuit cells at the corresponding gain setting to deliver the output power signal at the corresponding voltage level.

In a further aspect of the present invention, an apparatus for providing electrical power for use in powering electronic devices is provided. The apparatus includes a plurality of semiconductor chips. Each of the plurality of semiconductor chips includes a voltage reduction circuit that includes a plurality of capacitor terminals and a switching circuit including a plurality of switching devices coupled to the plurality of capacitor terminals. The apparatus also includes a plurality of flyback capacitors coupled to each of the plurality of capacitor terminals. The plurality of semiconductor chips includes a first semiconductor chip including an input terminal configured to receive an input power signal and a second semiconductor chip including an output terminal configured to provide an output power signal. The plurality of voltage reduction circuit cells are coupled together in series between the input terminal and the output terminal for delivering the output power signal at a voltage level that is less than a voltage level of the input power signal.

In one aspect of the present invention, an electrical circuit for providing electrical power for use in powering electronic devices is provided. The electrical circuit includes a voltage reduction circuit cell that includes an input terminal configured to receive an input power signal, an output terminal configured to provide an output power signal, a first capacitor, a second capacitor, a switching circuit, and a hold capacitor coupled between the switching circuit and the output terminal. The switching circuit includes a plurality of switching devices that are coupled to the first and the second capacitors for delivering power from the input terminal to the output terminal. The plurality of switching devices includes at least two switching devices that are coupled to ground. The voltage reduction circuit cell also includes a controller for operating the switching circuit in a plurality of operational modes to deliver the output power signal at a desired voltage level.

In another aspect of the present invention, a method of operating an electrical circuit for powering electronic devices is provided. The electrical circuit includes a voltage reduction circuit cell that includes an input terminal, an output terminal, a first capacitor, a second capacitor, a switching circuit coupled to the first and the second capacitors, a hold capacitor coupled between the switching circuit and the output terminal, and a controller for operating the switching circuit. The method includes the steps of receiving an input power signal at the input terminal and the controller operating the switching circuit in a charge mode to couple a positive plate of each of the first and the second capacitors to the input terminal and to couple a negative plate of each of the first and the second capacitors to the hold capacitor, and operating the switching circuit in a discharge mode to deliver an output power signal to the output terminal at a desired voltage level.

In a further aspect of the present invention, an apparatus for providing electrical power for use in powering electronic devices is provided. The apparatus includes a plurality of capacitors and a semiconductor chip. The plurality of capacitors, which, one or more may be either on the monolithic silicon or external, and includes a first capacitor, a second capacitor, and a hold capacitor. These capacitors may be the "deep trench" type in silicone or other types in silicon and external capacitors. The semiconductor chip includes an input terminal formed on the semiconductor chip and configured to receive an input power signal, an output terminal formed on the semiconductor chip and configured to provide an output power signal, a plurality of capacitor terminals formed on the semiconductor chip, and a switching circuit formed on the semiconductor chip. Rectification, if needed, for converting AC input, may either be external to the chip or be on a circuit within the Integrated Circuit. The inductors referenced in this invention may either be external to the IC or incorporated into the IC. The plurality of capacitor terminals includes a first set of capacitor terminals that are coupled to the first capacitor, a second set of capacitor terminals that are coupled to the second capacitor, and a third set of capacitor terminals that are coupled to the hold capacitor. The switching circuit includes a plurality of switching devices that are coupled to the first capacitor, the second capacitor, and the hold capacitor with the plurality of capacitor terminals. A controller is coupled to the switching circuit for operating the switching circuit in a plurality of operational modes to deliver the output power signal at a desired voltage level. The controller may either be an embedded microcontroller core in the silicone, external chip, or a combination of state machine, analog, digital and microprocessor devices; which may operate with or without some type of non-volatile memory (NVM), such as One Time Programmable (OTP), Flash memory, or EEprom. The memory may either be embedded on the silicon or external, and may be a die packaged with the ASIC.

In one aspect of the present invention, an electrical circuit for providing electrical power for use in powering electronic devices is provided. The electrical circuit includes an input terminal configured to receive an input power signal, an output terminal configured to provide an output power signal, and a forward converter coupled to the input terminal and the output terminal. The forward converter includes a transformer, and a primary side regulation circuit coupled to a primary side of the transformer. The primary side regulation circuit includes a switching device coupled to the primary side, a current sense circuit configured to sense a current level on the primary side, and a controller configured to generate a pulse-width modulated control signal delivered to the switching device as a function of the sensed current level to regulate the transformer to deliver the output power signal at a desired voltage level.

In another aspect of the present invention, a method of operating an electrical circuit for powering electronic devices is provided. The electrical circuit includes an input terminal configured to receive an input power signal, an output terminal configured to provide an output power signal, and an optional forward converter coupled to the input terminal and the output terminal. The forward converter includes a transformer and a primary side regulation circuit including a controller and a switching device coupled to a primary side of the transformer. The method includes the steps of sensing a current level of the primary side of the transformer, generating a pulse-width modulated control signal as a function of the sensed current level, and transmitting the pulse-width modulated control signal to the switching device to operate the switching device to regulate the input to the transformer to deliver the output power signal at a desired voltage level.

In a further aspect of the present invention, an apparatus for providing electrical power for use in powering electronic devices is provided. The apparatus includes a transformer for receiving an input power signal and delivering an output power signal, a capacitor coupled to a primary side of the transformer and to ground, the capacitor configured to reset the transformer after each transformer cycle, and a semiconductor chip which may have one or more circuits external to the semiconductor chip (IC). The semiconductor chip includes a transformer terminal formed on the semiconductor chip, a switching device formed on the semiconductor chip and coupled to the primary side of the transformer with the transformer terminal, and a controller formed on the semiconductor chip. The controller is configured to sense a current level of the primary side of the transformer and generate a pulse-width modulated control signal delivered to the switching device as a function of the sensed current level to regulate the transformer to deliver the output power signal at a desired voltage level.

The electrical circuit may also includes a vampire load elimination system that is configured to determine when a consumer device has finished charging and/or is disconnected from the power circuit, and operates the power circuit to disconnect the supply of power to the power circuit and/or the electronic device, and also capable of creating a flea powered "stand-by" mode. This is accomplished by putting the system in to "sleep mode" where the only circuits powered are the timing circuits, which periodically "wake up" to check to see if there is a connection or current draw on the secondary.

In another aspect of the invention, the power circuit is formed on a semiconductor chip that includes analog and digital components on the same chip. A semiconductor process such as a 350V Silicon-on-Insulator (SoI) BCD process could be used for the semiconductor, which would permit the integration on one die of the microcontroller, timer/quartz real-time clock, PID controller and PWM controllers, MOSFETs, and corresponding drivers. In addition, the typical specific capacitance in CMOS technology ranges from 0.1 fF/μm² (polypoly capacitors) to 5 fF/μm² (MIM capacitors) or ceramic capacitors can be considered. Moreover, a process like DMOS can be used, or a bi/substrate can be considered, such as a layer of Silicon Carbonate, with Gallium Nitrate or Silicon Dioxide bi/substrata's also can be used. Or alternatively, Gallium Nitrate or Gallium Arsenide and the use of Deep Trench capacitors could be used for construction of the chip or the transistors within the chip rather than CMOS silicon. All of these options are necessary because of the capacitance needed with the low $R_{on}$ MOSFETS or transistors.

A BCDMOS process may be used to manufacture the power circuit. BCDMOS includes a process for integrating Bipolar (analog), CMOS (logic) and DMOS (power) functions on a single chip for ultra high voltage (UHV) applications. BCDMOS provides a broad range of UHV applications such as LED lighting, AC-DC conversion and switched mode power supplies. Capable of operating directly "off line" from a 110/220VAC source, integrated circuits (ICs) implemented with a non-Epi process can deploy optimized 450V/700V DR-LDMOS transistors that specify low on resistance and a breakdown voltage that exceeds 750V. When used in power switching applications, designers can expect lower conduction and switching losses.

BRIEF DESCRIPTION OF THE DRAWINGS

Other advantages of the present invention will be readily appreciated as the same becomes better understood by reference to the following detailed description when considered in connection with the accompanying drawings wherein:

FIGS. 69 and 70 are exemplary illustrations of data records that may be used by a controller for use in operating the electrical power circuit shown in FIGS. 2 and 42-50, according to an embodiment of the present invention;

FIGS. 78 and 79 are exemplary illustrations of data records that may be used by a controller for use in operating an electrical power circuit with the primary side regulation circuit shown in FIGS. 71 and 72, according to an embodiment of the present invention;

Corresponding reference characters indicate corresponding parts throughout the drawings.

DETAILED DESCRIPTION OF INVENTION

Figure 1:
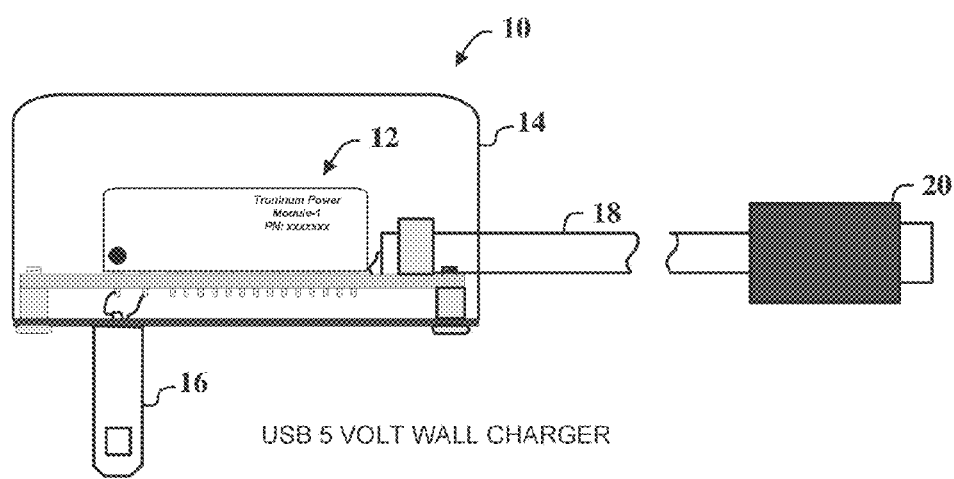
FIG. 1 is a schematic diagram of an electronic charging device for use in providing electrical power to electronic devices, according to an embodiment of the present invention.

With reference to the drawings and in operation, the present invention overcomes at least some of the disadvantages of known power delivery systems by providing a power module that includes a power circuit that provides DC voltage output power to consumer electronic devices from an AC mains supply (typically 120VAC (US) to 240VAC [EU/Asia]). The power circuit is configured to provide electrical power to charge electronic storage devices and/or power consumer electronic products including, but not limited to, a cell phone, a smartphone, a tablet computer, a laptop, and/or any suitable electronic device that may benefit from this invention due to extremely high efficiencies and very low stand-by power requirements.

In an embodiment of the present invention, the power circuit includes a plurality of voltage reduction circuit cells, e.g., stages, that are configured to receive an input power signal and deliver an output power signal at a desired voltage level. In one embodiment, each voltage reduction circuit cell includes a pair of flyback capacitors, a switching circuit that is coupled to the flyback capacitors and includes a plurality of switching devices, a hold capacitor coupled between the switching circuit and an output terminal, and a controller that is configured to operate the switching circuit in a plurality of operational modes to deliver the output power signal at a desired voltage level. In addition, the controller may be configured to operate each voltage reduction circuit cell in capacitive isolation to facilitate preventing a corresponding input terminal from being connected directly to the corresponding output terminal of the voltage reduction circuit cell during operation between a charge mode and a discharge mode.

In one embodiment, the power circuit may include a buck regulator circuit coupled to the plurality of voltage reduction circuit cells. In another embodiment, the power circuit may include a forward converter including a transformer that is coupled to the plurality of voltage reduction circuit cells.

The power circuit may also include a primary side regulation circuit that is coupled to a primary side of the transformer to regulate the transformer to deliver the output power signal at a desired voltage level. In one embodiment, the primary side regulation circuit includes a switching device that is coupled to the primary side of the transformer, a current sense circuit that is configured to sense a current level on the primary side, and a controller that is configured to generate a pulse-width modulated control signal delivered to the switching device as a function of the sensed current level to regulate the transformer to deliver the output power signal at a desired voltage level.

In another embodiment of the present invention, the power circuit includes a primary power circuit and a secondary power circuit for receiving high voltage AC power from an electrical power source and delivering a low voltage DC power signal to one or more electronic devices. The primary power circuit receives the AC power signal from an AC power supply and generates an intermediate direct current (DC) power signal at a reduced voltage level. The secondary power circuit receives the intermediate DC power signal from the primary power circuit and generates and delivers an output DC power signal having a voltage level suitable for use in powering and/or charging consumer electronic devices.

The primary power circuit includes a rectification circuit for receiving the AC power signal and generating a rectified DC power signal, and a switch capacitor voltage divider circuit for dividing the rectified DC voltage to a reduced voltage for use by the secondary power circuit. The switch capacitor voltage divider circuit includes fly-back capacitors to maximize power efficiency and a hold capacitor to minimize the voltage ripple. In one embodiment, the switch capacitor voltage divider circuit is configured to deliver up to 50 mA and maintain ≥95% efficiency across the range of load currents from 50 mA to less than 1 mA under light load conditions. The primary power circuit may also include a switch-mode buck regulator that is connected in parallel with the switch capacitor voltage divider circuit for handling large current loads, for example, up to 430 mA to 500 mA (or more) of current. The buck regulator may include a P-channel MOSFET switch, a high voltage buck diode, and a buck energy storage inductor. In addition, the buck regulator may also include a pulse-width modulator (PWM) controller for generating a pulse width modulated signal to control the on/off time of the buck regulator PMOSFET, which may also be expressed as an NMOSFET with the appropriate gate drivers.

The secondary power circuit includes a forward converter power circuit that includes a transformer for receiving the intermediate DC power signal from the primary power circuit and generating the output DC power signal. The forward converter also includes a MOSFET connected to the primary side of the transformer, which may either be internal or external to the IC, and a control circuit to operate the MOSFET to regulate the voltage at the output of the forward converter as load current is drawn from the secondary-side of the transformer. For example, the forward converter control loop may be configured to regulate the output voltage under heavy fluctuation (4.5 nA to 4.5 A) of load current without triggering any instability.

In the modern world, the MOSFET has become a more and more important part of "Real World" interfaces. It enables motor/solenoid driving, transformer interfacing, and a host of other functions. At the other end of the spectrum is the Microprocessor. It is characterized by steadily reduced operating voltages and currents. In many systems these parts are used together. A standard high-voltage MOSFET requires a driver that can deliver on the order of a 5v to 20v volt swing to the FET gate in order to successfully turn the FET on or off. In the case of turn-on for an NMOSFET, it is actually required that this gate drive voltage exceed the power rail voltage. Specialty drivers using charge pump technology have been devised for this purpose, but they are typically discrete parts and increase the number of power rails needed on a circuit. The FET driver's other main function is to have a reduced input voltage requirement making it compatible with the output port capability of a modern CMOS microprocessor. This arrangement is costly in terms of power and typically requires three power supplies. First is the main power rail. It is composed of a voltage in the range of 100 to 600 volts supplied to the MOSFET. The second supply is the 5-20 volts required by the driver and finally is the supply required by the microprocessor. This present invention combines all these rails within the chip, such that the power and parts normally associated with the circuit are minimized and therefore efficiencies increased.

In many circumstances, the power supplies constitute a significant percentage of both the parts count and cost in a small system. A consolidated part can substantially alter this equation. This new part would consist of a combination of a high power MOSFET as the base part to which is added the appropriate driver with an included charge pump. Also added is the power supply required for the driver derived from the main rail supply internally. A final addition is an output pin to supply power for the microprocessor from this internal supply. In many modest systems the complete parts list would consist of this new device, the microprocessor, and the main power rail parts. This would allow the next generation of low cost/low assembly count microprocessor subsystems.

The power module includes the advanced power supply system on a chip (Tronium™ PSSoC), which is the subject of this present invention, including a controller application specific integrated circuit (ASIC) to provide a low-cost, highly efficient means to convert the AC line voltage present at a typical home or business electrical outlet to a reduced regulated DC voltage for consumer electronic applications. Typical applications include, but are not limited to, charging systems for cell-phones, tablets or other handheld devices, USB power conversion, power supplies for consumer, medical and industrial devices, and many other possible uses.

Figure 23:
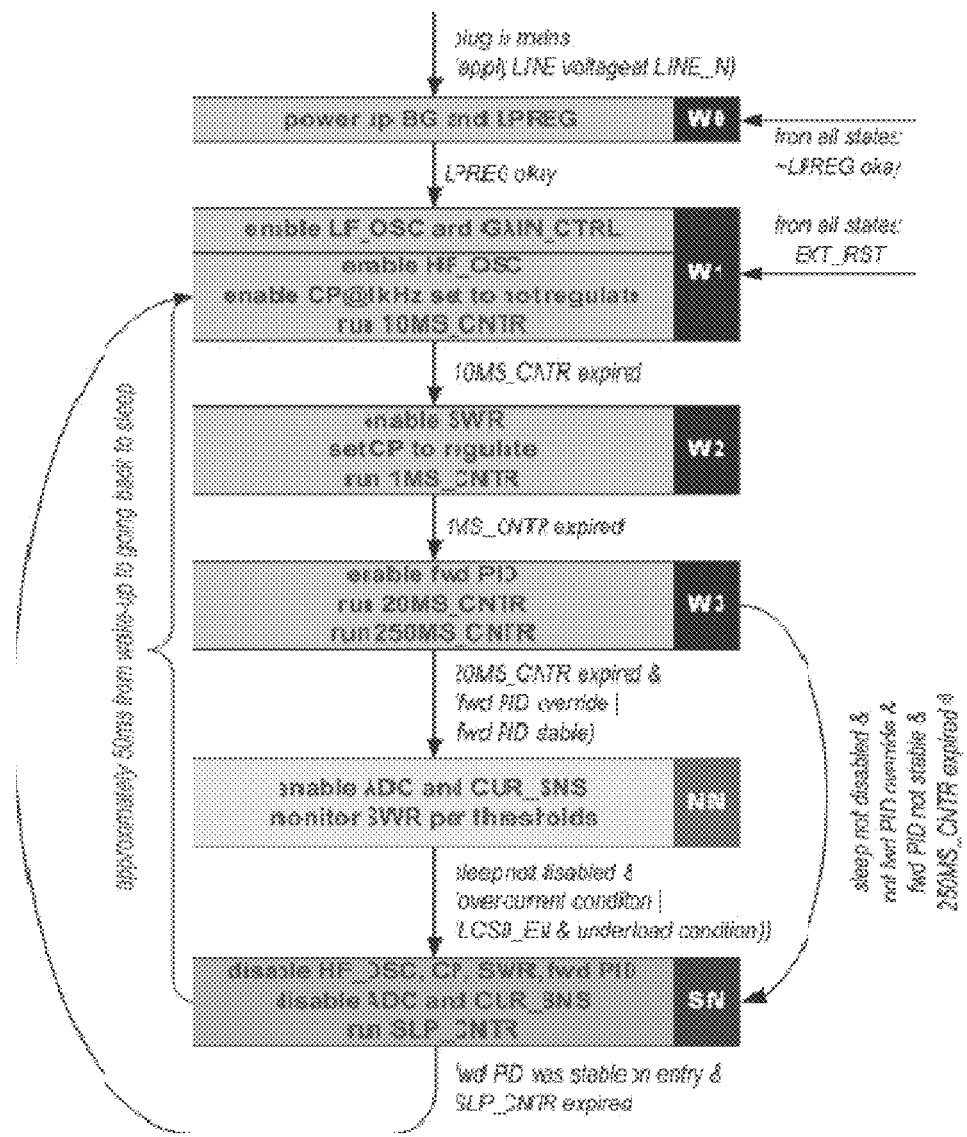
FIG. 23 is a flow chart illustrating a method of operating the power circuit shown in FIG. 2 for use in providing electrical power to electronic devices, according to an embodiment of the present invention.

The Tronium PSSoC™ is configured for use in two primary power module applications including an Autonomous Power Module and a Universal Power Module. The Autonomous Power Module operates in an autonomous mode of operation that is based upon an analog feedback approach for reduced cost. The Universal Power Module operates in a universal mode of operation that utilizes a microprocessor (μP) controller and may use some type of memory, to automatically trim, to provide feedback for regulation of the final output voltage, which can be one power rail which is controlled/monitored or more, to provide overhead for the state machine and its regulation algorithms, and to enhance the sleep/wake up mode, as shown in FIG. 23. Some key features of the Tronium PSSoC include, but are not limited to, 90 VAC to 264 VAC Line Voltage Operation (other input voltage either AC or DC may be used), a Country Code located in the controller, which sensing which country's grid is providing the input, and then automatically sets the algorithms to operate on that Country's grid, to make the proper divisions of the input to the target output. Other features also include Programmable Output Voltage (also done by manually or automatically changing the voltage conversion algorithms to change the target voltage), Hybrid switch capacitor voltage breakdown circuit (i.e., the switch capacitor voltage divider circuit) & Switch-Mode Buck Regulator (which is synchronously rectified for efficiency) for DC-DC Conversion, PID Regulation Control Loop for High Accuracy, Digital State Machines for Current and Temperature Monitoring, Ultra-Low Power Dissipation for Idle (Vampire) Mode of Operation, Opto-Isolated Microprocessor Interface for Configuration and Control, I2C Slave Port for Manufacturing Test, auto-detect input voltage range: 127 VDC to 373 VDC (world-wide voltages 110VAC-260VAC), featured Out Power: 22.5 W (any wattage possible), hybrid voltage converter for high-efficiency operation, stacked Switch Capacitor Voltage Breakdown Modules, PID regulation loops with PWM gate drivers, power scaling function for high efficiency at multiple load levels and flea power Stand-by Mode, thermal sensing and shut-off, short circuit and over-current protection, adjustable no-load/light load shut-off with restart and control logic, selectable analog or digital control, minimal or no external circuitry part count and discrete device size, and optional digital interface for bi-directional communication.

In addition, the Switch Mode Buck Regulator circuit may include what is typically know as a Buck/Boost circuit; or the Buck/Boost may be replaced with a SEPIC, Cúk, or Push Pull or other topologies. These will have synchronous rectification for efficiency and may either use a fly-back or forward convertor typologies.

The Tronium PSSoC is an advanced power controller integrated circuit that is configured to provide output voltage regulation with high-efficiency and high accuracy. The advanced features of the Tronium PSSoC provide the user with a multi-purpose device which can be used in a large variety of applications in either a "charger" mode or "constant supply" mode. Programmable output voltages (1.7V to 48V or higher) are possible with the Tronium PSSoC, with little or no loss of efficiency across a variety of current load conditions, which feature is called the "Dial-a-Voltage" feature. In addition, multiple output currents may be created by the combination of the Hybrid Circuit, or the Switch Capacitor Circuit by itself, so as to create multiple voltage/current combinations ranging typically from 1.7V to 48V, which is sufficient to power most electronic devices. This "Dial-a-Voltage" feature, is factory programmable or programmable by a customer with a proper code, so that the same chip may be used for a 1.7V output or a 48V output by changing the voltage division algorithms, with only nominal changes in any external components like the transformer winding and the FETs which drives the transformer.

The Tronium Power Supply System on a Chip (PSSoC) ASIC is an advanced power control device that enables high efficiencies across a very wide range of output power. While typical 'high efficiency' power supply controllers boast ~50% efficiencies down to 10% of full load, the Tronium device is intended to provide >90% efficiency down to and below 1% of full load.

The Tronium PSSoC provides a revolutionary topology for high voltage power conversion by implementing an intermediary voltage rail, allowing the power capabilities of the system to scale with the load demand. It also shrinks parts into the ASIC, minimizing external parts needed; and enables a wider range of transformer options for enhanced optimization of power with lower coil losses. The Tronium PSSoC also provides a PID switching controller with which to drive the primary side of a transformer if isolation is required, or other topologies of conversion and regulation. It also features either secondary or primary side control/feedback.

In one embodiment, the Tronium PSSoC uses a proprietary high-voltage intermediate voltage capacitor voltage breakdown conversion scheme, which can be used alone, or in combination with a switch-mode buck regulator to maintain high-efficiency regardless of the load voltage or current. When no current is being drawn by the load, the device will enter a low-current mode of operation of approximately ½ milliwatt in order to minimize and virtually eliminate the traditional 'vampire' current required to stay awake.

The Tronium PSSoC may include the following major circuit blocks: Intermediate Capacitor Voltage Break-Down Converter Module (CVBD Module) (can be one or more stages for desired current output); High-Voltage Single-Stage or Two-Stage switch capacitor voltage divider circuit; Proportional to Integral and Differential (PID) Regulator Control Block for PWM Control of Forward converter; Switch-Mode Buck Regulator PID Controller (optional Hybrid typology for voltage output); Buck Regulator Switch Driver; Current and Temperature Sense Blocks; 12-bit ADC for Voltage and Current Monitoring; 10-bit DAC's for Feedback Control; Digital Control Block for Current Monitoring State Machine; Serial Input for Opto-Isolator Communications Interface; I2C Serial Interface Port for Test, Evaluation, Repair and Communication; Oscillators for generation of internal clock signals; Power Manager for On-Chip Voltage and Current Generation; Adapted for use with or without a microcontroller which can be embedded into the chip or external; Primary Side Sensing or Secondary Side Sensing Capabilities; and Synchronous forward convertor.

The power module may also include a Tronium PSSoC that includes both analog and digital control in order to optimize performance and efficiency. In order to enable not only analog control but also digital control the proper inputs and outputs must be available on the Tronium PSSoC. Given these availabilities, and coupled with power loop control from an internal clock-control of the clock can be driven and controlled with external signals. The novel approach is that these signals can be driven from the secondary side while the Tronium PSSoC sits on the primary side of the transformer.

Digital control is commonly accomplished on the same side of the isolation barrier. However, given that the Tronium PSSoC is inherently an isolated system, and end to end efficiency optimization is required, control from primary side or secondary back to primary side may be utilized. This is accomplished in a number of different ways given the Tronium implementation. This can be done with optocouplers transmitting the digital control signal from a microcontroller as well as analog signals from a current sense circuit. Furthermore, this can be accomplished by using a third winding on the isolation transformer.

Some or all of the circuits and/or electrical devices include in the power circuit may be integrated onto the chip using either a silicon process, Gallium nitride (GaN) or Gallium Arsenide (GaA), or by using Deep Trench Capacitors, or other available processes which provides high efficiency parts, if high efficiency is desired. Thus, one or all of these parts may be embedded in the ASIC rather than be external discretes, even the transformer, using the known transformer in silicon (or GaN-GaA) techniques. In addition, the use of MIM and MOM capacitors along with low $RDS_{ON}$ MOSFETS, integrated decoupling capacitors and/or flying capacitors ($C_{FLY}$), for ripple reduction, which in turn decreases the size of needed capacitors may be used where capacitors or FETS are called for herein. Also, the introduction of integrated inductors on chip helps achieve the highest efficiencies. Alternatively, the highest efficiency parts, like GaA, GaN or Schottky diode parts are to be used.

In addition, the capacitors may be nano-capacitors, and may be based upon ferroelectric and core-shell materials as well as those based on nanowires, nanopillars, nanotubes, and nanoporous materials.

The substrata for the Tronium PSSoC could be made from customary films currently used in capacitors (if external) or within semiconductor substrates such as high or low Ohmic silicon substrate, polysilicon, gallium nitride, gallium arsenide, silicon germanium or substances like silicon carbide or indium phosphide.

They key is on-board ASIC integration of as many discretes as possible where the process permits, and if efficiency is key then identification of low RDSon values, high efficient parts, and sufficient voltage break-down parts. Another key is to run the Switch Buck Module at higher frequencies, so that parts become smaller, and sufficiently smaller to become on-board chip devices.

A selected embodiment of the present invention will now be explained with reference to the drawings. It will be apparent to those skilled in the art from this disclosure that the following description of the embodiment of the present invention is provided for illustration only and not for the purpose of limiting the invention as defined by the appended claims and their equivalents.

Figure 2:
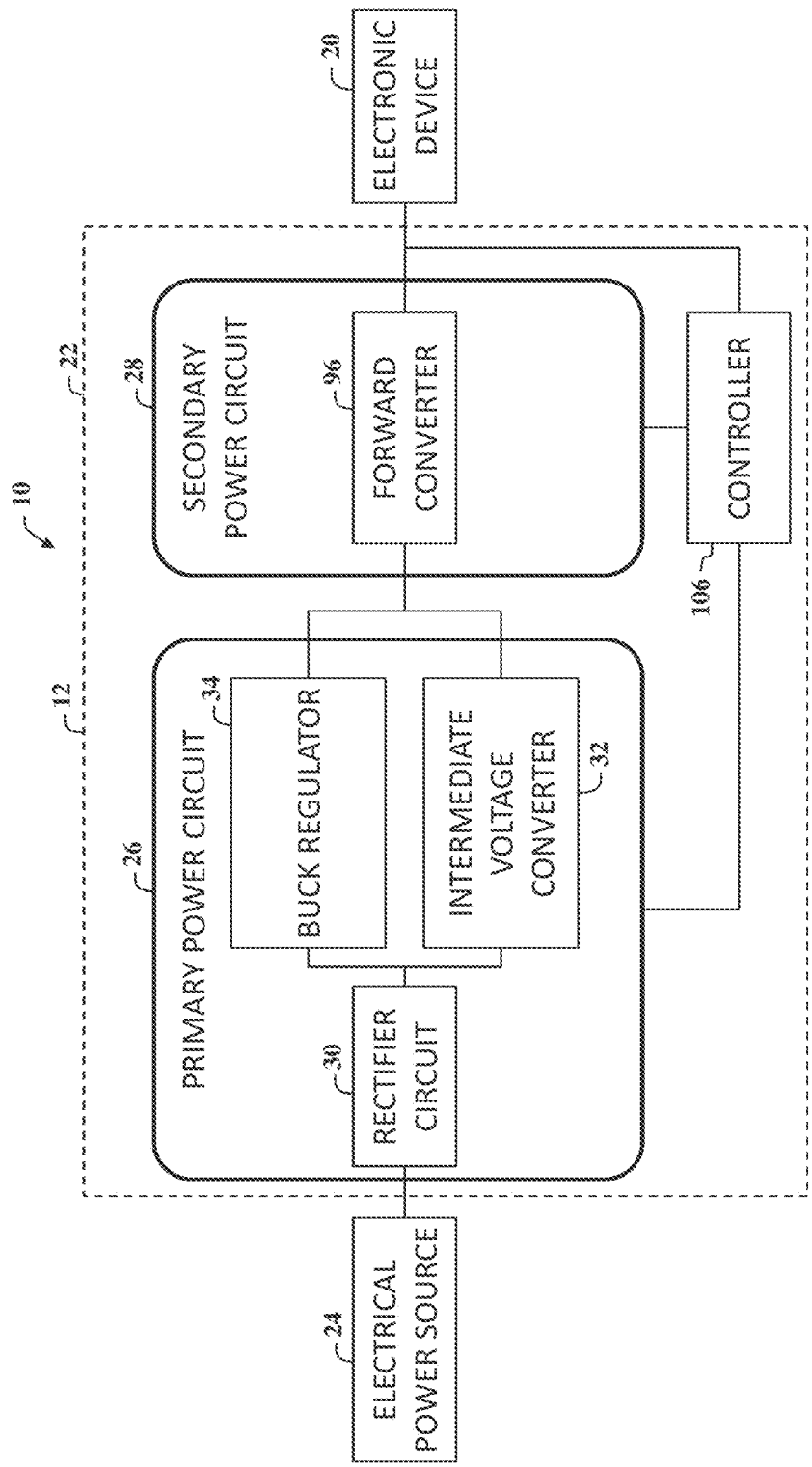
FIG. 2 is a block diagram of a power circuit that may be used with the charging device shown in FIG. 1, for use in providing electrical power to electronic devices, according to an embodiment of the present invention.

FIG. 1 is a schematic diagram of an electronic charging device 10 for use in providing electrical power to electronic devices. FIG. 2 is a block diagram of a power module 12 that may be used with the electronic charging device 10. In the illustrated embodiment, the electronic charging device 10 includes a housing 14, a pair of power prongs 16 extending outwardly from the housing 14 and a device connection assembly 18 that is adapted to connect to an electronic device 20 to deliver electric power from the charging device 10 to the electronic device. The electronic charging device 10 also includes the power module 12 that includes a power circuit 22 that is configured to receive power from an electrical power source 24 and deliver power to the electronic device 20 such as, for example, portable consumer electronic devices including, but not limited to, a cell phone, a smartphone, a tablet computer, a laptop, and/or any suitable electronic device. In addition, the power circuit 22 may deliver power for use in charging electronic storage devices such as, for example, mobile phone/laptop/tablet power storage batteries. In one embodiment, the power circuit 22 may be configured to provide low voltage DC output (typically 5VDC) from an AC mains supply typically 120VAC (US) to 264VAC (EU/Asia).

In the illustrated embodiment, the power circuit 22 includes a primary power circuit 26 and a secondary power circuit 28. The primary power circuit 26 is adapted to be electrically coupled to the electrical power source 24 and is configured to receive an AC (or DC) input power signal from the electrical power source 24 and generate an intermediate direct current (DC) power signal. The intermediate DC power signal being generated at a first voltage level that is less than a voltage level of the AC input power signal. The secondary power circuit 28 is electrically coupled to the primary power circuit 26 and is configured to receive the intermediate DC power signal from the primary power circuit 26 and deliver an output DC power signal to the electronic device 20. The output DC power signal is delivered at an output voltage level that is less than the first voltage level of the intermediate DC power signal. For example, in one embodiment, the primary power circuit 26 is configured to receive the AC input signal having a voltage level between a range of 127 volts to 375 volts AC and to deliver the intermediate DC power signal at a voltage level of approximately 110 volts DC. The secondary power circuit 28 is configured to receive the intermediate DC power signal and deliver the output DC power signal at approximately 5 volts DC.

Figure 13:
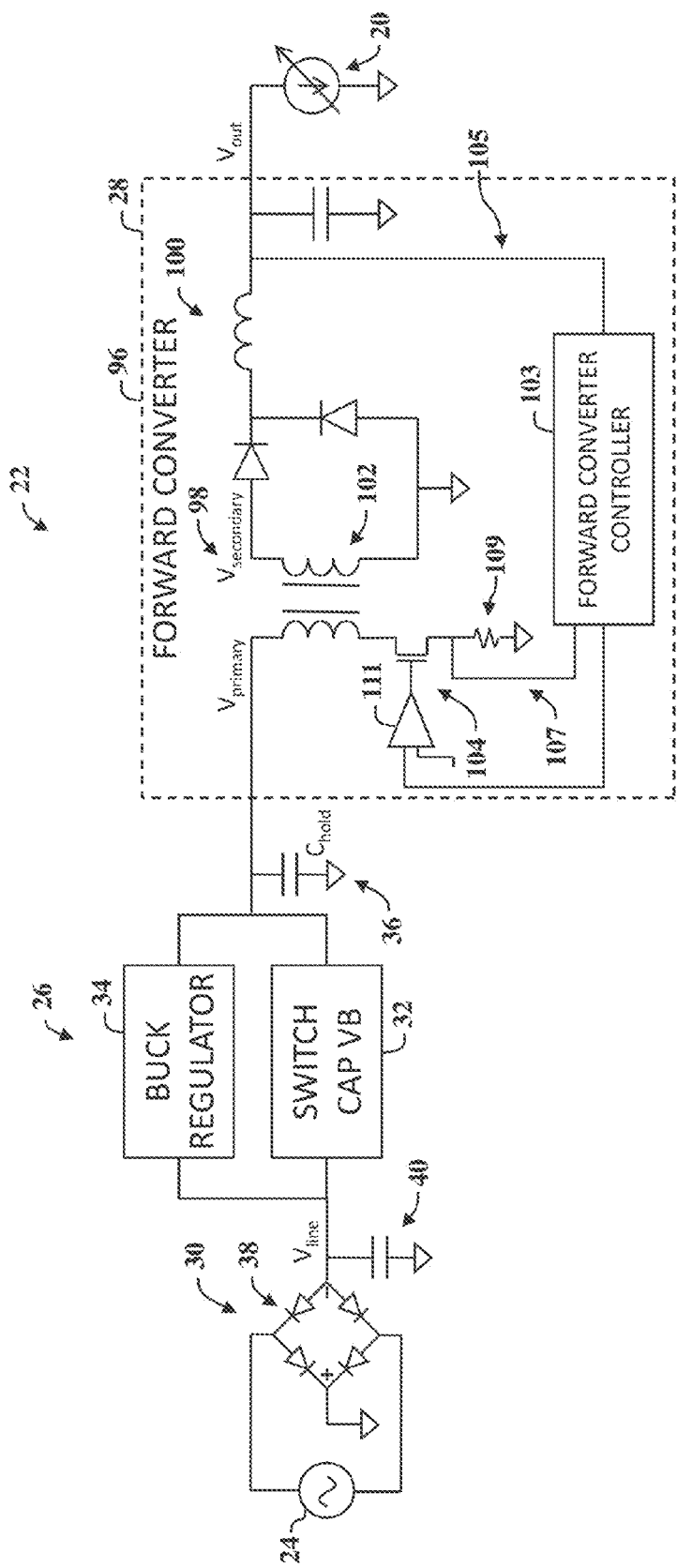
FIG. 13 is a schematic diagram of a forward converter circuit that may be used with the power circuit shown in FIG. 2, according to an embodiment of the present invention.
Figure 14:
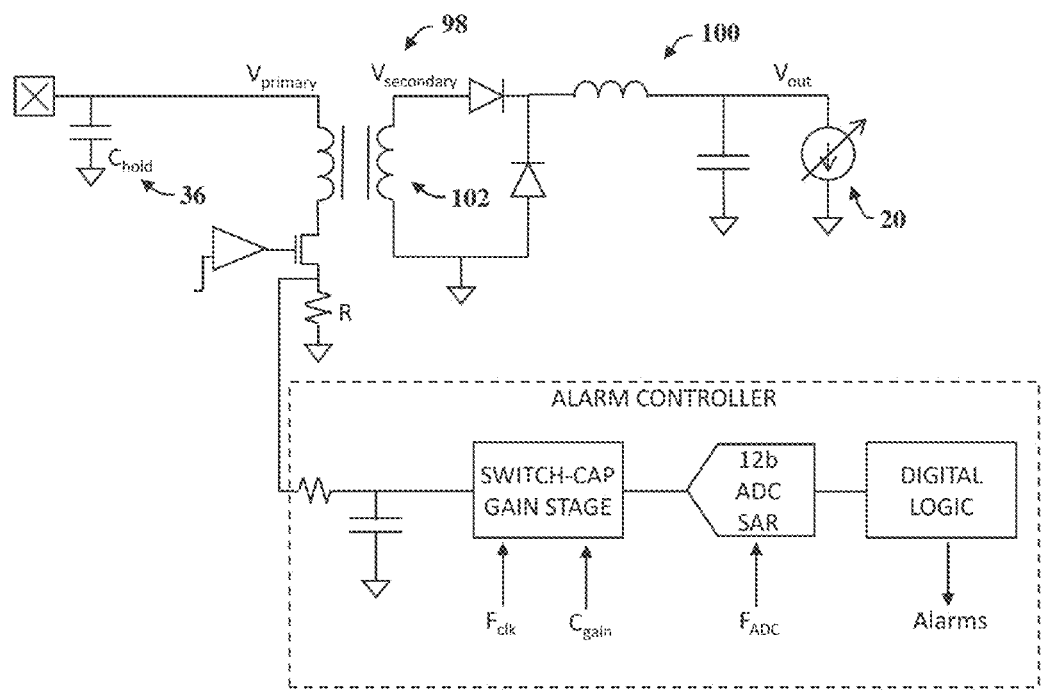
FIG. 14 is a schematic diagram of an alarm control circuit that may be used with the power circuit shown in FIG. 2, according to an embodiment of the present invention.
Figure 15A:
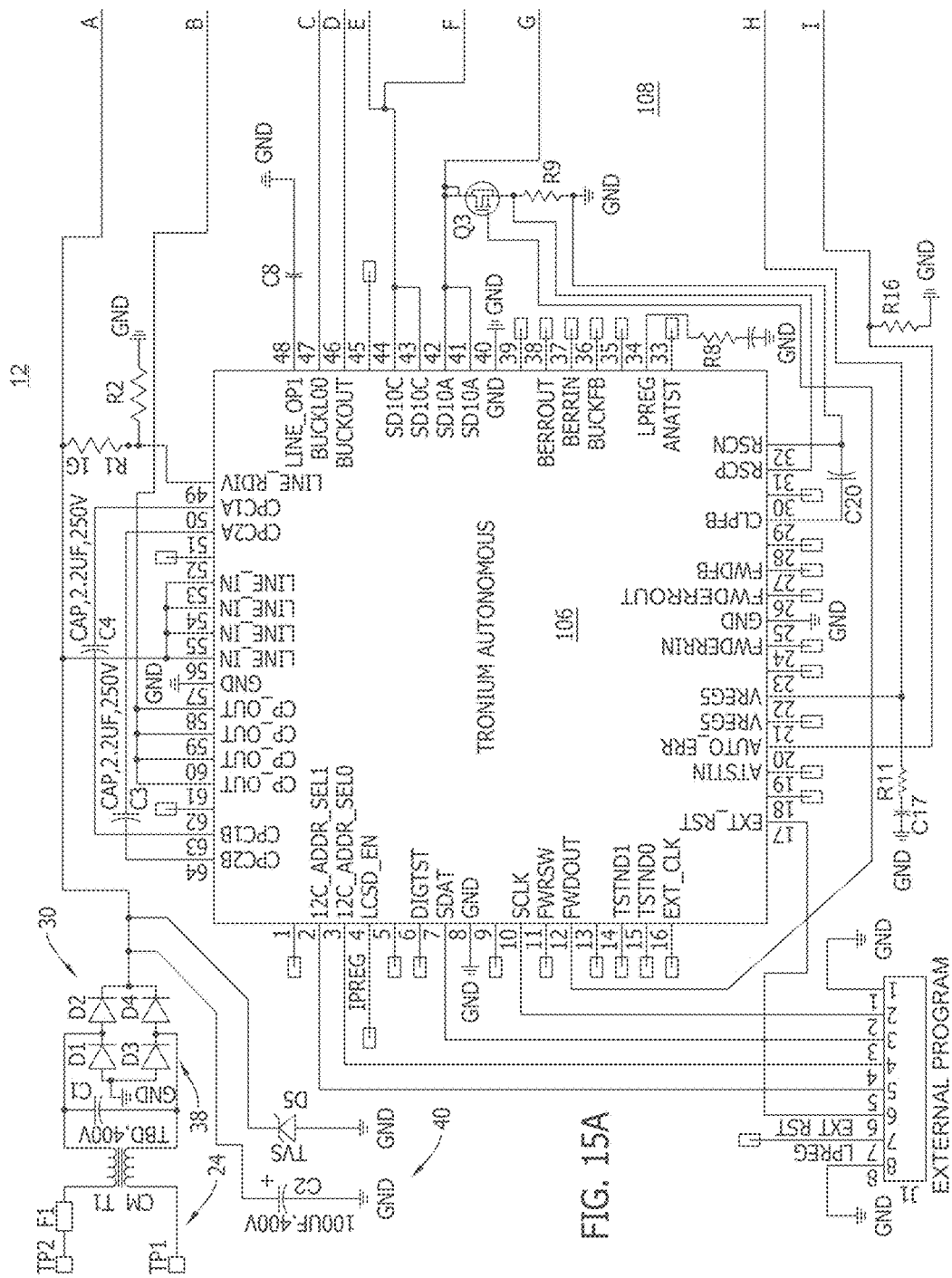
FIGS. 15A and 15B are schematic diagrams of the power circuit shown in FIG. 2, including a power controller integrated circuit, according to an embodiment of the present invention.
Figure 15B:
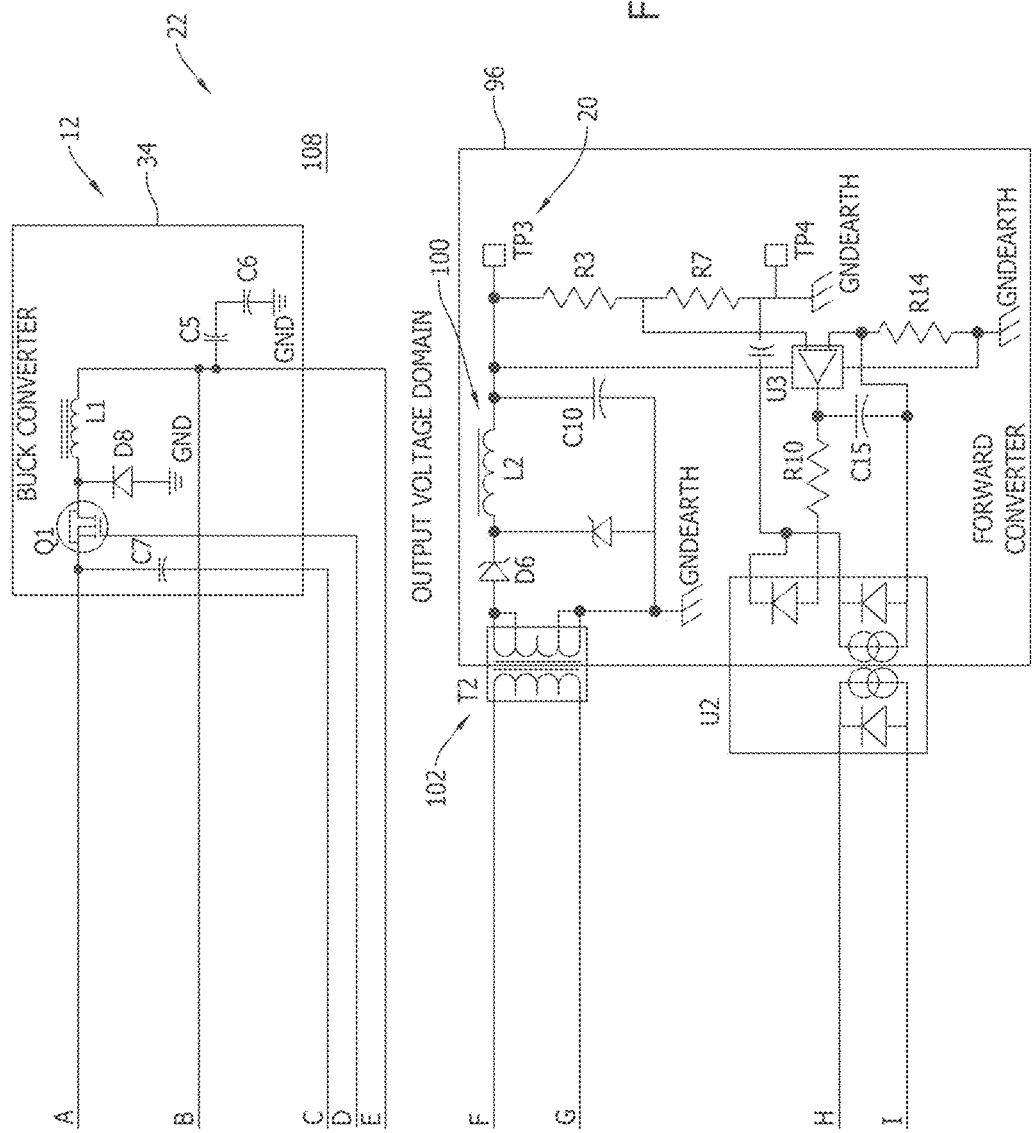

In the illustrated AC-DC embodiment, the primary power circuit includes a rectifier circuit 30, an intermediate voltage converter 32, a buck regulator 34, and a hold capacitor 36 that is electrically coupled to the intermediate voltage converter 32 and the buck regulator 34. The intermediate voltage converter 32 and the buck regulator 34 are coupled in parallel between the rectifier circuit 30 and the secondary power circuit 28. The rectifier circuit 30 is configured receive the AC power input signal from the electrical power source 24 and generate a rectified DC power signal that is delivered to the intermediate voltage converter 32 and the buck regulator 34. In one embodiment, the rectified DC power signal is delivered having a voltage level that is approximately equal to the voltage level of the AC input power signal. As shown in FIGS. 13, 15A, and 15B, in the illustrated embodiment, the rectifier circuit 30 includes a plurality of diodes 38 that are arranged in a full-wave bridge rectifier having first and second input terminals coupled to the high and low sides of the electrical power source 24 for producing a DC power signal from an AC input power signal. In one embodiment, the rectifier circuit 30 may also include a filter capacitor 40 that is coupled to the full-wave bridge rectifier. In yet another embodiment, the rectifier circuit 30 does not include the filter capacitor 40. In another embodiment, the rectifier circuit 30 may include a half-bridge rectifier (not shown).

Figure 3:
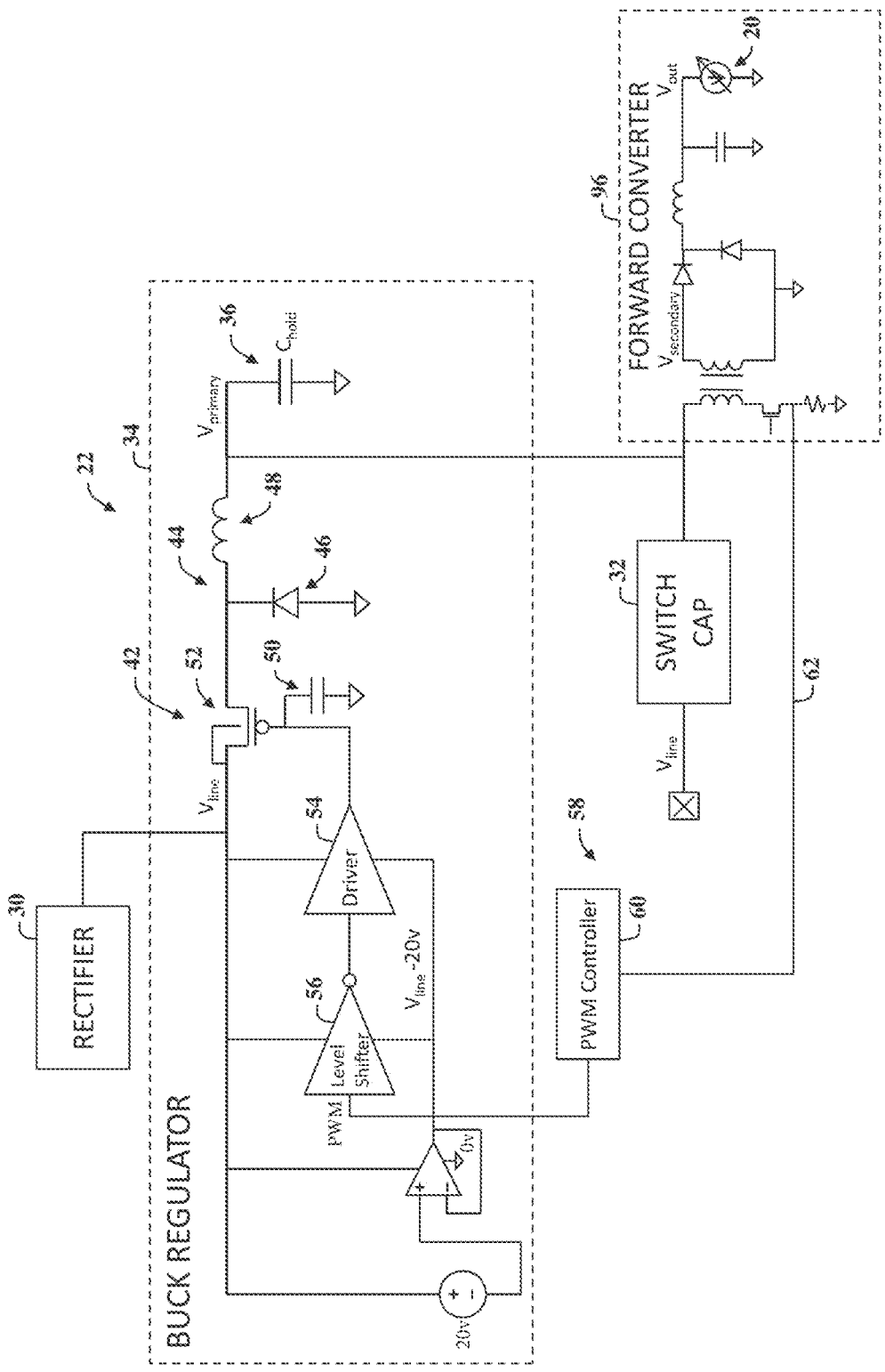
FIG. 3 is a schematic diagram of a buck regulator circuit that may be used with the power circuit creating a "Hybrid" voltage divider circuit as shown in FIG. 2, according to an embodiment of the present invention.

FIG. 3 is a schematic diagram of the buck regulator circuit 34 that may be used with the power circuit 22. In the illustrated embodiment, the buck regulator circuit 34 includes a regulator switch assembly 42 that is coupled to a voltage reduction circuit 44. The voltage reduction circuit 44 includes a high voltage buck diode 46, a buck energy storage inductor 48, and a capacitor 50. The regulator switch assembly 42 is operated to selectively deliver the rectified DC power signal to the voltage reduction circuit 44. In the illustrated embodiment, the regulator switch assembly 42 includes a P-channel MOSFET 52, a driver circuit 54 that is coupled to the P-channel MOSFET 52, and a level shifter 56 that is coupled to the driver circuit 54. In one embodiment the regulator switch assembly 42 may include an N-channel MOSFET and/or a P-channel MOSFET. In the illustrated embodiment, the buck regulator 34 also includes a regulator control circuit 58 that includes a regulator PWM controller 60 (also shown in FIGS. 16, 17A, and 17B) for generating a pulse width modulated signal to control P-channel MOSFET 52. In one embodiment, the control circuit 58 may also include a voltage sensing circuit 62 that is connected to the primary side of the forward converter transformer for sensing the voltage level of the intermediate DC power signal being delivered to the secondary power circuit 28. The regulator PWM controller 60 may generate a pulse-width modulated control signal as a function of the sensed first voltage level to adjust a duty cycle of the PWM control signal being delivered to the P-channel MOSFET 52 to maintain the voltage level of the intermediate DC power signal. The Buck Regulator servo loop 58 is voltage controlled and the Vprimary is sensed and used to modulate the duty cycle of the driver 54.

In one embodiment, the sensing circuit 62 includes one or more Hall Effect sensors that are coupled to the primary side of the forward converter transformer for sensing a magnetic field being generated within the transformer. The Hall Effect sensors facilitate determining a zero-crossing of the transformer by directly sensing the magnetic field being generated by the transformer during operation. In one embodiment, the sensing circuit 62 includes a primary side Hall Effect sensor coupled to the primary side of the transformer. The primary side Hall Effect sensor is connected to the PWM controller 60 for transmitting a signal to the PWM controller 60 for use in determining when the transformer nears the "zero-crossing". In another embodiment, the sensing circuit 62 includes a secondary side Hall Effect sensor that is coupled to the secondary side of the transformer, and is connected to the forward converter controller (shown in FIG. 13) for transmitting a signal indicative of the transformer magnetic field for use in determining the time at which the transformer reaches the "zero-crossing".

Figure 11:
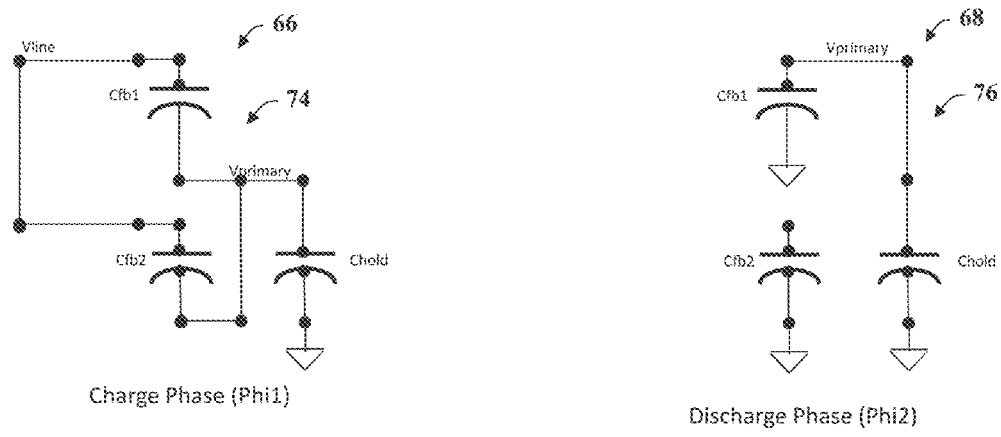
Figure 12:
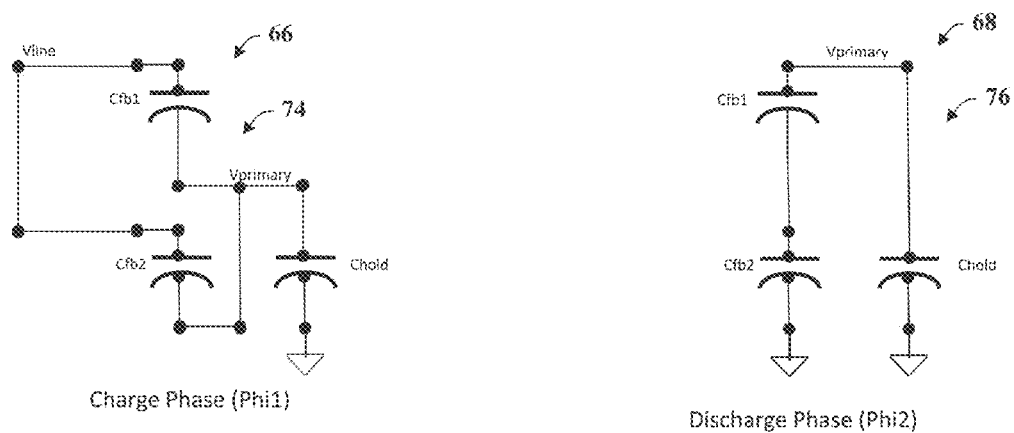

FIGS. 4-8 are schematic diagrams of the intermediate voltage converter 32 including a voltage reduction circuit cell. FIG. 9 is a table illustrating gain settings that may be used with the intermediate voltage converter 32. FIGS. 10-12 are schematic illustrations of the intermediate voltage converter 32 in a charge phase mode 66 and a discharge phase mode 68 for each of the gain settings shown in FIG. 9. In the illustrated embodiment, the intermediate voltage converter 32 includes a single-stage switch capacitor voltage divider circuit that is coupled to the hold capacitor 36 and the secondary power circuit 28. The switch capacitor voltage divider circuit includes a pair of flyback capacitors 70 that are electrically coupled in parallel and a plurality of switch assemblies 72 that are electrically coupled to each of the flyback capacitors 70. The switch assemblies 72 are selectively operated between the charge phase mode 66 and the discharge phase mode 68. During the charge phase mode 66 the switch assemblies 72 are operated to form a charging circuit 74 to connect the flyback capacitors 70 to the rectifier circuit 30 to deliver the rectified DC power signal to each of the flyback capacitors 70. During the discharge phase mode 68, the switch assemblies 72 are operated to form a discharging circuit 76 to connect the flyback capacitors 70 to the secondary power circuit 28 to deliver the intermediate DC power signal to the hold capacitor 36.

Figure 8:
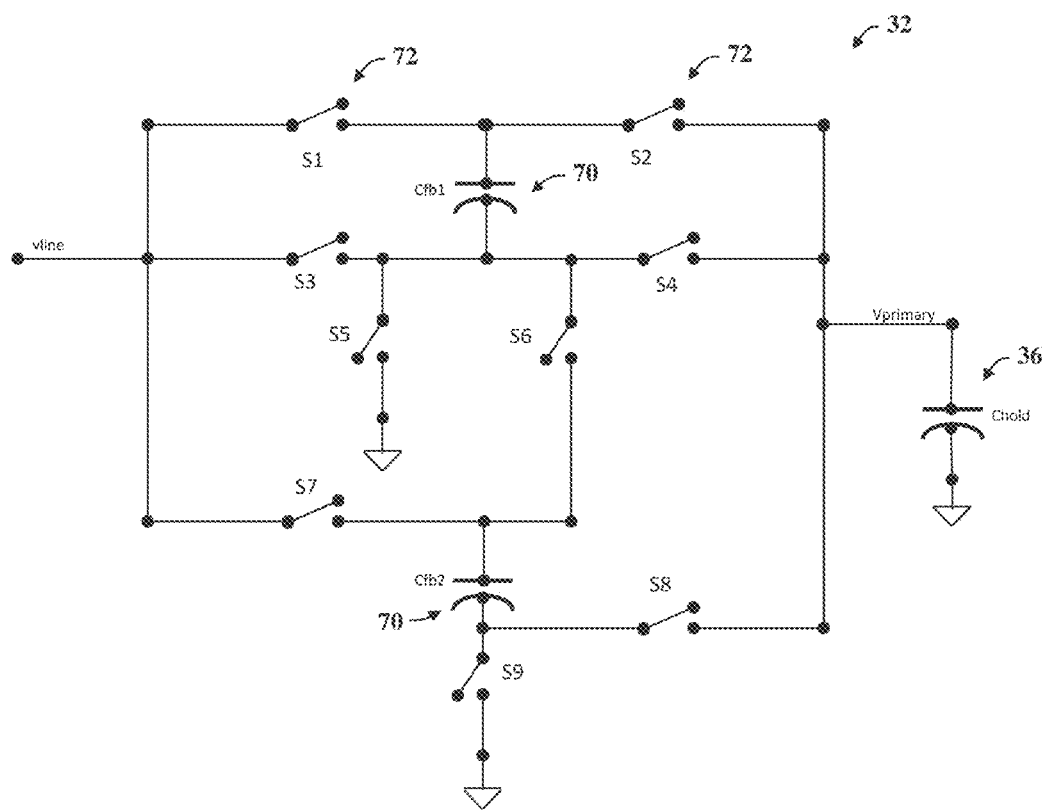
FIG. 8 is a schematic diagram of a portion of the switch capacitor voltage divider circuit, herein referred to as a Muxcapacitor™ (Mux) Core Cell, shown in FIG. 4, according to an embodiment of the present invention.
Figures 9, 10:
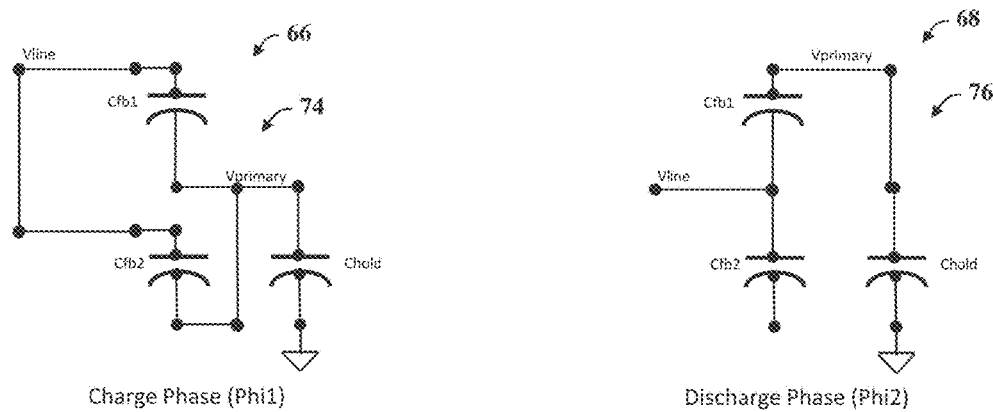
FIG. 9 is a table illustrating gain settings for use with the switch capacitor voltage divider circuit shown in FIG. 8, according to an embodiment of the present invention.
FIGS. 10-12 are schematic illustrations of the switch capacitor voltage divider circuit shown in FIG. 8 in a charge phase mode and a discharge phase mode associated with each of the gain settings shown in FIG. 9, according to an embodiment of the present invention.

In one embodiment, as shown in FIG. 8, the single-stage switch capacitor voltage divider circuit 32 may include a first flyback capacitor Cfb1 and a second flyback capacitor Cfb2, and nine switch assemblies S1, S2, S3, S4, S5, S6, S7, S8, and S9. In addition, two of the switch assemblies S3 and S9 are coupled to ground. During operation, the gain setting of the switch capacitor voltage divider circuit may be adjusted by selectively operating the switch assemblies according to the gain setting table shown in FIG. 9. For example, during the charge phase mode 66 (Phase 1), switches S1, S4, S7, and S8 are turned on and moved to a closed position and switch assemblies S2, S3, S5, S6, and S9 are turned off and moved to an open position to form the charging circuit 74 to connect the flyback capacitors Cfb1 and Cfb2 to the rectifier circuit 30. As shown in FIG. 10-12, in the charging circuit 74 the top plate of each flyback capacitor Cfb1 and Cfb2 are connected to the rectifier circuit 30 line voltage, Vline. For a gain setting equal to G=1×, during the discharge phase mode 68 (Phase 2), switch assemblies S2, S3, and S7 are turned on and switch assemblies S1, S4, S5, S6, S8, and S9 are turned off to form a discharging circuit 76 shown in FIG. 10 that includes the top plate of capacitor Cfb1 connected to the hold capacitor 36 and the top plate of capacitor Cfb2 connected to the bottom plate of capacitor Cfb1. With reference to FIGS. 9 and 11, for a gain setting equal to G=½×, during the discharge phase mode 68 (Phase 2), switch assemblies S2, S5, and S9 are turned on and switch assemblies S1, S3, S4, S6, S7 and S8 are turned off to form a discharging circuit 76 that includes the top plate of capacitor Cfb1 connected to the hold capacitor 36, the bottom plate of capacitor Cfb1 connected to ground, and the top plate of capacitor Cfb2 connected to the hold capacitor 36, the bottom plate of capacitor Cfb2 connected to ground. Referring to FIGS. 9 and 12, for example, a gain setting equal to G=⅔×, during the discharge phase mode 68 (Phase 2), switch assemblies S2, S6, and S9 are turned on and switch assemblies S1, S3, S4, S5, S7 and S8 are turned off to form a discharging circuit 76 that includes the top plate of capacitor Cfb1 connected to the hold capacitor 36, top plate of capacitor Cfb2 connected to the bottom plate of capacitor Cfb1, and bottom plate of capacitor Cfb2 connected to ground.

In one embodiment, multiple "stages" of the switch capacitor circuits, as explained herein, are linked together, which may be used to gain additional current output, with or without the need for the addition of the Hybrid power conversion/regulation circuits.

Figure 7:
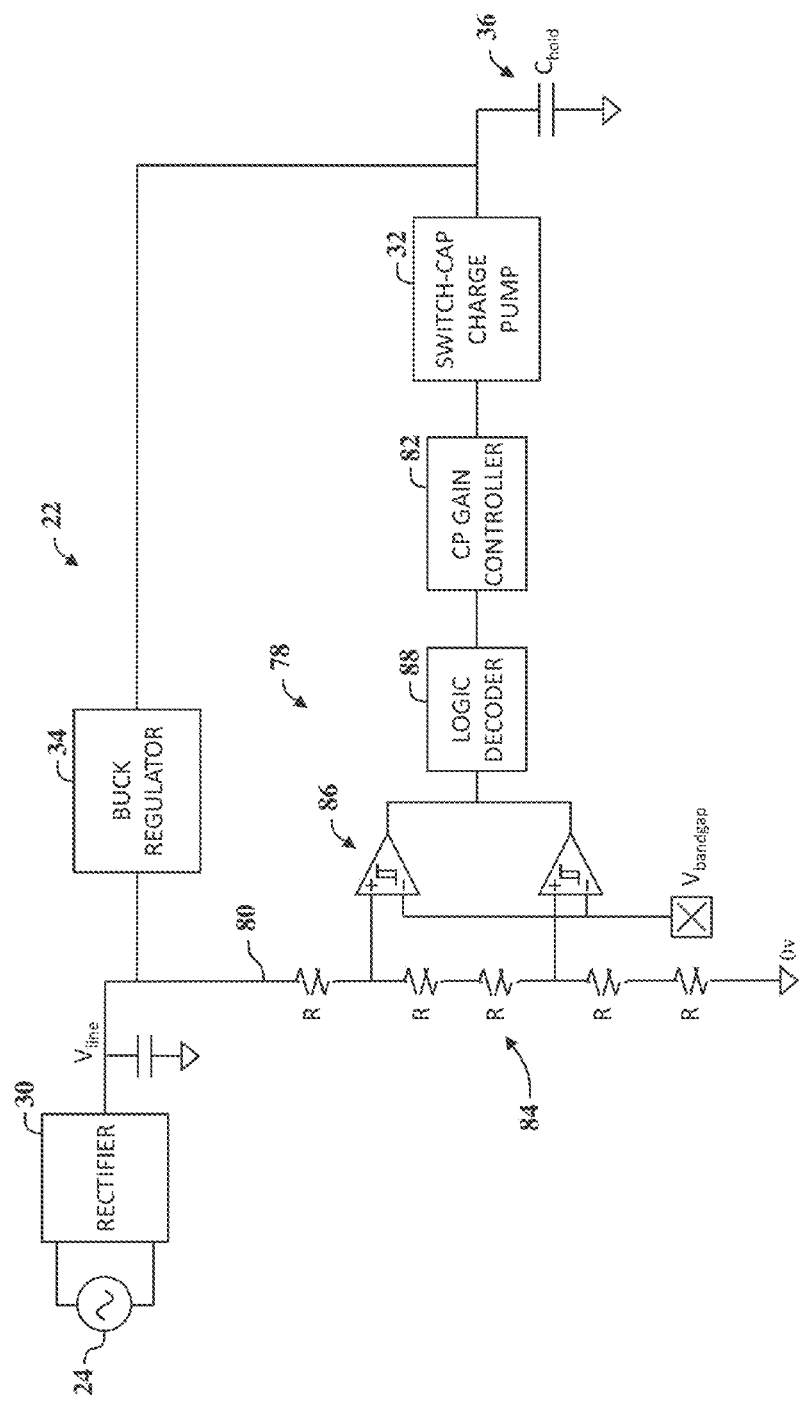

Referring to FIG. 7, in the illustrated embodiment, the switch capacitor voltage divider circuit 32 also includes a control circuit 78 that is coupled to each of the switch assemblies 72 to operate the switch capacitor voltage divider circuit 32. The control circuit 78 includes a voltage sensing circuit 80 for sensing a voltage level of the rectified DC power signal being received from the rectifier circuit 30 and a gain controller 82 that is configured to select a gain setting of the switch capacitor voltage divider circuit 32 as a function of the sensed voltage level and operate each of the plurality of switch assemblies as a function of the selected gain setting. By providing a control circuit 78 that selects the gain setting of the switch capacitor voltage divider circuit 32 as a function of the sensed input voltage level, the switch capacitor voltage divider circuit 32 is able to adjust the operation of the switch capacitor voltage divider circuit 32 to account for variations of AC voltage levels in different countries and/or power grids and deliver the intermediate DC output signal at a predefined voltage level and maintain optimum power efficiency. In the illustrated embodiment, the control circuit 78 includes a resistor divider 84, a pair of comparators 86, a logic decoder 88, and a gain controller 82. The negative input of the comparators 86 is connected to a bandgap generator and the positive inputs are connected to the rectifier circuit 30 line voltage, Vline.

Figure 4:
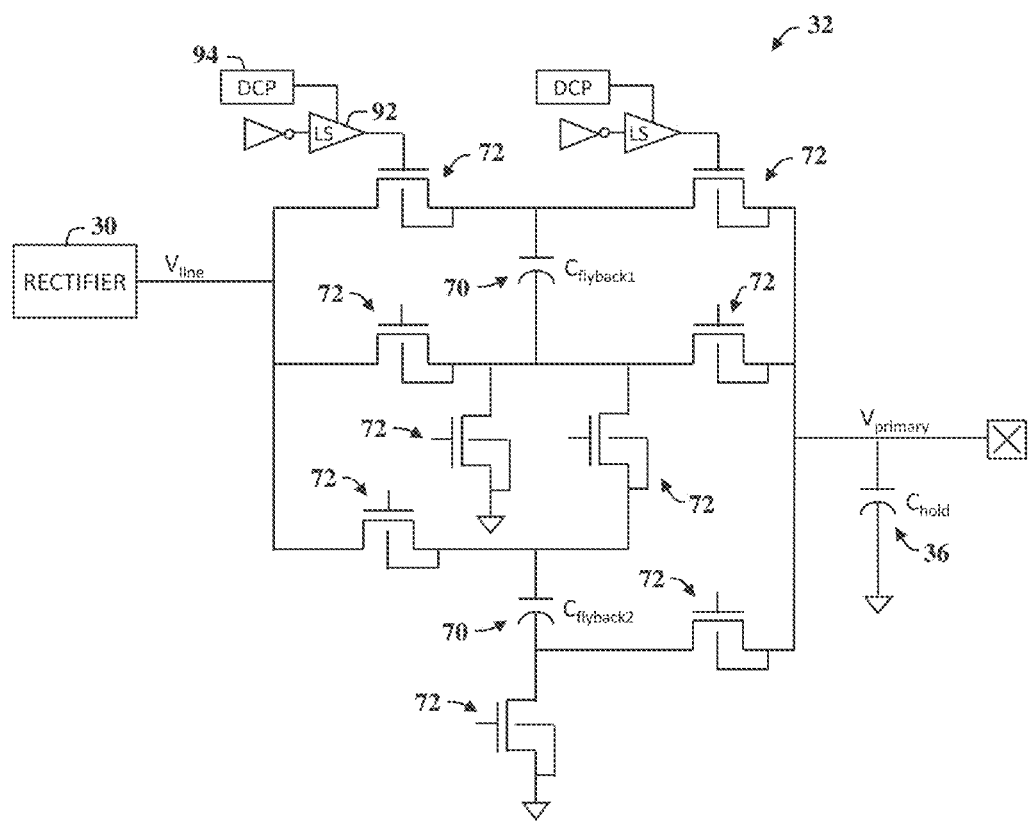
FIGS. 4-7 are schematic diagrams of a switch capacitor voltage divider circuit that may be used with the power circuit shown in FIG. 2, including the sharing of gates between capacitors for further reducing $RDS_{ON}$ losses, according to an embodiment of the present invention.
Figure 5:
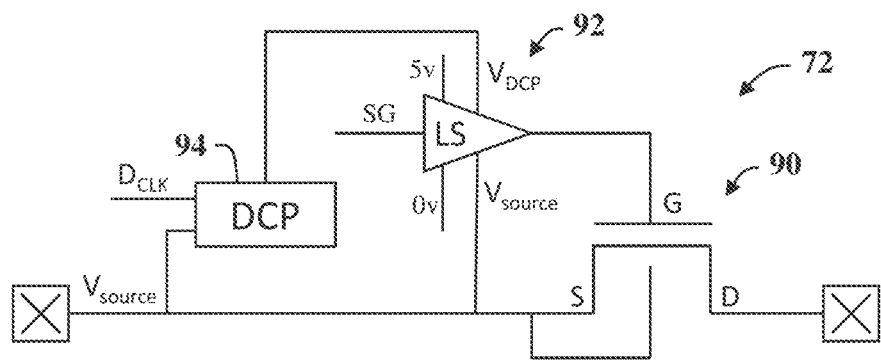
Figure 6:
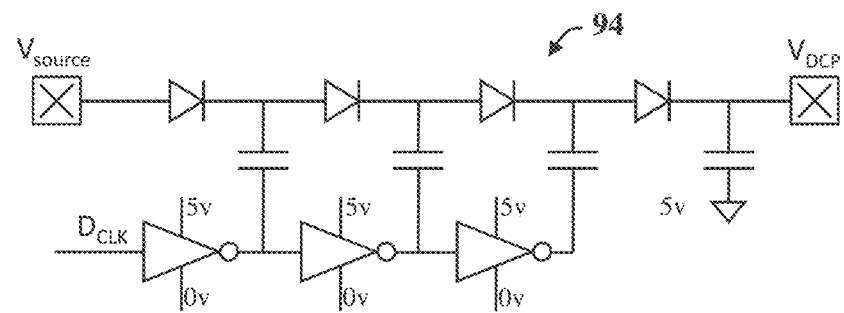

Referring to FIGS. 4-6, in the illustrated embodiment, one or more switch assemblies includes an N-channel MOSFET switch 90, and a level shifter 92 that is connected to the N-channel MOSFET switch 90 for delivering a control signal to the N-channel MOSFET switch 90 to facilitate operating the N-channel MOSFET 90. In addition, one or more switch assemblies 72 include a charge pump 94 that is connected to the level shifter 92 to provide a high-voltage signal required to close the N-channel gate during operation. In one embodiment, the charge pump may include a Dickson charge pump. Alternatively, the charge pump 94 may include any suitable charge pump that enables the power circuit 22 to operate as described herein. In the illustrated embodiment, the charge pump 94 is configured to generate an output power signal having a voltage level that is greater than a switch assembly source voltage to enable the level shifter 92 to operate the N-channel MOSFET switch 90. In one embodiment, each of the switch assemblies 72 includes an N-channel MOSFET 90, a level shifter 92 coupled to the N-channel MOSFET 90, and a charge pump 94 coupled to the level shifter 92. In another embodiment, two of more level shifters 92 may be connected to a single charge pump 94. Wherever in this specification the term NMOS is used, it could be substituted with a PMOS and vice versa.

In the illustrated embodiment, at least one switch assembly 72 includes a level shifter 92 that is connected to an N-channel MOSFET switch 90. In addition, a charge pump 94 is connected to the level shifter 92 to provide a power signal sufficient to close the gate of the N-channel MOSFET switch 90. In the illustrated embodiment, the charge pump 94 is connected to the source voltage, Vsource, of the N-channel MOSFET and is configured to deliver an output signal to the level shifter 92 that has a voltage level that is greater than the voltage level of the source voltage, Vsource in the case of using an NMOS. In one embodiment, the charge pump 94 is configured to deliver an output power signal, $V_{DCP}$, having a voltage level that is approximately 15-20 volts greater than the source voltage, Vsource in order to assure proper gate operation. The gain controller 82 is connected to the level shifter 92 for providing a low voltage control signal to the level shifter 92. The level shifter 92 is connected to the source voltage, Vsource, and to the charge pump 94, and is configured to deliver the control signal to the N-channel MOSFET 90 having a voltage level sufficient to operate the switch assembly 72 as a function of the received control signal.

FIG. 13 is a schematic diagram of the secondary power circuit 28 including a forward converter circuit 96. In the illustrated embodiment, the forward converter circuit 96 includes a primary voltage reduction circuit 98 and a secondary voltage reduction circuit 100. The primary voltage reduction circuit 98 is configured to receive the intermediate DC power signal from the primary power circuit 26 and deliver a secondary DC power signal to the secondary voltage reduction circuit 100. The secondary DC power signal has a voltage level that is less than the voltage level of the intermediate DC power signal. The secondary voltage reduction circuit 100 is configured to receive the secondary DC power signal and generate the output DC power signal being delivered to the electronic device 20.

Figure 37:
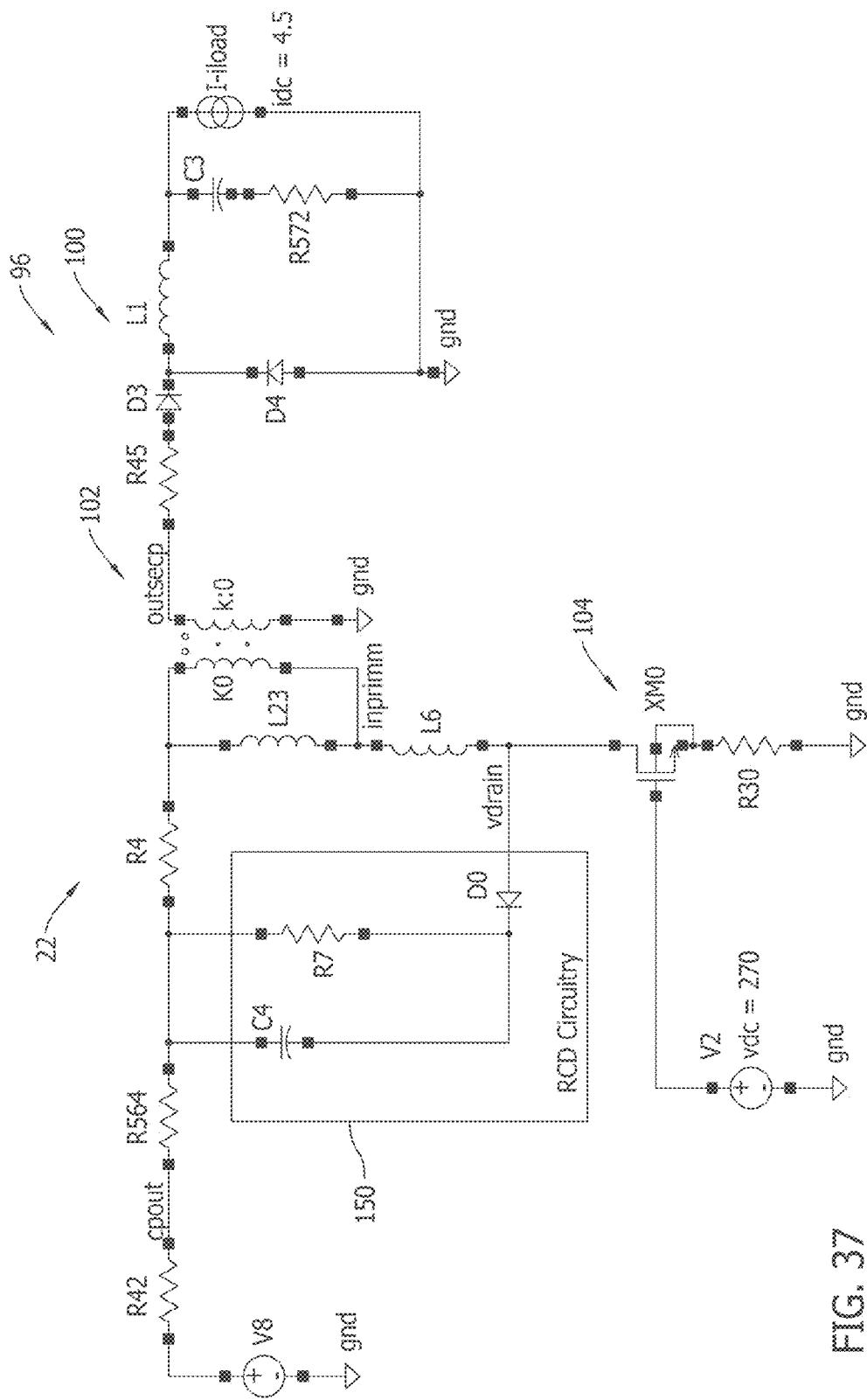
FIG. 37 is a schematic illustration of an RCD circuit that may be used with the forward converter circuit shown in FIG. 13, according to an embodiment of the present invention.
Figure 72:
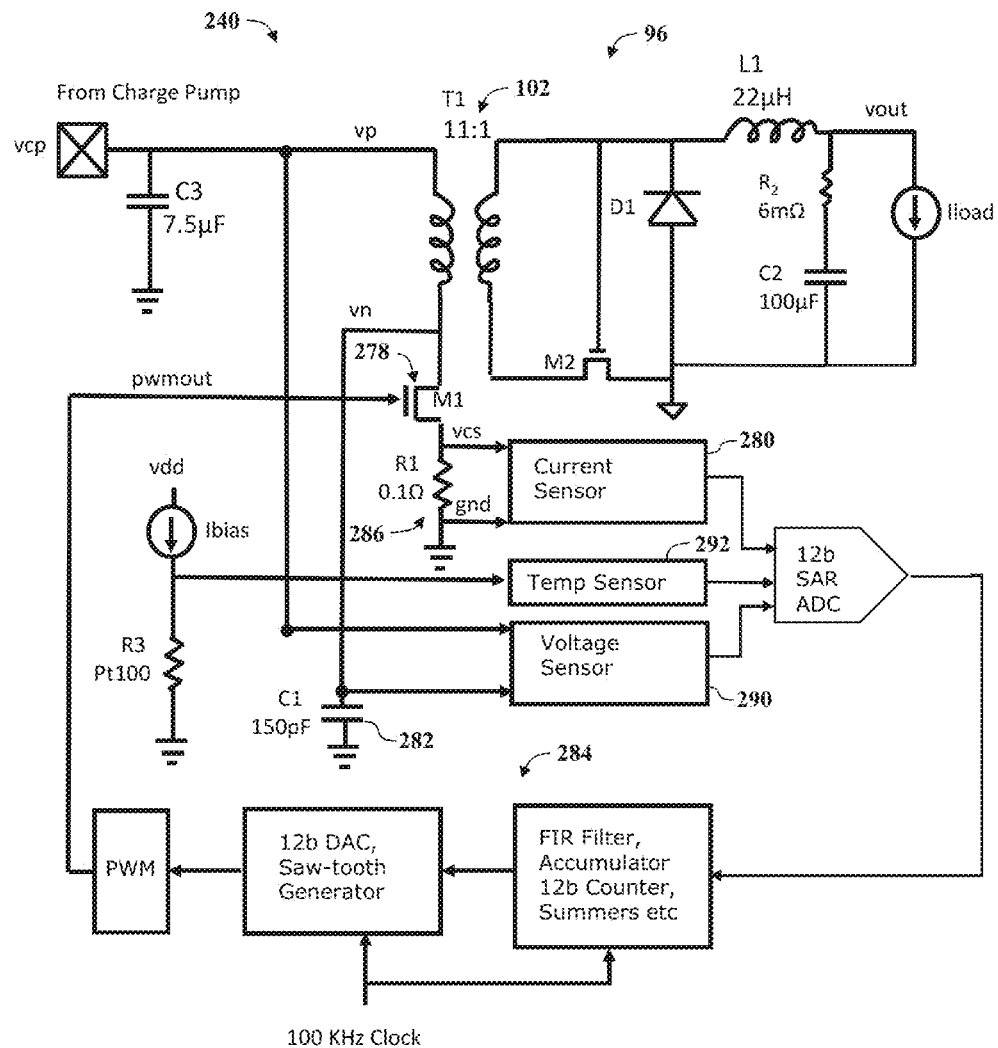
Figure 73:
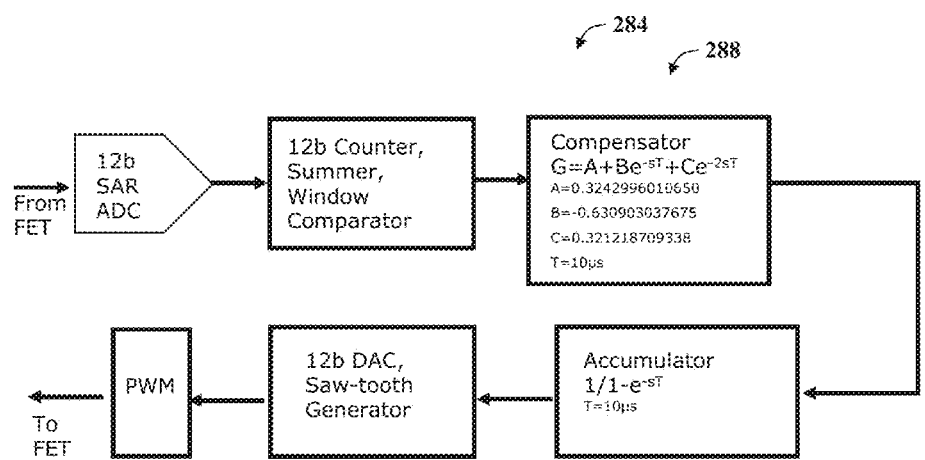
FIG. 73 is a block diagram illustrating a portion of a controller that may be used with the primary side regulation circuit shown in FIGS. 71 and 72, according to an embodiment of the present invention.

In the illustrated embodiment, the primary voltage reduction circuit 98 includes a transformer 102. The primary side of the transformer 102 is connected to the primary power circuit 26 and the secondary side of the transformer 102 is connected to the secondary voltage reduction circuit 100. In one embodiment, the primary voltage reduction circuit 98 may include a switch assembly 104 including a FET that is coupled to the transformer primary side, and a control circuit 103 that is coupled to the switch assembly 104 for selectively operating the switch assembly 104 to adjust a voltage level of the secondary DC power signal. The transformer control circuit 103 may include a primary side voltage sensing circuit 105 for sensing voltage and current level of the DC output signal and operate the transformer switch assembly 104 to maintain the voltage level of the DC output signal at a predefined output voltage level and required current level. In this fashion at least five parts are removed from the equation, which are normally needed with a secondary side sense controller, including an opto-coupler, opamp, an inductor, diode and a capacitor. In the illustrated embodiment, the secondary voltage reduction circuit 100 includes a pair of diodes, an inductor, and a capacitor. In one embodiment, the secondary voltage reduction circuit 100 may include a diode and a MOSFET (shown in FIG. 72). In another embodiment, the secondary voltage reduction circuit 100 may include a pair of MOSFETs (shown in FIG. 50). The forward converter 96 may also include a resistor, capacitor, diode (RCD) circuit 150 (shown in FIG. 37). The RCD circuit 150 is configured to perform a transformer reset when the primary side switch 104 is off to avoid saturating the transformer 102. The forward converter 96 is a pulsed based step down converter. A duty cycle modulated digital pulse is applied to the primary side switch 104 to convert the incoming DC voltage to an AC voltage. The transformer winding ratio provides the step down. In this case, the step down is from 11:1. The secondary side sees an ac voltage on its terminals. This AC voltage is rectified by the secondary voltage reduction circuit 100 diodes and filtered by the LC filter to produce a stepped down DC voltage on the output. The duty cycle is modulated by either an analog or a digital servo loop. This servo loop looks at the dc voltage on the output side, compares it with a response to produce an error signal. This error signal is used to drive a comparator which converts this error in a pulse width modulated DC pulse. This DC pulse when applied to the primary side switch gate 104 corrects the error on the output and maintains regulation for various load levels.

In one embodiment, the transformer control circuit 103 may include a primary side current sense circuit 107 that is connected to the primary side of the transformer 102 to sense the load current and the load voltage to facilitate regulating the DC output signal to within 5% of a predefined load voltage. The control circuit 103 uses a current sense resistor 109 and measures across the primary winding. In the illustrated embodiment, the transformer control circuit 103 includes a comparator 111 that drives the FET 104. In one embodiment, the resistor 109 is a 0.10 ohm resistor. The control circuit 103 is configured to sense the load current on a pulse by pulse basis and sense the peak current. For example, in one embodiment, the control circuit 103 senses the voltage across the resistor 109 and provides the sense current in a voltage format when the switch 104 is on. When the switch 104 is off, the control circuit 103 senses the differential voltage across the primary side of the transformer 102. This differential voltage is the ΔV voltage across the winding which may be approximately equal to Vprimary minus the voltage at the drain of the off transistor 104. These voltages are scaled down to less than 5V for sensing by the control circuit 103. Both the voltage and current of the primary winding are then sampled using a switched-capacitor sample and hold circuit. The sample and hold circuit drives the comparator 111. The other input of the comparator 111 is a sample and held peak current voltage that we sense across the 0.1 ohm resistor 109. The inputs into the comparator 111 are scaled and gained up and offset so that the inputs are under steady state, and the comparator 111 drives a set-reset flow clock. The FET 104 includes an AND-gate that is driven by the comparator 111. A clock off the comparator 111 adjusts the duty cycle of the AND-gate. The AND-gate also has a high duty cycle driven by a high pulse width clock, which is a sawtooth signal. The other input of the AND-gate is the output of the comparator 111 so then the comparator 111 modulates that duty cycle to small duty cycle or to a large duty cycle. In one embodiment, the clock is the 100 KHz clock for the forward converter servo loop.

A tertiary winding from the transformer is not needed as a supply for the sensor. The supply is available from the primary side because the sensing circuit is on the primary side and supply is not needed from the secondary side. The voltage across the primary side inductor and the current that is going to the primary side FET 104 is used to determine the output voltage of the system. In one embodiment, the FET 104 includes a 200 volt Philips part device having a 2-volt threshold, which may use a 5v signal to drive the FET 104 to turn it on without level shifting. In another embodiment, a 10 volt LDO or 20 volt LDO may be used with a level shifter to go from 5 volts to 10 volts, or 5 volts to 20 volts to operate the FET 104.

In the illustrated embodiment, the control circuit 103 uses the sense resistor 109 that is in the drain path of the MOSFET 104 to implement a gated approach in which a sample and hold circuit obtains the peak voltage right when the switch 104 is on between each square wave in the PWM cycle. The gating arrangement samples when the switch is on, because when the switch is off there is no information available at that time.

In the illustrated embodiment, the power circuit 22 is configured to accommodate different transformers having different turn ratios to generate a DC output signal having various current and/or voltage requirements.

In one embodiment, the power circuit 22 may not include the full wave bridge 38, rectifier circuit 30, and input capacitor, 40, such that $V_{LINE}$ is DC and thus the circuit can receive a direct current (DC) if the use case requires, and then conduct the voltage break down as further explained herein using the regulated buck circuit 34 and switch cap VB 32 are still used. However, in some use cases, especially with low DC to DC voltage breakdown, the buck regulator 34 would not be needed, and only the switch cap VB 32 would be used, whether one stage (as shown in FIGS. 2-12) only would be used. In this case, one could eliminate the control signal 105 from the output, and rely solely on the current sense resistor 109 and still maintain a tightly regulated voltage.

In another embodiment, for DC input variation of the circuit, the use case may not require a transformer (if the transformer is not needed for the voltage/current conversion, or if isolation is not needed) like in the case of an internal part, such as is found in smart phones. In this instance, the transformer is not necessary and may be removed from the circuit together with the FET that drives the transformer. In this case the entire forward convertor controller circuit 96, 28 can be removed, and the $C_{hold}$ capacitor 36 would be replaced with the sense resistor circuit segment 109. Further, if an AC circuit does not need to be rectified or isolated, than this circuit can work with AC as well as DC.

Figure 16:
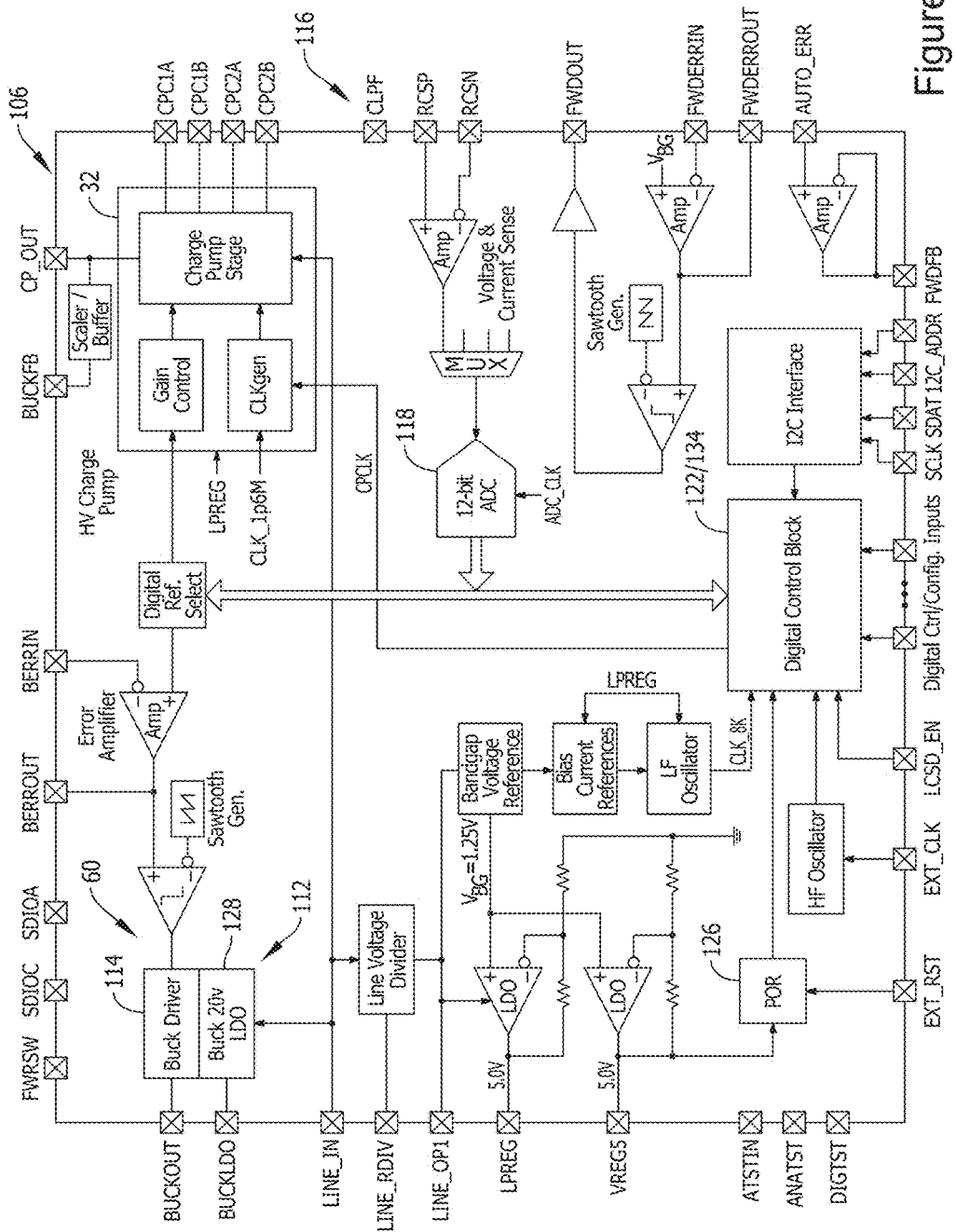
FIGS. 16, 17A, and 17B are block diagrams of the power controller integrated circuit shown in FIG. 10, according to embodiments of the present invention.
Figure 17A:
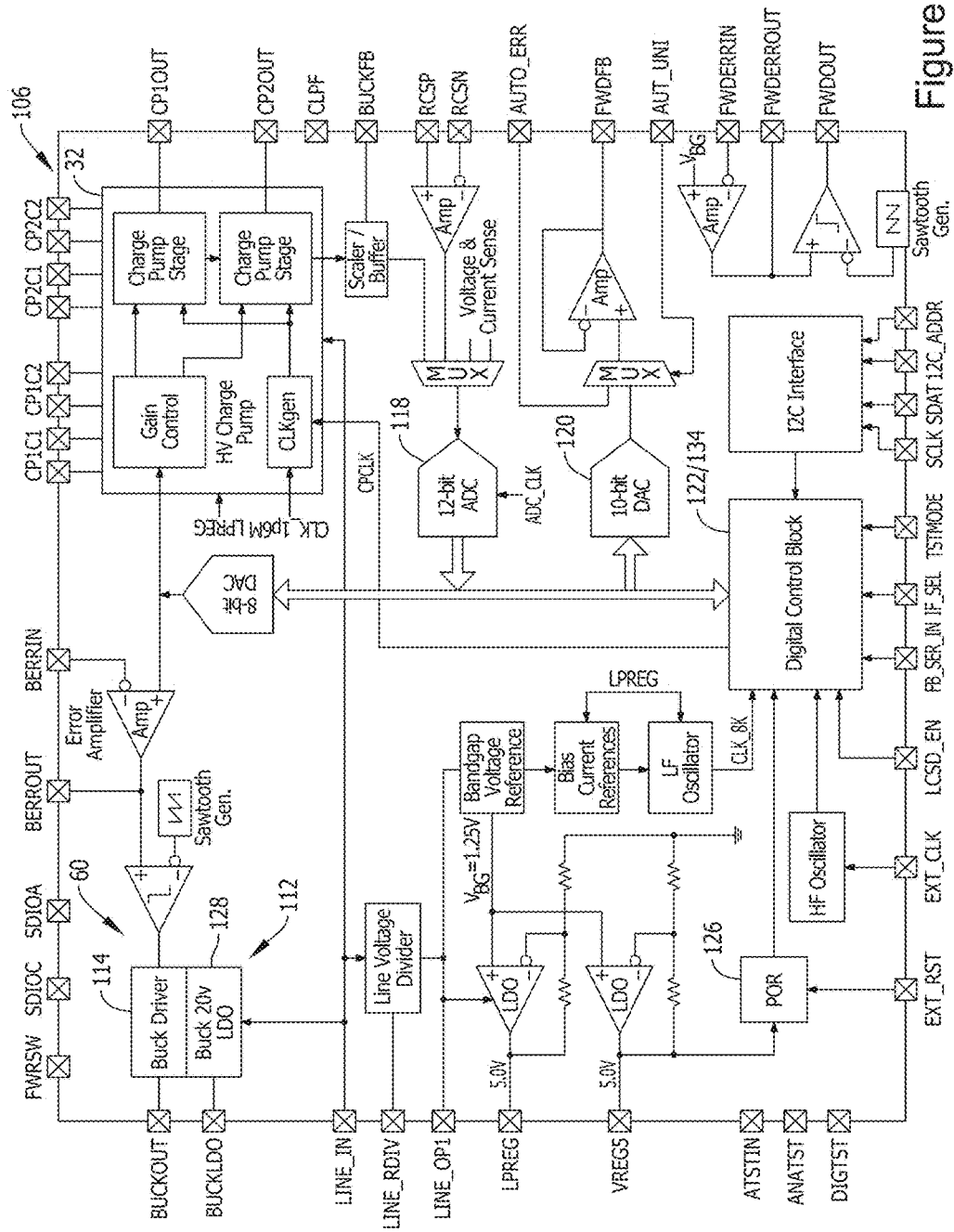
Figure 17B:
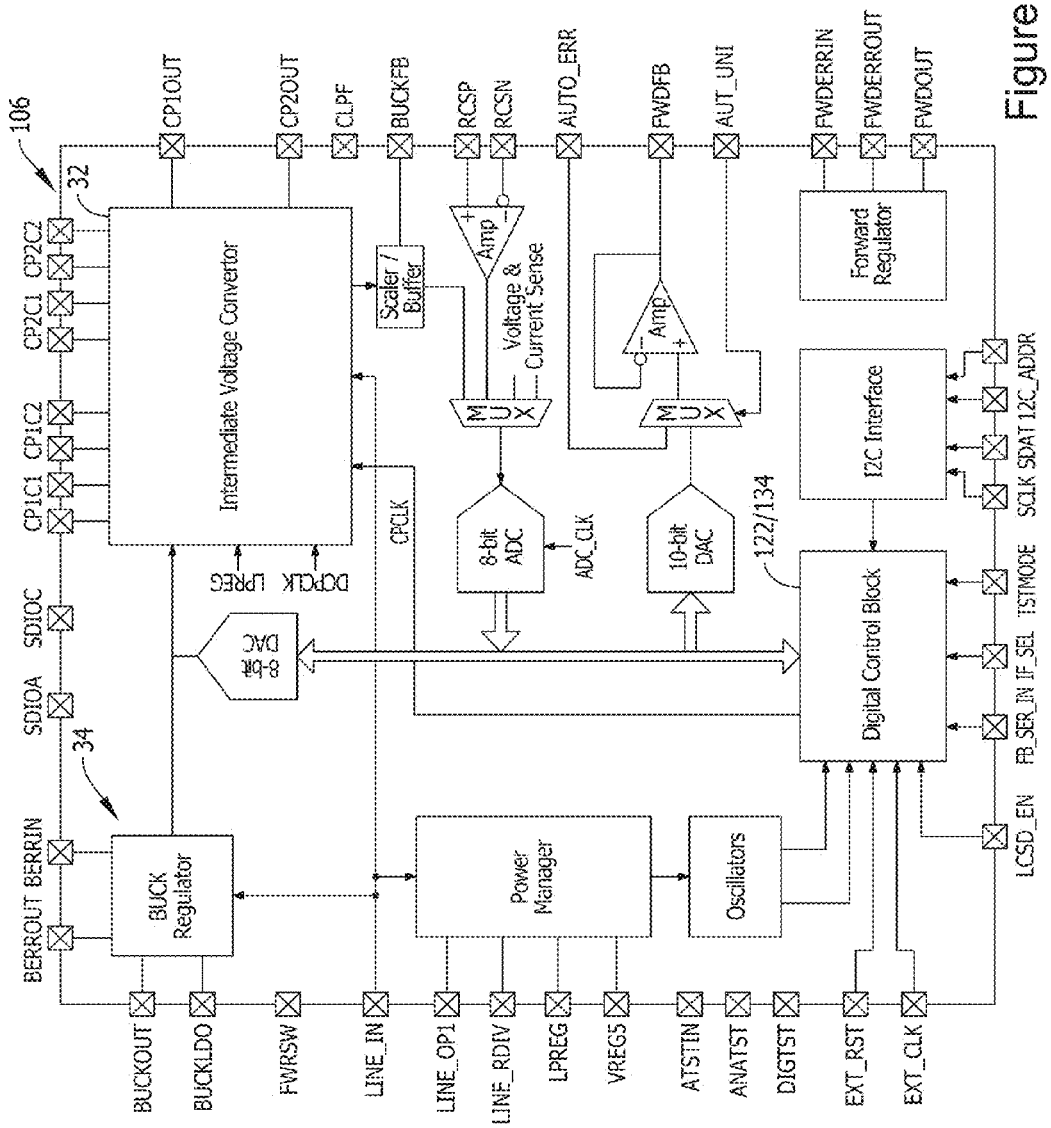
Figure 28:
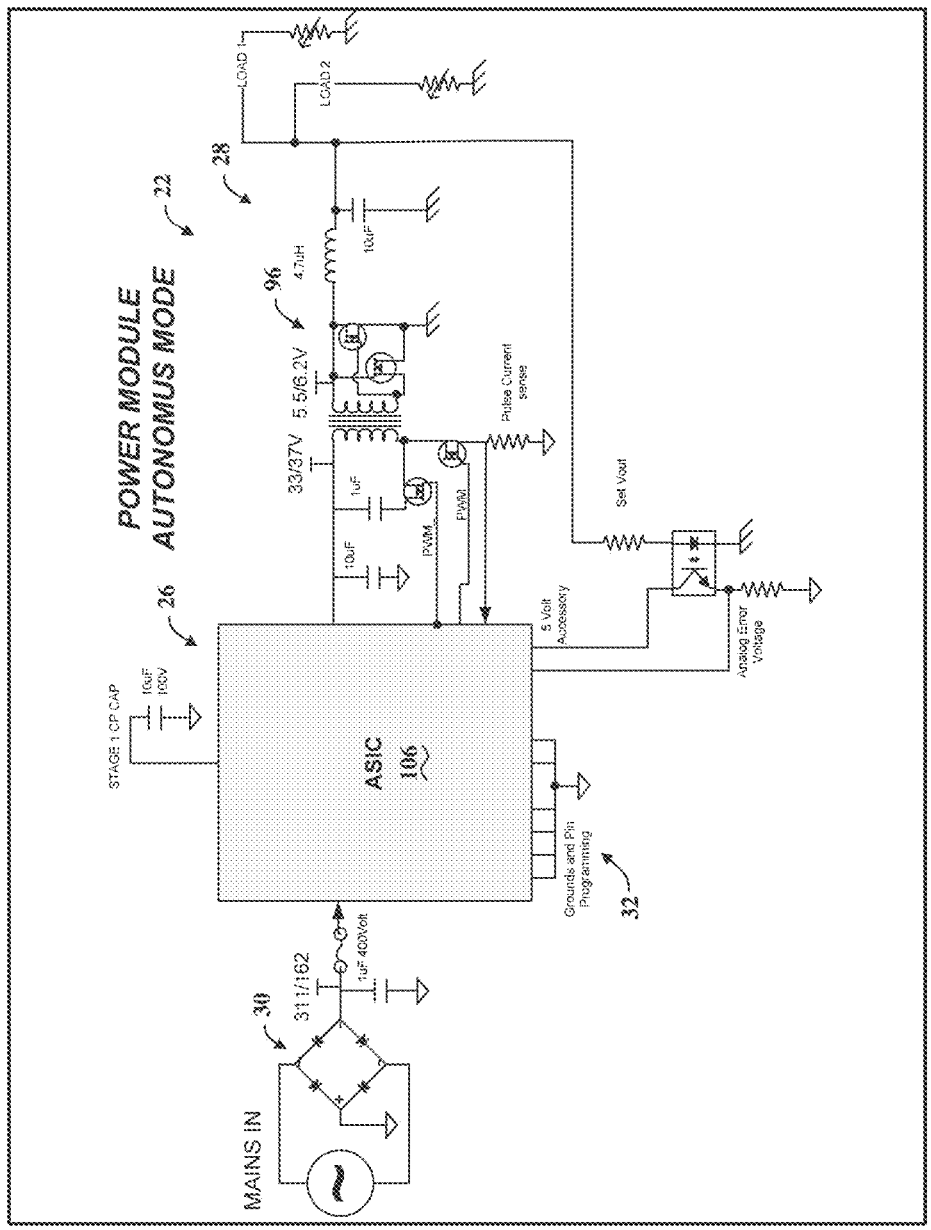
FIGS. 28 and 29 are schematic illustrations of the power circuit shown in FIG. 2, according to an embodiment of the present invention.
Figure 29:
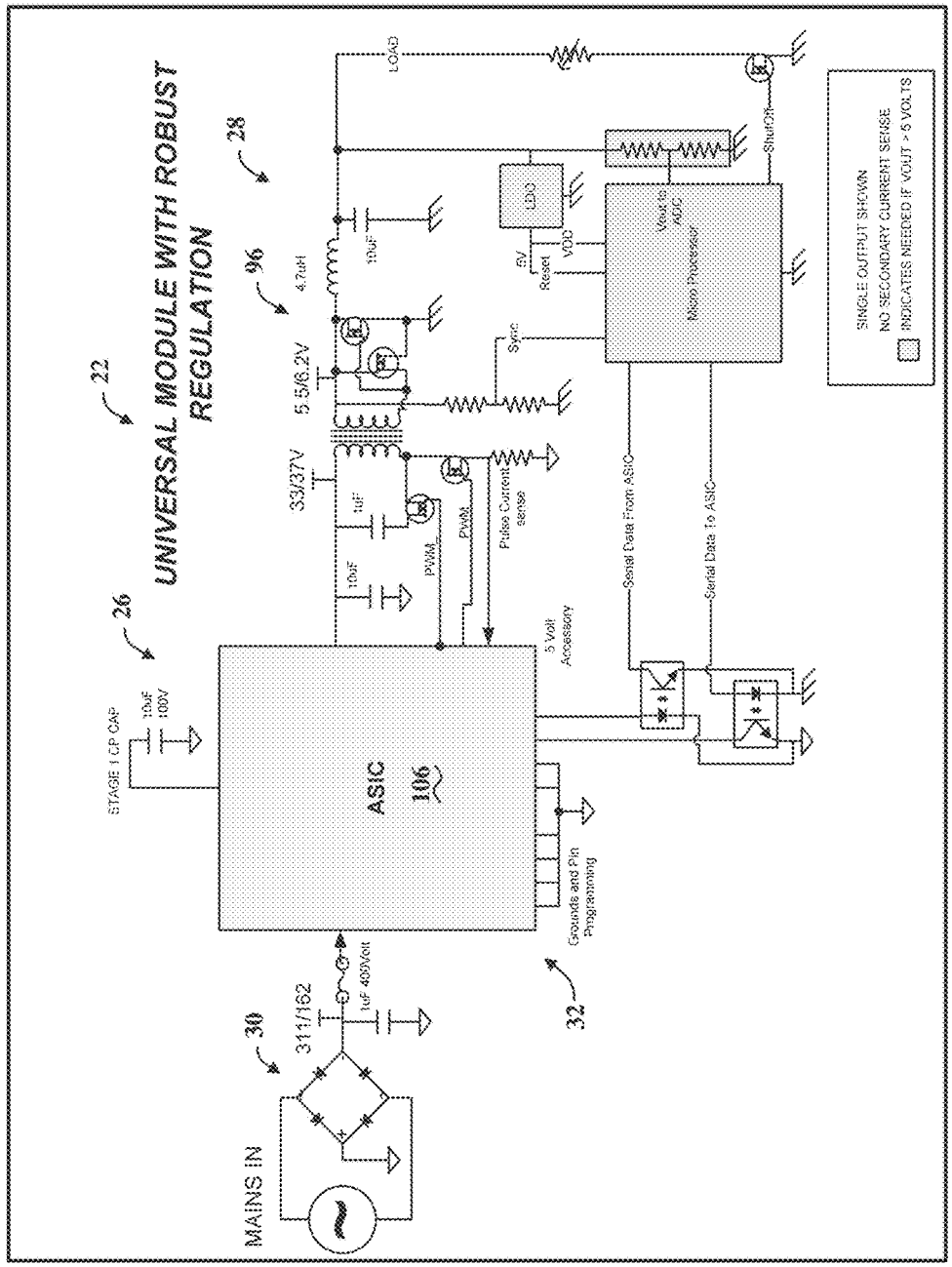

FIGS. 15A and 15B are schematic diagrams of the power module 12 including a power controller integrated circuit (Tronium PSSoC) 106 that may be used with the electrical power circuit 22. FIGS. 16, 17A, and 17B are block diagrams of the Tronium PSSoC 106. In the illustrated embodiment, the power module 12 includes a printed circuit board 108 and the Tronium PSSoC 106 that is formed within a packaged chip and is coupled to the printed circuit board 108. At least a portion of the electrical circuit 22 is included within the Tronium PSSoC 106. In addition, the digital control may be conducted by either a microprocessor, external or embedded on the chip or a state machine. In one embodiment, some or all of the electrical circuits and electrical components included in the electrical circuit 22 are included within the Tronium PSSoC 106. The Tronium PSSoC 106 may be configured for use in two primary power module applications including an Autonomous Power Module (shown in FIGS. 16 and 28) and a Universal Power Module (shown in FIGS. 17A, 17B, and 29). For example, as shown in FIG. 16, the Autonomous Power Module includes a Tronium PSSoC 106 that is configured to operate in an autonomous mode of operation that is based upon an analog feedback approach for reduced cost. The Universal Power Module, shown in FIGS. 17A and 17B, includes a Tronium PSSoC 106 that is configured to operate in a universal mode of operation and that utilizes a microprocessor (μP) controller to provide feedback for regulation of the final output voltage.

In the illustrated embodiment, the Tronium PSSoC 106 is configured to meet predefined requirements for traceability, marking, solderability, and/or solvent resistance. The Tronium PSSoC 106 is marked to indicate a date code, plant identifier, and traceability/authenticity code. The authenticity code provides a means of identification and verification as a genuine part against "knock-offs". All production packaged components on a tape and reel include the same unique date code, plant identifier, and traceability/authenticity code. Lot segregation may exist in such a way as to prevent the mixing of date codes within the same lot of components. Packaged parts shall be marked to indicate the part number, date code and traceability code. Terminals are configured to meet the solderability requirements of IPC-J-STD-001 and IPC-J-STD-002 for the packaged Tronium PSSoC. The packaged Tronium PSSoC and its markings are configured to meet the requirements of the MIL-STD-202 test method 215.

The Tronium PSSoC 106 is an advanced power controller integrated circuit designed to provide output voltage regulation with high-efficiency and high accuracy. The Tronium PSSoC 106 provides the user with a multi-purpose device which can be used in a large variety of applications and because of the "Dial-a-Voltage" feature, the same chip can be configured to work in practically any electronic device. Likewise, programmable output voltages are possible with the Tronium PSSoC, with little or no loss of efficiency across a variety of current load conditions.

In the illustrated embodiment, the Tronium PSSoC 106 uses the switch capacitor circuit 32 and the switch-mode buck regulator 34 to maintain high-efficiency regardless of the load voltage or current. For example, when no current is being drawn by the load the electronic device 20, the Tronium PSSoC 106 enters a low-current mode of operation to minimize the traditional 'vampire' current required to stay awake. In the illustrated embodiment, the Tronium PSSoC 106 includes the single-stage switch capacitor circuit 32, a PID regulator control block 110 (shown in FIG. 20) for PWM control of the forward converter secondary transformer 102, a switch-mode buck regulator controller 112, a buck regulator switch driver 114, a current and temperature sense blocks 116, 12-bit Analog-to-Digital Converter (ADC) 118 for voltage and current monitoring, a 10-bit Digital-to-Analog Converter (DAC) 120 (shown in FIGS. 17A and 17B) for feedback control, a digital control block 122 for current monitoring state machine, serial input for opto-isolator communications interface, a I2C serial interface port, and power manager unit 124 for on-chip voltage and current generation. Other types of sensors, such as, sound, photo-detection, radiation and shock can also be added depending on the use case.

Figure 18:
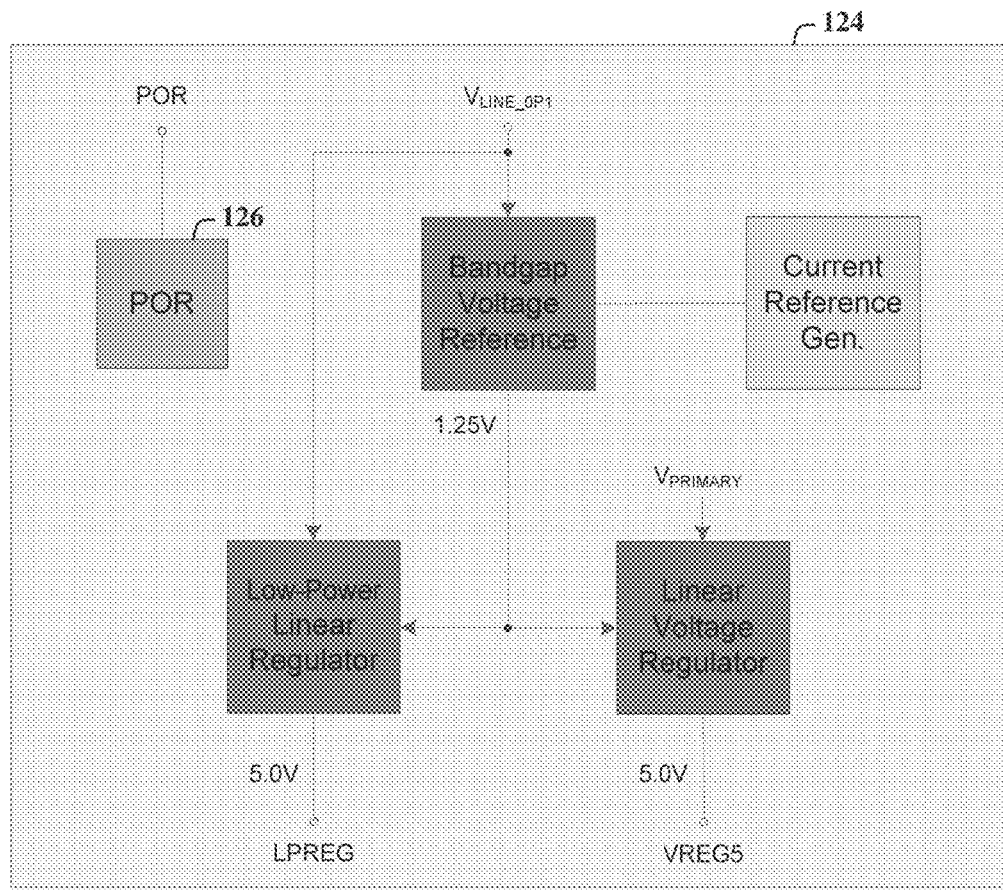
FIG. 18 is a block diagram of a power management unit that may be used with the power controller integrated circuit shown in FIGS. 16, 17A, and 17B, according to an embodiment of the present invention.

FIG. 18 is a block diagram of the Power Management Unit 124. In the illustrated embodiment, the power management unit (PMU) circuit block 124 generates and supervises the bias voltages and currents required for proper operation of the Tronium PSSoC. Two linear voltage regulators provide regulated 5.0V supplies for the low-voltage circuits of the IC, as well for external support devices such as the opto-isolators and an optional external microprocessor. In addition to providing proper initialization of the IC upon connection to the line voltage, the PMU 124 monitors the voltage supplies for fault conditions and provides a master power-on-reset (POR) 126. In the illustrated embodiment, the PMU 124 includes the bandgap voltage reference, current reference generator, a line-side low-power linear voltage regulator, a transformer primary-side linear voltage regulator, and power-on-reset. To reduce power dissipation, the line-side circuits are powered from the LINE_0P1 pin which supplies a voltage of approximately one-tenth of the LINE_IN voltage (Vline). This voltage is generated internally using an external resistor divider connected to the LINE_IN and LINE_RDIV pins of the IC. Initialization of the PMU 124 begins with the application of the rectified voltage at the LINE_IN pin.

The PMU 124 contains a low-power bandgap reference voltage and current generator for the Tronium PSSoC 106 which is powered from the line voltage. A high-precision temperature-compensated output voltage is provided for use as a reference by subsequent circuit blocks, along with multiple bandgap Proportional To Absolute Temperature (PTAT) current outputs. The bandgap output voltage can be trimmed at wafer probe to optimize the temperature coefficient with the bg_trim[7:0] register bits and stored in a one-time programmable (OTP) memory stored in a microprocessor. The bandgap cell is self-starting, requiring only the default trim value for initialization. The bandgap cell is not disabled during sleep mode, but is always powered on, and is designed for ultra-low power operation.

The PMU 124 also includes a low-power linear voltage regulator (LPREG) that is provided to convert the high-voltage present at the LINE_IN input of the PSSoC to a regulated voltage for the low-power voltage domain. The LPREG uses the bandgap reference voltage to generate a regulated output of 5.0V to drive the low power on-chip circuit blocks that are always powered on including the Low-Frequency Oscillator for the switch capacitor circuit 32, on-chip logic, etc. An external (off-chip) bypass capacitor may be used for noise filtering, connected to the LPREG pin. The regulator is not disabled during sleep mode, but is always powered on.

The PMU 124 may also include a primary-side low voltage regulator that is provided to supply the higher current requirements of off-chip opto-isolators, PWM gate drivers and other support circuits. An external 10 μF bypass capacitor may be used for noise filtering, connected to the VREG5 pin. The voltage regulator may be disabled for test purposes with the use of the en_Xv signal. When the en_Xv input to the cell is 'low', all of the internal analog currents in the cell are disabled and the outputs are high impedance.

Figure 19:
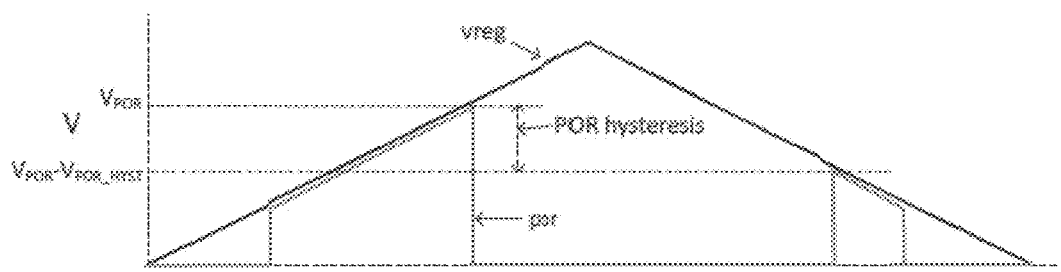
FIG. 19 is a graphic illustration of Power-On-Reset threshold voltages that may be used with the power controller integrated circuit shown in FIGS. 16, 17A, and 17B.

The POR 126 block monitors the internal supply voltage of the Tronium PSSoC as generated by the LPREG circuit block. For example, FIG. 19 illustrates POR threshold voltages that may be used with the POR 126. In one embodiment, for voltages at the LPREG pin less than the $V_{POR}$ threshold voltage, the POR output will be asserted 'high' indicating a reset condition. In addition, for voltages at the LPREG pin greater than the $V_{POR}$ threshold voltage, the POR output will be de-asserted 'low' for normal operation. Hysteresis is provided such that a reduction in the threshold voltage occurs once the $V_{POR}$ threshold is exceeded. The threshold derived from hysteresis is then equal to $V_{POR}-V_{HYS}$. An inverted version of the POR signal may also provided at POR_B.

Figure 38:
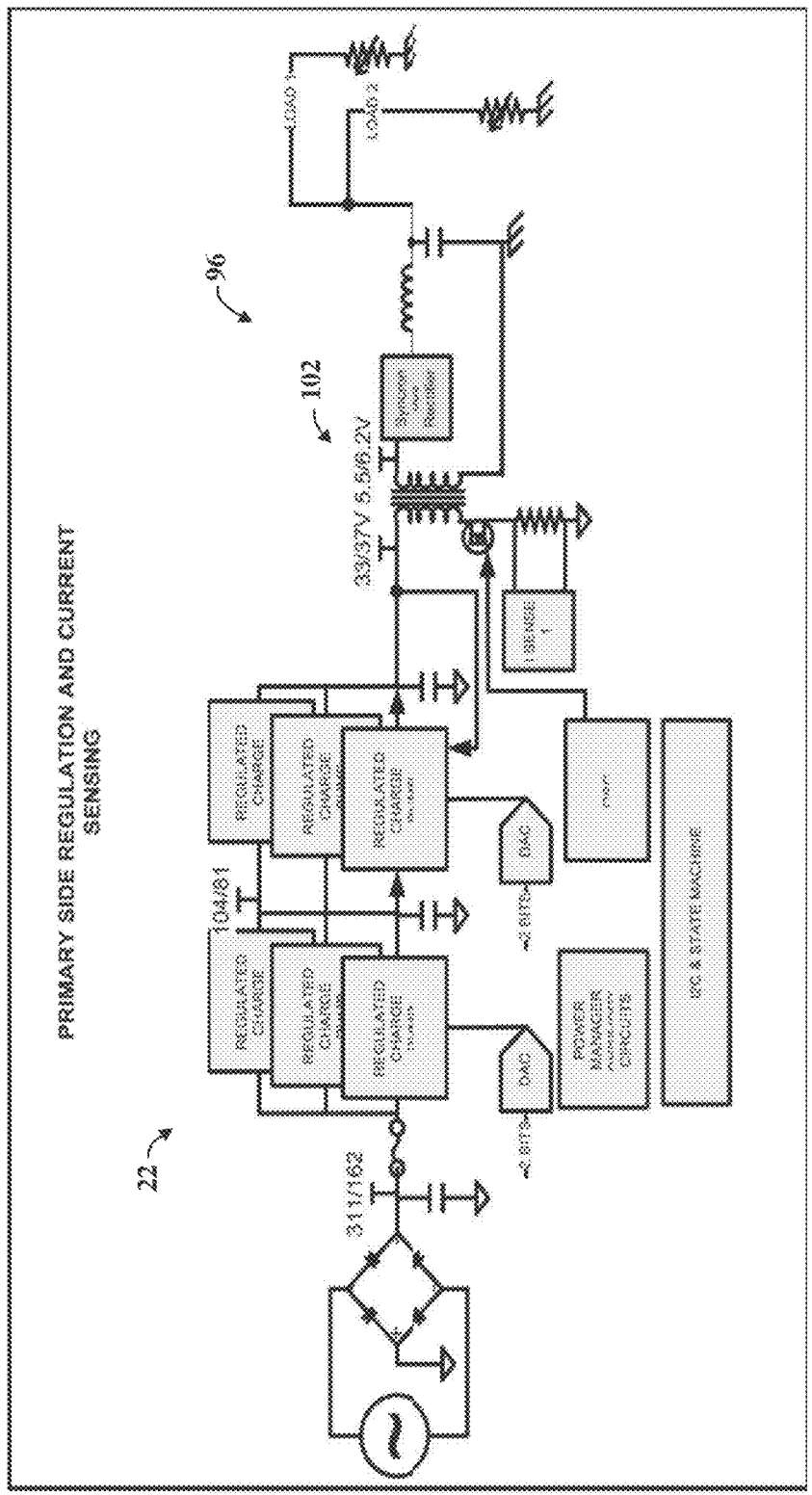
FIGS. 38 and 39 are additional schematic illustrations of the power circuit shown in FIG. 2, according to an embodiment of the present invention.
Figure 39:
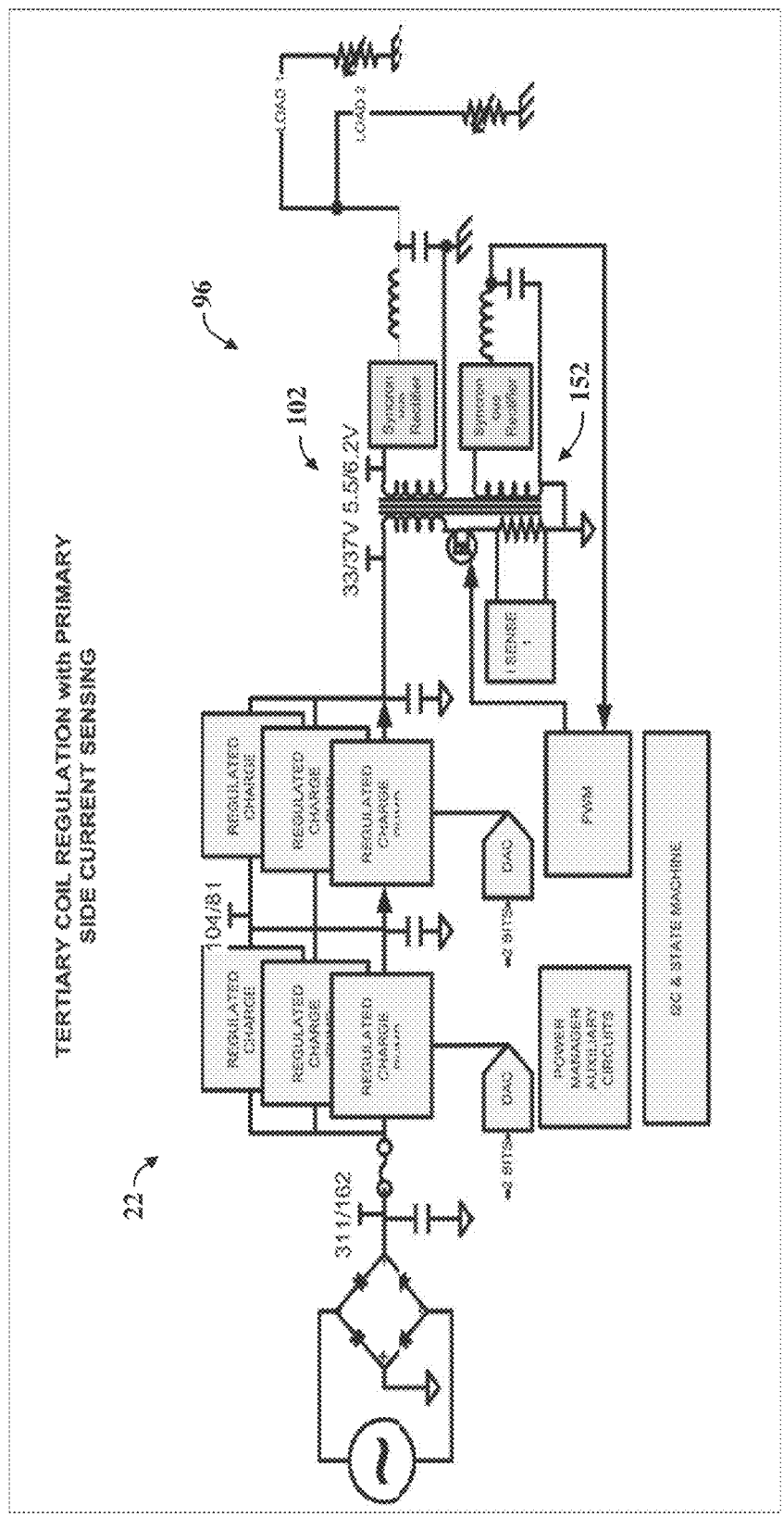

In the illustrated embodiment, the switch capacitor voltage breakdown circuit (SCVBC) 32 (i.e., the switch capacitor voltage divider circuit) included in the Tronium PSSoC 106 is configured as a voltage divider through Capacitive Voltage Break Down techniques (CVBD). Through capacitors, it divides the rectified DC voltage present at the LINE_IN pin to a reduced voltage at the CP2_OUT pin for use by the external transformer 102 and secondary voltage control loop. The external transformer 102 then further reduces this voltage to the desired application voltage as a function of the primary-to-secondary windings ratio. In one embodiment, the SCVBC 32 is configured as a cascade of two identical stages, as shown in FIG. 17A. In another embodiment the SCVB 32 includes multiple switch capacitor stages, as shown in FIGS. 38-39. The SCVBC 32 is configured to deliver up to 50 mA per Capacitive Break Down block, which consists of Switch Capacitor blocks which provide the voltage breakdown by half or other divisionals. This provides and maintains ≥95% efficiency across the range of load currents from 50 mA to less than 1 mA under light load conditions on the primary side of the transformer 102. For example, assuming a ≥97% efficiency for the external transformer & rectifier, and overall module efficiency of ≥92-97% has been simulated and is achievable. In one embodiment, the SCVBC 32 may include on-chip fly-back capacitors to maximize power efficiency, external 2.2 μF bucket capacitors and two external 7.5 μF hold capacitors to minimize the voltage ripple. These capacitors are connected to the CP1_OUT and CP2_OUT pins, respectively, for the outputs of the 1st and 2nd stages of the switch capacitor circuit. Both stages are clocked at a rate of 1 KHz from a two-phase non-overlapping clock generator which is derived from an on-chip Oscillator.

Referring to FIGS. 17A and 17B, in one embodiment, for the Tronium PSSoC 106, the SCVBC 32 output voltage at CP2_OUT is programmable over the range of 120-90 Volts in steps of 0.117 Volts with the use of an 8-bit binary-weighted digital-to-analog converter. The SCVBC output is limited to this range to ensure that the forward converter transformer 102 provides most of the output current in the step-down process. The SCVBC is limited to an output current of 50 mA. If additional current is required for the application, the switch-mode buck regulator 34 may be enabled to provide up to 430 mA of current. Each stage of the SCVBC 32 may be programmed to produce a voltage conversion ratio. This programming is done automatically in the Course Gain Control where the rectified LINE_IN voltage is compared to the 8-bit DAC setting. The digital control of this DAC enables multiple voltages to be programmed to obtain the desired final output voltage required for the target application. An example of the load voltages which can be programmed with the DAC as a function of the transformer turns ratio.

Referring to FIG. 16, in one embodiment, the SCVBC 32 may include a single-stage switch capacitor circuit with a corresponding divider ratio of 1, 0.66 or 0.5. The output voltage present is then reduced by the external (off-chip) forward converter 96 to obtain the final application output voltage of 5.0V. All analog and digital signals for the SCVBC (and Buck Controller) are generated in the 5V domain. The SCVBC Error Voltage is scaled to be within the XV domain using a resistor divider. The LINE_IN voltage is also scaled so that processing can be done within the XV voltage domain.

In one embodiment, shown in FIG. 16, the SCVBC 32 includes a Gain Control block that uses the scaled LINE_IN voltage to determine the appropriate divider ratio for the SCVBC 32. The scaled LINE_IN voltage is compared to the Bandgap reference voltage to select one of three or more possible divider ratios as a function of the AC Mains voltage. Final regulation of the output voltage may performed in the switch capacitor regulator where the clock is turned on and off to control the amount of charge delivered to the hold capacitor.

Referring to FIGS. 17A and 17B, in one embodiment, the SCVBC Gain Control block may use the scaled LINE_IN voltage and Output Voltage DAC setting to determine the appropriate Course Divider ratio derived from the combined divider steps in CP1 and CP2. In this way, settings for the 120 and 90 Volt outputs as a function of world-wide AC input voltages can be achieved. Final regulation of the CP2 output voltage is performed in the switch capacitor regulator where the clock is turned on and off to control the amount of charge delivered to the CP1 and CP2 hold capacitors. The lowest divider ratio required for CP1 and CP2 should be programmed for the CP1 stage to minimize the voltage drop across the high-voltage NMOS switches.

The CP2 output feeds the primary winding of the Forward Regulator. The final output voltage of the system is set by the following equation:

$$(V_{SET}/XFMR_{RATIO})*dc=V_{OUT}$$

Where dc is the duty cycle for the Forward Regulator and should be maintained at 0.5 or less to ensure the system transformer does not saturate.

The SCVBC 32 includes a Dickson charge pump (DCP) 94 (shown in FIGS. 5 and 6) that may be used to provide a boosted voltage for the gates of the NMOS high-voltage switches. The DCP's may be clocked at a clock rate of 1.6 MHz and generate gate voltages equal to the voltage at the LINE_IN pin plus approximately 18V. In addition, each NMOS high-voltage switch 90 may include a corresponding level shifter to translate the drive signal from the low-voltage domain to the boosted voltage provided by the DCP's. In one embodiment, this requires dual level shifters, other requirements may only need one level shifter. The input to the level-shifter is 5V and is translated to the 20V domain for use by the SCVBC 32. This same type of level shifter, scaled for output current drive, may be used throughout the Tronium PSSoC 106.

In one embodiment, as shown in FIGS. 17A and 17B, the Tronium PSSoC 106 may include a Digital-to-Analog converter (DAC) that provides programmability for the output voltage of the switch capacitor circuit. An R2R current-mode DAC topology digitally scales the bandgap reference voltage to the control voltage required by the switch capacitor circuit to maintain the output voltage programmed by the user. The output voltage range of the DAC is from 120-90V programmed in steps of 118 mV by the CP_DAC[7:0] register bits.

The SCVBC 32 may also include a switch capacitor regulator that includes a comparator and an AND gate that are used to control the charging of the SCVBC. In one embodiment, the comparator's inputs may include the Output Voltage DAC and the scaled version of the CP2 output voltage. For example, if the scaled voltage from the CP2 output is greater than the DAC voltage, the comparator output is low and the 1 KHz CP clock is gated OFF. If the DAC Voltage is greater than the scaled CP2 output voltage, then the comparator output is asserted high and the AND gate enables the clock to charge up the output. In addition, the comparator may be designed with hysteresis to minimize the CP2 output voltage ripple. Moreover, the regulator may run both CP stages in the discontinuous mode; that is, the clock pulses are only present when charging of the 7.5 μF hold capacitors is required.

In the illustrated embodiment, if a stack of CVBD Modules are not used, then large current loads (up to 430 mA or more) are easily handled with the use of a hybrid topology which includes a Switch-Mode Buck Regulator (SWR) 34 and the CVBD Module. The Tronium PSSoC 106 contains the controller for the SWR 34, which makes use of an external (off chip) PMOS switch (which can be an internal to the Chip PMOS or NMOS [with additional Dickson Charge Pumps for gates]) to supply the high-current demands of the load. Since the high-current path is external to the PSSoC, the PSSoC is not required to dissipate the majority of the load current. This improves the overall system efficiency by eliminating the source of additional parasitic losses in the PSSoC due to the ON-resistance of the high-voltage devices. The SWR may be regulated at the same frequency as the CVBD Module, or run at higher (500 KHz-1 MHz) to very high frequencies, while the CVBD Module is running at lower frequencies in order to remain more efficient. (The CVBD Module can be run at higher frequencies, but with current devices offered in semiconductor platforms today, this increases gate openings/closings, which increases losses).

In one embodiment, the buck regulator 34 may include the following external (off chip) components: 1. Series High PMOS Switch. The PMOS Switch may be selected for low $RDS_{ON}$, low input capacitance and a $V_{DS}$ of >400V; 2. High Voltage Buck Diode with High Volt Breakdown, extremely low leakage and switching current; and 3. Buck Energy Storage Inductor. The inductor must have low ESR and be able to handle appropriate de-rated current. However, these parts, usually depending on the frequency which runs the Buck (the higher the frequency the smaller the value of the parts needed), may be internal devices/components on the chip, and not external. With the application of GaN and/or GaA and Deep Trench Capacitor technologies, as well as technologies which put transformers on the chip, all parts may exist on one chip.

The Tronium PSSoC 106 may also include a high-frequency oscillator that is divided down to produce a 100 KHz (nominal) clock for use by the Buck Regulator PWM controller. The 100 KHz clock is dithered with a pseudo random algorithm in the Digital Control block to ensure the suppression of harmonics in the EMI spectrum. This clock is then Pulse Width Modulated to control the on/off time of the external Buck Regulator PMOS/NMOS FET. The 100 kHz clock is converted to a saw-tooth ramp inside the Tronium PSSoC 106 where it is compared to the Error Amplifier output. The Pulse Width Modulated signal from the Comparator output is then applied to the level shifter input to control the on/off time of the external Buck Regulator PMOSFET. The Error Amplifier of the Buck regulator 34 receives feedback from the regulator by scaling the voltage at CP2_OUT with the use of a resistor divider. The voltage feedback signal is then conditioned using internal resistors and capacitors to control the response of the Buck Regulator under all conditions. The resulting transfer function for the regulation servo loop is comprised of multiple poles and zeros to ensure that the regulator output is stable for the full range of load conditions from 50 mA to 430 mA. The Error Amplifier and PWM Controller for the Buck Regulator are all located in the 5 Volt domain with the final control signal being level shifted to drive the external high-voltage PMOSFET switch.

The Tronium PSSoC 106 may also include a LDO Buck Regulator 128 that is used to create the high-side voltage necessary to drive the gate of the PMOS/NMOS FET for the Buck regulator 34. This voltage is then used to supply the gate voltage required to drive the external PMOS/NMOS FET. A capacitor is connected for filtering.

In the illustrated embodiment, the Tronium PSSoC 106 includes a Current Sense Amplifier of the Tronium PSSoC senses the voltage across the external current sense resistor at pins RCSP and RCSN. This voltage is sampled and held by a switched-capacitor difference amplifier and digitized by the on-chip general-purpose ADC. The digital word is then compared against programmed thresholds to enable or disable the Buck Regulator 34 as needed to optimize efficiency. The output of the Current Sense Amplifier is also monitored for possible fault or alarm conditions such as over current, allowing a digital state machine that controls the current sense feedback to disable the SCVBC 32 to prevent possible damage.

The Tronium PSSoC 106 may also contain one or more oscillators which provide a 16 KHz frequency output and a 9.6 MHz frequency output. The oscillators may share a common trim controller which allows the frequencies to be trimmed using the osc_trim register bits.

The low-frequency (16 KHz) Oscillator is a line-side Oscillator that runs continuously after the application of the line voltage at LINE_IN. It is supplied by the LPREG regulator. This oscillator output frequency is divided down to a number, like 1 KHz to provide the clock for the SCVBC 32. The oscillator output, in that case, is also used as the reference clock for the Sleep mode Shut-down Timer. A high-frequency (9.6 MHz) Oscillator provides the master clock for the decoding of the single-wire serial data input. The oscillator 9.6 MHz output is divided by 6 to provide the 1.6 MHz clock required by the Dickson Charge Pumps in the switch capacitor circuit. It is further divided to provide the clock source for the Buck Regulator and Forward converter PWM Control Blocks. These 100 KHz clocks are dithered with a pseudo random algorithm by the digital logic to ensure suppression of the harmonics in the EMI spectrum. The oscillator can be enabled with the osc_en register bit and is powered by the LPREG regulator on the line side.

In the illustrated embodiment, the Tronium PSSoC 106 includes an ultra-low power ADC 118 to digitize a temperature sensor and current sense amplifier analog voltages. These digitized voltages can then be compared by the Digital Control block to disable or restart the analog circuitry. The ADC uses a successive-approximation (SAR) topology for low-power and enhanced INL/DNL performance. The input to the ADC is provided by a multiplexer. The multiplexer can select each of the channels of interest for digitization by the ADC. The converted sample values are then stored in the ADC_SAMP register for use by the Control State Machine. The ADC uses a low voltage supply and will be disabled when the device is in sleep mode.

Figure 20:
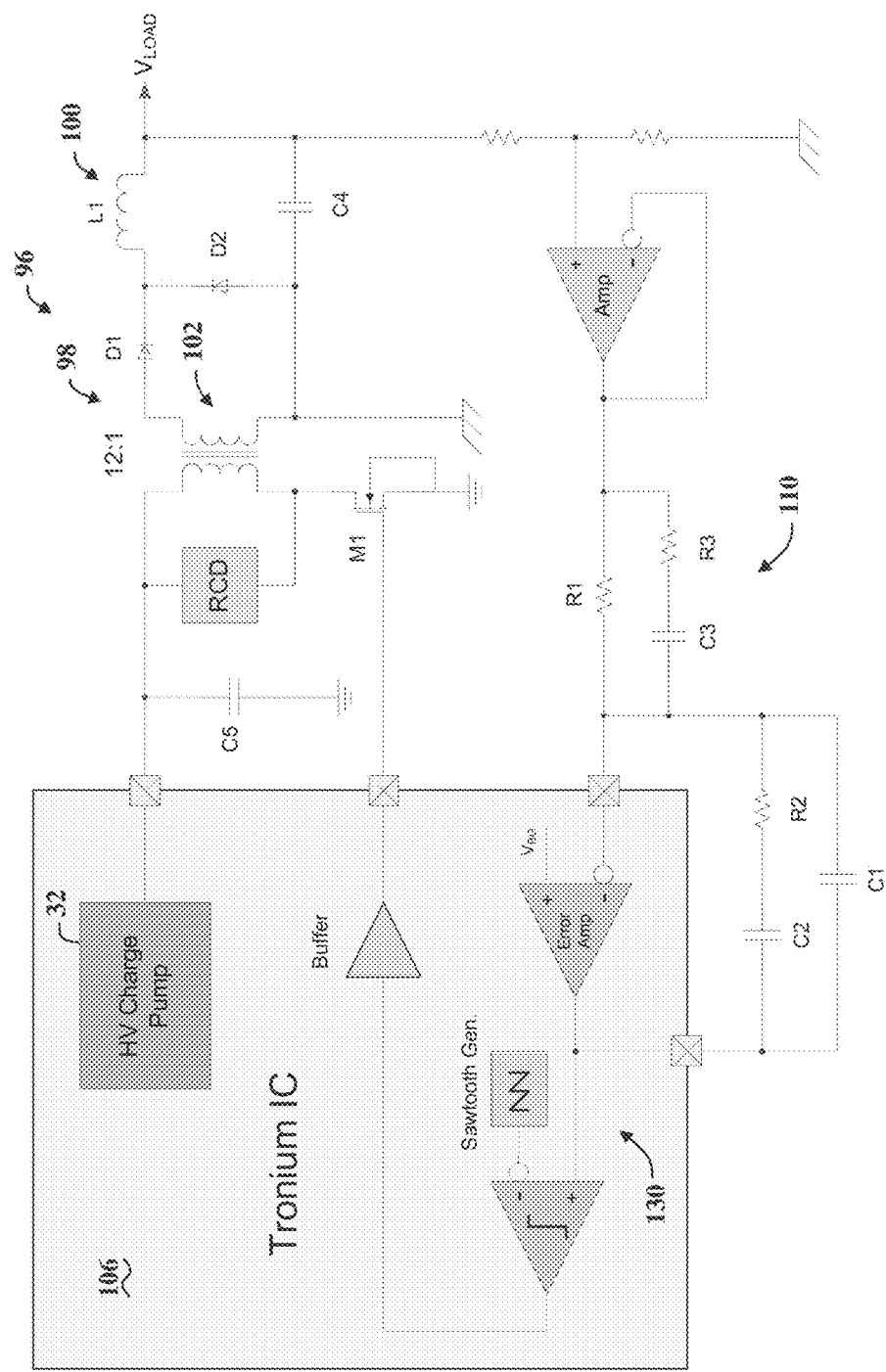
FIG. 20 is a schematic illustration of a Proportional to Integral and Differential Regulator Control circuit that may be used with the power controller integrated circuit shown in FIGS. 16, 17A, and 17B, according to an embodiment of the present invention.

FIG. 20 is a schematic illustration of a Proportional to Integral and Differential (PID) Regulator Control circuit 110 that may be used with the Tronium PSSoC 106. In the illustrated embodiment, the Tronium PSSoC 106 includes a PID servo loop 130 to regulate the voltage at the output of the forward converter 96 as load current is drawn from the secondary-side of the external transformer. The PID block includes an Error Amplifier, Saw-tooth Waveform Generator, Comparator and PWM Clock Control Block. The PID loop is designed to regulate the output voltage under heavy fluctuation of load current without triggering any instability.

A PID Buffer Amplifier receives the feedback to close the Forward regulation loop via the AUTO_ERR input. This is the output of the Opto-Isolator which provides a voltage to the PSSoC which represents the output voltage of the Forward converter. This voltage is then scaled on the PSSoC with a resistor divider and buffered for the Error Amplifier.

The Error Amplifier for the Autonomous PID Loop is located on the Tronium PSSoC with the compensation resistors and capacitors on-chip. The Error Amplifier uses the bandgap voltage as the reference for the PID Servo Loop. A Saw-tooth, or other, Waveform Generator provides a clock-based means of pulse-width-modulation (PWM) for the PID Servo Loop. The circuit receives the 100 KHz clock from the digital logic and converts it to a saw-tooth waveform of the same frequency to be compared to the output of the Error Amplifier. The outputs of the Error Amplifier and Saw-tooth Waveform Generator are compared by the PID Comparator to generate the PWM clock required to drive the Forward converter. A Duty Cycle Limiter is provided to ensure that the PWM output provided by the PID Comparator does not exceed 65%. This output is applied at the FWDOUT pin to drive the external transformer. In normal operation, the PWM duty cycle is limited to a range of 10-65% to avoid saturation of the transformer.

In one embodiment, the PID Servo Loop is designed to operate at low voltage and deliver a maximum of the required DC current to the load. The regulation can be controlled up to a high percentage of absolute accuracy by using an LC filter on the secondary side and by properly sizing the internal R's and C's of the $3^{rd}$ order compensation network. The LC filter double pole is given by the following equation: $FLC=1/2\pi\sqrt{L1C4}$.

The C1 capacitor has a certain ESR (series resistor) which produces a zero. This zero generates a +90 degree phase shift: $FESR=1/2\pi C1RESR$.

The compensation loop has a certain bandwidth (Fc) which is approximately 1/10th of the clock rate of the forward converter. The goal of the network is to maintain at least 45 degrees of phase margin at Fc: Phase Margin=180 degrees+ Phase of loop.

The PID loop has 2 zeroes and 2 poles. The 2 zeroes are necessary to provide 180 degree of phase boost in order to negate the 180 degree of phase loss due to the output LC filter. Both zeroes are placed at about ~50% of the LC filter pole frequency. Two poles are then located at the switching frequency of the converter (100 KHz). This allows us to calculate C1, C2, C3, R2 and R3. R1 is set to a reasonable value in order to start the calculation procedure.

In another embodiment, the PID Servo Loop is designed to operate for multiple output voltages which can be programmed by the user for the required application. The loop may deliver ny current, but in this illustrated case 4.5 A of DC current to the load with a regulation of up to 0.1% of absolute accuracy. Feedback for the Universal loop is provided by the external microprocessor and voltage sense support circuits, and is input to the Tronium pin as a serial data stream. A parallel-to-serial conversion is then performed on the digital word which is converted to an analog voltage for application to the error amplifier as shown in FIG. 20. Conversion to analog is performed with an on-chip DAC which is updated at the frequency of the incoming data rate. The reference voltage for the PID error amplifier is generated by a second DAC which is programmed by the microprocessor.

A Digital-to-Analog converter (DAC) generates the analog reference voltage for the PID Control Loop based upon the digital programmed input from the microprocessor. The Digital-to-Analog converter (DAC) as shown is a 10-bit scheme, but can be any number of bits. The DAC may also provide feedback for the PID Control Loop by converting the digital word received from the pin to an analog voltage for input to the loop. The DAC voltage is input to the error amplifier and compared to the analog reference voltage to produce the error voltage for the control loop. The DAC provides updates to the loop at the rate of the incoming data.

Referring to FIGS. 17A and 17B, in one embodiment, the Tronium PSSoC 106 may include an on-chip ΔV based temperature sensor that enables the IC to sense the temperature of the die or module. In this example, a general purpose 12-bit ADC is used to digitize the differential voltage. The digitized value is then compared to programmable thresholds in order to shut down or re-enable the Tronium PSSoC depending on temperature concerns.

In the illustrated embodiment, the Tronium PSSoC 106 provides two modes of operation and four wake-up states (W0-W3) applied upon powerup.

Figure 24:
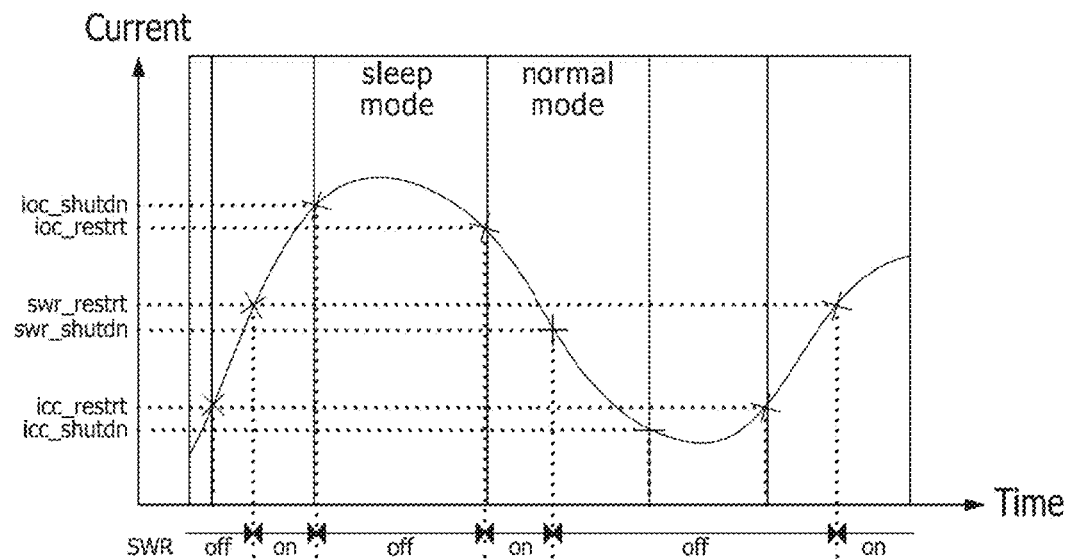
FIG. 24 is a graphic illustration of state transitions that may be used with the method shown in FIG. 23, according to an embodiment of the present invention.

Startup Mode. During Startup Mode, the Tronium PSSoC controls the startup behavior of the module when power is first applied or when a phone is plugged in (in the case of a charger). When power is first connected to the AC Mains, the rectified and filtered LINE voltage present at the LINE_IN pin of the IC increases until it reaches its final DC value. The basic support circuits of the Tronium PSSoC are consequently powered up to initiate the power management functions. A timing diagram of an exemplary startup sequence of events is shown in FIG. 24, beginning with the application of the LINE_IN voltage at t=0.

The line side has three circuit blocks that are always powered ON: 1. Low-Power Bandgap Reference; 2. Low-Power 5V Regulator (LPREG); and 3. Low-Frequency Oscillator. Other circuits may be powered, but in this example it has been reduced to three in this instance in order to draw extremely low stand-by power. These circuits draw power directly from the LINE_IN input with no transformer action to increase the available current. As a result, they are designed for ultra-low power consumption. Alternatively, the transformer could be enabled, but this would reduce efficiency.

Normal Mode. Following the application of power and the completion of the wake-up states, the Tronium PSSoC 106 will enter the Normal Mode of operation. The Normal Mode of operation is maintained until the voltage/current becomes extinct or passes a low current threshold where typically the microchip inside the battery system begins resisting the current to prevent overload. In the normal mode of operation, the Tronium PSSoC exits the Sleep Mode as a result of the detection of load current. Regulation of the load occurs as the Buck Regulator and SCVBC supply the necessary current. In this mode of operation all Tronium circuits are powered ON and responding to the external stimulus.

In one embodiment, combining the elements of Normal Mode, Start Up Mode and Sleep Mode the battery can be provided a "bump" charge. In this instance another mode, called Bump Charge Mode would be executed when it is determined by the logic in the chip that a full charge has been executed, meaning a drain from a higher current to lower current over a given period of time. This Bump Charge mode of operation can exist in the state machine or be enabled/disabled via the I2C interface and would instruct the circuit to "disconnect" several times and begin recharging up to a maximum threshold of approximately 150 milliamps with an interval in between. In this fashion, the battery would be prompted to receive an additional trickle charge to ensure that it is really full, not just stating "full" on the device battery indicator. This will solve the problem where cell phones only charge to about 80-90% of their batteries capacities, thus, over time, while the indicator still registers the battery at 100%, it is really a 100% of 80% of the battery's capacity, not 100% of 100% of the battery's capacity. Under the Bump Charge Mode, the Tronium PSSoC digital provides an additional current threshold which is higher than the sleep threshold so that the Sleep Mode function, set out below, is not compromised.

Sleep Mode. The Tronium PSSoC must use minimal power when connected to the AC Mains power and no charging or power supply function is required. This requires the electrical circuit 22 to have at least two distinct power domains: 1) the line side domain and 2) the primary side domain. The line input side is the domain that must be capable of being powered at all times. There is also a 1.6 MHz Oscillator that is used for the Dickson Charge pumps. This oscillator remains OFF in the SLEEP mode. The 16 KHz oscillator is used as a countdown timer to wake the Tronium PSSoC when the programmed countdown time has been reached.

In the illustrated embodiment, the Tronium PSSoC 106 includes a Digital Control block 122 that provides the user the ability to manage numerous aspects of the Tronium application in setup, programmable, normal, test, or evaluation modes of operation. A microprocessor or state machines are provided to monitor the output voltage and current of the Switch capacitor circuit and include configurable registers which provide feature selection and programmability for both the normal mode of operation and the low-current or 'sleep' operating mode. Communication interfaces are also provided for external devices as required by the application.

Figure 21:
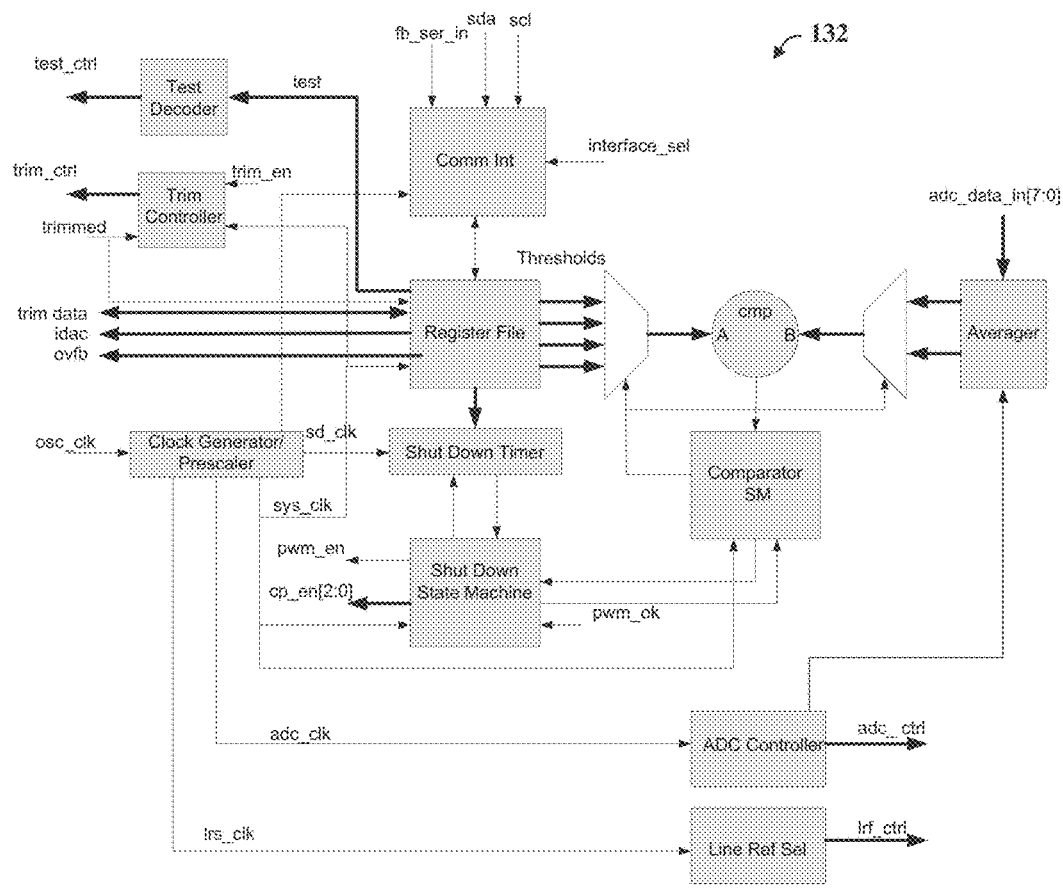
FIGS. 21 and 22 are block diagrams of a digital control block that may be used with the power controller integrated circuit shown in FIGS. 16, 17A, and 17B, according to embodiments of the present invention.
Figure 22:
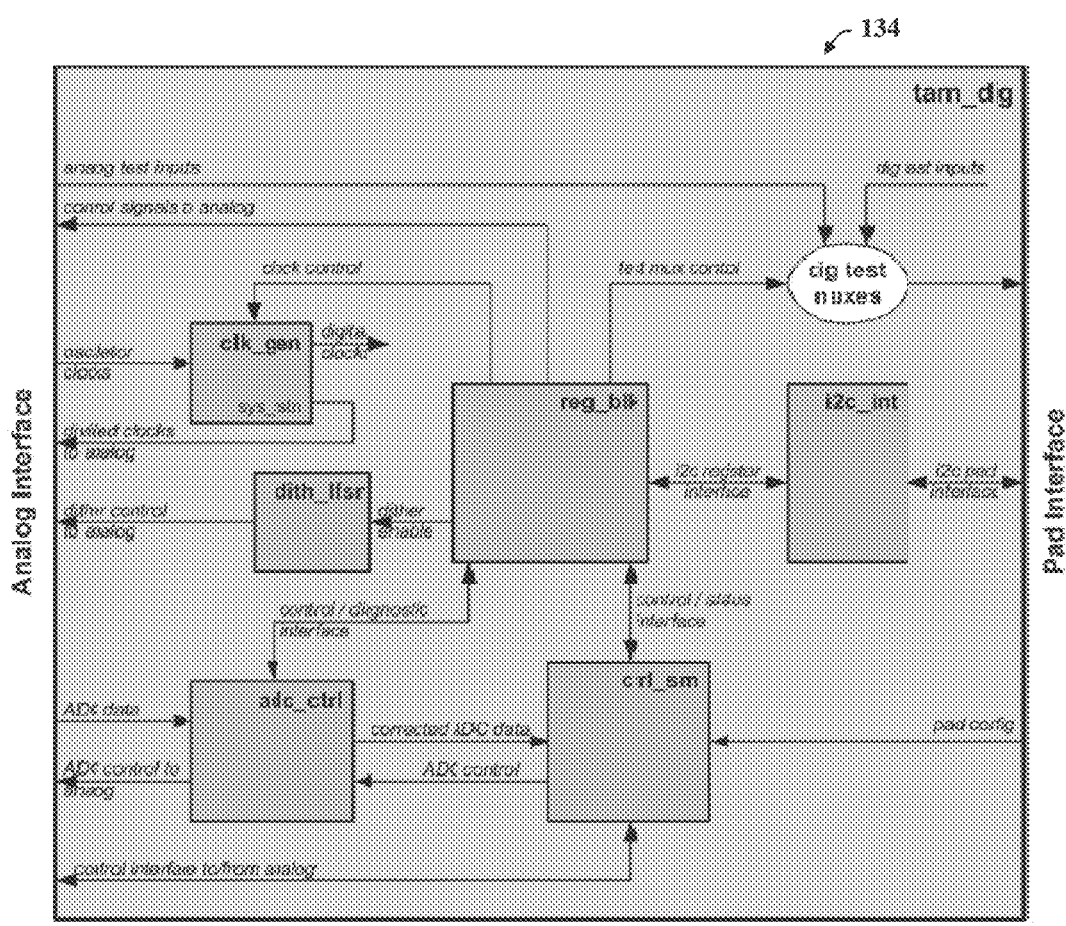

FIG. 21 is a block diagram of a Tronium universal digital control block 132 that may be used with the Tronium PSSoC 106. FIG. 22 is a block diagram of a Tronium autonomous digital control block 134 that may be used with the Tronium PSSoC 106. FIG. 23 is a flow chart illustrating a method of operating the power circuit 22. FIG. 24 is a graphic illustration of a state transitions that may be implemented by the Tronium PSSoC 106.

Referring to FIG. 21, in one embodiment, the Tronium PSSoC 106 includes the universal digital control block 132. The Tronium universal digital control block 132 provides the following functions for control of the Universal Module: Control State Machine, Clock Generator, ADC Controller, Clock Dither LSFR, I2C Interface—Mono or Dual Communication Mode, Programmable Communication Mode, microprocessor Interface, Test/Eval Multiplexer, and/or Register File.

The Control State Machine or microprocessor/microcontroller determines the proper operating mode of the Tronium Module by monitoring the output current of the switch capacitor circuit. At least two modes of operation are provided including a Sleep mode and a Normal regulation mode. The Control State Machine or microprocessor also provides four states to wake-up the PSSoC, plus the Bump Charge Mode, upon the first application of power, or when exiting from the Sleep mode. In addition, the state machine or microprocessor continually monitors the output voltage current for an over-or-under-current alarm condition.

Monitoring of the switch capacitor output current is achieved in the analog subsystem or in the microprocessor with the use of a Current Sense Amplifier and an Analog-to-Digital Converter (ADC). The Digital Control block provides control of the ADC and can perform periodic gain and offset correction for the ADC. The ADC samples are then compared to the programmed digital thresholds for switch capacitor current required by the Control State Machine.

A Clock Generator provides the clocks required for the analog and digital subsystems, and also enables clock gating to minimize power consumption in the Sleep mode of operation.

The Digital Control block provides a single-wire serial interface to support configurability of the PSSoC via an external microprocessor; or a multi-wire interface which will support two way communication between the Tronium PSSoC and the microprocessor or state machine. A Clock Dither Linear Feedback Shift Register (LSFR) is included to generate pseudo-random numbers for dithering of the Forward and Buck Regulator PWM clocks. The pseudo-random number is used by the analog subsystem to dither the high-frequency oscillator output. An I2C port is included for manufacturing settings, test, evaluation, updates, health-checks and debug. The Register File which contains configuration registers for device operation can be accessed using the I2C interface. A digital multiplexer is provided to selectively multiplex various internal digital signals to the DIGTST output pin for test purposes.

Referring to FIG. 22, in one embodiment, the Tronium PSSoC includes the autonomous digital control block 134 that provides the following functions for control of the Autonomous Module: the Control State Machine or microcontroller; Clock Generator; ADC Controller; Clock Dither LSFR; I2C Interface; Test Multiplexer; and Register File. The Control State Machine determines the proper operating mode of the Tronium PSSoC 106 by monitoring the output current of the switch capacitor circuit at the CP_OUT pin. Two modes of operation are provided including a Sleep mode and a Normal regulation mode. The Control State Machine or microcontroller also provides four states to wake-up the IC upon the first application of power, or when exiting from the Sleep mode. In addition, the state machine monitors the output current for an over-under-current alarm condition and Bump Charge Mode.

Monitoring of the switch capacitor output current is achieved in the analog subsystem with the use of a Current Sense Amplifier and an 12-bit Analog-to-Digital Converter (ADC) is used in this example. The Digital Control block provides control of the ADC and can perform periodic gain and offset correction for the ADC. The ADC samples are then compared to the programmed digital thresholds for switch capacitor current required by the Control State Machine and/or microcontroller.

A Clock Generator provides the clocks required for the analog and digital subsystems, and also enables clock gating to minimize power consumption in the Sleep mode of operation or Bump Charge Mode.

A Clock Dither Linear Feedback Shift Register (LSFR) is included to generate pseudo-random numbers for dithering of the Forward and Buck Regulator PWM clocks. The pseudo-random number is used by the analog subsystem to dither the high-frequency oscillator output.

An I2C port is included for manufacturing settings, evaluation, upgrades, resets, chip health-checks, test and debug. The Register File which contains configuration registers for device operation can be accessed using the I2C interface.

A digital multiplexer is provided to selectively multiplex various internal digital signals to the DIGTST output pin for test purposes.

In the illustrated embodiment, the Tronium autonomous digital control block 134 includes a State Machine to determine the proper mode of operation for the Autonomous Module based upon the load current.

As shown in FIGS. 23 and 24, the Control State Machine provides four wake-up states (W0, W1, W2 and W3) and two operating modes; a Normal Mode and a Sleep Mode.

Wake-Up 0 (W0)—When power is applied, the line-side circuits wake up: the bandgap (BG) and the low-power regulator (LPREG) power up. After the LPREG is stable, por_b is released and the system transitions to Wake-Up 1 (W1).

Wake-Up 1 (W1)—The low-frequency oscillator (LF_OSC) and the gain_control (GAIN_CTRL) get enabled. At the same time, the high-frequency oscillator (HF_OSC) and the charge_pump (CP) get enabled. The CP is set to not regulate. When the LF_OSC is stable, the lf_clk to the digital block is released at which point (a) the 10 mS counter starts up and (b) the 1 kHz clock to the switch capacitor becomes active. When the 10 ms counter expires, the system transitions to Wake-Up 2 (W2).

Wake-Up 2 (W2)—The switch-regulator (SWR) gets enabled, the CP is set to regulate and the 1 mS counter starts. When the 1 mS counter expires, the system transitions to Wake-Up 3 (W3).

Wake-Up 3 (W3)—The forward PID gets enabled and two counters start up: the 20 mS counter and the 250 mS counter. The following scenarios provoke transitions from this state: a.) The 20 mS counter expires and the forward PID override option is on: The system transitions to normal mode (NM); b.) The 20 mS counter expires, the forward PID override option is off and the forward PID stabilizes before the 250 mS counter expires: The system transitions to normal mode (NM); c.) Sleep mode is not disabled, the forward PID override option is off and when the 250 mS counter expires, the forward PID has not stabilized yet: The system transitions to sleep mode.

Normal Mode (NM)—The current sense block (CUR_SNS) and the ADC get enabled. If self-calibration is not disabled, the ADC uses the first two samples for gain and offset calibration and signals that the ADC data is okay when the third sample is ready. If self-calibration is disabled, the ADC performs gain and offset correction with the values programmed in the designated registers and signals that the ADC data is okay when the third sample is ready. When the ADC data is okay, the system monitors the current load. The following mutually exclusive conditions, the thresholds for which are programmable, can occur: 1. Over-current condition: The system sets the over-current status bit. If sleep mode is not disabled, the system transitions to sleep mode (SM); and 2. Under-load condition: If the LCSD_EN pin is high and sleep mode is not disabled, the system transitions to sleep mode (SM); and 3. Low-load condition: The system shuts down the SWR when it detects a low-load condition and turns the SWR back when the low-load conditions subsides.

Sleep Mode (SM)—The system disables the HF_OSC, the CP, the SWR, the forward PID, the CUR_SNS) and the ADC. It also starts the sleep counter, the duration of which is programmable. The default sleep time is approximately 5 seconds, which may be adjusted depending on use application. The system stays in sleep mode if the forward PID previously hadn't stabilized on entry to sleep mode. In this case, the system can be restarted in W1 by triggering the EXT_RST pin or in W0 by removing power. If the forward PID was okay on entry to sleep mode, the system transitions to the W1 state when the sleep counter expires.

In the illustrated embodiment, the transition between the Normal and Sleep modes of operation is achieved by monitoring the output current of the switch capacitor circuit via the Current Sense Amplifier and the ADC. In addition, the Control State Machine can disable the SWR Buck Regulator if the load current decreases to the programmed digital threshold. Monitoring of the current and the corresponding mode transitions is illustrated in the diagram of FIG. 24.

Referring to FIGS. 21 and 22, the digital control block 122 may include a clock generator which generates all the clocks required by the digital subsystem. Three clock domains are provided which are asynchronous to each other, a low-frequency clock domain, a high-frequency clock domain, and a I2C clock domain.

The Low-Frequency Oscillator in the analog subsystem provides a clock, in the illustrated example, a 16 kHz clock for the digital subsystem (lf_clk). In addition to the clock used by the Register File, the Clock Generator derives the following clocks from lf_clk: 1. sys_clk—An 8 kHz clock with a 50% duty cycle which clocks the control state machine. 2. adc_gclk—A gated version of sys_clk which clocks the ADC controller. This clock is gated off in sleep mode. 3. lfdiv_clk—A divided clock with a programmable frequency of 1, 2 or 4 kHz with a 50% duty cycle to be used in the analog block. This clock is gated off in sleep mode.

The oscillator can be bypassed in the analog subsystem via the TSTMD0 input to enable the application of a 16 kHz clock from the EXT_CLK pin.

The High-Frequency Oscillator in the analog subsystem provides a 1.6 MHz, 50% duty-cycle clock which is further divided by the Clock Generator to create the hfdiv_clk. The hfdiv_clk is programmable via the Register File to provide frequencies of 100, 200, and 400 kHz. The hfdiv_clk is also used in the digital for the Clock Dither LFSR and in the analog for the Buck Regulator and Forward PID loops. The clock shuts off in sleep mode when the HF Oscillator is disabled in the analog.

The I2C Interface uses the clock input at the SCLK pin to control operation of the I2C port. Data rates of up to 100 Kbps are supported.

In the illustrated embodiment, the digital control block 122 also includes an ADC controller which generates the control signals for the general purpose 12-bit ADC in the analog subsystem. It also controls selection of the input to the ADC for conversion via the ADC multiplexer and the ADC_MUX_SEL registers in the CONTROL0 register. The ADC output format is magnitude. The Digital Control block performs a self-calibration routine once when the ADC is first enabled. The Digital Control block can configurably use the gain and offset correction values calculated during the self-calibration, or use the gain and offset correction values written to the ADC_GAIN and ADC_OFFS registers.

During the self-calibration routine the offset and gain correction values are determined as described below.

The Offset is determined first as follows: Set the ADC input mux to select the Reflo reference voltage. Do one ADC conversion. The Ideal value would be 0. Load the ADC Conversion data into the local ADC Offset Correction Register.

The Gain is determined next as follows: Set the ADC input mux to select the Refhi reference voltage. Do one ADC conversion. The Ideal value would be 4095. Load the local ADC Gain Correction register with the results of (ADC Conversion data−Offset Correction)/4095.

Following the self-calibration phase, the ADC Conversion values are corrected as follows: ADC Corrected data=(ADC Conversion data−Offset Correction)/4095.

The Clock Dither LFSR provides pseudo-random number values to implement dithering on the 1.6 MHz clock to mitigate EMI. The LFSR is a 12-bit, maximum-sequence, Galois-type LFSR with the polynomial of x12+x6+x4+x+1.

The Clock Dither LFSR can be selectively enabled or disabled with the dith_en register bit in the Control register.

In one embodiment, the Tronium PSSoC digital control block 122 may include a configurable down counter with a range of 0.512 Sec to 16.384 Sec, to implement the Sleep Timer function. The Step size is 512 mS. The counter receives its clock from the Clock Generator block where it is divided down from the LF Oscillator clock. The counter is loaded with the sleep_time value programmed in the SLEEP_CTRL register. The counter will count down from this value until it reaches zero at which time it notifies the Control State Machine that the Sleep Timer has expired.

Figure 25:
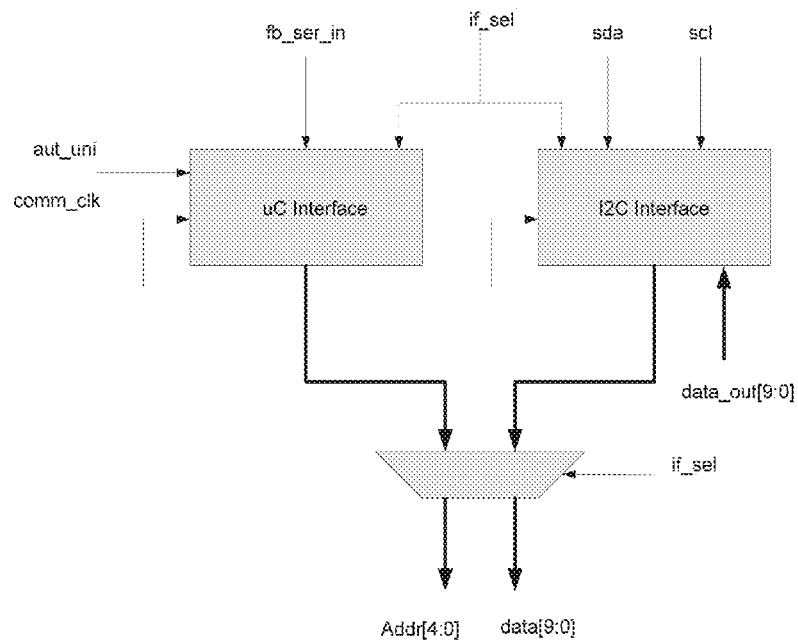
FIG. 25 is a schematic illustration of a communication interface that may be used with the power controller integrated circuit shown in FIGS. 16, 17A, and 17B, according to an embodiment of the present invention.
Figure 26:
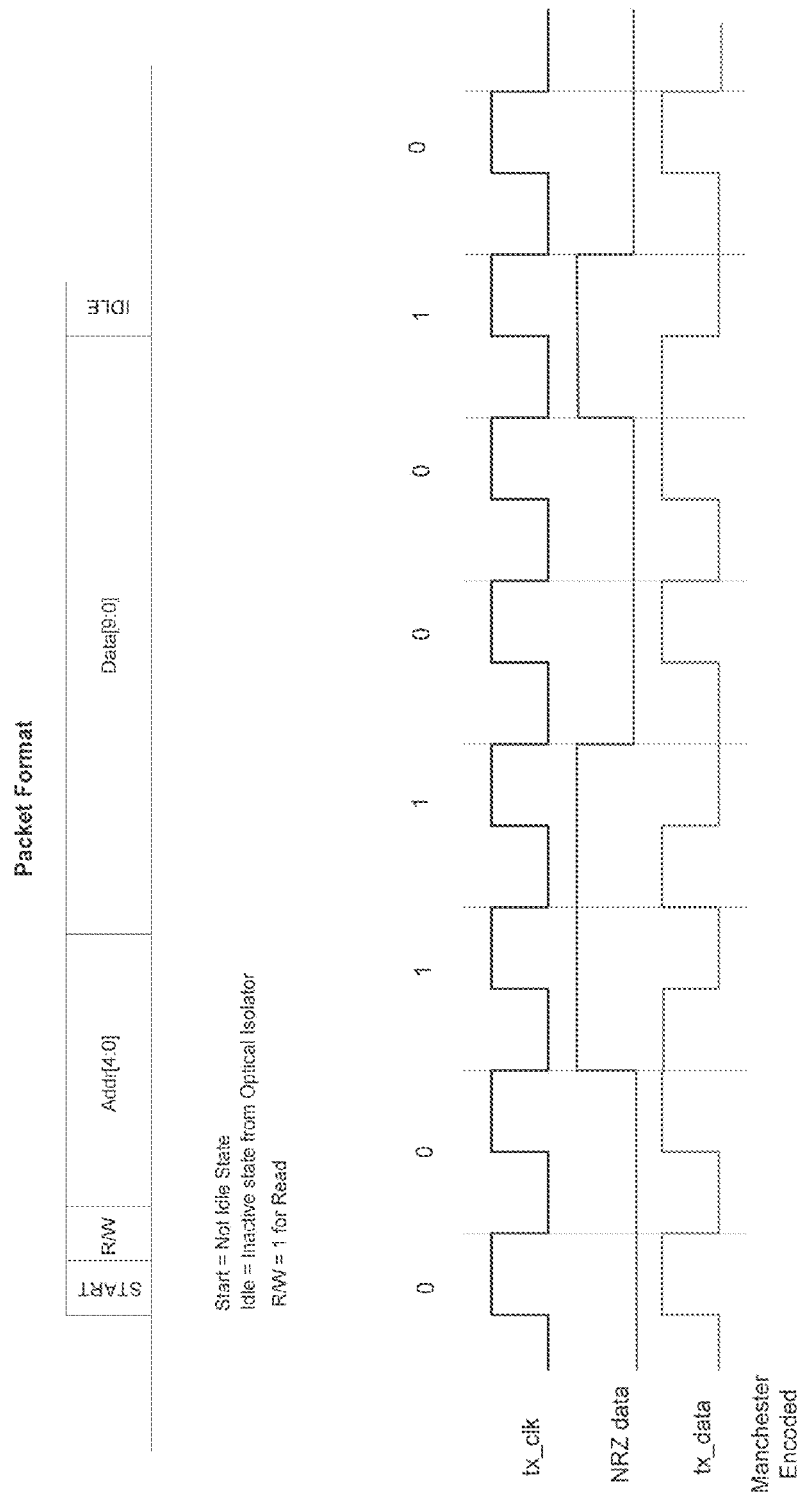
FIG. 26 is a schematic illustration of a microprocessor communication protocol that may be used with the power controller integrated circuit shown in FIGS. 16, 17A, and 17B, according to an embodiment of the present invention.

FIG. 25 is a schematic illustration of a communication interface that may be used with the Tronium PSSoC 106. FIG. 26 is a schematic illustration of a microprocessor communication protocol that may be used with the Tronium PSSoC 106. In the illustrated embodiment, the communication may be uni-directional or bi-directional. The Tronium PSSoC 106 contains one or more communication interfaces, here described as three interfaces: 1) a microprocessor interface, 2) a single or dual communications/update interface for programming values or returning information to the state machine/micro, and 3) a test/eval interface. The microprocessor interface will be used to communicate with an external microprocessor for certain products, the communications/update interface may update the micro or any of the values internal in the chip. This allows for product configurability and for implementation of a control loop for the Tronium charger. For the Tronium PSSoC, this can be either a read/write or a write only interface, i.e. the microprocessor will or will not be able to read from the PSSoC depending on the type of communication determined: one way or multilateral.

The test/eval interface will be used in the manufacturing test environment, and for bench evaluation of the Tronium PSSoC. It will allow for write and read access to the on-chip registers. The upgrade, eval, health-check and reset interface will be used to reprogram a chip, change its voltage/current output, or change other reprogrammable portions of the control logic, including thresholds, as well as run scans to help determine if anything is wrong with the chip (health-check).

Typically, only one interface can be selected at a time, but this can be changed based on the state machine or micro settings. The IF_SEL input pin selects the I2C when '1' and the microprocessor interface when '0'.

Microprocessor Communication Interface. The Tronium PSSoC may also provide a single-wire serial interface to support configurability of the PSSoC. The interface consists of uni- or multi-directional data input/output. The protocol is shown in FIG. 26. All packets will be homogenous in structure and length unless otherwise necessary. Each packet will be a certain number of bits. The packet fields are described below. By adding another wire, a dual communication interface may be had so that the information is multi-directional.

To support reliable communication, the data may be Manchester Encoded per the IEEE 802.3 Communication Standard. The receiver will then use an over-sampling clock to maintain bit synchronization over the packet. The bit rate will be 600 Kbps. The incoming data will be oversampled by a factor of 16 times the bit rate. The oversampling clock is therefore 9.6 MHz, and is sourced from an on-chip Oscillator.

Start: A single bit whose value is the non-idle state of the signal line. This will be '1' for this application. R/W: A single bit to indicate a read or write request. When '0', the data is written to the selected Tronium register. Note that Tronium only supports write accesses. Addr[4:0]: 5 bits used to address the Tronium configuration registers. Data[9:0]: 10 bits to be written to the selected Tronium register. For cases where the target register is less than 10 bits, data will be right justified. For example when writing to an eight bit register, Data[7:0] will be written to the addressed register location. Idle: A single bit whose value is the idle state of the signal line. This will be '0' for this application.

Data is transferred MSB first. For example, Addr[4] is transmitted first in time by the host. The Tronium implementation will or will not support read operations of the ASIC registers by the host depending on the programming. The R/W bit is included for future expansion.

Figure 27:
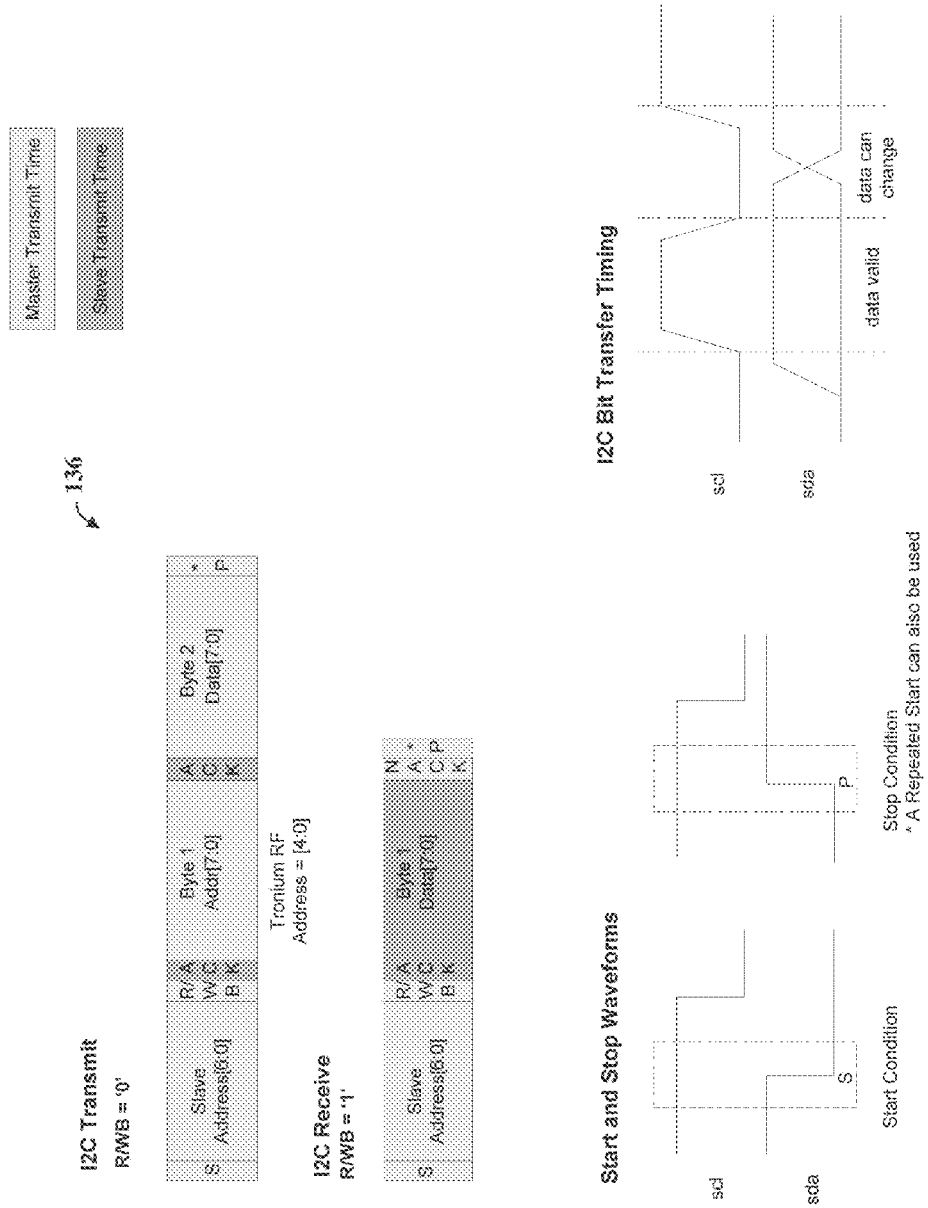
FIG. 27 is an illustration of a timing diagram an Inter-Integrated Circuit that may be used with the power controller integrated circuit shown in FIGS. 16, 17A, and 17B, according to an embodiment of the present invention.

FIG. 27 is a timing diagram of an Inter-Integrated Circuit ($I^2C$) 136 that may be included in the Tronium PSSoC 106, that allows for data transfer between integrated circuits. In the illustrated embodiment, the Tronium PSSoC 106 contains an $I^2C$ slave port to support testing of the device. The $I^2C$ address is configurable using the I2C_ADDR pins. The I2C_ADDR inputs are compared to the $I^2C$ Slave Address bits. The Tronium I2C Bus protocol is shown FIG. 27. The $I^2C$ Interface supports bit transfer rates up to 100 Kbs. The $I^2C$ interface runs entirely off the I2C SCLK clock input.

$I^2C$ Write Operations: The Tronium PSSoC supports writes to the Tronium Memory Mapped registers over the I2C Slave port. After receiving an I2C slave address which matches the Tronium $I^2C$ address, the next byte, shown as byte1 in FIG. 27, will contain the 5 bit address field for the Tronium Register File addresses. The Tronium PSSoC only supports access of one register per command.

$I^2C$ Read Operations: The Tronium PSSoC supports reads from the Tronium Memory Mapped registers over the $I^2C$ Slave port. The read operation requires two $I^2C$ operations. First, an $I^2C$ write to the RDREQ register where the data in byte2 is the Tronium Memory Map address of the register to read. Then an $I^2C$ read command will read the requested register. The Tronium only supports accessing one register per command.

Note that there is a delay between the $I^2C$ Write operation and the time at which the RDREQ register is updated. This means that following the $I^2C$ Write operation, the I2C Master must wait 400 µsec before issuing the $I^2C$ Read operation. This wait time only applies to the first $I^2C$ read following the $I^2C$ Write to update the RDREQ register.

In one embodiment of the Tronium PSSoC the digital memory has intelligence where if the Tronium PSSoC is powering a television, if a television has not been used from a certain time period to another, such as midnight to 7:00 o'clock A.M. for a fixed number of days, the Tronium would always put itself into Sleep Mode during these times to conserve energy and not re-engage in the current sensing routine of the wake-up sequencing.

In another embodiment of the invention, the Tronium PSSoC is connected through its $I^2C$ interface to wireless (like BlueTooth®) or power-line type communication protocols and devices, either external, on-chip or on-module, in order to receive instructions to the state machine or microprocessor. In this fashion there could be "real-time" instructions given to the Tronium about when to go to Sleep Mode, when to wake up, and reset, upgrade or change other preconditions, like over-voltage or PWM regulation. In this fashion, the Tronium PSSoC can have "real-time" sensing and switching of its control mechanism to achieve different levels of frequency, speed, or adapt to low power situations, like in some countries, where the grid typically runs undervoltage during significant portions of the time. In this case the Tronium PSSoC can get real-time information about resets, operation, or shutdowns/restarts, including real-time commands from its owner, even from a cell phone or tablet through the use of cell system to inside the home communication technologies. In this case a person may want to shut down power to certain electronic equipment or electronic devices powered by the Tronium PSSoC while away, and this could be accomplished through the communication interface over wireless or wire communication technologies giving specific instructions through the $I^2C$ interface in the Tronium PSSoC, instructing it to shut down the device, and even pre-setting the time it should wake up.

In another embodiment of the invention, and when used as a charger or constant supply power, the Tronium PSSoC is small enough to fit into a wall plug attached to the cord, therefore eliminating the need for a charger "box" or laptop "brick".

In one embodiment, the Tronium PSSoC 106 has several test structures to support manufacturing, programming, eval, upgrading, health-check, communication, test and bench evaluation. The Tronium PSSoC provides two test registers for controllability and observability of key internal functions and control signals. The TEST_CTRL0 register provides the user with the ability to selectively enable, disable, or override the control of individual analog circuit functions in the Tronium PSSoC to provide an alternate method of control should the Control State Machine need to be bypassed. The TEST_CTRL1 register provides the ability to multiplex internal analog and digital signals to the ANATST and DIGTST output pins for test purposes.

Many modifications and variations of the present invention are possible in light of the above teachings. The invention may be practiced otherwise than as specifically described within the scope of the appended claim.

Figure 30:
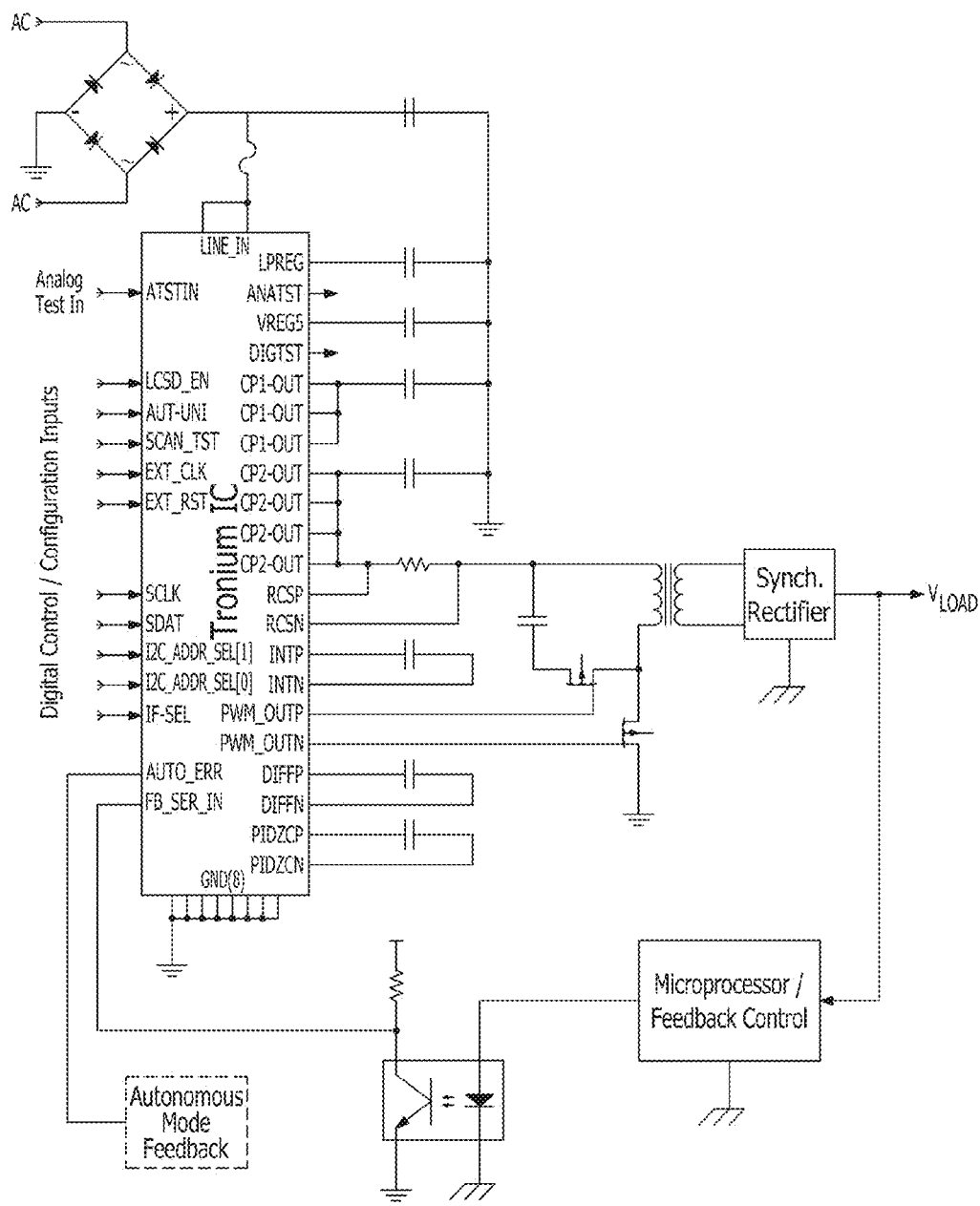
FIG. 30 is a connection diagram that may be used with the power controller integrated circuit shown in FIGS. 16, 17A, and 17B, according to an embodiment of the present invention.
Figure 31:
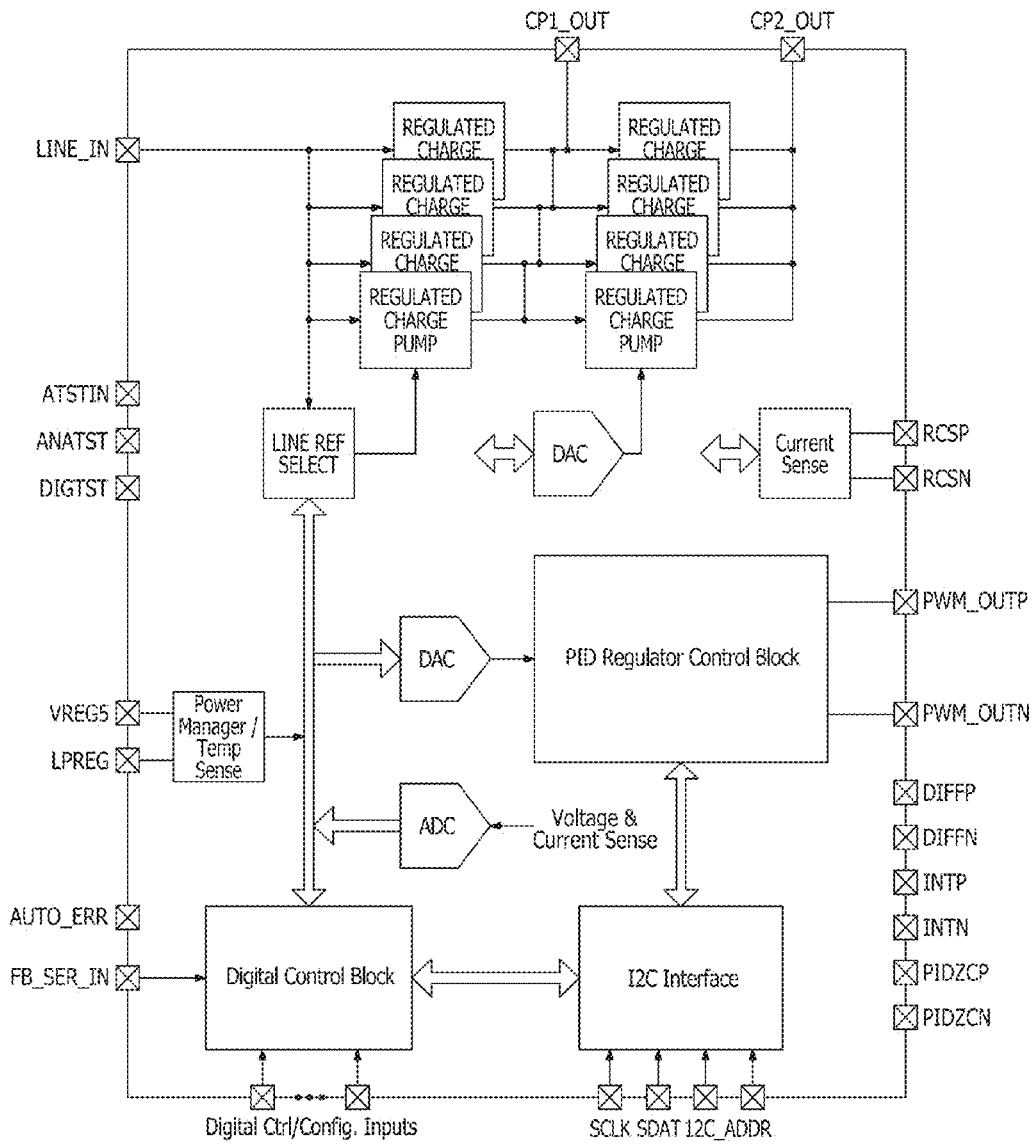
FIGS. 31 and 32 are additional schematic illustrations of the power controller integrated circuit shown in FIGS. 16, 17A, and 17B, according to embodiments of the present invention.
Figure 32:
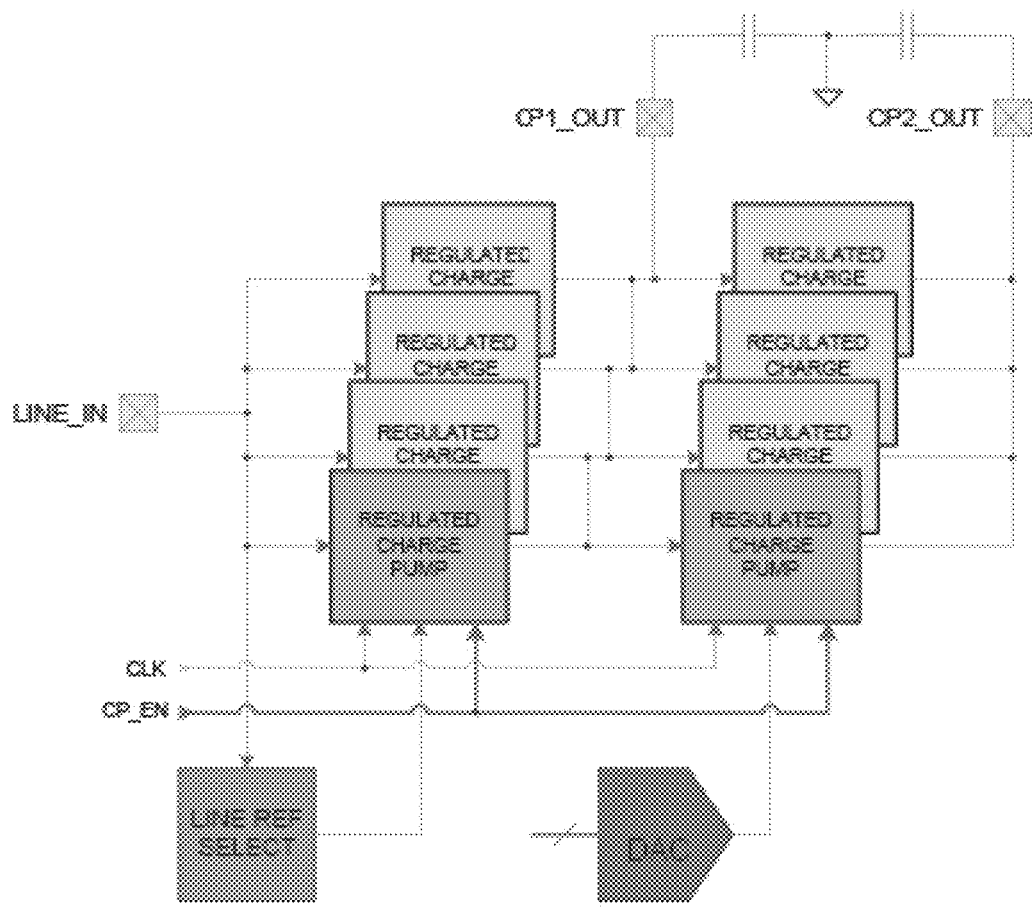
Figure 33:
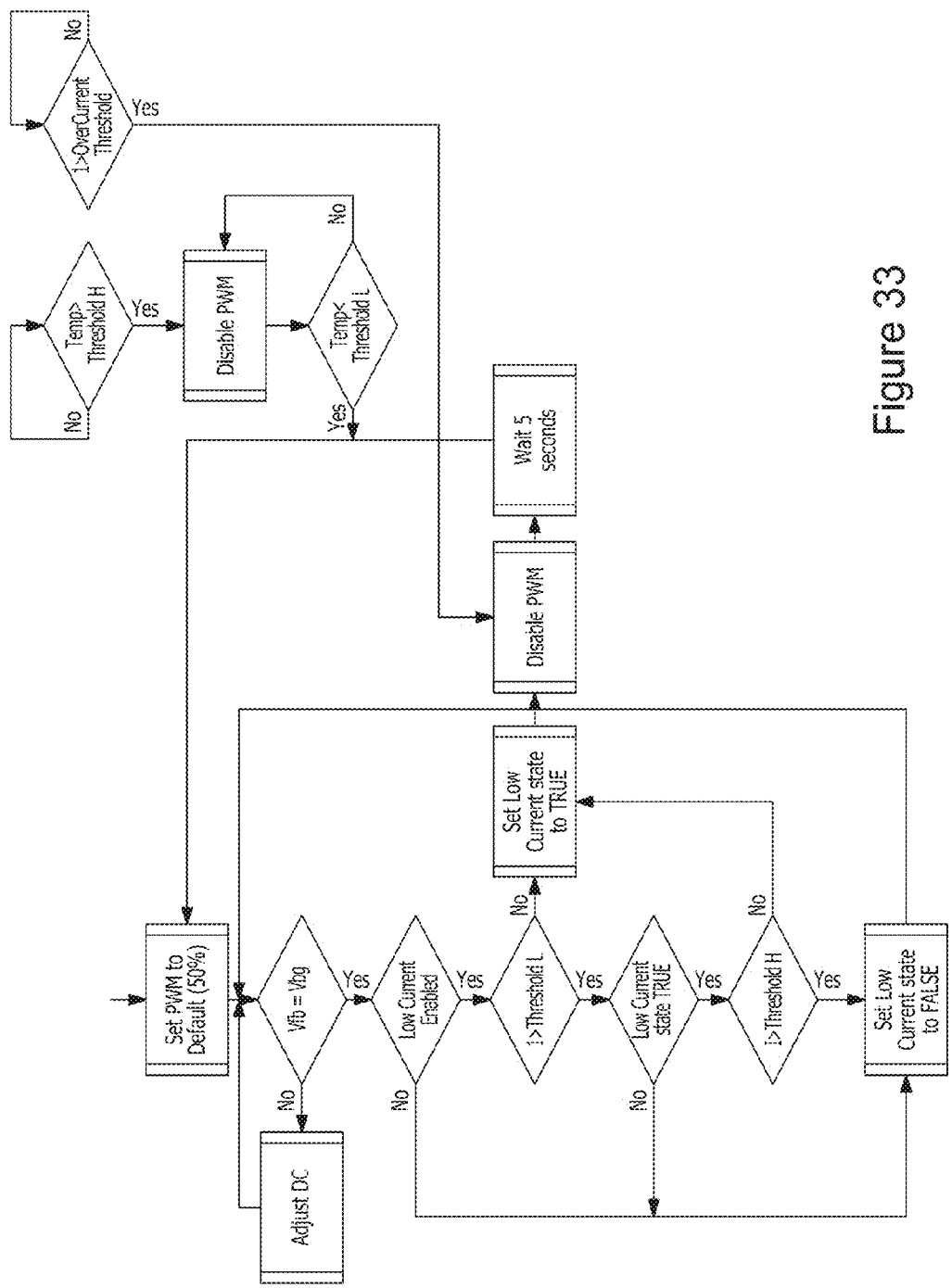
FIG. 33 is a flow chart of an algorithm for a low-current detection and an error detection that may be used with the power controller integrated circuit shown in FIGS. 16, 17A, and 17B, according to an embodiment of the present invention.
Figure 34:
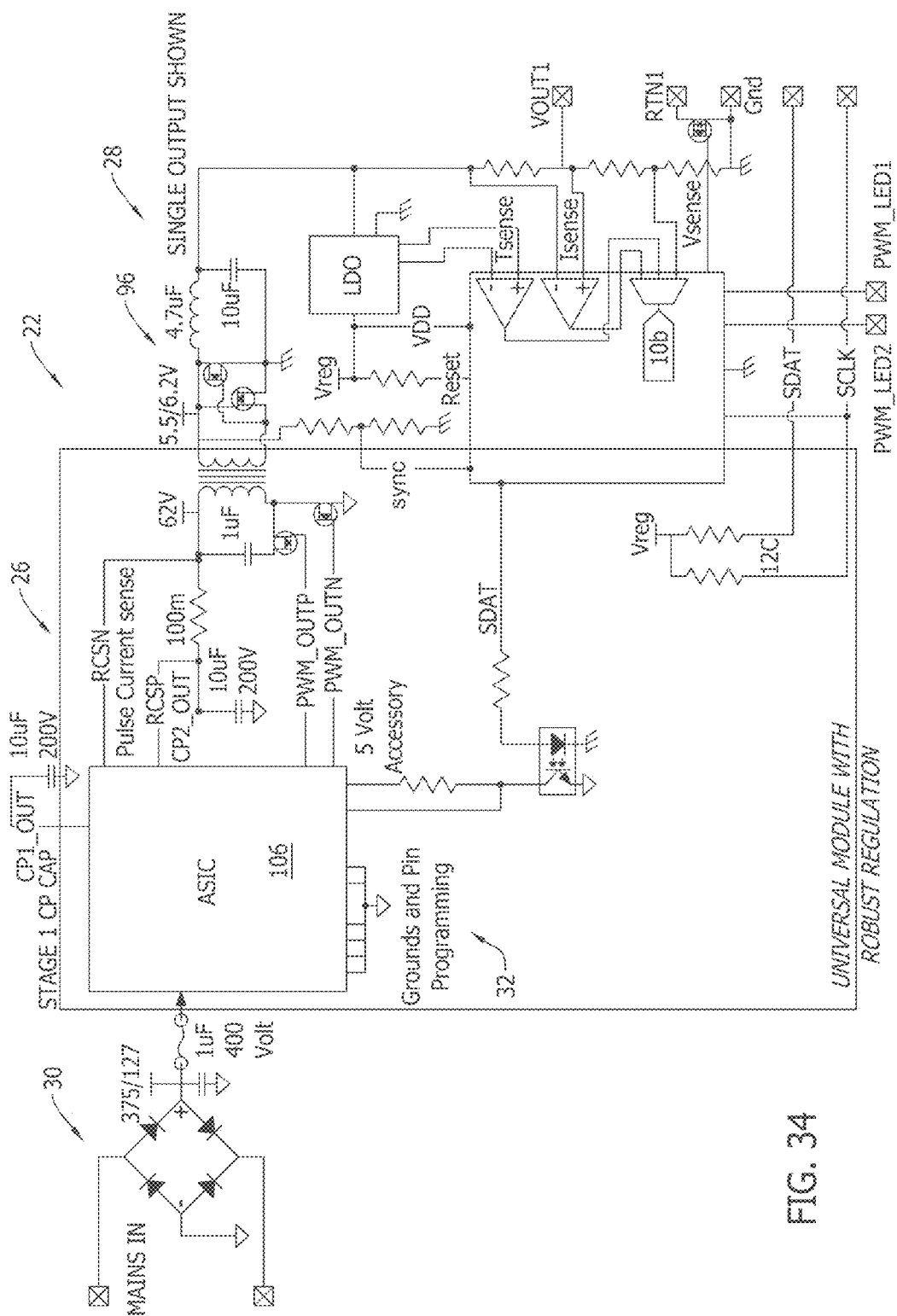
FIGS. 34 and 35 are schematic illustrations of the power circuit shown in FIG. 2, according to an embodiment of the present invention.
Figure 35:
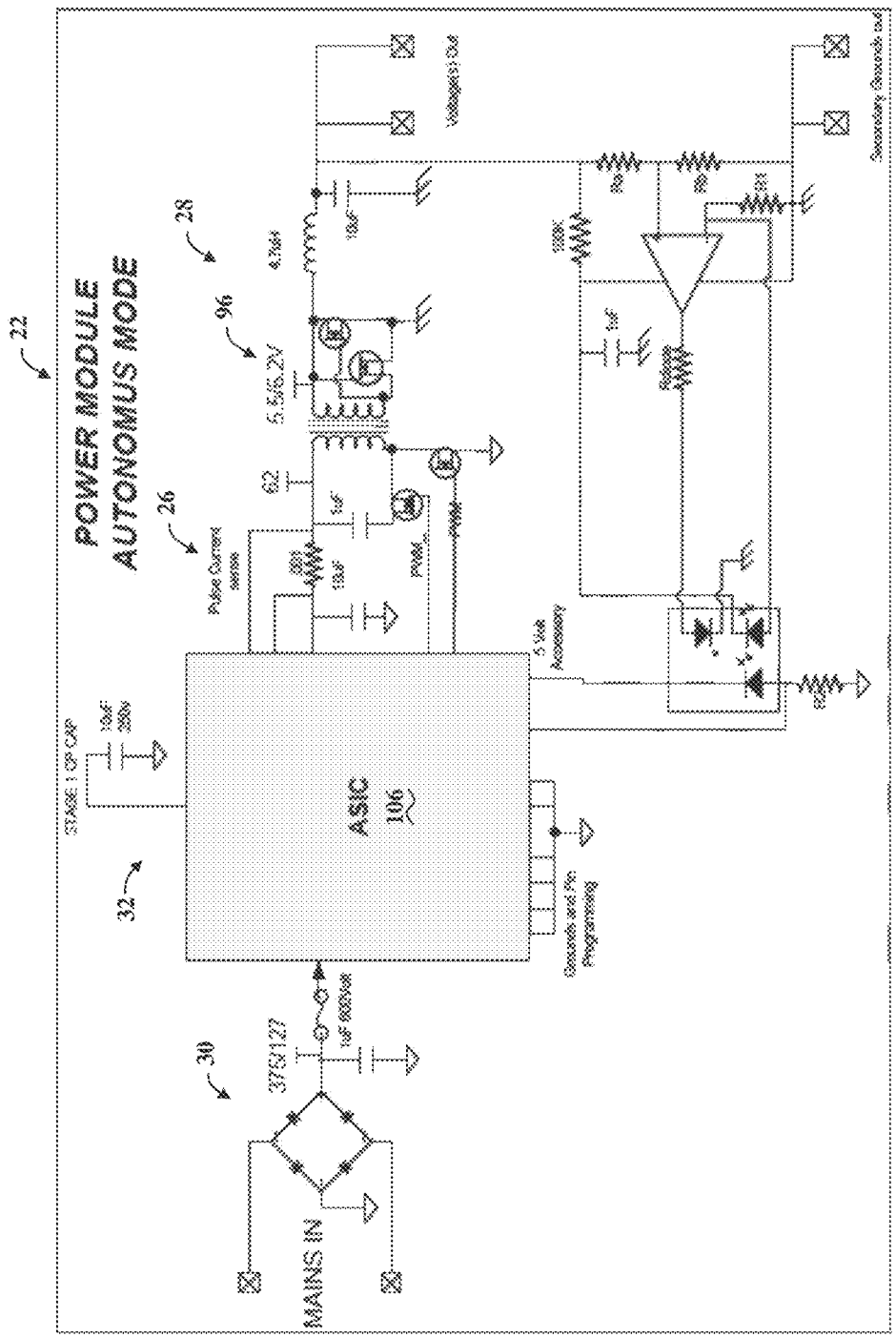

FIG. 30 is a connection diagram that may be used with the Tronium PSSoC 106. FIGS. 31 and 32 are additional schematic illustrations of the Tronium PSSoC 106. FIG. 33 is a flow chart of an algorithm for a low-current detection and an error detection that may be used with the Tronium PSSoC 106. FIGS. 34 and 35 are schematic illustrations of the power circuit 22 including the Tronium PSSoC 106. In the illustrated embodiment, the Tronium PSSoC 106 is an advanced power controller integrated circuit (IC). The Tronium PSSoC 106 and corresponding integrated Module provide a low-cost, highly efficient means to convert the AC line voltage present at a typical home or business electrical outlet to a reduced regulated DC voltage for consumer electronic applications. Typical applications include, but are not limited to, charging systems for cell-phones, tablets or other handheld devices, USB power conversion, power supplies for consumer, medical and industrial devices, and many other possible uses.

The Tronium PSSoC provides high efficiency, low noise, and low EMI with the configurations and features as set out above. In addition, the AC-DC, DC-DC converter has high power density, low cost, and electric isolation. These advantages are achieved from integrating otherwise discrete parts onto the chip, utilization of the Switch Capacitors Voltage Breakdown scheme and primary side sense/control. Thus, the key features of the Tronium PSSoC are as follows: Support for wide range of available AC or DC input voltages and frequencies; Programmable Output Voltage and auto-detect of input voltage with automatic setting to configure to the input voltage for proper operation; High-Efficiency switch capacitor circuit for AC-DC, DC-DC Conversion; PID (or similar) Regulation Control Loop for High Accuracy; Digital State Machines for Current and Temperature Monitoring; Ultra-Low Power Dissipation for Idle (Vampire) Mode of Operation; Opto-Isolated Microprocessor Interface for Configuration and Control; and Communications Port for Manufacturing Test.

The analog and digital interfaces, inputs, and outputs of the Tronium PSSoC are able to withstand Voltages and Currents that are outside of the typical operating range. The unit is also operable over a wide temperature range and provide ample ESD immunity.

The Tronium PSSoC provides inputs and outputs to interface to the outside world and external circuitry. These include but are not limited to: power inputs, power outputs, low current shutdown enable inputs, mode selection input, intermediary connections for which external circuitry is required, test connections, communications connections, power outputs, regulator outputs, connections for PID based PWM, FET drive outputs, and feedback inputs.

The Tronium PSSoC is an advanced power controller integrated circuit designed to provide output voltage regulation with high-efficiency and high accuracy. The advanced features of the Tronium PSSoC provide the user with a multi-purpose device which can be used in a large variety of applications. Programmable output voltages are possible with the Tronium PSSoC, with little or no loss of efficiency across a variety of current load conditions.

The Tronium PSSoC uses a proprietary switch capacitor circuit system to maintain high-efficiency regardless of the load voltage or current. When no current is being drawn by the load, the device will enter a low-current mode of operation to minimize the traditional 'vampire' current required to stay awake as well as scale the number of active subsystems to the load in order provide high efficiencies across a wide loading range.

A top-level block diagram of the Tronium PSSoC is shown below, and is comprised of the following major circuit blocks: High-Voltage Multi-Stage/Multi-Branch switch capacitor voltage divider circuit; PID (or other switched mode control scheme), Regulator Control Block for PWM Control of Secondary Transformer; Current and Temperature Sense Blocks; ADC or Comparator for Voltage and Current Monitoring; DAC, PWM, or other signal for Feedback Control; Digital Control Block for Voltage & Current Monitoring State Machines; Communications Interfaces; and Power Management for On-Chip Voltage and Current Generation and other power requirements. The blocks in the IC may also include internal circuits for rectification.

Power Management. The power management block provides necessary power rails and references to the rest of the IC. It is comprised of voltage regulators, current references and voltage references. It also includes all necessary buffering and amplification needed for IC usage. The power management system also contains a reset controller which manages the shut down and start up of the system on power cycle.

Switch Capacitor Voltage Breakdown Circuit. The switch capacitor voltage breakdown circuit (i.e., the switch capacitor voltage divider circuit) of the Tronium PSSoC works as a near lossless voltage divider which is controlled by algorithms in the controller. According to which algorithms (for input and target output) are enabled, it divides the rectified DC voltage present at the LINE_IN pin to a reduced voltage at the CP2_OUT pin for use by the external transformer and secondary voltage control loop. An external transformer can then further reduce this voltage to the desired application voltage as a function of the primary-to-secondary windings ratio, as well as provide isolation if desired.

The switch capacitor circuit is configured as a cascade of multiple identical stages with multiple parallel branches as shown below. The parallel branches are switched in or out of the circuit based upon the load current that is sensed by the current sense amplifier. This enables the switch capacitor circuit to maintain high efficiency across the wide range of load currents. In the diagram below, the number of parallel subsystems is 4 comprising two stages. The number of parallel systems and conversion stages may change so that the system is best optimized for a particular input/output voltage ratio or power requirement.

The switch capacitor circuit uses on-chip or off-chip fly-back capacitors to maximize power efficiency and external hold capacitors to minimize the voltage ripple. These capacitors are connected to the CP1_OUT and CP2_OUT pins, respectively, for the outputs of the 1st and 2nd stages of the switch capacitor circuit. All stages are clocked by an oscillator, or each stage may have its own dedicated oscillator. Each branch of the switch capacitor circuit may have an independent enable. These capacitors may be "deep trench" type monolithic capacitors in silicon or gallium. The transistors associated with the capacitors may also be either created in any type of silicon or gallium.

The output voltage is programmable over the range of voltages for a given range of applications with high resolution with the use of a digital-to-analog converter (DAC). The digital control of this DAC enables multiple voltages to be programmed at the CP2_OUT pin to obtain the desired final output voltage required for the target application.

The switch capacitor circuit output settings of the other switch capacitor circuit stages can be determined by the user or derived from the measured AC line Vin, so that an optimum ratio between Vin and Vout can be realized.

Regulation of each switch capacitor circuit stage is obtained with the use of an Operational Trans-conductance Amplifier (OTA). The OTA regulates the current applied to the fly-back capacitors in each stage as a function of the difference between the output voltage and the input reference voltage. The input reference voltage may be programmed, derived, or fixed depending on application.

Voltage measurement of the incoming line may be taken in order to optimize the switch capacitor circuit settings. This setting calculation can be performed on-chip, off-chip, or on the fly through appropriate on chip circuitry, so that the outputs of each switch capacitor circuit stage are in the most optimized ratios.

Current Sense Amplifier. The current sense amplifier in the Tronium PSSoC allows the device to measure current as part of the feedback loop as well as error reporting. The current can be measured by an ADC or through a series of comparators with varying thresholds.

PID Control Loop. The Tronium PSSoC provides a Proportional-to-Integral-and-Differential, PID, loop or alternative PWM control circuit in order to drive the primary side of the isolation transformer, a buck, a boost, or a buck-boost circuit. This circuit is to provide post regulation and isolation if necessary.

Feedback to the PID loop can be from either a digital source for example, but not limited to, a serialized ADC stream or an analog signal, both of which are dependent on the output of the circuit. This feedback can provide information relating regulated output current or voltage.

Temperature Sensor. An on-board temperature sensor may be realized so that ample protection from over temperature situations exists. Actions taken to protect against thermal damage may include de-rating of output power and complete shut-down of output.

Control Circuitry. The Tronium PSSoC provides for control whether through digital means or through analog circuitry. Through this control circuitry, the IC is able to set and change existing control thresholds and control points as well as enable/disable specific functionality. This can be done through registers or fuses in a digital interface situation or through applied voltages to analog pins should analog setting be desired.

If the feature is enabled, the Tronium PSSoC allows the output of the system to be disabled or de-rated. This can take place by turning off the PWM, switch capacitor circuit, or through de-ration of either or both subsystems. The output can be disabled as a result of error detection or as a result of a low output current or output power situation such as arises when a connected device that includes a battery is done charging the battery and the Tronium PSSoC is only providing power to the non-battery charging functionality. Once the Tronium PSSoC has entered into a low current shutdown state, it will intermittently re-apply output power to the end device in order to check whether or not it now requires power above certain threshold indicating that the battery now needs further charge. The time spent in the off state may be adjusted for varying applications. FIG. 33 illustrates an example of the algorithm for low-current detection and error detection.

The Tronium PSSoC provides multiple interfaces to external circuitry so that devices may control and configure the IC. These interfaces can include, but are not limited to, SPI, I2C, UART or other synchronous/asynchronous serial stream. Alternate encoding to NRZ formats can also be realized to optimize the size and part count of external circuitry. Likewise these communications interfaces can be connected to isolation devices in order to enable communications from an isolated region should this be desired.

Clock Generator. The Tronium PSSoC may have the ability to generate its own internal clocks which may also include frequency controlling circuits including, but not limited to: internal Oscillators, PLLs, FLLs, clock dividers, VCOs, and trimming circuitry. Additionally the clocking tree may implement intentional clock jitter or other means to vary the clock edge placement in order to minimize the effects of the clocking on radiated and conducted EMI.

Module Description. The Tronium PSSoC is intended for use as a power supply device which is to be incorporated into a module which accepts AC power in, converts this power to a DC Voltage, and supplies this power external devices. Alternatively, a DC input may be introduced, which bypasses the rectification, which then produces either a DC or AC output. The module can take many forms, which can include either analog or digital feedback of the output to the ASIC, or the ASIC can operate in open loop mode with no feedback. Additionally, module circuitry can be constructed so that individual outputs (should there be a plurality of connected outputs) can be discretely monitored and controlled. The sensing capabilities within the module are meant to supplement or replace the measurements taken by ASIC depending on the application and regulation requirements.

FIG. 34 is a schematic of the power circuit 22 including Digital Feedback module with isolation and discrete output sensing. FIG. 35 is a schematic illustration of the power circuit 22 including Analog Feedback module with linearization of feedback isolation. These represent an analog feedback version and a digital feedback version. Both of these diagrams also indicate an isolation transformer as part of the design. This component may or may not be included in the module depending on the requirements of the application. Both examples describe a synchronous rectification scheme, however an asynchronous system could also be realized.

Digital Feedback Description. The digital feedback module includes a microcontroller, standalone ADC, or secondary ASIC in order to monitor the output voltage and to allow very precise measurements to be taken at the output connection. This allows the module to compensate for component losses, temperature, and other variables that may cause variance in the output voltage. This data is then formatted and sent back to the ASIC to provide the digital feedback stream. Current sensing and output enable transistors are also shown so that should a multitude of outputs be connected to the module with individual sensing at each. In this manner the low power shut-off functionality described in the ASIC description could be applied to individual loads even though the power is shared.

Analog Feedback Description. If for cost or other reasons it is desired to use an analog feedback system, the Tronium PSSoC allows this to be realized through the analog feedback input. In the embodiment shown, the current through an opto-isolation LED is proportional to the output voltage. The circuit is designed so that the voltage at the analog feedback pin on the IC is at nominal voltage when the output voltage is at the target output. Current monitoring is performed by the IC at the primary side of the transformer, and the measurements are scaled by the turns ration of the transformer.

Figure 36:
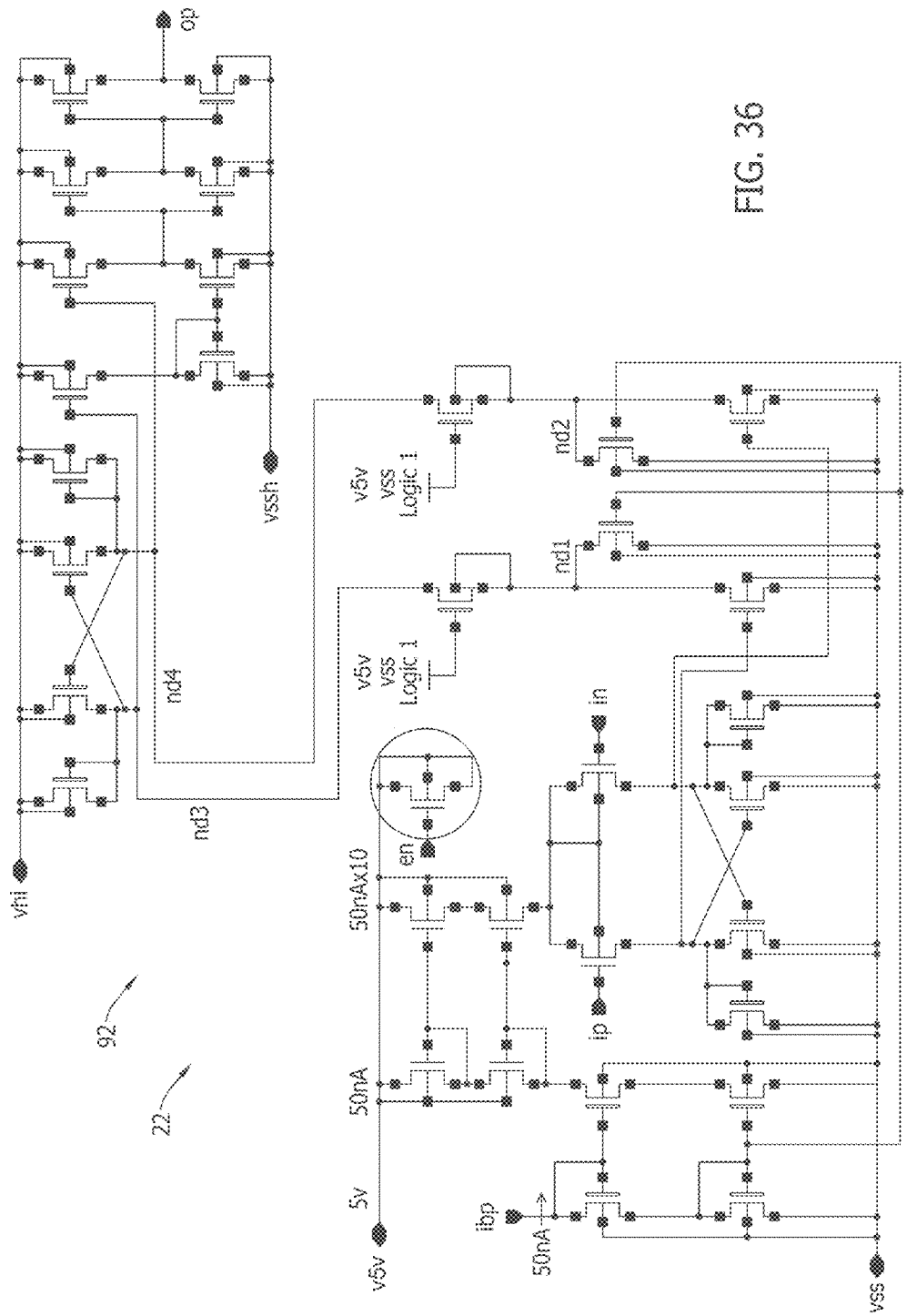
FIG. 36 is a schematic illustration of Level Shifter that may be used with the power circuit shown in FIG. 2, according to an embodiment of the present invention.

FIG. 36 is a schematic illustration of a Level Shifter circuit that may be used with the power circuit 22. In one embodiment, the switch capacitor voltage divider circuit 32 and the buck regulator 34 relies on a level shifter that can take a static CMOS level digital signal and voltage shift the signal to various levels. This is done to properly drive the gates of high voltage switches both off and on Tronium PSSoC chip. The level shifter is comprised of a differential pair with a static dc current bias current. The diff pair amplifies the CMOS level signal and then shifts to a higher rail. There are cascodes used in the signal path to avoid any transistor breakdown. The level shifter can be disabled via a p-channel switch to avoid any static current drain. Once the signal is shifted to another rail, it is further amplified converted to single ended and then converted back to static CMOS levels to drive high voltage switches.

Figure 40:
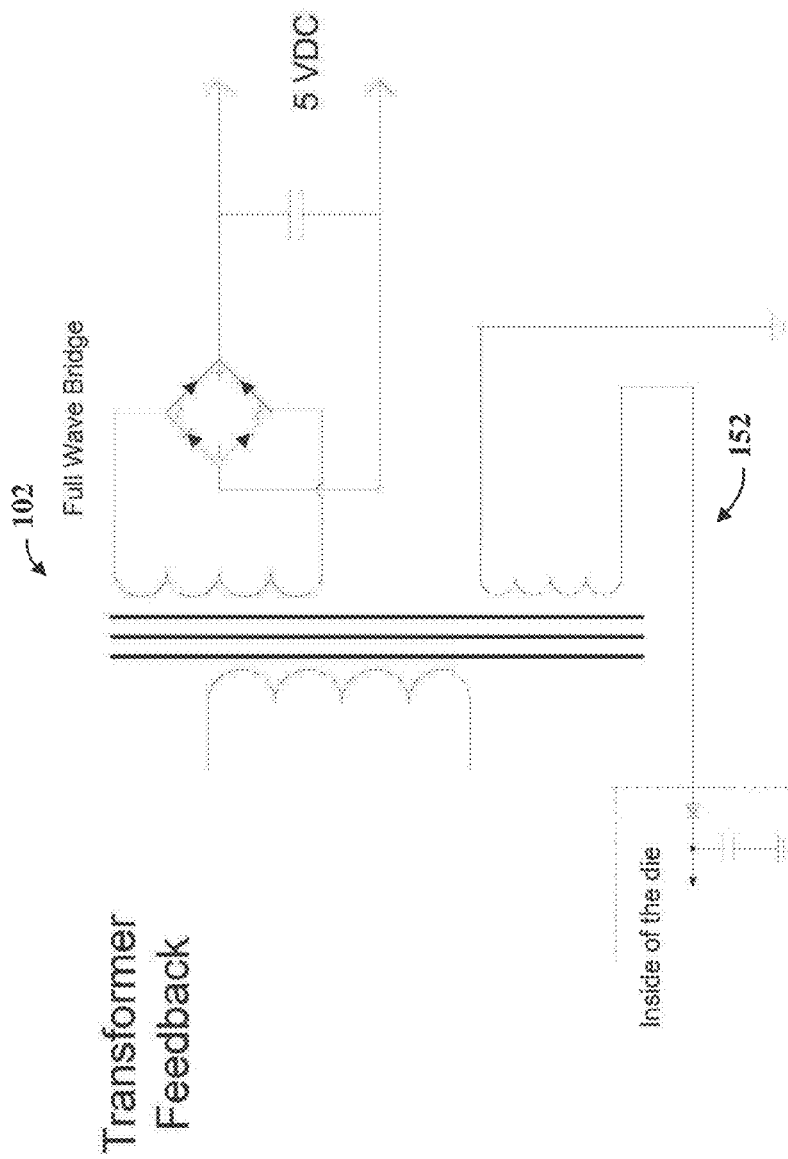
FIG. 40 is a schematic illustration of a portion of the power circuit shown in FIG. 2, according to an embodiment of the present invention.

FIGS. 38 and 39 are additional schematic illustrations of the power circuit 22. In one embodiment, the forward converter transformer 102 may include a tertiary winding 152 (shown in FIGS. 39 and 40) that may be used as a replica of the secondary side for current sensing. For example, some Tronium PSSoC applications can run at low voltages and a self driven synchronous rectifier may not be a reliable solution. More gate voltage would ensure a robust system. For example there will be an application for a 1.8 Volt DC output. Assume a 12:1 transformer and a 43 Volts CP_DAC2 setting, 3.6 VDC is the peak voltage on the secondary winding. A 12:2 auxiliary winding can be used to produce 7.2 Volts of gate drive for the synchronous rectifier FETs. The transformer design may include the auxiliary winding 152 on the secondary side to support this requirement.

Figure 41:
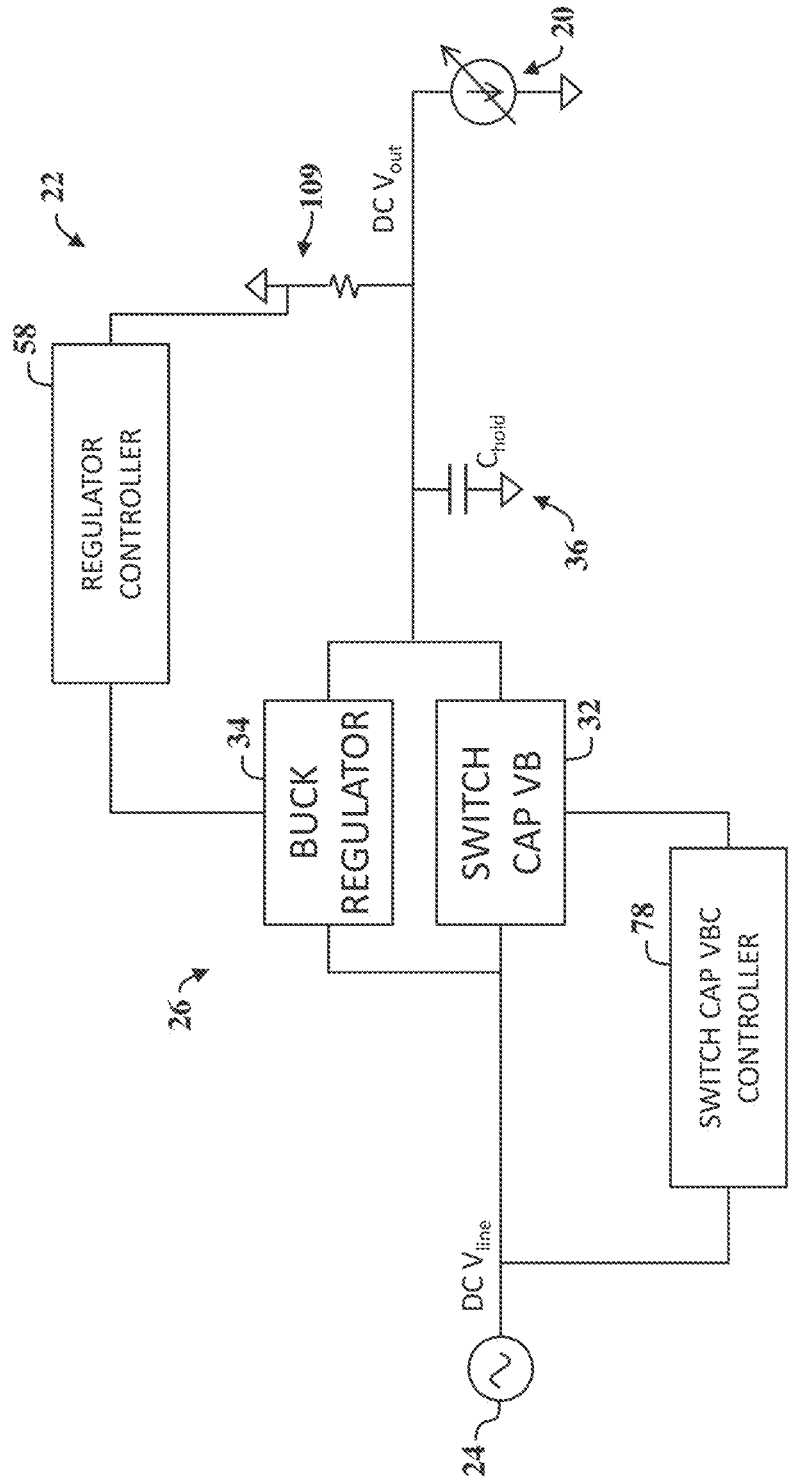
FIG. 41 is another schematic illustrations of the power circuit shown in FIG. 2, according to an embodiment of the present invention.

FIG. 41 is a schematic diagram of the power circuit 22 including a DC-DC conversion circuit. In the illustrated embodiment the power circuit 22 includes the switch capacitor voltage divider circuit 32 for receiving a DC input power signal and generating a DC output power signal having a lower voltage level. In one embodiment, the power circuit 22 may also include the switch-mode buck regulator 34 coupled in parallel with the SCVBC 32. The high-efficiency switch capacitor voltage divider circuit 32 includes a pair of flyback capacitors electrically coupled in either in parallel or series, depending on whether the primary function of that circuit block is to reduce voltage or increase current, and a plurality of switch assemblies that are electrically coupled to each of the pair of flyback capacitors. In one embodiment, the gates between the capacitors are shared. The switch assemblies may be operated to selectively deliver an input DC power signal to each of the pair of flyback capacitors during a charge phase, and to selectively deliver an output DC power signal to an electronic device during a discharge phase that has a lower voltage level than the input DC power signal. At least one switch assembly may include an N-channel MOSFET switch and a level shifter for delivering a control signal to the N-channel MOSFET switch. In addition, a charge pump may be coupled to the level shifter to receive the input DC power signal and generate an output power signal having a higher voltage level than the input DC signal. The output power signal is delivered to the level shifter for use in operating N-channel MOSFET switch (or closing for other types of MOSFETs). In addition, the switch capacitor voltage divider circuit may include a control circuit that includes a voltage sensing circuit for sensing a voltage level of the input DC power signal and a gain controller configured to select a gain setting of the switch capacitor voltage divider circuit as a function of the sensed voltage level and operate each of the plurality of switch assemblies as a function of the selected gain setting.

Figure 42:
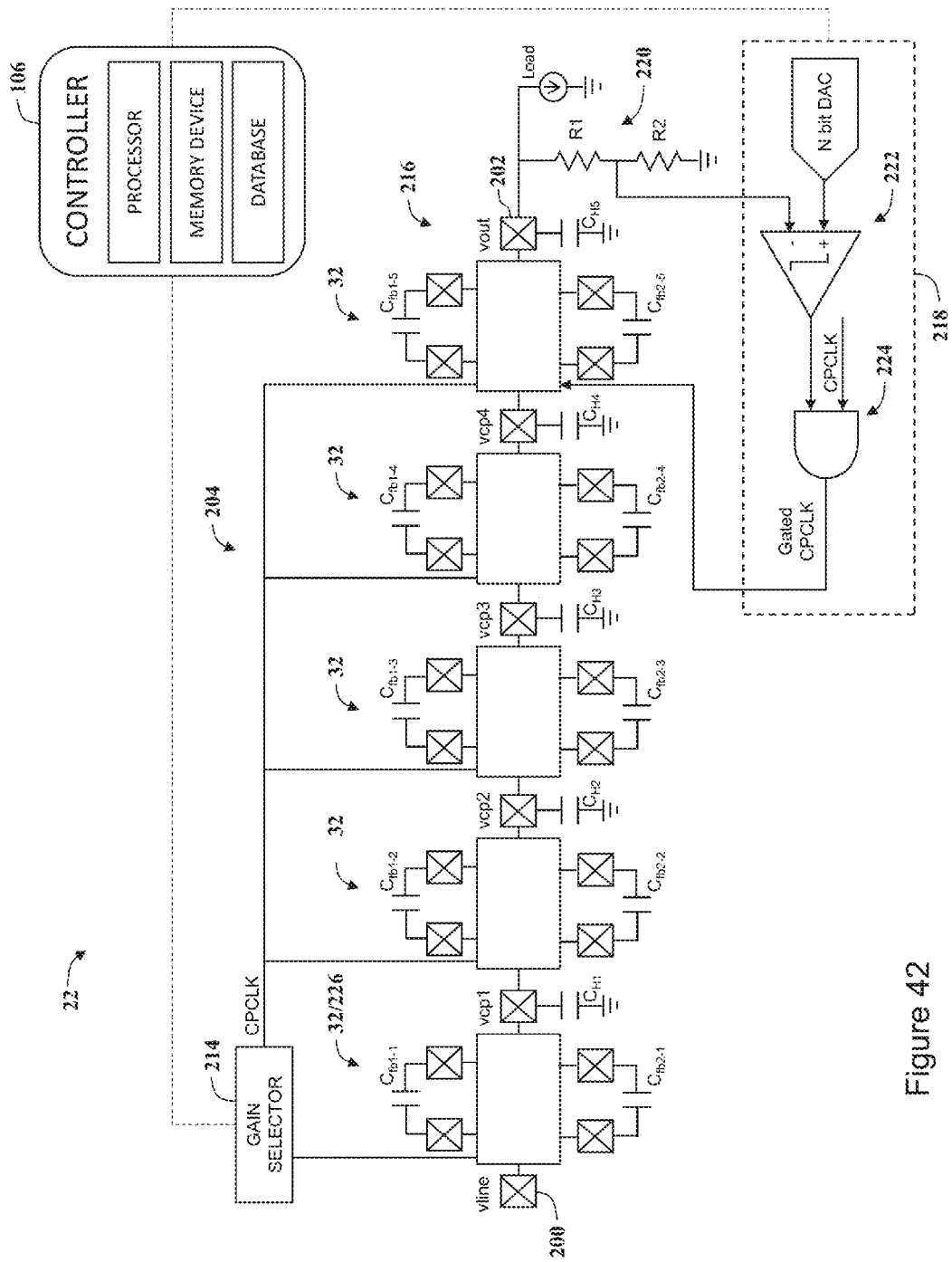
FIGS. 42-50 are additional schematics diagram of the electrical power circuit shown in FIG. 2, according to various embodiments of the present invention.

FIGS. 42-50 are additional schematics diagram of the electrical power circuit 22. FIG. 51 is a schematic diagram of a voltage reduction circuit cell 32 that may be used with the electrical power circuit 22. Referring to FIG. 42, in one embodiment, the power circuit 22 includes a DC-DC conversion circuit that includes multiple stages of voltage reduction circuit cells 32. In the illustrated embodiment, the power circuit 22 includes a circuit input terminal 200 that is configured to receive an input power signal, a circuit output terminal 202 that is configured to provide an output power signal to an electrical device, and a multi-stage voltage reduction circuit 204 that includes a plurality of voltage reduction circuit cells 32 that are coupled between the circuit input terminal 200 and the circuit output terminal 202 for receiving the input power signal and delivering the output power signal at a desired voltage level. In one embodiment, the output power signal is delivered at an output voltage level that is less than the voltage level of the input power signal. In another embodiment, the output power signal may have an output voltage level that is greater than, or approximately equal to, the voltage level of the input power signal.

In one embodiment, the multi-stage voltage reduction circuit 204 provides to following: 1) Universal Vline capability: 127v to 375v (DC); 2) No Buck Regulator; 3) No Forward Converter; 4) 5-8 Stage Regulated Charge Pump depending on the output voltage; 5) LT_Spice simulations run for 0.5v & 19.6v outputs at 127v & 375v line voltage; 6) 0.5v case for 50 mA load current; 7) 19.6v case for 200 mA load current; 8) 200 mA load current limited by Rdson/area of MOS switches; 9) Maximum efficiency achieved when low divide ratio's are applied to front end stages and high divide ratio's applied to the back end stages; 10) Only the final stage regulated, all other stages running unregulated for maximum efficiency; 11) 7.5µF fly back capacitors used; and 12) Downstream stages (~3 stages) with 20v devices to optimize area.

Referring to FIG. 51, in the illustrated embodiment, the voltage reduction circuit cell 32 includes a cell input terminal 206 that is configured to receive a cell input power signal, a cell output terminal 208 that is configured to provide an cell output power signal, a pair of flyback capacitors 70, a switching circuit 210 coupled to the flyback capacitors 70 for delivering power from the cell input terminal 206 to the cell output terminal 208, and a hold capacitor 36 that is coupled between the switching circuit 210 and the cell output terminal 208. The switching circuit 210 includes a plurality of switching devices 72 that are configured to operate the voltage reduction circuit cell 32 at a plurality of operational modes including a charge mode 66 (shown in FIG. 54), a discharge mode 68 (shown in FIG. 55), and a bypass mode 212 (shown in FIG. 65).

In the illustrated embodiment, the power circuit 22 also includes a controller, such as for example the power controller integrated circuit (Tronium PSSoC) 106, shown in FIGS. 16, 17A, and 17B. The controller 106 is coupled to each of the voltage reduction circuit cells 32 for operating each of the voltage reduction circuit cells 32 at the plurality of operational modes to receive the input power signal at the circuit input terminal 200 and deliver the output power signal at the circuit output terminal 202 at the desired voltage level. In one embodiment, the controller 106 includes a processor for executing operational programs for regulating the operation of the power circuit 22, a memory device for storing the operational programs that are accessible by the processor, and a database for storing various data for use in operating the power circuit 22 according to the embodiments described herein.

In the illustrated embodiment, the multi-stage voltage reduction circuit 204 includes a plurality of voltage reduction circuit cells 32 that are coupled together in series between the circuit input terminal 200 and the circuit output terminal 202. For example, as shown in FIG. 42, the power circuit 22 may include a first voltage reduction circuit cell 32 and a second voltage reduction circuit cell 32 that are coupled together in series between the circuit input terminal 200 and the output terminal. The cell input terminal 206 of the first voltage reduction circuit cell 32 is coupled to the circuit input terminal 200 for receiving the input power signal. The cell output terminal 208 is coupled to the cell input terminal 206 of the second voltage reduction circuit cell 32 to deliver a power signal to from the first voltage reduction circuit cell 32 to the second voltage reduction circuit cell 32. The cell output terminal 208 of the second voltage reduction circuit cell 32 may be connected to the circuit output terminal 202 or a cell input terminal 206 of another voltage reduction circuit cell 32.

In the illustrated embodiment, the controller 106 operates each voltage reduction circuit cell 32 to reduce a voltage level of the power signal being delivered from each corresponding voltage reduction circuit cells 32. For example, the controller 106 may operate the first voltage reduction circuit cell 32 to deliver an intermediate power signal to the second voltage reduction circuit cell 32 having a reduced voltage level, and operate the second voltage reduction circuit cell 32 to further reduce the voltage level of the power signal to deliver an output power signal having a voltage level that is less than the voltage level of the intermediate power signal. In the illustrated embodiment, the controller 106 operates each voltage reduction circuit cell 32 at a voltage division ratio, e.g., a gain setting, to sequentially reduce the voltage level of the input power signal to the desired voltage level of the output power signal.

In one embodiment, the controller 106 may include a gain selector 214 that is enabled by the algorithms, which is configured to determine a gain setting for each voltage reduction circuit cell 32 and generate and deliver a control signal to each voltage reduction circuit cell 32 to operate the voltage reduction cells 32 at the corresponding gain settings. For example, as shown in FIGS. 52-63, each voltage reduction cell circuit 32 is configured to operate in a plurality of gain settings. For example, in one embodiment, the voltage reduction circuit cell 32 may be operated at a gain setting of 1×, ⅔×, and/or a ½× gain setting. In one embodiment, the controller 106 may determine a gain setting for each of the plurality of voltage reduction circuit cells 32 as a function of a predefined output signal voltage level and generate and deliver the control signal to each of the voltage reduction circuit cells 32 as a function of the corresponding gain settings. In one embodiment, the gain settings of each of the voltage reduction circuit cells 32 is selected to deliver the output power signal at a desired voltage level and minimize power losses through the power circuit 22.

In one embodiment, the controller 106 is configured to operate one or more voltage reduction circuit cells 32 at different gain settings. For example, in one embodiment, the first voltage reduction circuit cell 32 may be regulated at a first capacitive gain setting and the second voltage reduction circuit cell 32 may be regulated at a second capacitive gain setting that is different from the first capacitive gain setting. In addition, the controller 106 may operate the first voltage reduction circuit cell 32 at a first capacitive gain setting that includes a voltage division ratio that is less than a voltage division ratio of the second capacitive gain setting to facilitate reducing the losses across each of the voltage reduction circuit cell stages and increase the overall power efficiency of the power circuit 22. For example, in one embodiment, the controller 106 may operate the first voltage reduction circuit cell 32 at a gain setting of ⅔×, and operate each subsequent voltage reduction circuit cell 32 at a gain setting of ½×.

In the illustrated embodiment, the multi-stage voltage reduction circuit 204 includes a regulated voltage reduction circuit cell 216. The controller 106 is configured to regulate the control signal delivered to the regulated voltage reduction circuit cell 216 to adjust a duty cycle of the control signal to maintain the voltage level of the output power signal at a desired voltage level and/or within a desired voltage level range. In one embodiment, the controller 106 may include a regulation control circuit 218 that includes a voltage scaler 220 including a pair of resistors for sensing a voltage level on the output power signal, and comparator 222, and a clock generator 224 for generating a modulated gated clock signal to the switching circuit 210. In one embodiment, the desired voltage level, Vref, may be a fixed voltage level and/or be received from the DAC, which can be regulated or unregulated. In addition, Vref may be received by the controller 106 from power device and/or via wireless communication. The comparator 222 compares the voltage signal received from the voltage scaler 220 with the desired voltage level and transmits a control signal to the clock generator 224. The clock generator receives the control signal from the comparator 222 and a control clock signal and generates a gated clock signal transmitting to the switching circuit 210.

In the illustrated embodiment, the controller 106 is configured to regulate the regulated voltage reduction circuit cell 216 independent of the gain setting of the regulated voltage reduction circuit cell 216. For example, in one embodiment, the gain selector 214 delivers a gain setting control signal to provide a course setting to operate the regulated voltage reduction circuit cell 216 at a determined gain setting, and the regulation control circuit 218 delivers a regulated control signal to provide a fine setting to regulate the regulated voltage reduction circuit cell 216 to deliver the output power signal at the desired voltage level. For example, in one embodiment, regulation of the regulated voltage reduction circuit cell 216 may include pulse skipping to partially charge/discharge the corresponding capacitors 70.

In one embodiment, for a given input power signal voltage level, the number of voltage reduction circuit cells 32 that are required to reduce the input power signal voltage to the desired output voltage level is less than the total number of voltage reduction circuit cells 32 included in the power circuit 22. The controller 106 may be configured to determine a voltage level of the input power signal, determine the predefined output signal voltage level, and determine a required number of voltage reduction circuit cells 32 needed to deliver the output power signal at a the desired voltage level. The controller 106 may also determine a gain setting of each voltage reduction circuit cells 32 as a function of the number of required voltage reduction circuit cells 32 and the desired output power signal voltage level, and generate and deliver control signals to each of the voltage reduction circuit cells 32 as a function of the corresponding gain settings.

In one embodiment, in order to operate the power circuit 22 with the required number of voltage reduction stages, the controller 106 may select one of the voltage reduction circuit cells 32 to receive the input power signal to begin reduction of the power signal voltage level. For example, in one embodiment, the controller 106 may select an input voltage reduction circuit cell 226 of the multi-stage voltage reduction circuit 204 for receiving the input power signal and operate the power circuit 22 to deliver the input power signal to the cell input terminal 206 of the selected input voltage reduction circuit cell 226. In one embodiment, the controller 106 may identify one or more bypass voltage reduction circuit cells from the plurality of cells 32 that are coupled between the circuit input terminal 200 and the input voltage reduction circuit cell 226 and operate the bypass voltage reduction circuit cells with a gain setting of 1× (shown in FIGS. 52-55) to deliver the input power signal from the circuit input terminal 200 through the bypass voltage reduction circuit cells 32 to the input voltage reduction circuit cell 226. In another embodiment, the controller 106 may be configured to operate the bypass voltage reduction circuit cells in a bypass mode 212 (shown in FIGS. 64-65) to deliver the input power signal through the bypass voltage reduction circuit cells 32 and to the input voltage reduction circuit cell 226. The point of the bypass circuits being that the higher voltage Mux Core Cells and their devices may be avoided if the input voltage (for instance 48 volts DC rather than 110 volts AC) is less than the higher voltage Mux Core Cell. For instance, if 220 AC is the input voltage, then at least a 400 volt Mux Core Cell must be used as the first voltage division block. Then lower voltage Mux Core Cells would follow down to the target voltage output, which could be 2 or more conversion Mux Core Cells. However, if the input voltage is lower, for instance in the case of a telecom type input signal of 48 volts, then the Mux Core Cell voltage conversion blocks which have devices and break down voltages higher than 48 volts would be avoided, so that the 1:1 gain setting, and it's associated losses would not need to be introduced into the cascade of Mux Core Cell voltage division blocks.

Likewise, the signal may exit at any one of the cascaded Mux Core Cells so that a target voltage can be easily accomplished which would be higher than the lower voltage Mux Core Cells further down the chain. Also, the signal can exit at any stage of the Mux Core Cell cascade so that a transformer can be added to the circuitry. For instance a 220VAC signal may be the Vline input, and when a target range of voltage division of 50 volts has been accomplished, then the signal could be introduced into a transformer for the final and further conversions.

In one embodiment, the power circuit 22 may include at least one of the voltage reduction circuit cells 32 may include switching devices 72, such as for example MOSFETS, having voltage ratings that are less than a voltage rating of another voltage reduction circuit cell 32. For example, the first voltage reduction circuit cell 32 may include MOSFETS having a voltage rating that is higher than the voltage rating of the MOSFETS include in the second voltage reduction circuit cell 32. In addition, the first voltage reduction circuit cell 32 may be operated at a gain setting that delivers the intermediate power signal at a reduced voltage level, which enables the second voltage reduction circuit cell 32 receiving the intermediate power signal to include MOSFETS with lower voltage ratings determined as a function of the voltage level of the intermediate power signal. For example, in one embodiment, the power circuit 22 may include 4-stages of voltage reduction circuit cells 32 with gain settings of 0.5×, 0.5×, 0.5×, and 0.5×, respectively, receiving an input power signal having a line voltage, Vline, approximately equal to 373VDC and delivering an output power signal having an output voltage level approximately equal to 23VDC. In this example, during operation of the power circuit 22, the intermediate power signals delivered from the cell output terminal 208 of each voltage reduction stage is approximately 186VDC, 93VDC, 47VDC, and 23VDC, respectively. The corresponding voltage rating of the switching devices 72 include in each of the four stages is approximately 400V for the $1^{st}$ stage, 200V for the $2^{nd}$ stage, 100V for the $3^{rd}$ stage, and 50V for an the $4^{th}$ stage.

Figure 44:
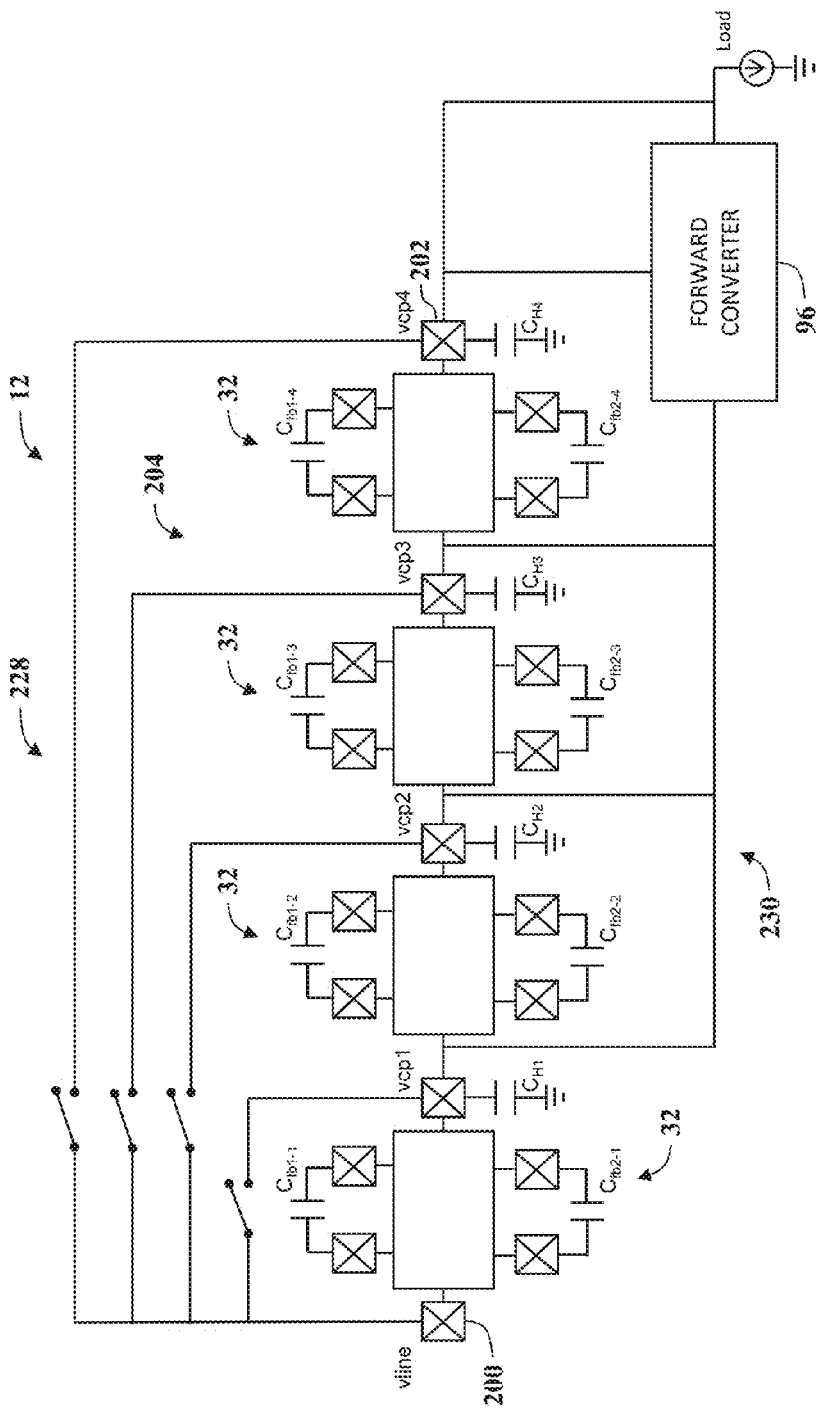

Referring to FIG. 44, in one embodiment, the power circuit 22 may include an input bypass circuit 228 that is connected between the circuit input terminal 200 and each voltage reduction circuit cells 32. The input bypass circuit 228 may include a plurality of switching devices 72 to enable the input power signal to be delivered to any of the voltage reduction circuit cells 32 within the power circuit 22. For example, in one embodiment, the controller 106 may operate the input bypass circuit 228 to bypass the bypass voltage reduction circuit cells to deliver the input power signal from the circuit input terminal 200 to the input voltage reduction circuit cell 226.

In the illustrated embodiment, the power circuit 22 may include a forward converter 96 that is coupled to the multi-stage voltage reduction circuit 204 for receiving an intermediate power signal from the multi-stage voltage reduction circuit 204 and deliver the output power signal at the desired voltage level. The power circuit 22 including the multi-stage voltage reduction circuit 204 and the forward converter 96 delivers a power source up to 4.5 A current; requires a 2 stage Charge Pump (CP); and the CP can source up to 200 mA of load current, buck not required (4 component reduced).

In addition, the power circuit 22 may be configured to deliver the intermediate power signal from any of the voltage reduction circuit cells 32 included in the multi-stage voltage reduction circuit 204. For example, in one embodiment, the controller 106 may select an output voltage reduction circuit cell from the plurality of voltage reduction circuit cells 32 to deliver the intermediate power signal to the forward converter 96. The controller 106 may also select the output voltage reduction circuit cell as a function of a predefined desired output signal voltage level, operate the selected output voltage reduction circuit cell to couple the output voltage reduction circuit cell to the forward converter 96 to deliver an intermediate power signal from the multi-stage voltage reduction circuit 204 to the forward converter 96, and regulate the forward converter 96 to deliver the output power signal to the circuit output terminal 202.

The controller 106 may also be configured to identify one or more bypass voltage reduction circuit cells 32 that are coupled between the forward converter 96 and the output voltage reduction circuit cell and operate the bypass voltage reduction circuit cells 32 in a bypass mode 212 or with a 1× gain setting to deliver the intermediate power signal from the output voltage reduction circus cell through the bypass voltage reduction circuit cells to the forward converter 96.

In one embodiment, the power circuit 22 may include an output bypass circuit 230 that is connected between the forward converter 96 and each voltage reduction circuit cells 32 to enable the intermediate power signal to be delivered from any of the voltage reduction circuit cells 32 to the forward converter 96. For example, in one embodiment, the controller 106 may operate to disconnect one or more bypass voltage reduction cells from the multi-stage voltage reduction circuit and deliver the intermediate power signal from the output voltage reduction circuit cell through the bypass circuit 230 to the forward converter 96. For example, in one embodiment, the controller 106 may open one or more of the switching devices 72 of the selected bypass voltage reduction circuit cell to disconnect the selected bypass voltage reduction circuit cell.

In an alternative embodiment, power circuit 22 may use, for instance, eight stages for a given output, knowing that only four stages are needed for US (110V) or five stages for Europe (220V) to get to a target voltage such as, for example, 5v, and then operate the last one of more stages to connect by circuitry these last one or more stages to boost current from 10 W to 20 W.

Figure 43:
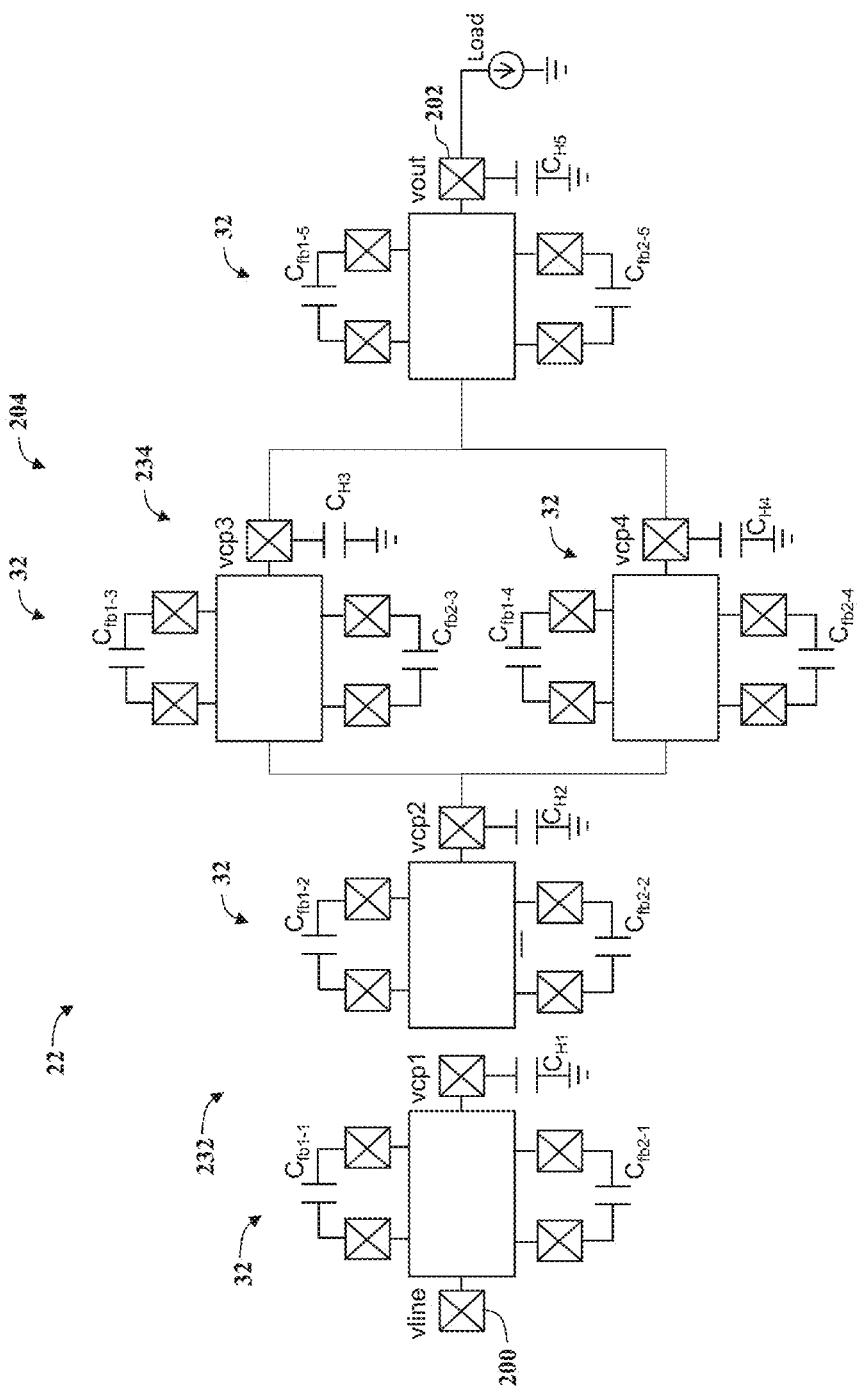

Referring to FIG. 43, in one embodiment, the multi-stage voltage reduction circuit 204 may include two or more voltage reduction circuit cells 32 that are electrically coupled in parallel. For example, the multi-stage voltage reduction circuit 204 may include a first set 232 of voltage reduction circuit cells 32 that are electrically coupled together in series and a second set 234 of voltage reduction circuit cells 32 that are electrically coupled together in parallel. The second set 234 of voltage reduction circuit cells 32 is configured to increase a current level of the output power signal being generated by the multi-stage voltage reduction circuit 204. In one embodiment, the second set 234 of voltage reduction circuit cells 32 is coupled between the first set 232 of voltage reduction circuit cells and the circuit output terminal 202 to facilitate increasing a current level of the output power signal being delivered to the circuit output terminal 202. In another embodiment, the second set 234 of voltage reduction circuit cells 32 may be coupled between the circuit input terminal 200 and the first set 232 of voltage reduction circuit cells 32. In yet another embodiment, the second set 234 of parallel voltage reduction circuit cells 32 may be coupled between two sets of voltage reduction circuit cells 32 coupled in series.

Figure 45:
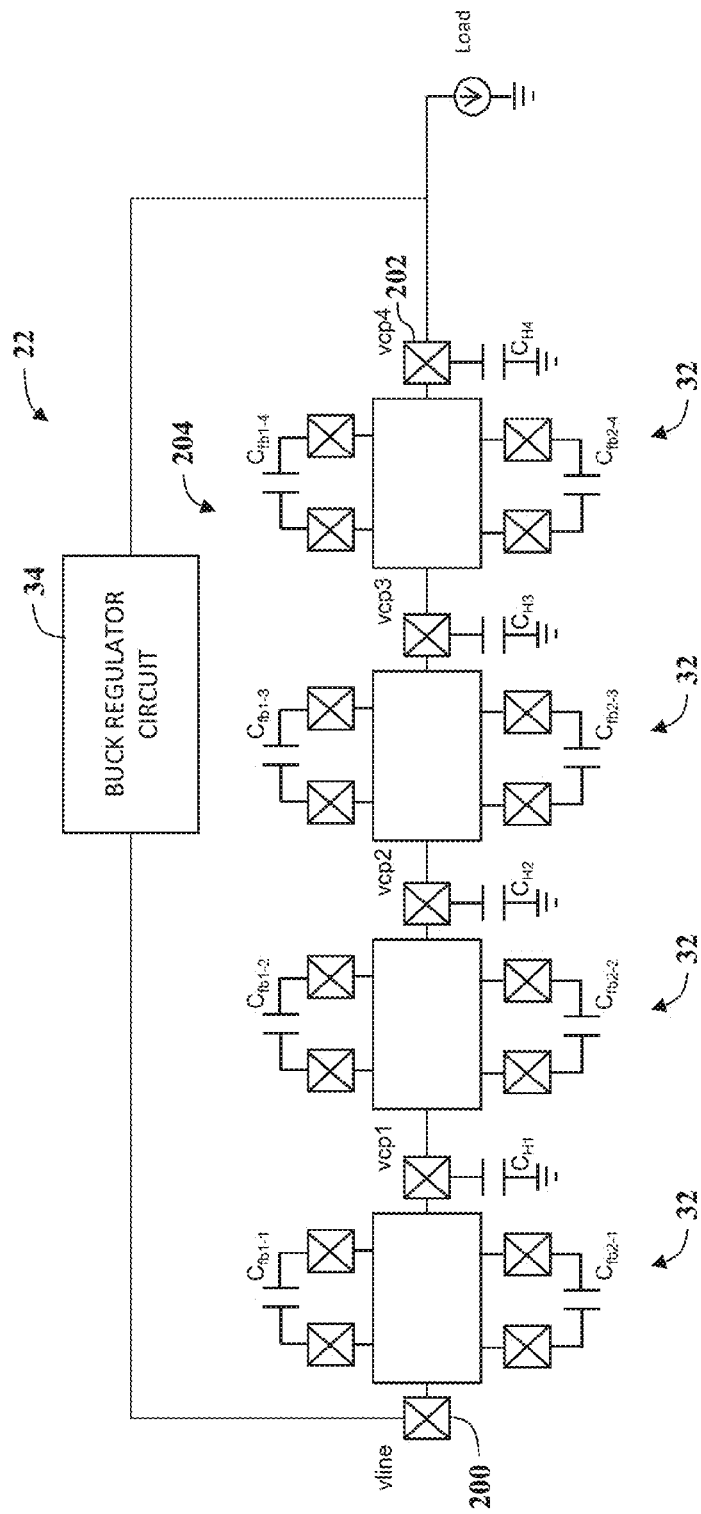

Referring to FIG. 45, in one embodiment, the power circuit 22 may include the multi-stage voltage reduction circuit 204 and a buck regulator 34. In one embodiment, the buck regulator 34 may be coupled between the circuit input terminal 200 and the circuit output terminal 202 and coupled in parallel with the multi-stage voltage reduction circuit 204. In another embodiment, the buck regulator 34 may be coupled in series with the multi-stage voltage reduction circuit 204. The controller 106 may be configured to operate the buck regulator 34 to facilitate increasing a current level of the output power signal.

Figure 46:
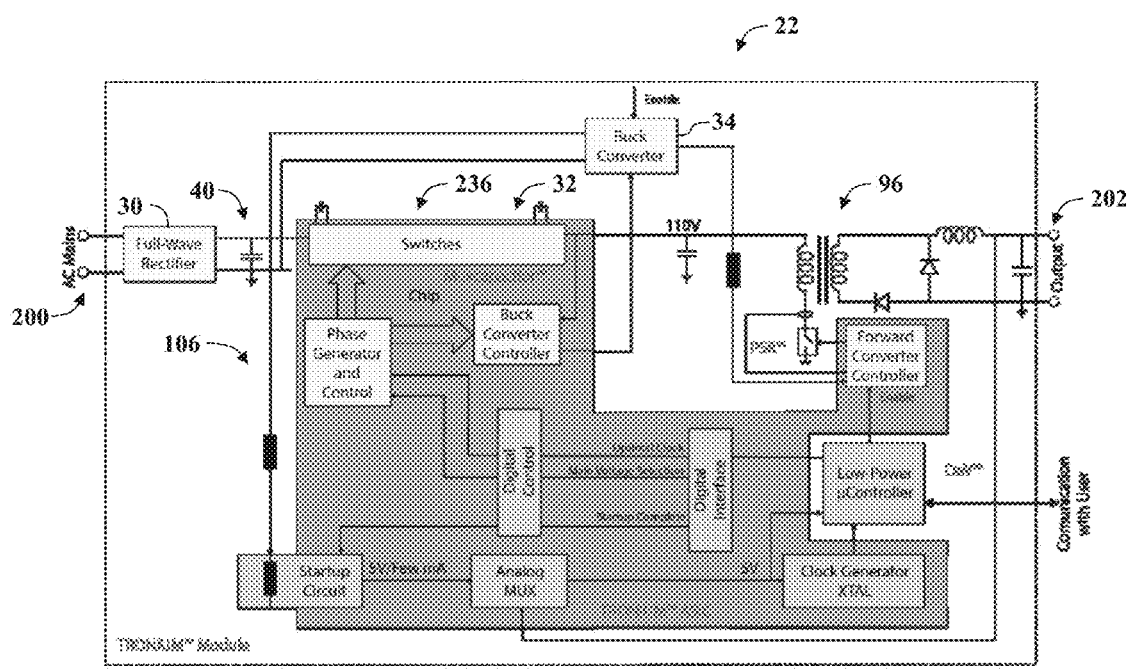
Figure 47:
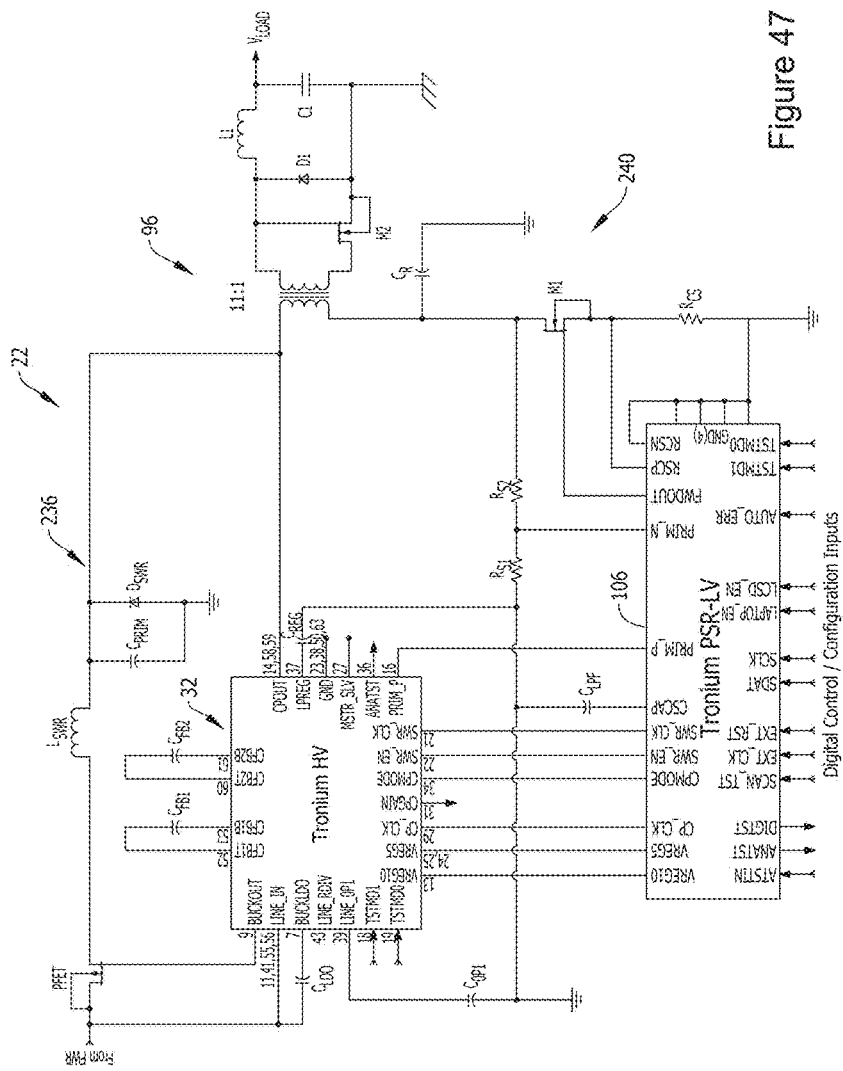
Figure 48:
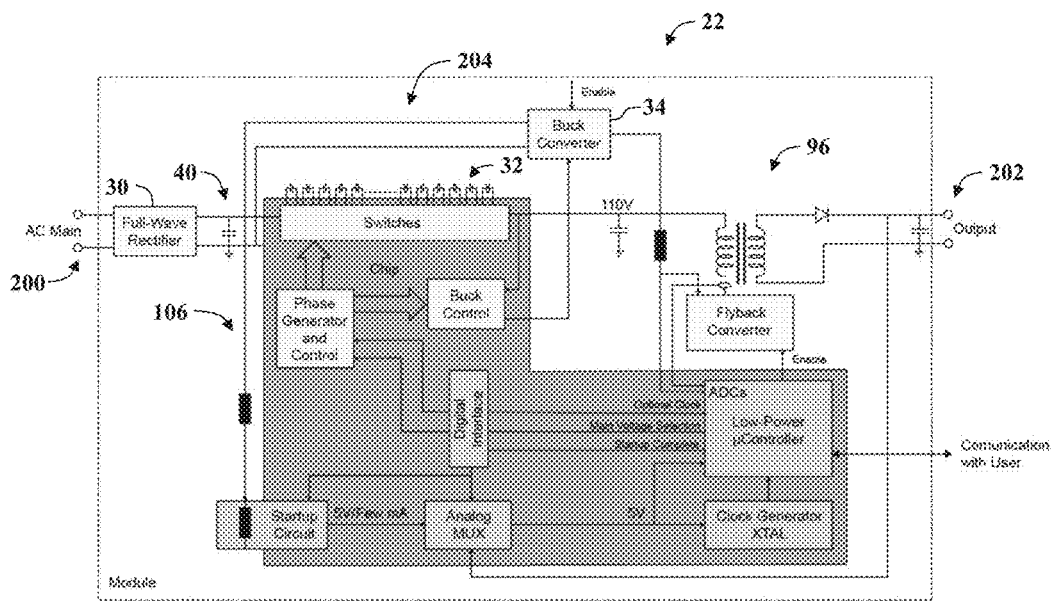

Referring to FIGS. 46 and 47, in one embodiment the power circuit 22 may include a single-stage voltage reduction circuit 236 including one voltage reduction circuit cell 32, a buck regulator 34, and a forward converter 96 coupled to the buck regulator 34 and voltage reduction circuit cell 32. The controller 106 may be configured to determine a desired current level of the output power signal and select the buck regulator 34 or the single-stage voltage reduction circuit 236 to receive the input power signal and deliver the intermediate power signal at a reduced voltage level to the forward converter 96. The controller 106 may also regulate the forward converter 96 to receive the intermediate power signal and deliver the output power signal at the desired voltage level. In addition, the controller 106 may be configured to operate the buck regulator 34 and the single-stage voltage reduction circuit 236 simultaneously to deliver the intermediate power signal to the forward converter 96. In another embodiment, as shown in FIG. 48, the power circuit 22 may include the multi-stage voltage reduction circuit 204 including a plurality of voltage reduction circuit cells 32, the buck regulator 34, and the forward converter 96 for delivering power signals from the buck regulator 34 and multi-stage voltage reduction circuit 204 to the circuit output terminal 204.

Figure 49:
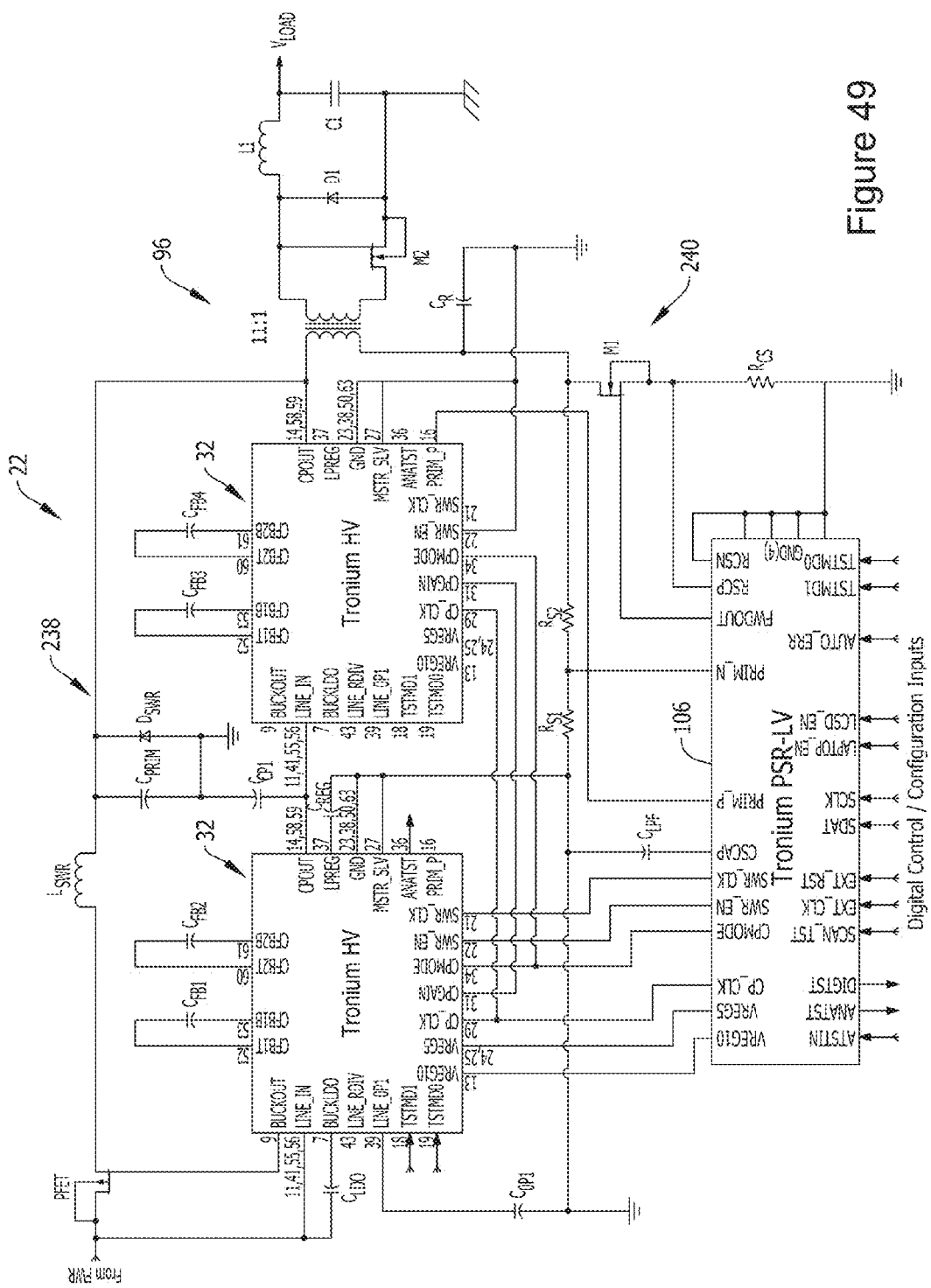
Figure 50:
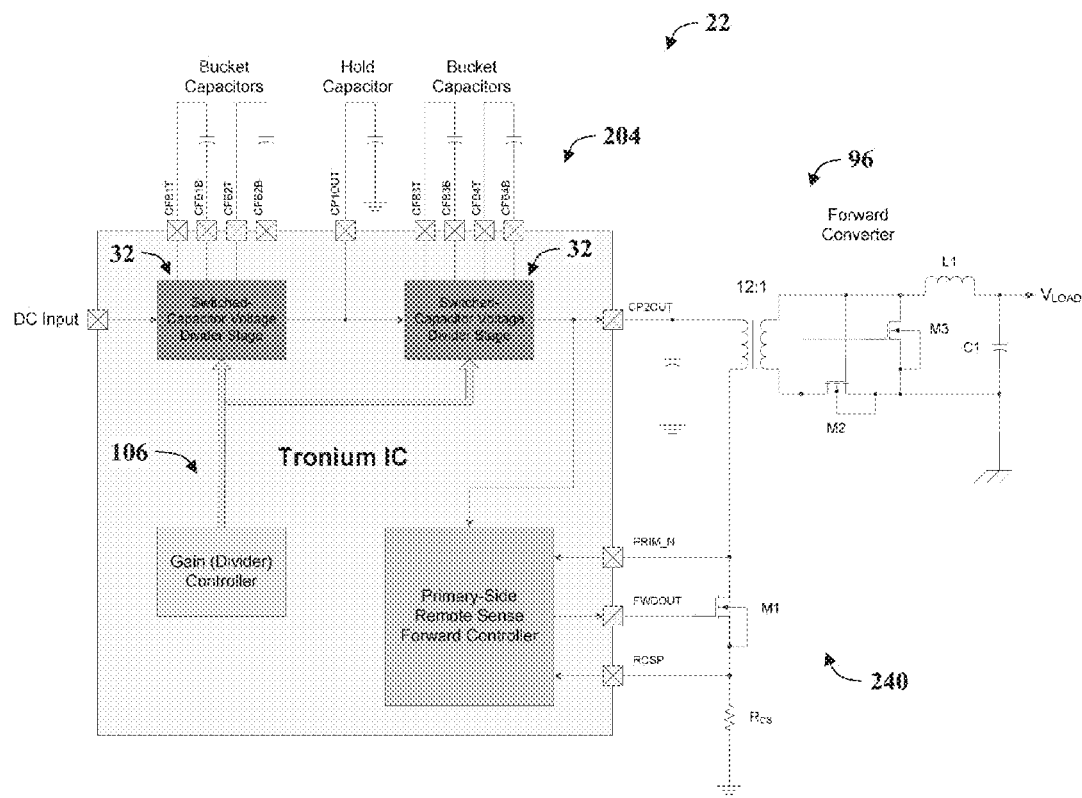
Figure 51:
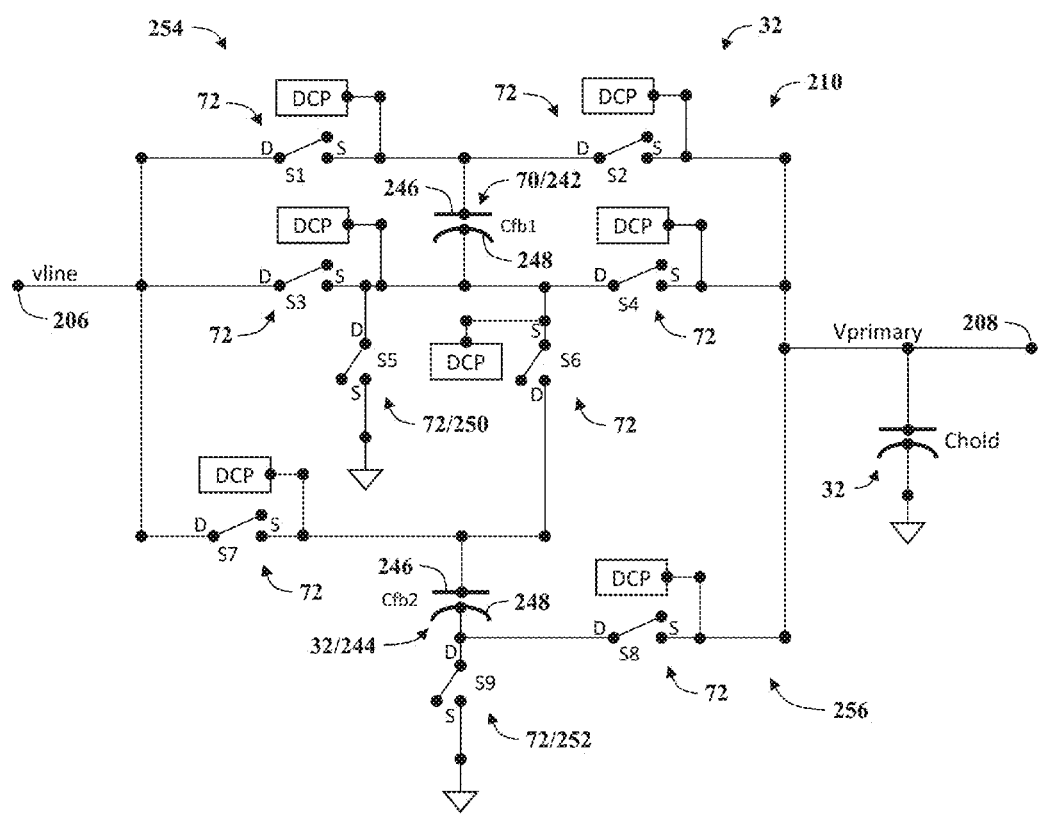
FIG. 51 is another schematic diagram of a voltage reduction circuit cell shown in FIG. 8 that may be used with the electrical power circuit shown in FIGS. 2 and 42-50, according to an embodiment of the present invention.

In one embodiment, shown in FIGS. 49 and 50, the power circuit 22 may include a two-stage voltage reduction circuit 238 coupled to a forward converter 96. The two-stage voltage reduction circuit 238 includes two voltage reduction circuit cells coupled in series. In the illustrated embodiment, the power circuit 22 includes a primary side regulation circuit 240 for regulating the forward converter 96 to deliver the output power signal at a desired voltage level.

Referring to FIG. 46, in one embodiment, the power circuit 22 may include a rectifier circuit 30 and an input filter capacitor 40 that is coupled to the single-stage voltage reduction circuit 236 for providing rectified DC power single to the single-stage voltage reduction circuit 236. The rectifier circuit 30 is coupled between the single-stage voltage reduction circuit 236 and the circuit input terminal 200 for receiving an AC power signal from the input power terminal 200 and delivering a rectified DC power signal to the single-stage voltage reduction circuit 236. Similarly, in one embodiment shown in FIG. 48, the power circuit 22 may include a rectifier circuit 30 and an input filter capacitor 40 coupled between the input power terminal 200 and the multi-stage voltage reduction circuit 204 for receiving an AC power signal from the input power terminal 200 and delivering a rectified DC power signal to the multi-stage voltage reduction circuit 204. In one embodiment, the power circuit 22 may not include the input filter capacitor 40, and the input filter capacitor 40 can be removed because the power circuit 22 can be configured to provide constant current through the capacitors in the first high voltage stage 32 of the single-stage voltage reduction circuit 236 and/or the multi-stage voltage reduction circuit 204.

Referring again to FIGS. 8 and 51, in the illustrated embodiment, the voltage reduction circuit cell 32 includes a cell input terminal 206 that is configured to receive an input power signal, a cell output terminal 208 that is configured to provide an output power signal, a first capacitor 242, a second capacitor 244, and a switching circuit 210 that includes a plurality of switching devices 72 that are coupled to the first capacitor 242 and the second capacitor 244 for delivering power from the cell input terminal 206 to the cell output terminal 208. The voltage reduction circuit cell 32 also includes a hold capacitor 36 that is coupled between the switching circuit 210 and the cell output terminal 208. The cell output terminal 208 is configured to be coupled to a cell input terminal 206 of another voltage reduction circuit cell 32 to facilitate use of the voltage reduction circuit cell 32 in a multi-stage voltage reduction circuit 204. Each capacitor 242, 244, 36 includes a positive top plate 246 and a negative bottom plate 248. The controller 106 is coupled to the switching circuit 210 and is configured to operate the switching circuit 210 in a plurality of operational modes to deliver an output power signal at a desired voltage level.

In the illustrated embodiment, the voltage reduction circuit cell 32 includes nine switching devices 72 (S1, S2, S3, S4, S5, S6, S7, S8, S9). In the illustrated embodiment, each switching device 72 includes a MOSFET switch having a source, drain, and gate. In one embodiment, each switching device 72 includes an N-channel MOSFET. In another embodiment, one or more switching devices 72 includes a P-channel MOSFET. As shown in FIG. 51, the switching circuit 210 includes at least two switching devices 72 (e.g., S5, S9) that are coupled to ground. For example, the switching circuit 210 includes a first switching device 250 (e.g., S5) that is coupled to the first capacitor 242 for coupling the negative plate 248 of the first capacitor 242 to ground and includes a second switching device 252 (e.g., S9) that is coupled to the second capacitor 244 for coupling the negative plate 248 of the second capacitor 244 to ground. The switching circuit 210 also includes a set of switching devices 72 (e.g., S1, S3, S7) having corresponding drains that are coupled to the cell input terminal 206, and a different set of switching devices 72 (e.g., S2, S4, S8) having the corresponding sources that are coupled to the cell output terminal 208. In addition, the switching device 72 includes a first set 254 of switching devices 72 (e.g., S1, S3, S7) that are coupled between the cell input terminal 206 and the first and second capacitors 240, 242, and a second set 256 of switching devices 72 (e.g., S2, S4, S8) that are coupled between the first and second capacitors 242, 244 and the cell output terminal 208. The switching circuit 210 includes at least two switching devices 72 (e.g., S1, S2) that are coupled to the positive plate 246 of the first capacitor 242 and at least two different switching devices (e.g., S6, S7) that are coupled to the positive plate 246 of the second capacitor 244. The switching circuit 210 also includes at least one switching device 72 (e.g., S6) that is coupled between the negative plate 248 of the first capacitor 242 and the positive plate 246 of the second capacitor 244.

In the illustrated embodiment, each switching device 72 includes a level shifter 92, with one or more of the switching devices 72 also inducing a charge pump 94 coupled to the corresponding level shifter 92. In one embodiment, the switching circuit 210 may include a charge pump 94 coupled to each level shifter 92. In another embodiment, as shown in Figured 51, the switching circuit 210 may include one or more shared charge pumps 94 that are coupled to two or more switching devices 72 such that the total number of charge pumps 94 included in the switching circuit 210 is less than a total number of switching devices 72.

In addition, the voltage reduction circuit cell 32 may be operated at a gain setting that delivers a power signal at a reduced voltage level, which enables at least some of the switching devices 72 included in the switching circuit 210 to include lower voltage ratings than other switching devices 72 included in the switching circuit 210. For example, in one embodiment, the switching circuit 210 may include a set of switching devices 72, e.g S4, S5, S8, and S9 that has lower voltage rating than the other switching devices 72, e.g., S1, S2, S3, S6, and S7.

Figure 62:
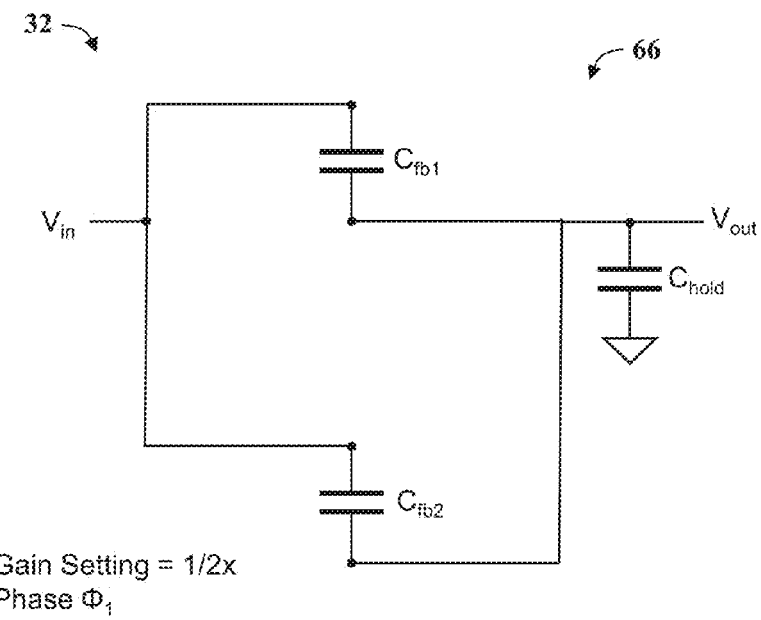
Figure 63:
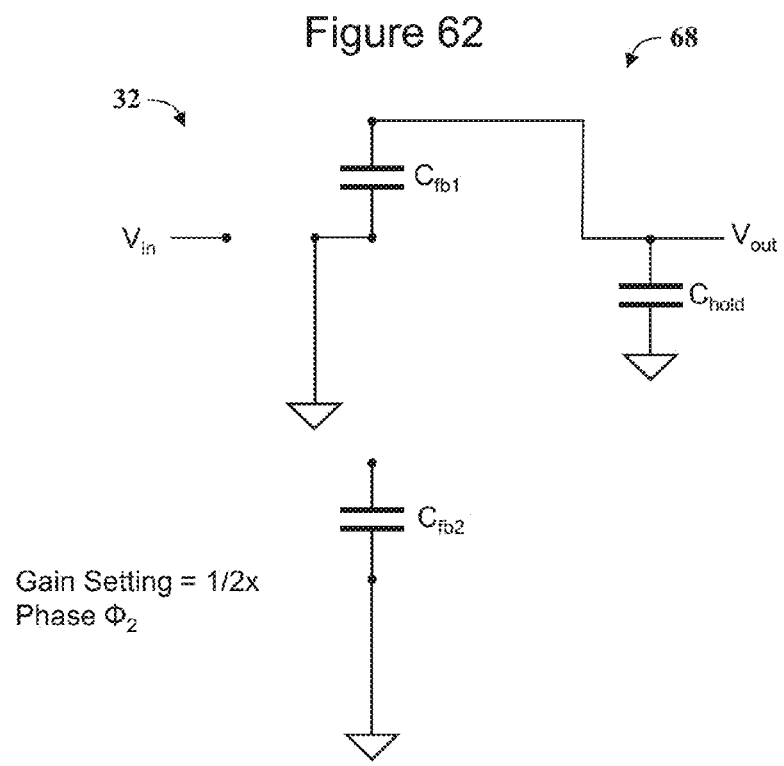
Figure 64:
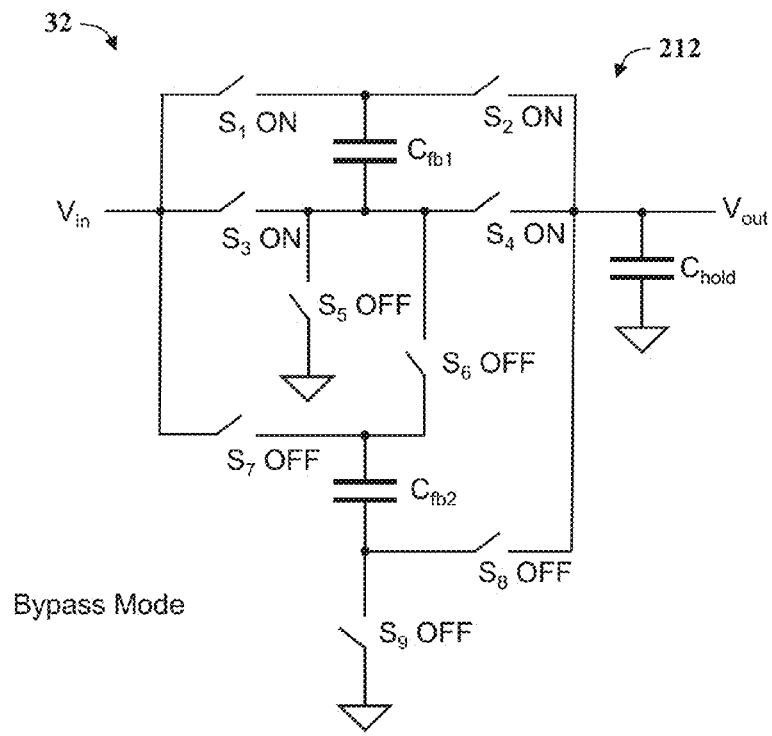
FIGS. 64 and 65 are schematic diagrams of the voltage reduction circuit cell in a bypass mode, according to an embodiment of the present invention.
Figure 65:
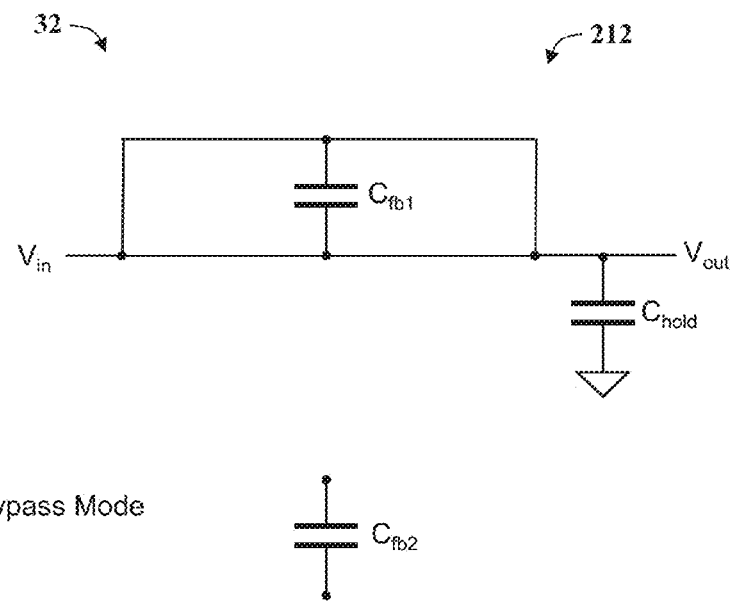

FIGS. 52-55 are schematic diagrams of the voltage reduction circuit cell 32 with a 1× gain setting, FIGS. 56-59 are schematic diagrams of the voltage reduction circuit cell 32 with a ⅔× gain setting, FIGS. 60-63 are schematic diagrams of the voltage reduction circuit cell 32 with a ½× gain setting, FIGS. 64 and 65 are schematic diagrams of the voltage reduction circuit cell 32 in a bypass mode, and FIG. 69 is a data table illustrating gain settings for use with the voltage reduction circuit cell 32.

Figure 52:
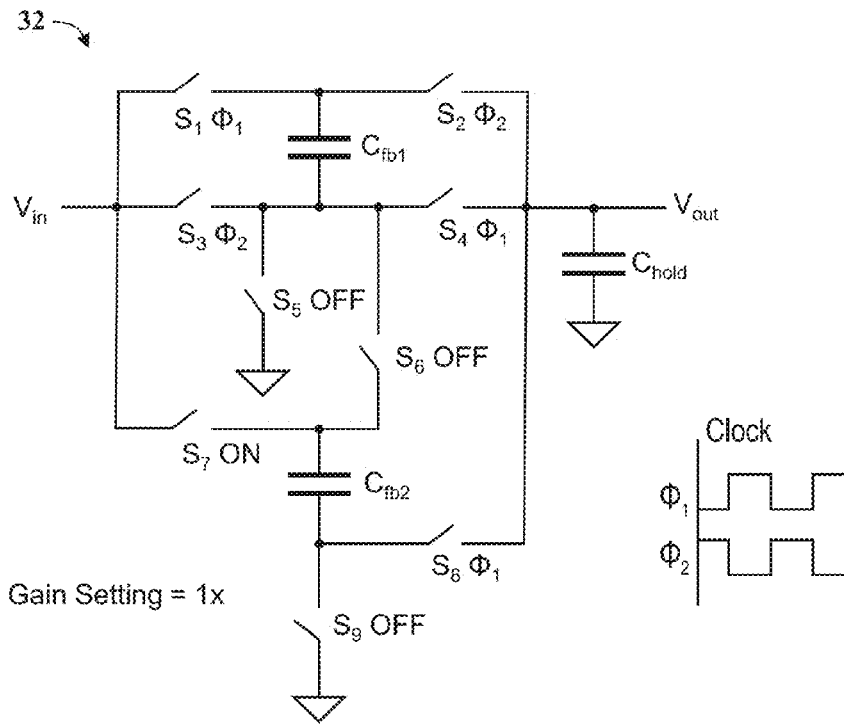
FIGS. 52-55 are schematic diagrams of the voltage reduction circuit cell with a 1× gain setting, according to an embodiment of the present invention.

In the illustrated embodiment, the voltage reduction circuit cell 32 is configured to operate in a plurality of operation modes. The controller 106 is coupled the switching circuit 210 and is configured to operate the switching circuit 210 in a plurality of operational modes to deliver the output power signal at a desired voltage level. For example, as shown in FIGS. 52-63, the controller 106 is configured to operate the voltage reduction circuit cell 32 between a charge mode 66 and a discharge mode 68. In addition, the controller 106 may select a gain setting associate with the voltage reduction circuit cell 32 and deliver a control signal to the switching circuit 210 to operate the voltage reduction circuit cell 32 between the charge mode 66 and the discharge mode 68 at the selected gain setting. As shown in FIG. 52, the controller 106 may be configured to deliver a controller signal having a first clock phase, $\Phi_1$, and a second clock phase $\Phi_2$. As shown in FIG. 69, the controller 106 may determine the clock phase signal delivered to each of the switching devices 72 as a function of the selected gain setting for the voltage reduction circuit cell 32.

Figure 54:
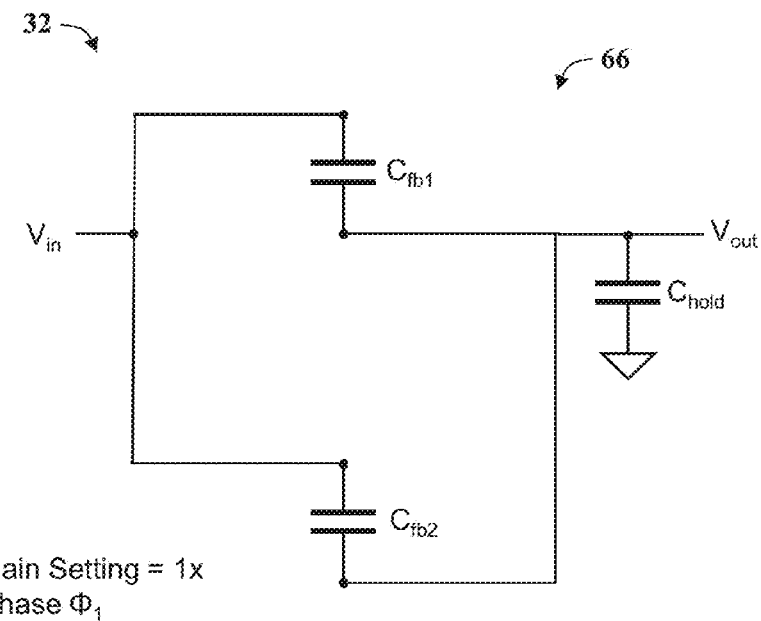
Figure 58:
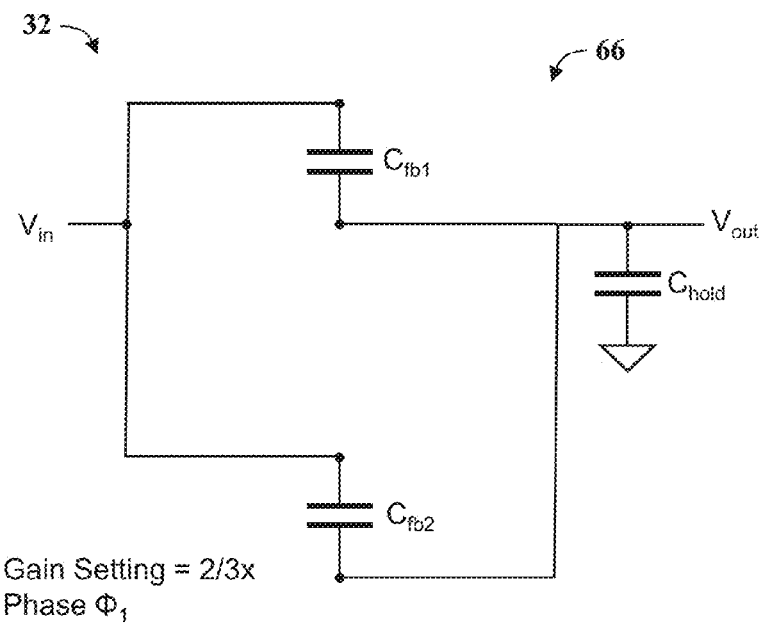

Referring to FIGS. 54, 58, and 62, the controller 106 configured to operate the switching circuit 210 in the charge mode 66 to couple a positive plate 246 of each of the first and the second capacitors 242, 244 to the cell input terminal 206 and to couple a negative plate 248 of each of the first and the second capacitors 242, 244 to the hold capacitor 36. For example, referring to FIGS. 9 and 51, in the charge mode 66, the controller 106 operates switching devices S1, S4, S7, and S8 to an "on" position, and operates switching devices S2, S3, S5, S6, and S9 to an "off" position.

Figure 53:
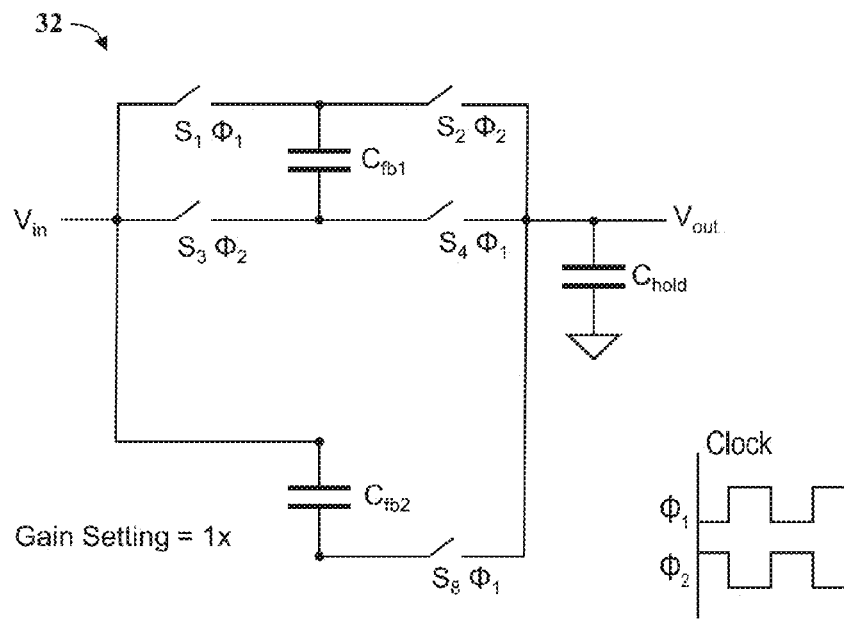
Figure 55:
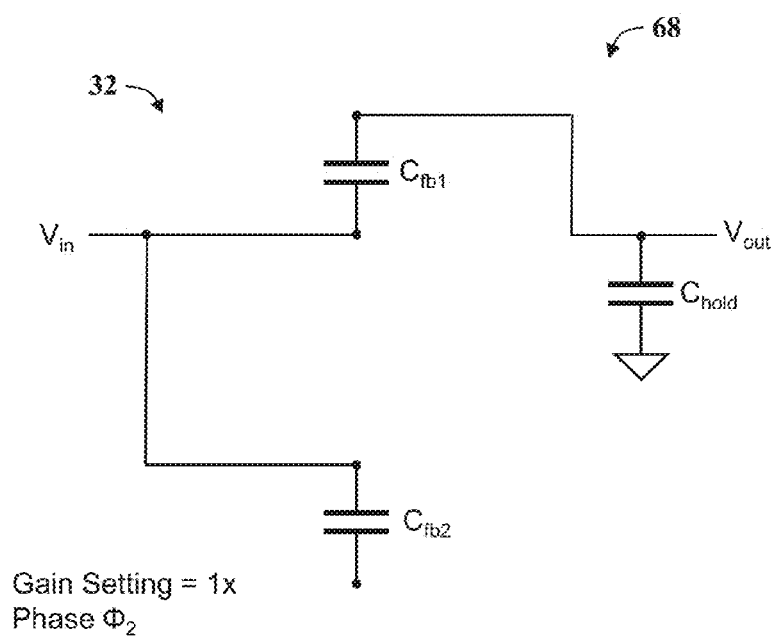

FIGS. 52 and 53 illustrate the operational states of the switching devices 72 for a gain setting of 1×. FIG. 55 illustrates the voltage reduction circuit cell 32 in the discharge mode 68 to achieve a voltage division of 1×. In the illustrate embodiment, as shown in FIGS. 52-55, the voltage reduction circuit cell 32 is configured to operate with a gain setting of 1×. For example, to achieve a gain setting of 1×, the controller 106 is configured to operate the switching circuit 210 in the discharge mode 68 to couple the cell input terminal 206 to the negative plate 248 of the first capacitor 242 and to the positive plate 246 of the second capacitor 244, to couple the negative plate 248 of the second capacitor 244 to ground, and to couple the positive plate 246 of the first capacitor 242 to the hold capacitor 36. Referring to FIGS. 9 and 51, in the discharge mode 68, for a gain setting of 1×, the controller 106 operates switching devices S2, S3, and S7 to the "on" position, and operates switching devices S1, S4, S5, S6, S8, and S9 to the "off" position. In one embodiment, referring to FIG. 69, to operate the voltage reduction circuit cell 32 between the charge mode 66 (shown in FIG. 54) and the discharge mode 68 (shown in FIG. 55) to achieve a voltage reduction of 1×, the controller 106 may operate a first set of switching devices 72 (e.g., S1, S4, S8) in the first clock phase, $\Phi_1$, an operate a second set of switches 72 (e.g., S2, S3) in the second clock phase, $\Phi_2$.

Figure 56:
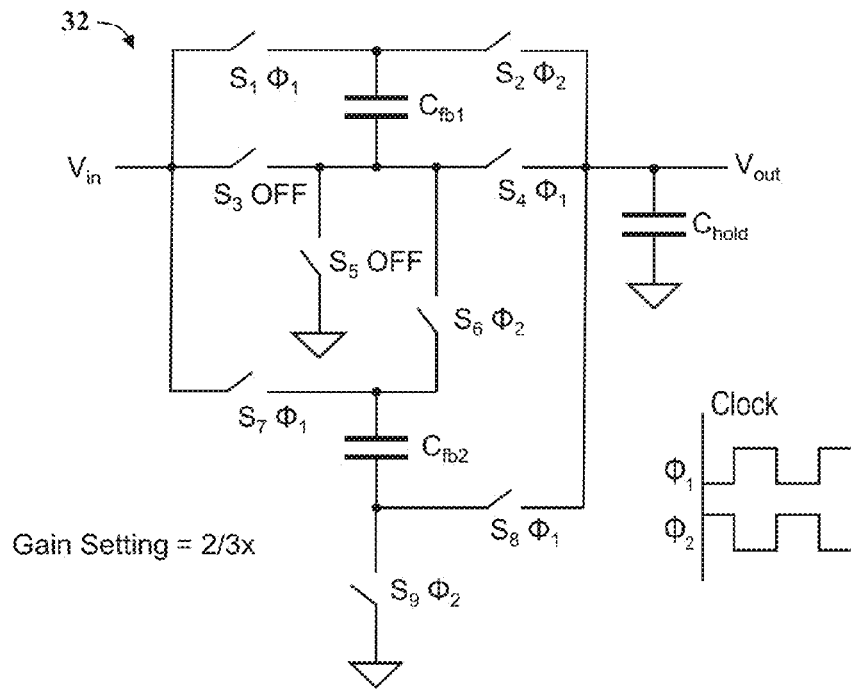
FIGS. 56-59 are schematic diagrams of the voltage reduction circuit cell with a ⅔× gain setting, according to an embodiment of the present invention.
Figure 57:
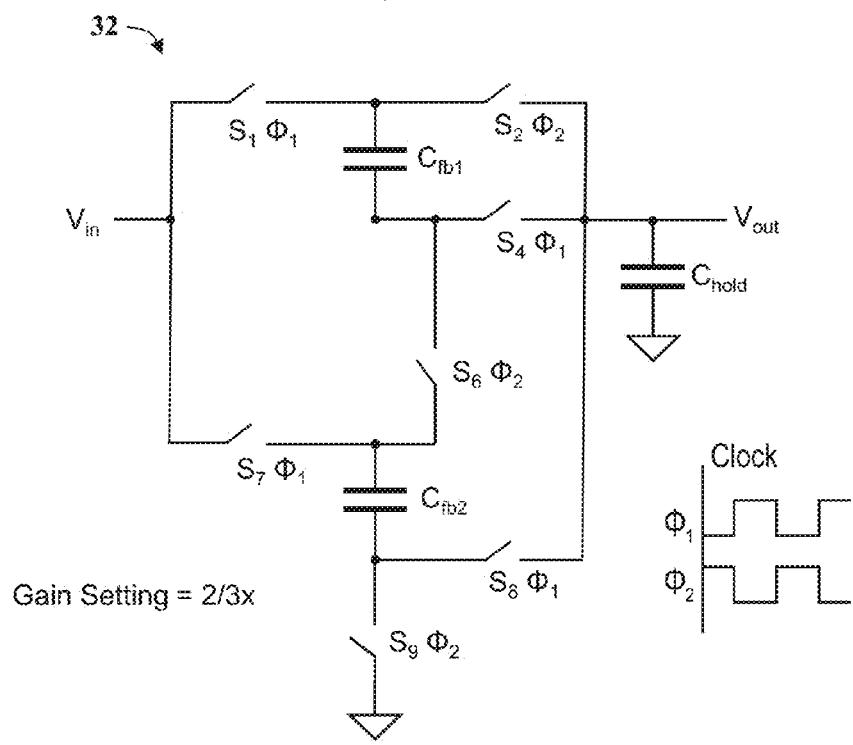
Figure 59:
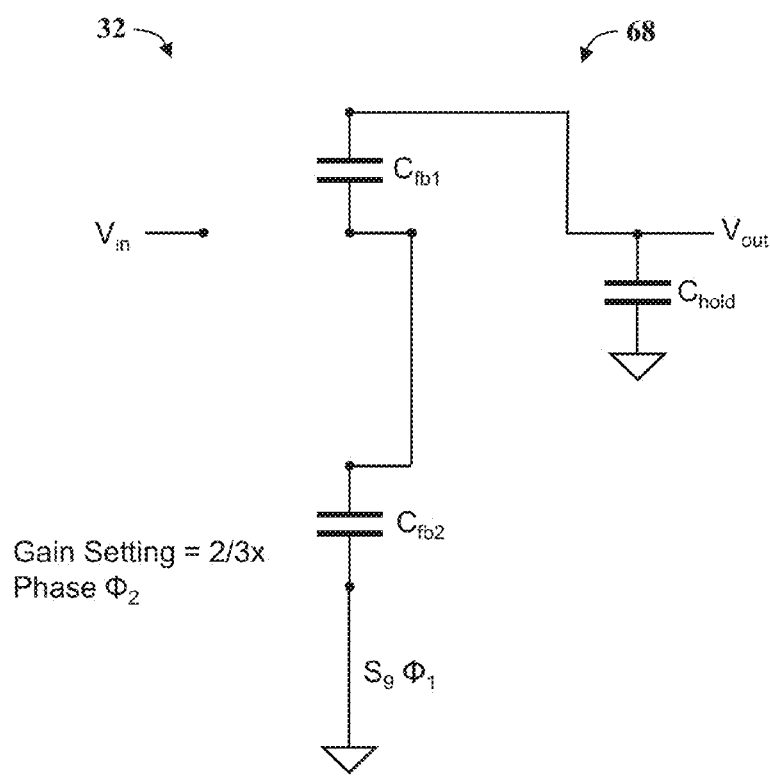

FIGS. 56 and 57 illustrate the operational states of the switching devices 72 for a gain setting of ⅔×. FIG. 59 illustrates the voltage reduction circuit cell 32 in the discharge mode 68 to achieve a voltage division of ⅔×. In the illustrated embodiment, to achieve a gain setting of ⅔×, the controller 106 operates the switching circuit 210 in the discharge mode 68 to couple the positive plate 246 of the first capacitor 242 to the hold capacitor 36, to couple the negative plate 248 of the first capacitor 242 to the positive plate 246 of the second capacitor 244, and to couple the negative plate 248 of the second capacitor 244 to ground. Referring to FIGS. 9 and 56, in the discharge mode 68, for a gain setting of ⅔×, the controller 106 operates switching devices S2, S6, and S9 to the "on" position, and operates switching devices S1, S3, S4, S5, S7, and S8 to the "off" position. In addition, as shown in FIGS. 56 and 59, to operate the voltage reduction circuit cell 32 between the charge mode 66 (shown in FIG. 58) and the discharge mode 68 (shown in FIG. 59) to obtain a voltage division of ⅔×, the controller 106 may operate a first set of switching devices 72 (e.g., S1, S4, S7, S8) in the first clock phase, $\Phi_1$, an operate a second set of switches 72 (e.g., S2, S6, S9) in the second clock phase, $\Phi_2$.

Figure 60:
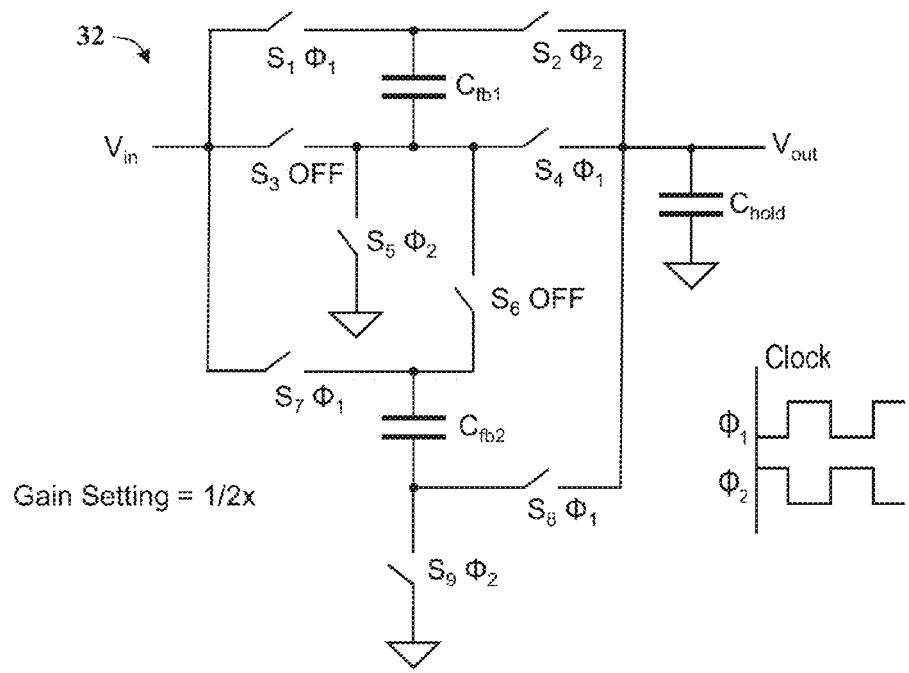
FIGS. 60-63 are schematic diagrams of the voltage reduction circuit cell with a ½× gain setting, according to an embodiment of the present invention.
Figure 61:
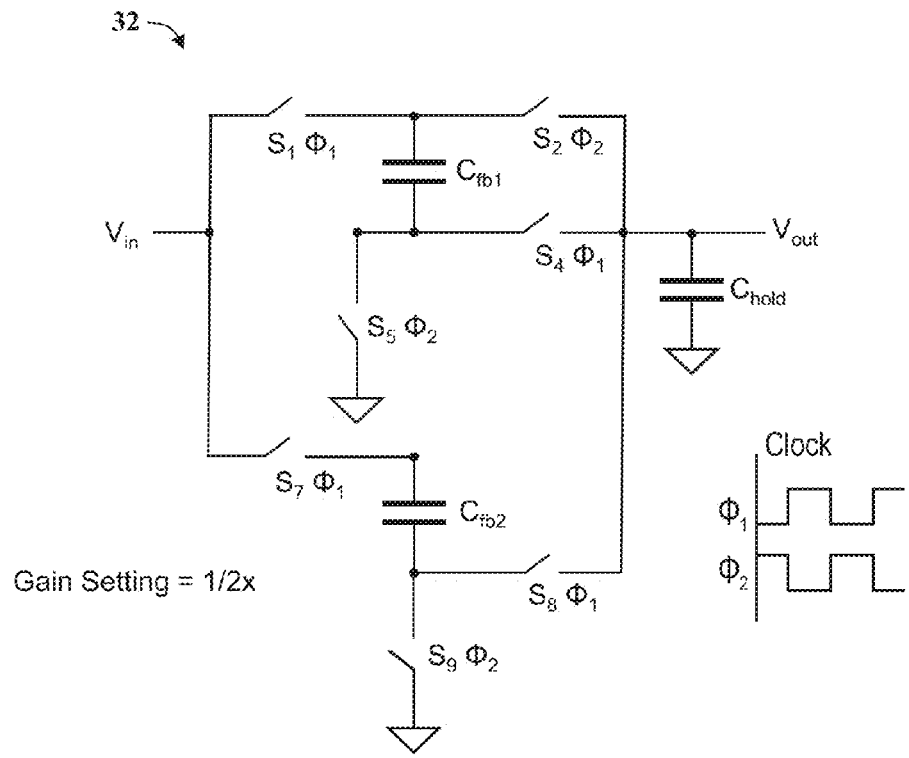

FIGS. 60 and 61 illustrate the operational states of the switching devices 72 for a gain setting of ½×. FIG. 63 illustrates the voltage reduction circuit cell 32 in the discharge mode 68 to achieve a voltage division of ½×. In the illustrated embodiment, to achieve a gain setting of ½×, the controller 106 operates the switching circuit 210 in the discharge mode 68 to couple the positive plate 246 of the first capacitor 242 to the hold capacitor, to couple the negative plate 248 of the first capacitor 242 to ground, and to coupled the negative plate of the second capacitor 244 to ground. Referring to FIGS. 9 and 60, in the discharge mode 68, for a gain setting of ½×, the controller 106 operates switching devices S2, S5, and S9 to the "on" position, and operates switching devices S1, S3, S4, S6, S7, and S8 to the "off" position. In addition, as shown in FIGS. 60 and 63, to operate the voltage reduction circuit cell 32 between the charge mode 66 (shown in FIG. 62) and the discharge mode 68 (shown in FIG. 63) to obtain a voltage division of ½×, the controller 106 may operate a first set of switching devices 72 (e.g., S1, S4, S7, S8) in the first clock phase, $\Phi_1$, an operate a second set of switches 72 (e.g., S2, S5, and S9) in the second clock phase, $\Phi_2$.

In the illustrated embodiment, the voltage reduction circuit cell 32 is configured to deliver a power signal in capacitive isolation to facilitate preventing the cell input terminal 206 from being connected directly to the cell output terminal 208 during operation between a charge mode 66 and a discharge mode 68. For example, the controller 106 may be configured to determine a gain setting of the voltage reduction circuit cell 32, select a subset of the plurality of switching devices 72 as a function of the gain setting, determine an operational state of each switching device 72 included in the selected subset of switching devices 72 as a function on the gain setting, and operate each switching device 72 included in the subset of switching devices 72 to maintain the corresponding operational state during the charge mode 66 and the discharge mode 68 to facilitate capacitive isolation.

In one embodiment, in order to achieve capacitive isolation and use the multiple stages of the Mux Core Cell (i.e. the voltage reduction circuit cell 32), the controller must be regulated by the clock as shown in FIG. 52 to ensure that all the gates in each Mux Core Cell 32 are never closed at the same time, and that they are never closed in each Mux Core Cell 32 of a cascade. In addition, there exist a sensing mechanism regulated by the controller to constantly check for overvoltage, which would be a sign of a short. If the system should malfunction and the Mux Core Cell 32 transistors would all be closed (i.e S1, S2, S3 and S4 were all closed at the same time), the an alarm event would occur and the system would shut itself down through a failsafe circuit which would prevent the chip from accepting any more signal from the source at VLine. In addition, a fuse can be used as a third backup of this system. In this fashion, multiple cascades of the Mux Core Cell 32 can become capacitive isolation which can do the complete voltage division to the target output voltage and would not need a transformer, and thus be a transformerless power system.

In one embodiment, the operation state is selected between an "on" state and an "off" state. For example, referring to FIGS. 52, 53, and 55, for a gain setting of 1×, the controller 106 selects the subset of switching devices 72 including S5, S6, S7, and S9, determines the operational state for switch S7 to be an "on" state and determines the operational state for switches S5, S6, and S9 to be the "off" state, and operates the selected switches at the selected state during operation of the voltage reduction circuit cell 32 between the charge mode 66 and the discharge mode 68. For example, upon selecting the operational states of the selected switches, the controller 106 operates the voltage reduction circuit cell 32 as shown in FIG. 53 to obtain a gain setting of 1×.

Similarly, referring to FIGS. 56, 57 and 59, for a gain setting of ⅔×, the controller 106 selects the subset of switching devices 72 including S3 and S5, determines the operational state for switches S3 and S5 to be the "off" state, and operates the selected switches at the selected state during operation of the voltage reduction circuit cell 32 between the charge mode 66 and the discharge mode 68. For example, upon selecting the operational states of the selected switches, the controller 106 operates the voltage reduction circuit cell 32 as shown in FIG. 57 to obtain a gain setting of ⅔×.

In addition, referring to FIGS. 60, 61, and 63, for a gain setting of ½×, the controller 106 selects the subset of switching devices 72 including S3 and S6, determines the operational state for switches S3 and S6 to be the "off" state, and operates the selected switches at the selected state during operation of the voltage reduction circuit cell 32 between the charge mode 66 and the discharge mode 68. For example, upon selecting the operational states of the selected switches, the controller 106 operates the voltage reduction circuit cell 32 as shown in FIG. 61 to obtain a gain setting of ½×.

In one embodiment, referring to FIGS. 64 and 65, the controller 106 may be configured to operate the voltage reduction circuit cell 32 in a bypass mode 212. During operation in the bypass mode 212, the controller 106 operates the switching circuit 210 to couple the positive plate 246 and the negative plate 248 of the first capacitor to the cell input terminal 206 and to the cell output terminal 208 to short the first capacitor 242 and to disconnect the second capacitor 244 from each of the cell input terminal 206, the cell output terminal 208, and the first capacitor 242. In addition, in the bypass mode 212, the source and drain of the switching devices 72 associated with the first capacitor 242 are shorted in parallel. In one embodiment, the controller 106 may close switching devices S1 and S2 to provide a bypass current path and close switching devices S3 and S4 to increase the current. The controller 106 may also disconnect one side connection to the hold capacitor, Chold, to ground, so that Chold would not fill, but the voltage/current would pass to the next stage. In another embodiment, during the bypass mode 212, the controller 106 may operate the voltage reduction circuit cell 32 with a gain setting of 1× to pass the power signal to the next stage.

In the illustrated embodiment, the controller 106 may also be configured to regulate the switching circuit 210 to adjust a gain setting of the voltage reduction circuit cell 32. For example, in one embodiment, the controller 106 may be configured to sense a voltage level of the output power signal and generate a control signal delivered to the plurality of switching devices 72 as a function of the voltage level of the output power signal to operate at a selected gain setting, and adjust a duty cycle of the control signal to maintain the voltage level of the output power signal at the desired voltage level. In addition, the controller 106 may sense a current level of the output power signal and adjust the duty cycle as a function of the sensed current level. The controller 106 may also be configured to sense a voltage level of the input power signal and generate a control signal delivered to the plurality of switching devices as a function of the voltage level of the input power signal, and adjust a duty cycle of the control signal to maintain the voltage level of the output power signal at the desired voltage level.

Figure 66:
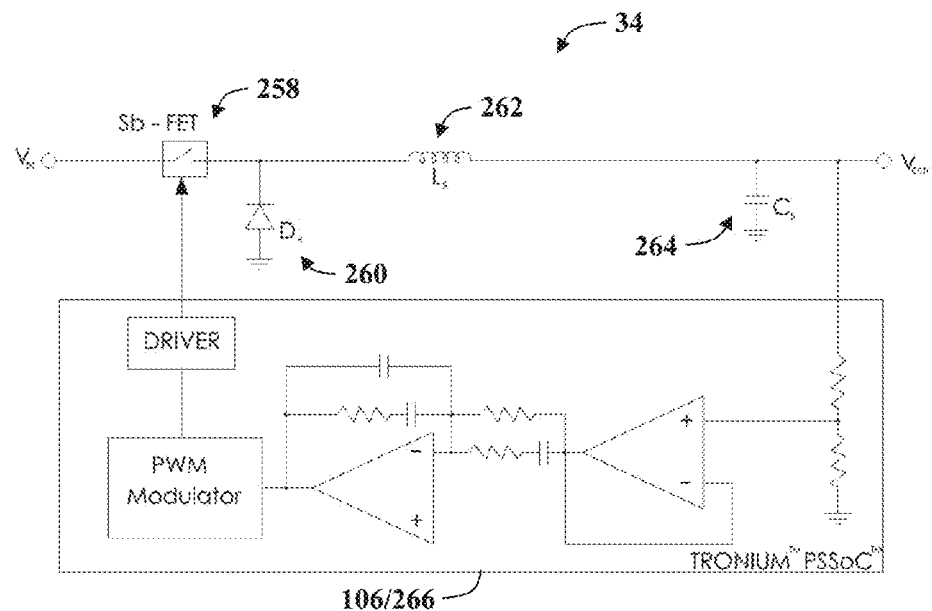
FIG. 66 is a schematic diagram of a buck regulator buck regulator circuit that may be used with the power circuit shown in FIGS. 2 and 42-50, according to an embodiment of the present invention.

FIG. 66 is a schematic diagram of the buck regulator circuit 34 that may be used with the power circuit 22. The buck regulator circuit 34 includes a switching device 258, a diode 260, an inductor 262, a capacitor 264, and a buck regulator control circuit 266 including with the controller 106 for operating the switching device 258 to regulate output signal delivered by the buck regulator circuit 34.

Figure 67:
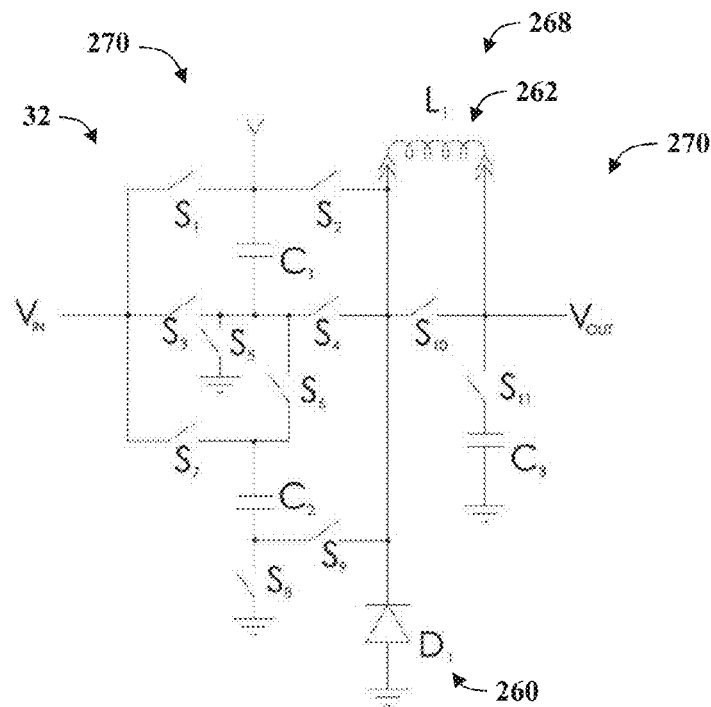
FIG. 67 is a schematic diagram of the voltage reduction circuit cell, herein referred to as a Bux™ circuit, shown in FIGS. 8 and 51 including an integrated buck regulator circuit, according to an embodiment of the present invention.

FIG. 67 is a schematic diagram of a modified voltage reduction circuit cell 268 that includes a voltage reduction circuit cell 32 and an integrated buck regulator circuit 270. In the illustrated embodiment, the voltage reduction circuit cell 32 may be configured to function as the MOSFET switch for an external buck converter as well as incorporate the diode and capacitor. Thus, a voltage reduction circuit cell 32 may be reconfigured to function as the MOSFET switch for an external buck converter 34. The external buck converter 34 may be employed when more power is required in excess of what the multi-stage voltage reduction circuit 204 can provide. Utilizing the existing switches (transistors, Charge Pump Drivers and Level Shifters) from a voltage reduction circuit cell 32 eliminates the need for an external high voltage MOSFET and its associated gate driver. Referring to FIGS. 66 and 67, the two semiconductor components Sb and Db can be replicated using the components present in the voltage reduction circuit cell 32. Thereby reducing component cost and reducing board space. In addition, the capacitors existing externally for the voltage reduction circuit cell 32 can also be used for Buck Capacitor, Cb.

For example, in one embodiment, the buck converter switch Sb may be replaced by S1. For more current capability, switches S1 and S2 in parallel with S3 and S4 would be employed. The reverse polarity diode Db would be implemented using either S5 or S8. The existing hold capacitor would be used in connection with the (external or internal) inductor. In addition, the reverse protection diode is inherent in the channel structure of the MOSFET. The internal nodes of the voltage reduction circuit cell 32 are accessible for connection to Lb because capacitors C1, C2 and C3 are external components implying external package pins exist for these nodes. The voltage reduction circuit cell 32 already contains the Dickson charge pumps and associated systems required for driving the high voltage biased MOSFET gates. Alternatively, a diode could exist above C3 which would provide the diode for the Buck, and also be used during Bypass Mode as the block to the capacitor if all four switches are used, which is then called a BUX™ circuit as it internally provides devices for the Buck operation from the Muxcapacitor Core Cell™, as shown in FIGS. 66 and 67.

In another aspect of the invention a Muxcapacitor Core Cell (MCC) can be reconfigured to function as the MOSFET switch for an external buck converter as well as incorporate the diode and capacitor from existing MCC features.

Thus, a Muxcapacitor stage can be reconfigured to function as the MOSFET switch for an external buck converter. The external buck converter is employed when more power is required in excess of what the Muxcapacitor stages can provide. Utilizing the existing switches (transistors, Dickson Charge Pump Drivers and Level Shifters) from a MCC (this method is called the "BUX") eliminating the need for an external high voltage MOSFET and its associated gate driver. FIG. 66 shows a typical buck converter with the following external components: Sb, Db, Lb and Cb.

As shown in FIG. 67, the two semiconductor components Sb and Db can be replicated using the components present in a Muxcapacitor Core Cell. Thereby reducing component cost and reducing board space. In addition, the Caps existing externally for the MCC can also be used for Buck Cap, Cb. Referencing the Muxcapacitor schematic shown in FIG. 67, (Mux Core Cell) the buck converter switch Sb can be replaced by S1. For more current capability, switches S1 and S2 in parallel with S3 and S4 would be employed. The reverse polarity diode Db would be implemented using either S5 or S8. The existing Hold Cap would be used in connection with the (external or internal) inductor. In addition, the reverse protection diode is inherent in the channel structure of the MOSFET. The internal nodes of the Muxcapacitor are accessible for connection to Lb because capacitors C1, C2 and C3 may be external components implying external package pins exist for these nodes. If they are internal capacitors, then internal circuitry would make the connection. The Muxcapacitor Core Cell already contains the Dickson charge pumps and associated systems required for driving the high voltage biased MOSFET gates. Alternatively, a diode could exist above C3 which would provide the diode for the Buck, and also be used during Bypass Mode as the block to the Cap if all four switches are used.

In one embodiment, the buck converter switch Sb is replaced by S2. For more current capability, switches S1 and S2 in parallel with S3 and S4 would be employed using $V_{IN}$ as the input point. The reverse polarity diode Db would be implemented using $D_1$. The existing hold capacitor, C3 would be used in connection with the external inductor $L_1$ in order to complete the buck circuit instead of an additional external capacitor, as is typically seen in a buck configuration. In addition, this configuration helps implement the "ByPass Mode" of operation. The ByPass Mode is used typically where a higher voltage reduction circuit cell 32 is bypassed and the input is started further down the multi-stage voltage reduction circuit chain. This method is used when the original $V_{IN}$ is a lower input voltage (i.e. 48 volt input would bypass two voltage reduction cells in order to avoid transistor losses associated with 1:1 conversions). Thus, closing $S_{10}$ allows the inductor to be shorted to remove it from the multi-stage voltage reduction circuit. Also, $S_{11}$ is opened to disconnect $C_3$ in the ByPass mode.

Figure 68:
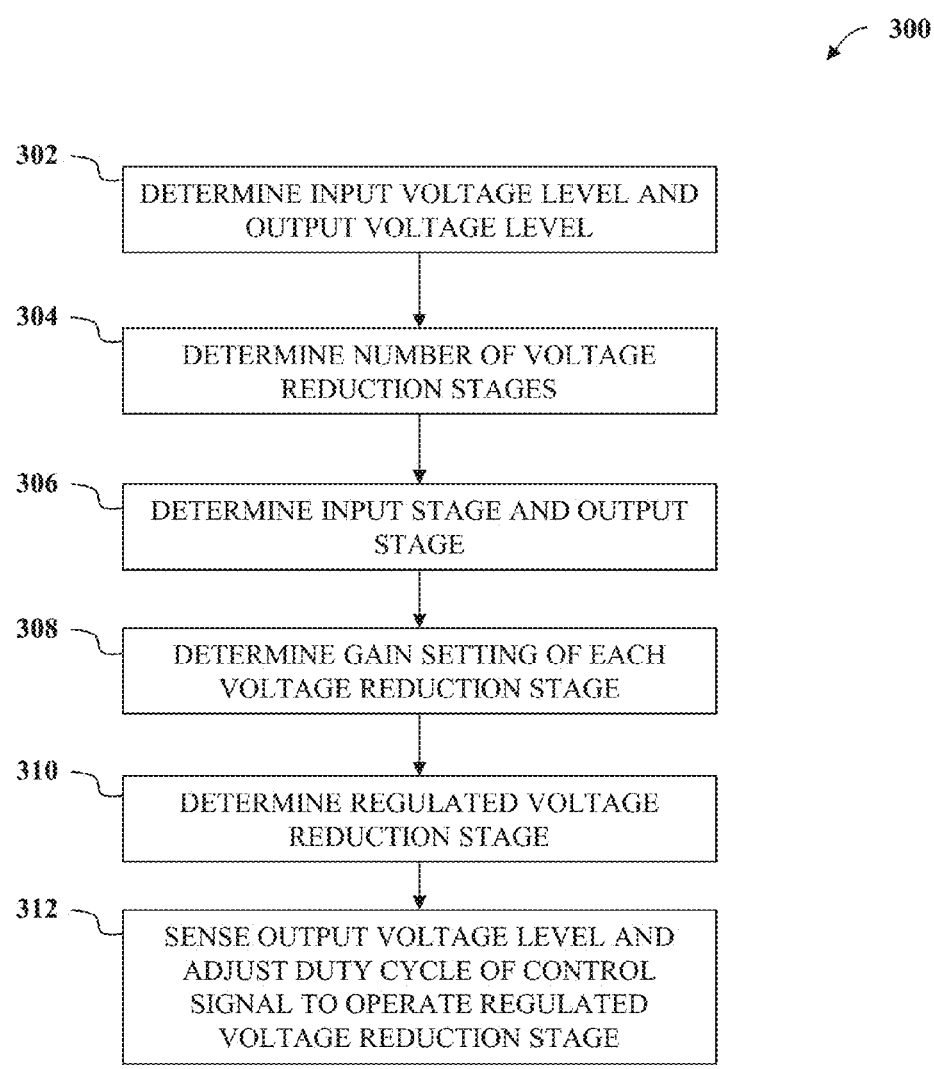
FIG. 68 is a flowchart of a method of operating an electrical circuit for powering electronic devices that may be used with the electrical power circuit shown in FIGS. 2 and 42-50, according to an embodiment of the present invention.

FIG. 68 is a flowchart of a method 300 that may be used to operate the power circuit 22 for powering electronic devices. FIGS. 69 and 70 are exemplary data records that may be used by the controller 106 for operating the power circuit 22 using method 300. The method 300 includes a plurality of steps. Each method step may be performed independently of, or in combination with, other method steps. Portions of the methods may be performed by any one of, or any combination of, the components of the controller 106.

In the illustrated embodiment, in method step 302, the controller 106 receives an input power signal at the circuit input terminal, senses a voltage level of the input power signal, and determines a desired voltage level of the output power signal to be delivered to the circuit output terminal 202.

In method step 304, the controller 106 determines the number of voltage reduction stages to be operated in the multi-stage voltage reduction circuit 204 to deliver the output power signal at the desired voltage level. For example, in one embodiment, the controller 106 may determine a required number of voltage reduction circuit cells 32 that may be used to reduce the voltage level of the input power signal and to deliver the output power signal at a voltage level approximately equal to the desired output signal voltage level. In addition, the controller 106 may be configured to determine the required number of voltage reduction circuit cells as a function of the sensed voltage level of the input power signal. For example, in one embodiment, the controller 106 may sense the voltage level of the input power signal and access a stage selection table 272 (shown in FIG. 70) being stored in the database. The controller 106 then selects the number of required stages as a function of the input power signal voltage level.

In method step 306, the controller 106 selects an input voltage reduction circuit cell 226 and an output voltage reduction circuit cell as a function of the selected number of stages.

In method step 308, the controller 106 determines a gain setting for each voltage reduction circuit cell 32 included in the selected number of stages. For example, the controller 106 may access the stage selection table 272 to select a gain setting for each voltage reduction circuit cell as a function of a the desired output signal voltage level and the sensed input power signal voltage level. The controller 106 may generate a control signal being delivered to each of the voltage reduction circuit cells 32 as a function of the corresponding gain settings. For example, in one embodiment, the controller 106 may access a gain setting table 274 (shown in FIG. 69) being stored in the database, and select the phased control signal to be delivered to the voltage reduction circuit cells 32 and function of the corresponding selected gain setting.

In method step 310, the controller 106 determines a regulated voltage reduction stage from the multi-stage voltage reduction circuit for use in providing a fine-tune regulation of the output power signal.

In method step 312, the controller 106 operates the selected stages of the multi-stage voltage reduction circuit to deliver the output power signal at the desired voltage level, senses a voltage level of the output power signal, and regulates the control signal being delivered to the regulated voltage reduction circuit cell to adjust a duty cycle of the control signal to maintain the voltage level of the output power signal at the predefined output signal voltage level.

In one embodiment, the controller 106 may select at least one bypass voltage reduction circuit cell of the plurality of voltage reduction circuit cells as a function of the required number of voltage reduction circuit cells, and operate the at least one bypass voltage reduction circuit cell to deliver the input power signal to the input voltage reduction circuit cell. The controller 106 may also select an output voltage reduction circuit cell from the plurality of voltage reduction circuit cells as a function of a predefined output signal voltage level, operate the selected output voltage reduction circuit cell to couple the output voltage reduction circuit cell to the forward convert to deliver an intermediate power signal from the plurality of voltage reduction circuit cells to the forward converter, and regulate the forward converter to deliver the output power signal to the output terminal.

FIGS. 71-74 are schematic illustrations of the primary side regulation circuit 240 that may be used to regulate the forward converter 96 included with the power circuit 22. In the illustrated embodiment, the forward converter 96 includes a transformer 102 for receiving power signals from the voltage reduction circuit 204 and generating the output power signal. The primary regulation circuit 240 is coupled to a primary side of the transformer 102 and includes a primary side switching device 278 that is coupled to the primary winding of the transformer 102, a current sense circuit 280 that is configured to sense a current level on the primary side of the transformer 102, a capacitor 282 that is coupled to the primary side of the transformer 102, and a regulating controller 284. The primary side switching device 278 may include a MOSFET. In one embodiment, the current sense circuit 280 may be configured to sense a differential voltage across a resistor 286 that is coupled in series with the primary side switching device 278 for use in determining a current level on the primary side of the transformer 102. The regulating controller 284 is configured to generate a pulse-width modulated (PWM) control signal that is delivered to the switching device 278 as a function of the sensed current level to regulate the transformer to deliver the output power signal at a desired voltage level. In one embodiment, the regulating controller 284 may be included with controller 106. In addition, the regulating controller 284 include a filtering control circuit 288 for generating a filtered PWM control signal for use in regulating the forward converter 96. The capacitor 282 coupled to the transformer 102 and to ground and is configured to reset the transformer after each transformer cycle. In the illustrated embodiment, the capacitor 282 may be coupled between the switching device 278 and a primary winding of the transformer 102.

The primary side regulation circuit 240 provides the following: 1) Output Regulation for a Wide Current Range (50 mA to 4.5 A); 2) Independent of Output Voltages, Input Voltages & Process; 3) Can be implemented for Both Forward and Fly Back Converters, Digital PSR trimmed for temperature drift due to external components; and 4) No Auxiliary Winding or special transformers needed.

In one embodiment, the primary side regulation circuit 240 may include a voltage sense circuit 290 that is coupled to the primary side of the transformer 102 for sensing a differential voltage level across the primary winding of the transformer 102. The regulating controller 284 may be configured to generate the pulse-width modulated control signal as a function of the sensed voltage level. In addition, the primary side regulation circuit 240 may include a temperature sense circuit 292 for sensing a temperature of the electrical power circuit 22. The regulating controller 284 may be configured to generate the pulse-width modulated control signal as a function of the sensed temperature.

During operation of the forward converter 96, the regulating controller 284 is configured to sense a current level of the primary side of the transformer 102, generate a pulse-width modulated control signal as a function of the sensed current level, and transmit the pulse-width modulated control signal to the switching device 278 to operate the switching device 278 to regulate the transformer to deliver the output power signal at a desired voltage level.

Figure 75:
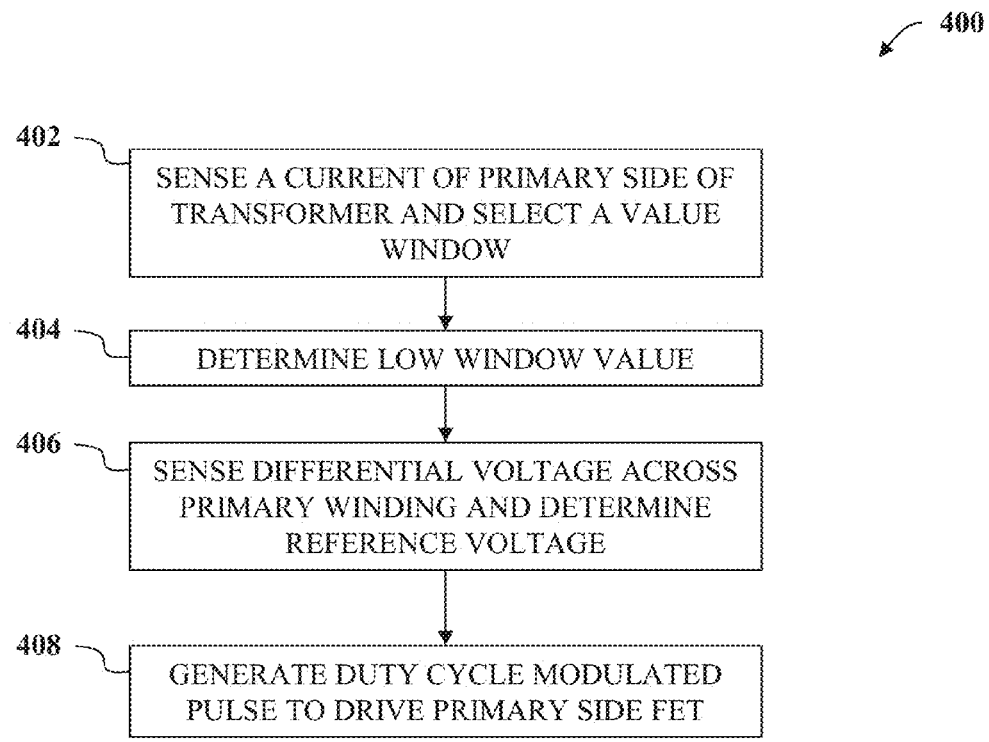
FIGS. 75 and 76 are flowcharts of methods of operating an electrical circuit for powering electronic devices with the primary side regulation circuit shown in FIGS. 71 and 72, according to an embodiment of the present invention.
Figure 76:
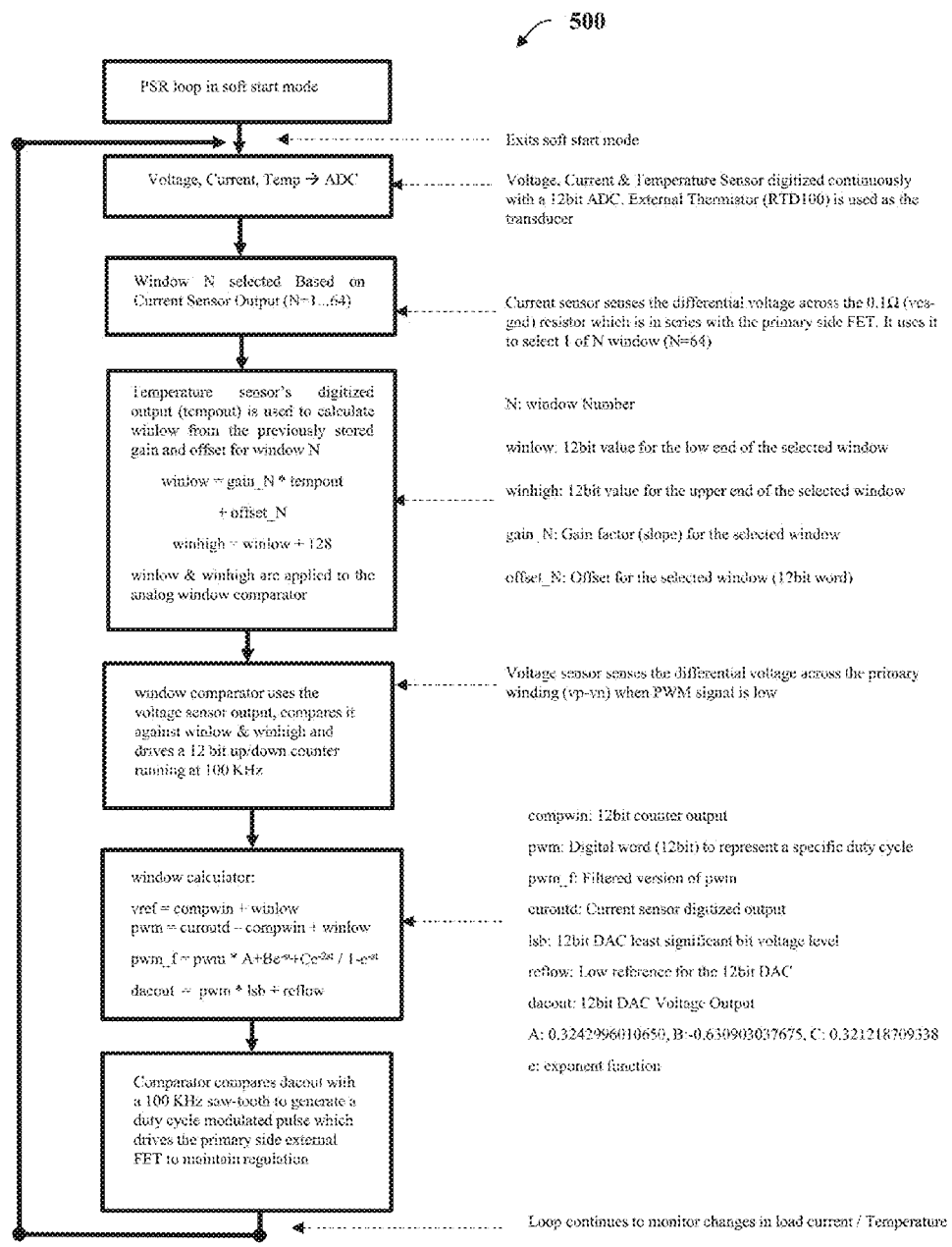
Figure 77:
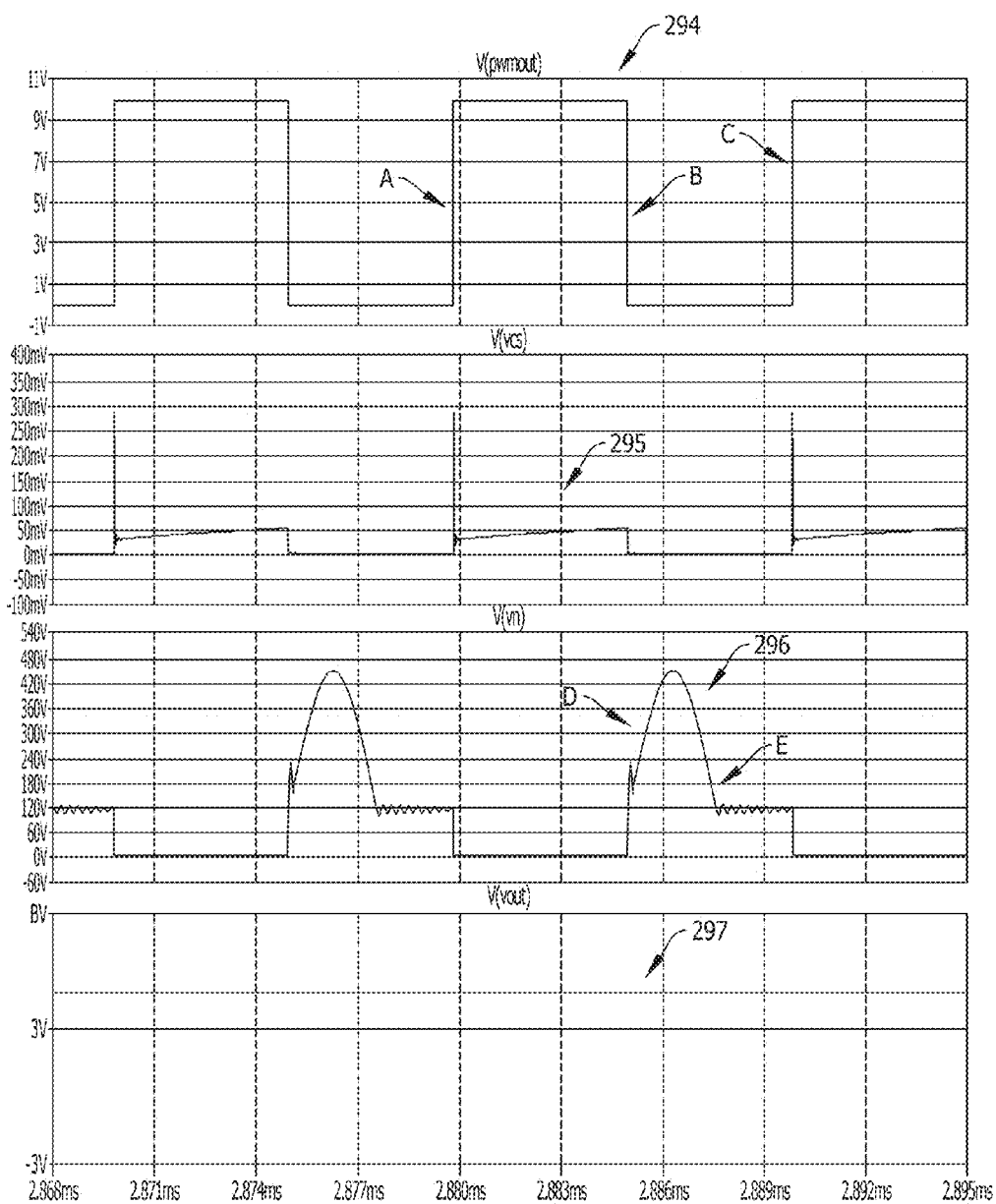
FIG. 77 is a graphical plot illustrating timing relationships associated with operational parameters of the operation parameters the primary side regulation circuit shown in FIGS. 71 and 72, according to an embodiment of the present invention.

FIG. 75 is a flowchart of a method 400 that may be used to operate the primary side regulation circuit 240 to regulate the forward converter 96 for powering electronic devices. FIG. 76 is another flowchart of a method 500 that may be used to operate the primary side regulation circuit 240. FIGS. 78 and 79 are exemplary data records that may be used for operating the primary side regulation circuit 240. The method 400 includes a plurality of steps. Each method step may be performed independently of, or in combination with, other method steps. Portions of the methods may be performed by any one of, or any combination of, the components of the controller 106. FIG. 77 illustrates a plurality of plots displaying the timing relationship of operational parameters used in operating the primary side regulation circuit 240. FIG. 77 includes a first plot 294 of the gate signal to the primary switching device 278, a second plot 295 of the source of the primary side switching device 278, a third plot 296 of the drain of the primary side switching device 278 showing reset, and a fourth plot 297 of the secondary side output of the forward converter 96.

In method step 402 the regulating controller 284 is configured to sense a current of the primary side of the transformer and select a value window. In one embodiment, the regulating controller 284 may include a predefined range of current values included within a plurality of value windows. Each of the value windows includes a subset of current values within the predefined range of current values. The regulating controller 284 is configured to sense a current level on the primary side of the transformer 102, select a value window from the plurality of value windows as a function of the sensed current level, and generate the pulse-width modulated control signal as a function of the selected value window. For example, in one embodiment, the regulating controller 284 senses a current level of the primary side of the transformer 102, selects a value window from the plurality of value windows as a function of the sensed current level, determines a low window value associated with the selected value window, and determines a reference voltage value as a function of the determined low window value. The regulating controller 284 then generates a duty cycle modulated pulse as a function of the reference voltage value and delivers the duty cycle modulated pulse to the primary side switching device 278 to adjust the voltage level of the output power signal. In one embodiment, the regulating controller 284 may sense a peak current level during a pulse of the switching device 278 and select the value window as a function of the peak current level. The regulation circuit 240 may also sense a temperature of the power circuit 22 and/or the power device and determine the low window value as a function of the sensed temperature.

For example, in one embodiment, the regulating controller 284 may be implemented by the controller 106 and include a processor, a memory device, and a database. The memory device is configured to store a regulation data tables (shown in FIGS. 78 and 79) in the database for use in generating the PWM signal being delivered to the switching device 278. For example, in one embodiment, the database stores a window selection table 298 (shown in FIG. 78) that includes a range of current values and a plurality of value windows associated with the range of current values. Each of the value windows including a subset of current values within the range of current values. The regulating controller 284 may be sense a current level on the primary side of the transformer 102 and access the window selection table 298 to select a value window as a function of the sensed current.

In method step 404, the regulating controller 284 determines a low window value. For example, in one embodiment, the regulating controller 284 accesses the window selection table 298 and selects the low window value, winlow, as a function of the selected value window. In one embodiment, the database may store gain-offset selection table 299 (shown in FIG. 79) that includes a plurality of gain factors, gain_N, and offset values, offset_N, associated with each value window. The regulating controller 284 selects the gain and offset values from the gain-offset selection table 299 as a function of the selected value window for use in determining winlow.

In method step 406, the regulating controller 284 senses a differential voltage across the primary winging and determine a reference voltage as a function of the sensed voltage. For example, the regulating controller 284 may sense a differential voltage across the primary winding of the transformer 102 and determines the reference voltage value as a function of the low window value and the sensed differential voltage level. The regulating controller 284 may also determine a high window value associated with the selected value window as a function of the low window value and determining the reference voltage value as a function of the low window value and the high window value. The regulating controller 284 may also be configured to sense a peak voltage of the primary side of the transformer and determine the reference voltage as a function of the sensed peak voltage, the low window value, and the high window value.

In method step 408, the regulating controller 284 generates a duty cycle modulated pulse as a function of the reference voltage to drive the primary side switching device 278.

In one embodiment, the regulating controller 284 may implement method 500 (shown in FIG. 76) to generate a duty cycle modulated pulse which drives the primary side external FET to maintain regulation for the forward converter 96. In one embodiment, the regulating controller 284 continually senses voltage, current and temperature with a 12 bit ADC. External Thermistor (RTD100) is used as the transducer. The current sensor senses the differential voltage across the 0.1Ω (vcs-gnd) resistor coupled in series with the primary side FET, and selects the one value window of the N number windows included in the window selection table 298 (e.g., N=64 windows). The regulating controller 284 then selects the gain and offset values associated with the selected value window from the gain-offset selection table 299 and uses the temperature sensor's digitized output (tempout) to calculate the winlow value.

The regulating controller 284 is configured to determine the low window value, winlow, as a function of the sensed temperature by accessing the gain-offset selection table 299 to determine a gain value, gain_N, and an offset, offset_N, and uses the temperature sensor's digitized output (tempout) to calculate the winlow value using the following equation:

$$\text{winlow}=\text{gain\_}N*\text{tempout}+\text{offset\_}N \qquad \text{Equation No. 1:}$$

wherein: N is the corresponding value window Number
winlow is a 12 bit value for the low end of the selected window,
gain_N is a Gain factor (slope) for the selected window;
offset_N is a Offset for the selected window (12 bit word); and
tempout is the temperature sensor's digitized output.

The regulating controller 284 the calculates a high window value, winhigh, using the following equation:

$$\text{winhigh}=\text{winlow}+128 \qquad \text{Equation 2:}$$

The regulating controller 284 then applies winlow and winhigh to an analog window comparator. The window comparator uses the voltage sensor output, compares it against winlow & winhigh and drives a 12 bit up/down counter running at 100 KHz. For example, regulating controller 284 the use the voltage sensor to sense the differential voltage across the primary winding (vp−vn) when PWM signal is low (as shown in FIG. 77) for use in driving the 12 bit up/down counter.

The regulating controller 284 then determines a 12 bit DAC Voltage Output value that may be used to generate a duty cycle modulated pulse using the following equations:

$$\text{vref}=\text{compwin}+\text{winlow} \qquad \text{Equation No. 3:}$$

wherein: compwin is a 12 bit counter output; and
Vref is a reference voltage.

$$\text{pwm}=\text{curoutd}-\text{compwin}+\text{winlow} \qquad \text{Equation No. 4:}$$

wherein: pwm is a Digital word (12 bit) to represent a specific duty cycle; and
curoutd is a Current sensor digitized output.

$$\text{pwm\_f}=\text{pwm}*A+Be^{-st}+Ce^{-2st}/1-e^{-st} \qquad \text{Equation No. 5:}$$

wherein: pwm_f is a Filtered version of pwm; and
A=0.3242996010650, B=−0.630903037675, C=0.321218709338; and
e=exponent function.

$$\text{dacout}=\text{pwm}*1\text{sb}+\text{reflow} \qquad \text{Equation No. 6:}$$

wherein: 1 sb: 12 bit DAC least significant bit voltage level; and
reflow: Low reference for the 12 bit DAC.

The regulating controller 284 then operates the comparator to compare dacout with a 100 KHz saw-tooth to generate a duty cycle modulated pulse which drives the primary side external FET to maintain regulation. In the illustrated embodiment, the regulating controller 284 generates a new duty cycle modulated pulse based on the sensed data for each pulse of the switching device 278. The regulation controller 284 may also be configured to conduct a device parametric compensation including determining a device trim and device compensation component loss compensation. For example, the Tronium chip along with other external components on the board have tolerance variations. The Tronium chip has a register to allow for a small correction to compensate for these device-to-device variations.

In one embodiment, the primary side regulation algorithm used by the regulation controller 284 is based upon dividing the 50 mA to 4.5 A output current range into "coarse" windows which contain multiple "fine" windows. These windows would be replicated for each current output range higher than 4.5 A, for instance 4.5 A TO 100 A. Each window has a certain gain and offset stored in some type of accessible memory. The primary function of the coarse windows is that once a range of voltage has been selected by the controller selecting a certain coarse window, then the on-going re-calculations revolves around that window, and does not involve other coarse windows. In other words if there were ten coarse windows, each with a twenty fine windows inside, the controller would only look to choose a fine window within the preexisting, pre-identified coarse window, without resorting to looking at all coarse windows. Only when the reference voltage/current has either risen or dropped sufficiently to no long be in the coarse reference window would the logic start looking at all coarse windows again. In this fashion the logic does not have to originally look at all windows, but only within the previously selected range. Each window has a unique offset and gain factor which is determined via simulations which would establish the gain factor or other behavioral model or characterization for a given application and for a given type of converter (Forward, Cúk, Flyback, SEPIC, etc.). The number of windows which is established is a function of the accuracy requirement. If the accuracy is relaxed then the number of windows is reduced. Up to 64 windows can be specified in the initial proposed architecture, but any number supported by the logic and firmware could be selected. Simulations show that 49 windows are required to obtain ±0.5% accuracy within the 50 mA to 4.5 A range. The PSR Loop begins acquisition in Soft Start mode which brings the output voltage close to 5v. The Current Sensor then starts and the 12-bit ADC digitizes the current sensor output when PWM is high. This result is the threshold which is used to select of 1 out of 49 windows. When a particular window is selected, its offset and gain are used to calculate a reference value which is then used to drive the PWM output. The digitized Voltage Sense output is also used to drive a digital window comparator in order to fine tune the reference value for the PWM determined by the Current Sense measurement. The reference value is filtered and applied to a 12-bit DAC which drives the PWM which drives the external FET switch.

In one embodiment, the primary side regulation circuit 240 uses two types of windows which are in actuality, settings coarse and fine. These are selected based on the "sense" of the Primary Side input. These selectable ranges are Coarse Windows (CW) and within each CW is other selectable settings which are calling Fine Windows (FW). The PSR Windows invention and innovation in the TRONIUM™ Power Supply System(s) on a Chip™ (PSSoC™).

The primary side regulation circuit 240 is configured with a "forward controller" configuration, as that is the most efficient topology. However, this invention can also be configured to work with "flyback" topologies, or topologies such as the SEPIC, Cúk, Push-Pull. With the Semitrex™ PSR Windows based primary side sensing and control, the power supply can avoid all the opto-isolation parts, and reduce the topology by up to a 10 part count. This is very desirable in terms of reducing costs, size and parts needed in inventory. It also helps consolidate a very fragmented industry, into fewer parts and a more standardized power supply footprint.

The logic uses the Primary Side Sensing to first find the correct CW, then finds within the CW the appropriate FW setting which matches the primary side sensed voltage and current. Alternatively, if a "slow start" is used, then the initial target can be fixed to the desired output, for instance if it is a 5V×1Amp device, then the initial target would be pre-selected at 5V×1 Amp. Then the system would move to the 5v output and current setting, but, within milliseconds, the actual sense mechanism on the primary side would begin to register information from which the correct "window" would be selected. The CW are used so that the logic can segregate and reduce its initial selection. Otherwise, if CW's aren't used, then the logic has to search all settings, rather than just the settings in a certain range. Thus, if the logic already knows the coarse window it is in, it only has to look at the fine tuning within that window, unless the sense input for sure tells the logic that it has gone outside the coarse window, then it looks for a fine tune setting within the second CW.

For this example of the invention, we are using a set of algorithms that calculate from 50 milliamps up to 4.5 amps, for example, as it could be more amps. Also, for this example we are selected a 5V setting to maintain. To exemplify the course window (CW) settings, one CW would be in the instance of plus or minus 50% of 1.5 amps is just coarse window, because it's very linear in that higher current range. However from 1, as we go down from 1.5 amps towards 50 milliamps the windows are very narrow because the current is not very linear. However, each window has a certain gain and offset. So it's an equation of a line that we are creating by simulations within the Fine Windows in each CW which fine tune the CW settings. Between 4.5 and 1.5 amps, it is an equation of a line so for that you would need a slope and an X intercept. So the slope is already determined, or we can just call it a gain factor, it's determined through simulations or on the bench, if you have the external discrete parts and their losses are stored in memory so that they can be calculated into the gain settings so that an "overshoot" is accomplished by producing extra current to compensation for the losses the module will experience in the Secondary. The same thing happens for corrections for temperature or other external variables, such as temperature, and with the offset.

In this instance, when the system logic gets a primary side current sense analog value, the output is digitized to an ADC, and then that output is, the digital output is used, it determines which window we are in, so let's say we are in between 4.5 and 1.5 you're in window 1, right, so if you get 2 amps for example, and the corresponding digital output from the current sensor will land us inside CW window 1 and the digital engine will calculate using the slope and offset to calculate a new reference voltage in digital which will then find the FW and then that value will be applied and a loop is locked. This is how the loop works. And then the number of windows is determined by the accuracy of the range, all the range if you just have one narrow range then we just can loop it with one or two windows, for the 0.5 percent accuracy there up to 49 CW windows needed to get the fine tuning necessary. So with this configuration, you have 1664, total windows, which provides the resolution necessary for the type of accuracy desired.

As mentioned, the number of windows is determined by the accuracy requirements, if the accuracy is looser then we need less windows, if the accuracy is tighter than 0.5 percent then we would need more windows. It would vary according to the accuracy desired. In this instance we have set 64 total windows, with 49 CW for the 0.5 percent accuracy.

In one embodiment, first, the soft-start mode is engaged and with the pre-selected value, which brings the system output close to 5 volts. Next, the current sensor, which is a switch cap amplifier, in one embodiment of the invention, digitizes the output of the current which is in terms of voltage. When the pulse width is high, the switch is closed on the primary side, a sawtooth is generated and digitized by the reference and then digitized by the ADP. That signal is used as a threshold to select one of the 49 CW, that is to select only one out of 49 CW.

Next, for example, the systems registers that it is in CW 1, based on the current sensor output we calculate, this information is then instantly used to determine next the offset and gain which are stored to calculate within the CW references, which would be the FW with is the representation of what the reference voltage is or should be on the secondary. That information is then used to create/generate a stored value for a PWM duty cycle modulated square wave to drive the system.

The voltage sensor is also used as a fine tuner to make sure that the reference voltage doesn't exceed above a certain window, which is fixed by the type and design of the system and its desired output voltage and current, so that the PSR always stays within a certain range. In this fashion there is coarse tuning, and fine tuning which can include offsets or gains for temperature, losses from the secondary discrete parts, and that type of additional calculation which is or may be necessary to truly have the PSR represent the exact conditions of the Secondary.

Thus, the FW fine tune's the current sensor and output measurement for further tuning from the referenced voltage from the digital and converted back into analog for the driving the system. This is how the PWM is being implemented. The output of the reference, which is in digital format, is converted into analog for the 12 bit DAC, so with that, it drives the PWM, which drives the comparator, the other input of the comparator is the sawtooth, and then output of the comparator is a square wave duty cycle modulated, which drives the external FET which drives the forward convertor. The voltage sensor is based on the peak detector, so it has a smaller rating than the current sensor. With the voltage across the inductor of the magnetizing inductance of the transformer. The voltage is peak detected, subtracted, and then that is used as during the reset time when the switch is off.

The CW slide algorithm is also implemented in digital. It's like the rest of the PSR. This uses a counter and it starts up after the POR is released, and the PSI is enabled. In this embodiment, it uses a 2 bit counter running at about 1.5 megahertz. It counts up to 3072 counts in inductor mode, which is ¾ths of the full count and then it takes about 2 milliseconds to reach by this clock rate.

Then that when the POR of the soft-start engine releases and the voltage is set to attempt to reach 5 volts. That is then when the two-by-one MUX is implemented in digital. The output which is called Out INP which is seen on the right hand side, that's the output of the reference voltage. Of course, 2 milliseconds the clock and the counter is ramping up so the counter is modeled as a, looks like a voltage source Vforward, from zero to 3072, during that time the MUX is closed, so VDD2 is applied. (This is shown in the information attendant to the provisional patent filing).

That brings the voltage, starts bringing it up, gradually starts bringing it up, if the time is reduced, then there is the possibility of ringing being generated, so 2 millisecond is possible for bringing the system up. By bringing start up, and then an output calculation done in LT-Spice, so the middle curve, which is the red curve from the top, the third one from the top, called V Out, that shows a soft start from zero to 2 milliseconds, it starts up at close to zero and then it gradually starts up, Vcounter Out is the output of the counter, or actually VPWMID which is a bottom curve. It shows the counter counting up and then after that it says that it's closing at 3072 and the MUX switches to less actual voltage come in and then the voltage starts to servo based on what the load currents are.

The power circuit 22 provides power controller integrated circuits (IC's) and corresponding integrated Modules provide a low-cost, highly efficient means to convert the AC line voltage present at a typical home or business electrical outlet to a reduced regulated DC voltage for consumer electronic applications. Typical applications include, but are not limited to charging systems for cell-phones, tablets or other handheld devices, USB power conversion, power supplies for consumer, medical and industrial devices, and many other possible uses. The Tronium Primary-Side Regulation Low-voltage (PSR-LV) IC when combined with a single Tronium High-Voltage (HV) Voltage Divider 32, provide a complete system solution for US-only applications with AC line voltages of 90V-132V. A second High-Voltage IC 32 containing a slave Voltage Divider can also be added to enable World-Wide applications for AC line voltages of 90V-264V.

Some of the key features of the Tronium PSR-LV System are as follows: Primary-Side Regulation of Final Output Voltage using an advanced PSR windowing algorithm; High-Voltage Switched-Capacitor Voltage Divider; Switch-Mode Buck Regulator Controller; Country Select LINE Voltage Monitor; Embedded 8051 Micro-processor for execution of power management firmware; 12-bit SAR ADC for high-speed sampling of current and voltage; Flash NVM for Code Storage; Ultra-Low Power Dissipation for Idle (Vampire) Mode of Operation; Optional Opto-Isolated Interface for Analog Sensing of the Output Voltage; and I2C Slave Interface Port for Manufacturing Test.

The Tronium PSR-LV System combines the high-efficiency Tronium High-Voltage Voltage Divider IC with the Tronium Primary-Side Regulation—Low Voltage (PSR-LV) advanced power controller IC for output voltage regulation with high-efficiency and high accuracy. The two Tronium IC's provide a total solution for Primary-Side Regulation which monitors the voltage and current on the primary side of the transformer for control of the secondary output voltage. As a result, the number of external components is minimized providing a cost and area effective solution for power control. When no current is being drawn by the load the device will enter a low-current mode of operation to minimize the traditional 'vampire' current required to stay awake.

The Tronium PSR-LV System (shown in FIGS. 47 and 49) is comprised of two integrated circuits for control of the module Buck Switching Regulator (SWR) and Forward Converter. The Tronium Primary-Side Regulation Low-voltage (PSR-LV) IC integrates an ultra low-power controller for a 5-Volt Cell-Phone or Laptop Charger Module. When combined with the Tronium High-Voltage Voltage Divider, it provides a complete solution for US-only applications with AC line voltages of 108V-132V. A second High-Voltage IC containing a slave Voltage Divider can also be added to enable World-Wide applications for AC line voltages of 90V -264V. Alternatively, the high voltage and low voltage circuits can co-exist in one chip which contains high voltage devices and low voltage devices.

Some of the key features of the Tronium PSR-LV IC are as follows: Primary-Side Regulation of Final Output Voltage using an advanced PSR windowing algorithm; Embedded 8051 Micro-processor for execution of power management firmware; 12-bit SAR ADC for high-speed sampling of current and voltage; Flash NVM for Code Storage; Ultra-Low Power Dissipation for Idle (Vampire) Mode of Operation; Optional Opto-Isolated Interface for Analog Sensing of the Output Voltage; and I2C Slave Interface Port for Manufacturing Test.

The Tronium High-Voltage (HV) IC (shown in FIGS. 47 and 49) integrates a proprietary High-Voltage Switched-Capacitor Voltage Divider & Switch-mode Buck Regulator to maintain high-efficiency regardless of the load voltage or current. The Tronium HV IC is used to transfer power from the rectified LINE voltage to the load as controlled by the PSR-LV Low-Voltage IC. The Tronium HV IC is comprised of the following major circuit blocks: High-Voltage Switched-Capacitor Voltage Divider; Switch-Mode Buck Regulator Controller; Country Select LINE Voltage Monitor; Bandgap for On-Chip Voltage and Current Generation; and 5V and 10V LDO Regulators for supply of the PSR-LV IC Controller.

The Tronium PSR-LV System can be configured for the following applications:

US-Only Applications: The Tronium Primary-Side Regulation Low-voltage (PSR-LV) IC can be combined with the Tronium High-Voltage Voltage Divider to provide a complete solution for US-only applications with AC line voltages of 108V-132V and can exist in two chips, based on high or low voltage circuits, or exist in one IC which has both high and low voltage devices and circuits. High voltage circuits are relative depending on input and targeted output. With European and US type outlet voltages being considered, typically high voltage would be devices and circuits which are designed to withstand in excess of 35-50 volts up to 600v, with low voltage circuits including circuits less than the 35-50v circuits and devices. In the case where both high and low voltage circuits exist on the same IC they would be the TRONIUM HLV chip, which depending upon the option selected, may or may not include PRS, so that it also can be a designated as a HLV-PSR chip.

This application can be seen in the diagram of FIG. 47 where the connectivity between the two IC's is shown along with the external Buck SWR and Forward Converter. A single Tronium HV IC is used to provide the necessary voltage division from the rectified LINE voltage to the primary side of the transformer. The Tronium PSR-LV IC controls the primary-side NMOS switch via Primary-Side Regulation to then efficiently transfer power to the application load at VLOAD.

World-Wide Application: A second Tronium HV IC (shown in FIG. 49) is required for conversion of world-wide LINE voltages ranging from 90VAC-264VAC. A diagram of this application is shown in FIG. 49 where the output of the first HV IC at CPOUT is used to drive the input of the second HV IC. This effectively provides two more stages of voltage division allowing for a wider range of input voltages. In this case the first HV IC is configured as the Master, while the second HV IC is the slave.

Master/Slave Configuration: The MSTR_SLV input of the Tronium HV IC allows each device to be configured separately for multiple applications. Redundant circuits can then be disabled for additional power savings when needed.

Bandgap: The Bandgap reference voltage of the Tronium PSR-LV IC must be trimmed to obtain regulation accuracies of less than ±1.5%. As a result, a 4-bit register word can be stored in memory with the trim information which can be obtained at either IC package or module test. High accuracy applications can also be supported with the use of an external Bandgap reference generator. For this mode of operation, the internal Bandgap of the IC can be disabled via register control.

Oscillator: The Master Oscillator of the Tronium PSR-LV IC is designed for high accuracy and will not require trim.

Calibration Methodology: 12-bit ADC. The 12-bit voltage and current sense ADC of the Tronium PSR-LV IC will require a two point gain and offset calibration to be performed on a periodic basis. The following routine will be used: 1) Apply VREFL and perform a conversion. Store the result as dout_offset. 2) Apply VREFH and perform the conversion. The result is dout(refhi). 3) calculate the gain factor as gain factor=(dout(refhi)−dout_offset)/4096; 4) For all subsequent conversions the result can be gain and offset corrected as follows: dout_corrected=(dout(actual)−dout(reflo)/gain_factor.

Temperature Calibration. Temperature calibration for the PSR can be performed automatically in the background so that no manual calibration is needed at the factory or in the field. The auto-calibration is completed in the following manner: 1) For a given load current at a known temperature a specific PSR window is selected; 2) The pre-stored offsets and gain are then used to calculate the specific output code which will provide 5.0V at 25 C (room temperature); and 3) As the temperature changes from 25 C, for the same fixed load current, another set of gains and offsets are applied that will fine tune the output to maintain regulation at 5.0V. Each window has a coarse tune (load current dependence) and a fine tune (temperature sensor) dependence that is used to maintain regulation.

An on-chip temperature sensor is provided on the Tronium PSR-LV IC to provide the means for calibration. It will be characterized/simulated over the temperature range of −40 C to 125 C in 20 degree increments, since it will be used to calculate the slope and offset for temperature fine tuning. An off-chip temp sensor (RTD or delta VBE) could also be used instead of the on-chip version.

Figure 71:
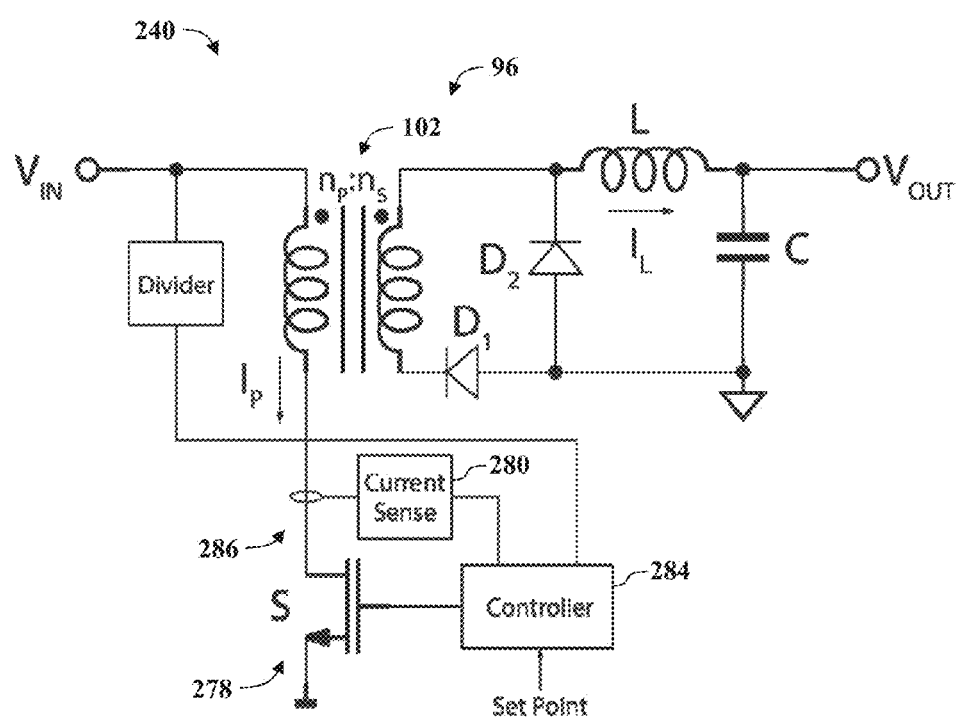
FIGS. 71 and 72 are schematic illustrations of a primary side regulation circuit that may be used with the electrical power circuit shown in FIGS. 2 and 42-50, according to an embodiment of the present invention.

The Tronium Windowed PSR (Power Side Regulation) implements a low cost, high efficiency method of providing a regulated isolated secondary voltage source. Referring to FIGS. 47, 49, and 71, in one embodiment, the PSR 240 consists of an isolation transformer, reset capacitor, switching transistor and controller. The isolation transformer is operated in the forward converter mode to minimize the amount of energy the core must store and therefore reduce the transformer's core size. The secondary voltage output is regulated using the transformer's reflective inductor pulse which represents the power delivered to the secondary load. The magnitude of the reflective inductor pulse increases with increasing load power. A programmable controller compensates for the non-linear characteristic of the reflective inductor pulse and to provide for more accurate regulation over temperature and component variations. The controller implements a multi-window method (up to 64 windows) whereby each window represents a segment of the load current. Each window consists a programmable gain and offset component to enable fully characterizing any transformer configuration. The number of windows is dependent on the non-linear characteristics of the transformer and the required accuracy of the secondary voltage regulation. The controller drives the gate of a switching MOSFET to implement a PWM switcher. The PSR feedback signal is the reflective inductor pulse. This pulse must be reset (current through the transformer's primary must be zero) for each PWM cycle for a proper feedback signal that represents the current secondary load condition. Correct selection of the reset capacitor's value ensures that the transformer resets before the next PWM cycle. Referring to FIG. 77, the timing events of the PWM cycle and the occurrence of the reflective inductor pulse of the primary side regulation circuit 240 are illustrated including plot 294 illustrating the MOSFET Gate Drive for switching device 278 and plot 296 illustrating the reflective inductor pulse measured by voltage sensor 290. Referring to plot 294, Data Point (A) is the start of PWM cycle, MOSFET turned on, Data Point (B) is the MOSFET turned off, and Data Point (C) is the End of PWM cycle. Referring to plot 296, Data Point (D) is the occurrence of reflective inductor pulse and Data Point (E) is the transformer reset event.

Referring to FIGS. 72-73 and 80-85, in one embodiment, the regulation controller 284 includes a micro-controller based architecture for the PSR-LV a part of which can also be implemented in state machine analog. This architecture uses an external NVM for trim, code, and constant storage.

The external or embedded micro-controller is responsible for the system (PSRLV and PSRHV) startup, operational modes, and overall PSR forward converter control loop management.

Figure 80:
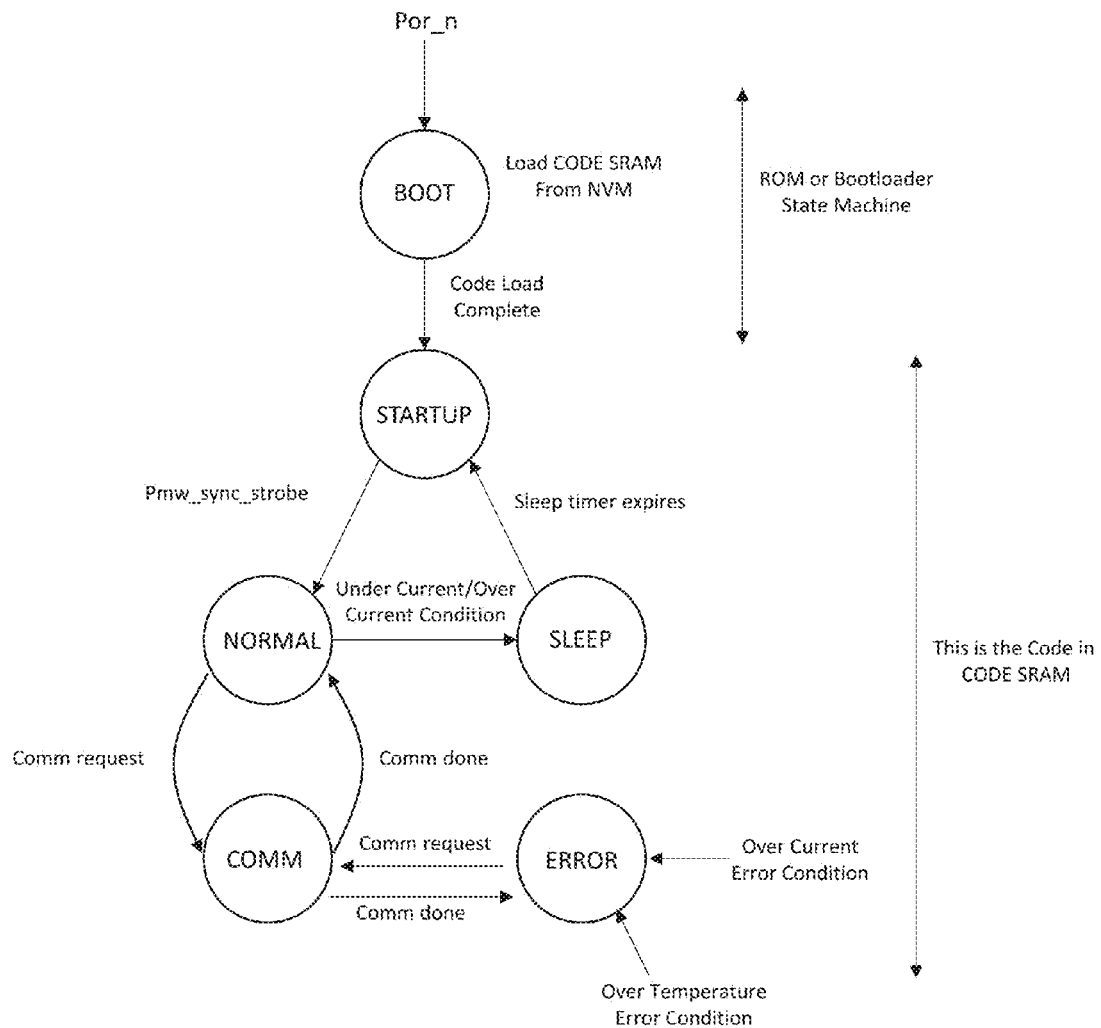
FIG. 80 illustrates a Primary Side Regulation, PSR-LV or HLV-PSR digital top level state diagram, according to an embodiment of the present invention.
Figure 81:
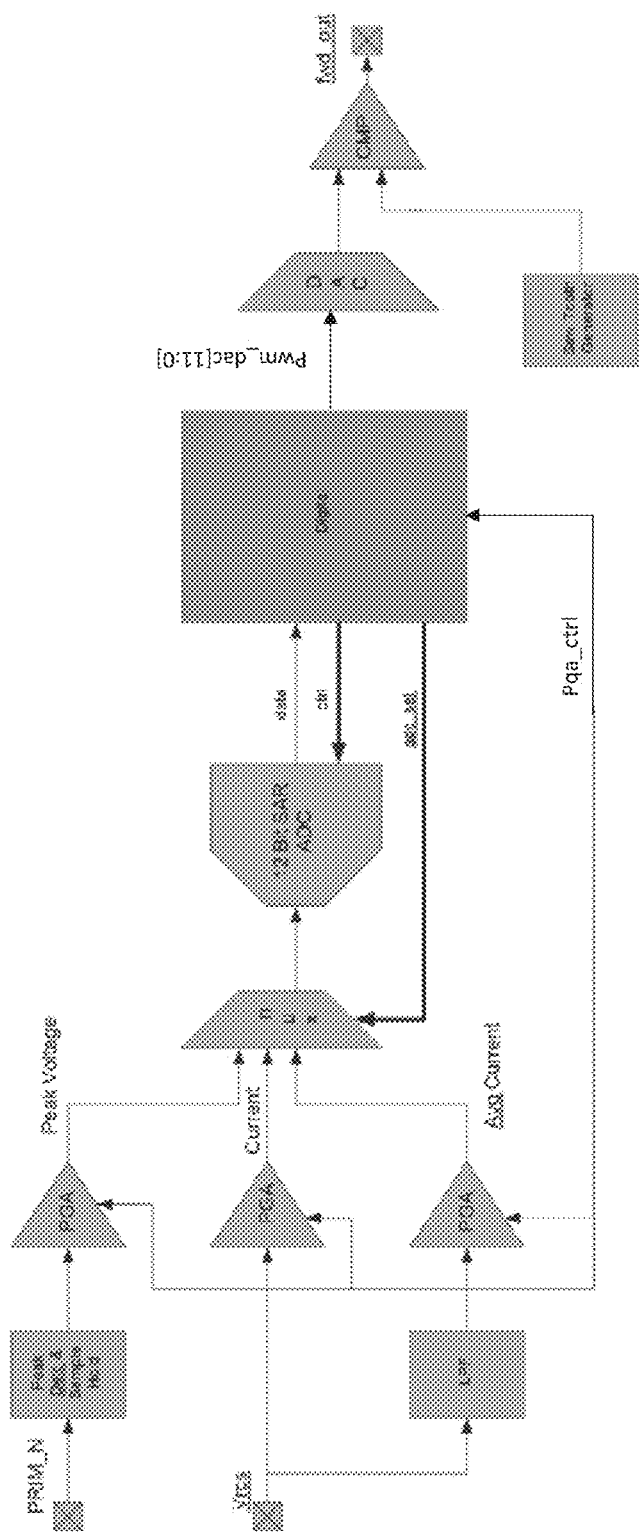
FIG. 81 illustrates a Primary Side Regulation, control loop partition, according to an embodiment of the present invention.
Figure 82:
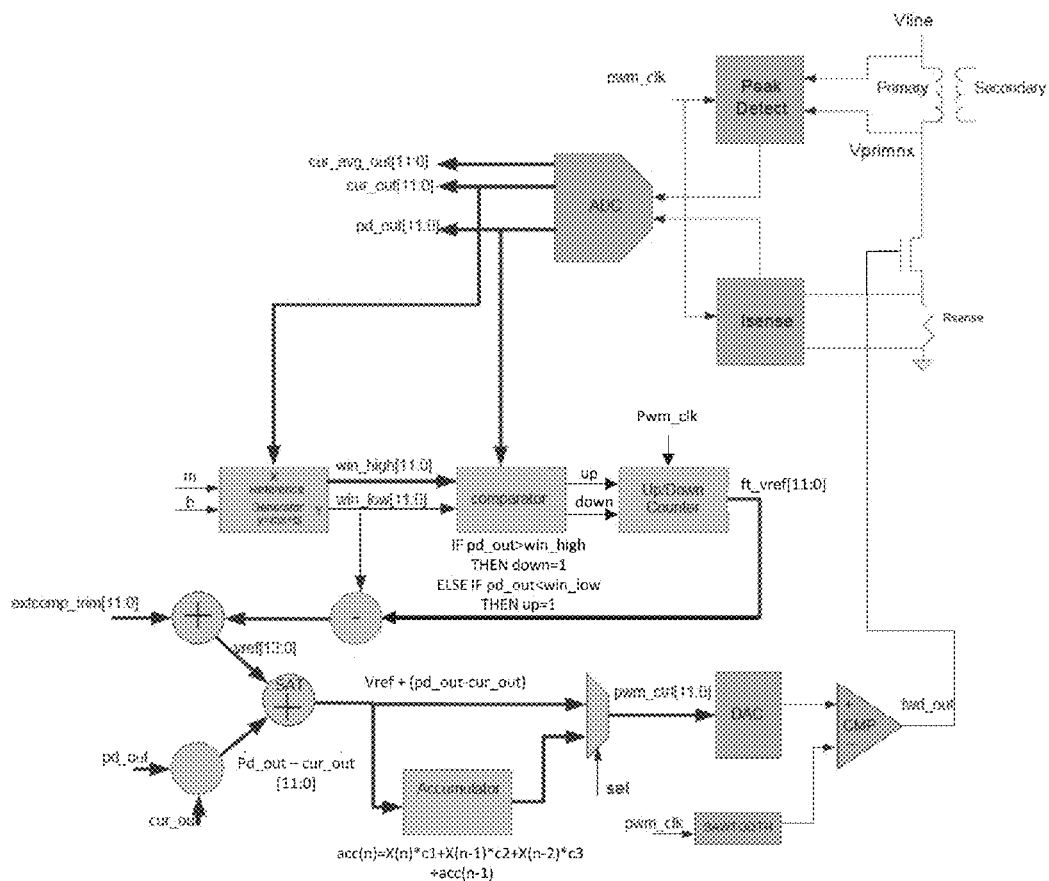
FIG. 82 is a conceptual diagram of the digital Primary Side Regulation control loop, according to an embodiment of the present invention.

Digital/Analog Partition. The PSRLV encompasses the same features as the previous Tronium ASIC low voltage elements. The Digital/Analog partition is similar, with the exception that the PSR control loop will be partitioned between the Digital and Analog Sub Systems. The micro-controller is responsible for the system (PSR-LV and PSR-HV) start-up, operational modes, modes, and management of the PSR Forward Converter Control Loop. FIG. 80 illustrates the top level state diagram and FIG. 81 illustrates the Analog/Digital partition for the PSR Control Loop. The aqua colored blocks are implemented in the Analog Sub System. The PSRLV Digital Sub System for the PSR Control Loop is shown in the conceptual diagram shown in FIG. 82. The ADC Controller, the Sleep Counter, Clock Generator, the Comparator Engine, and the PSR engine are implemented in logic, with the remaining functions being implemented in firmware running on the micro-controller. Using fixed logic for the Comparator Engine is necessary to support the 32 number of potential comparisons need to find the PSR Regulation Window Threshold (PRWT). In practice, most of the time the new PRWT should only be a few thresholds apart from the old PRWT.

The PSR engine implements the required arithmetic calculations for the control loop. The micro-controller has overall control of the PSR engine and has observability/controllability of intermediate calculations. To maintain resolution for the Pulse Width Modulation control signal, fwd_out, which goes to the external FET controlling current through the Primary Transformer winding, the Digital Sub System provides a 12 bit wide DAC control word to the PWM DAC in the Analog Sub System.

Critical Firmware Execution Time Line. The critical Firmware Execution processing occurs while the PSR control loop is active. During this time the PSR firmware will utilize the PSR Engine to update the PWM DAC pulse width control. As the PSR engine will be a fixed logic implementation of the arithmetic operations, the requirements on firmware are relaxed. Firmware will be able to enable the PSR Engine to run either independently of the micro-controller, or under the micro-controller's direct supervision.

Figure 83:
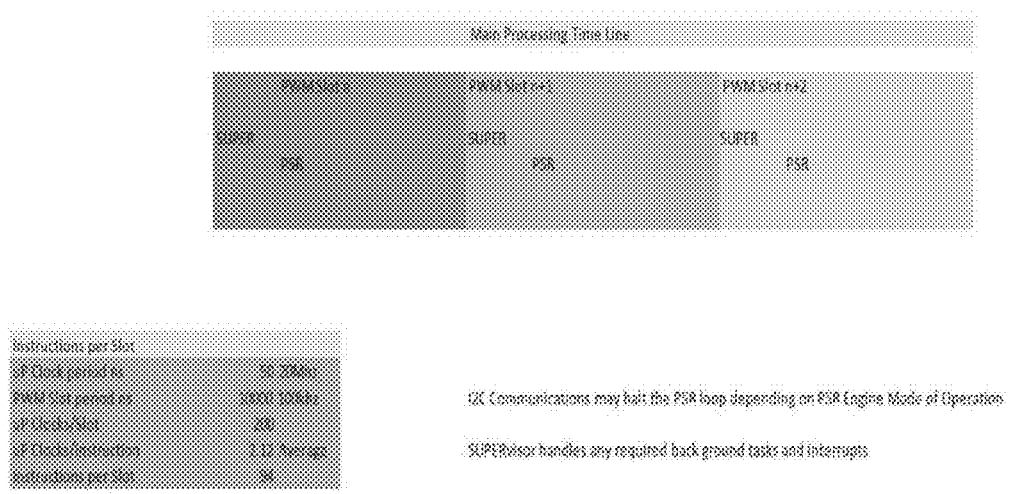
FIG. 83 is a conceptual diagram of the digital Primary Side Regulation execution processing time line, according to an embodiment of the present invention.

When the PSR Engine is under micro-controllers direct supervision, the micro-controller will be able to monitor and to interject data into the PSR Engine at key computational points. A PWM cycle is 100 Khz or higher and is derived from the micro-controller 20 Mhz clock. Referring to FIG. 83, given the clock frequencies above it follows that there are 200 micro-controller clock cycles per PWM cycle. Based on information from the micro-controller IP provider, on average the micro-controller requires 2.12 clocks per instruction. As currently envisioned, the firmware running during a PWM Slot (cycle) will include a supervisory process as well as the PSR algorithm management.

Micro-processor. The micro-processor was selected based on the Execution Processing Time Line discussed in section 3.2 and the concept of having fixed logic implementations for the arithmetic operations of the PSR control loop. Two architectures are presented below.

1) An 8051 based micro-controller (8 bit) is considered as it will meet the overall system control and PSR control loop management. The micro-controller will also have the following peripherals: One 16 bit Timer (Timer 0); One Multiply/Division unit. (MDU); One Slave I2C port; Watchdog Timer; ISR Controller; and OCDS interface (On Chip Debug System).

2) An 80251 based micro-controller (16 bit) which also will meet the overall system control and PSR control loop management, and additionally will have added processing power to address future modifications to the PSR control loop algorithm. The micro-controller will also have the following peripherals: One 16 bit Timer (Timer 0); One Multiply Accumulate unit. (MAC); One Slave I2C port; Watchdog Timer; ISR Controller; OCDS interface (On Chip Debug System).

Figure 84:
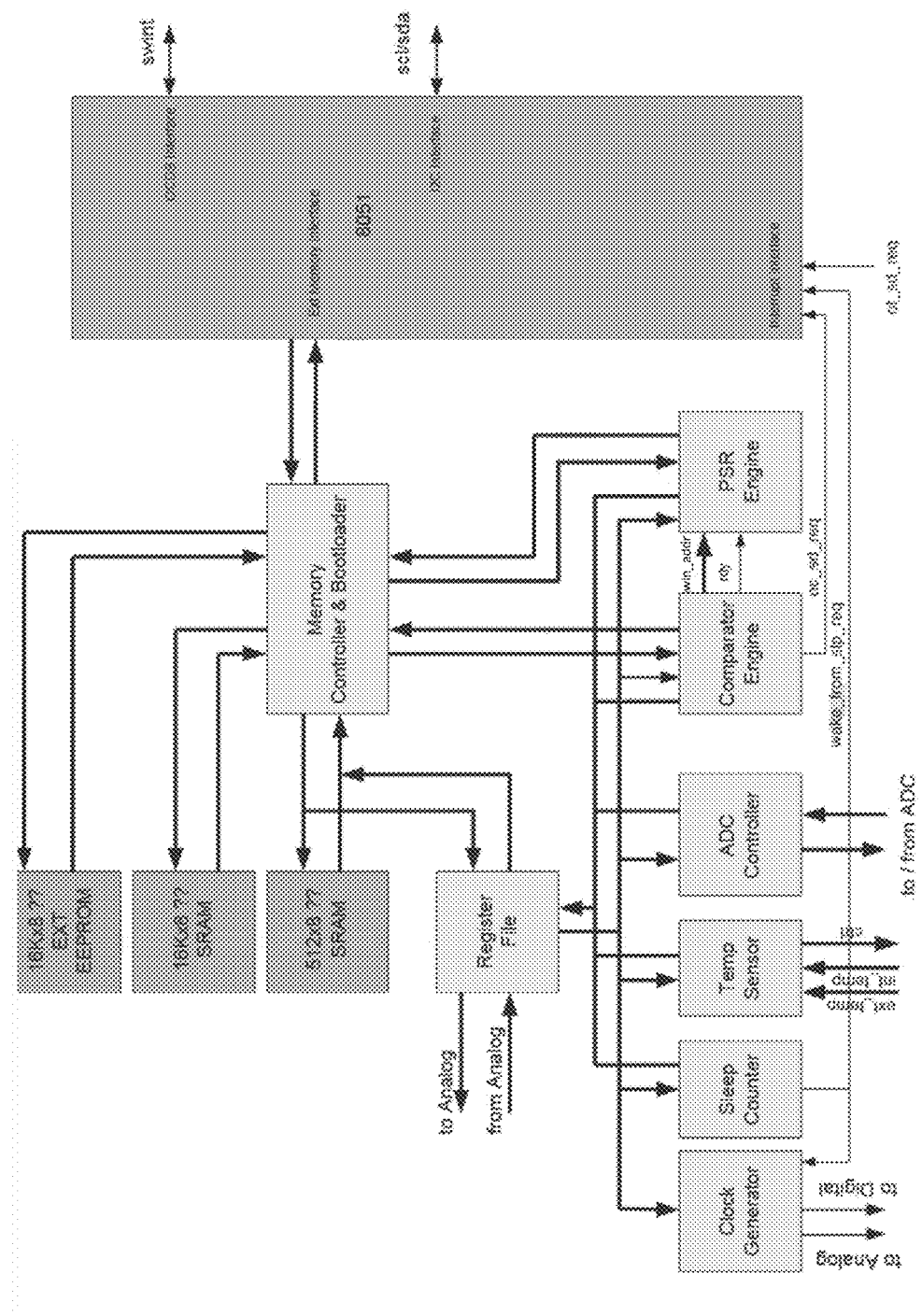
FIG. 84 is a block diagram of a 8051 digital subsystem that may be used with the Primary Sider Regulation system, according to an embodiment of the present invention.
Figure 85:
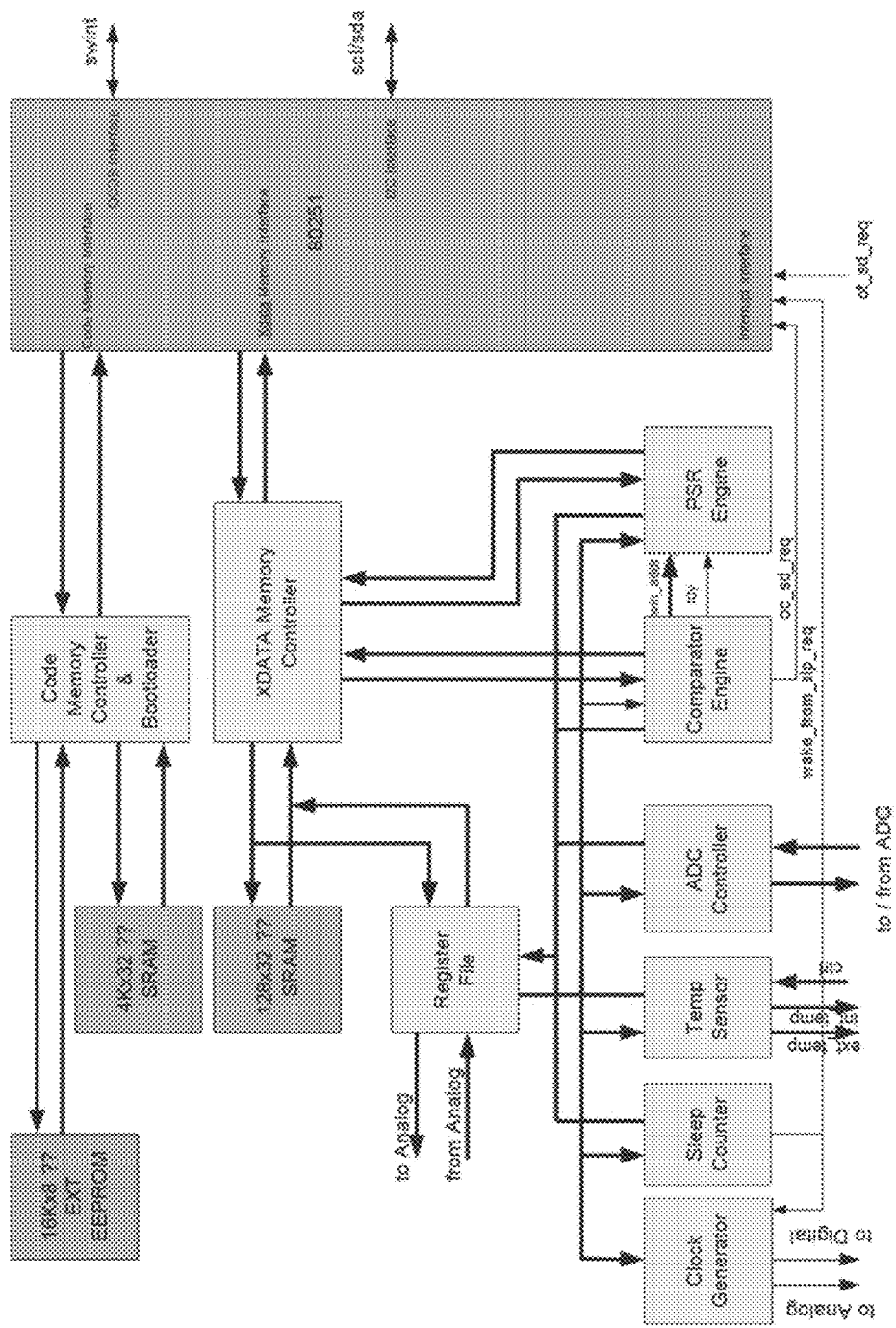
FIG. 85 is a block diagram of a 80251 digital sub system that may be used with the Primary Sider Regulation system, according to an embodiment of the present invention.

Digital Sub System. Based on the sections above, the architectures shown in FIG. 84 and FIG. 85 are being considered. A 8051 based architecture is depicted in FIG. 84 which is used as a reference as many microprocessor architectures may be used including ARM's. In one embodiment, the micro-controller is configured as a Harvard architecture which means that there are two memory spaces, the code memory, and the data memory. The two memory spaces are shared with a common external memory bus. With this architecture only code or data memory can be accessed per micro-processor cycle. In addition, the micro-controller IP supports 8 bit code and data busses.

A 80251 based architecture is depicted in FIG. 85. In one embodiment, this micro-controller is configured as a Harvard architecture which means that there are two memory spaces, the code memory, and the data memory. The two memory spaces have dedicated memory busses. With this architecture both code and data memory can be accessed per micro-processor cycle. In addition, the micro-controller IP supports 32 bit code and data busses. With this architecture, the micro-controller processing power is enhanced, thereby supporting more computationally intensive tasks than the 8051 based architecture.

For both architectures, or any other microprocessor used, the code memory space is comprised of SRAM or similar. The data memory space is comprised of SRAM and a Register File. To support the multiple comparisons required to implement the PSR control loop both architectures employ a hardware Comparator Engine to off-load the firmware processing requirements. The Window Thresholds are stored in SRAM along with the gain and offset values for each window. Up to 64 Windows will be supported. All thresholds values are 12 bit, the gain and offset. The Comparator Engine will compare the peak current sample against the primary regulation window thresholds, PRWTs, which are stored in SRAM. Once the primary regulation window, PRW, has been identified, the Comparator Engine updates a register with an index into SRAM that contains the Gain and Offset values for that PRW. The micro-controller then accesses SRAM, using the index. The corresponding Gain and Offset values located at that index, are then loaded into the PSR Engine to start the PSR control loop calculations. At startup the micro-controller moves the PRWTs, Gain, and Offset values into SRAM from the NVM.

Additionally a PSR Engine is used to off-load the computational requirements of the PSR algorithm from firmware. The PSR Engine will do the required arithmetic calculations for the PSR control loop. The PSR Engine is programmable in terms of gain coefficients. The micro-controller may observe and control the integrator output, the 12-bit counter used for fine tuning the integrator reference, and the digitized ADC outputs for peak voltage and instantaneous current. The micro-controller can also control the PSR update rate as well as when calculations start.

The PSR Engine can be configured in an autonomous mode as well, such that the calculations are executed as soon as the Comparator Engine has completed without microcontroller intervention.

The ADC controller is dedicated hardware to support the low level control of the SAR ADC in the Analog Sub-System. Calibration is controlled via firmware. Once initiated, the ADC conversions for the PSR control loop are under the control of the ADC controller. The ADC controller will support three independent channels for peak voltage, instantaneous current, and average current. There will be an on-board temp sensor for the IC and for the module, which will provide input for error corrections as temps vary.

The Digital Sub-System implements power management features, including a Sleep Mode, during which most of the Digital Sub-System and portions related to regulation in the Analog Sub-System are disabled to reduce current consumption. The sleep counter is dedicated hardware to control the duration of the Sleep Mode. This allows for the micro-controller to be disabled, via clock gating, during Sleep Mode.

Micro-Controller. Two Micro-controller are considered:

Option 1 the micro-controller will be an 8051 soft core. A possible vendor would be CAST Inc. The IP also has soft IP peripherals that are provided with the 8051 core. The IP with peripherals is ~20Kgates.

Option 2 the micro-controller will be an 8051 soft core. A possible vendor would be CAST Inc. The IP also has soft IP peripherals that are provided with the 8051 core. The IP with peripherals is ~35Kgates.

Non-Volatile Memory. For the external NVM architecture an off the shelf NVM memory would be used to hold the micro-controller firmware code. On power up, the bootloader would read the contents of the external NVM and write it to internal SRAM. After the firmware code is written to SRAM, the micro-controller would start running from SRAM, and execute the Tronium PSRLV application code.

One possible NVM would be Atmel's AT28BV256 32k×8 Parallel EEPROM.

The NVM will be mounted onto the ASIC die and both will be housed in the same package.

SRAM. Depending on micro-controller the bus widths will be different. However, the total number of bytes is the same for both. The cost is the same as well. The micro-controller executes from internal SRAM after the firmware code has been retrieved from the external NVM and stored into the internal SRAM. Again the Foundry provides various complied SRAM memories as described above. In addition, piggybacked flash memory will be used when necessary. The 128×32 SRAM IP is 0.06 mm². The 8K×32 SRAM IP is 1.618 mm².

Power and Size. The estimated Digital Sub-System dynamic current and size is discussed below. For the 8051 based architecture: The estimated dynamic current is 0.52 ma, assuming a Sleep duty cycle of 50%. The estimated Digital Sub-System area is 2.4 mm2 which includes the memories.

For the 80251 based architecture: The estimated dynamic current is 0.59 ma, assuming a Sleep duty cycle of 50%. The estimated Digital Sub-System area is 2.7 mm2 which includes the memories.

The implementation of the TRONIUM PSR can also be used for other power typologies, such as flyback, buck, forward convertor, SEPIC, Push-Pull, and Cúk.

The PSRLV (which also includes the HLVPSR) Digital will implement Operational Modes, namely Startup, Normal, and Sleep Modes, with the same functionality as on the prior Tronium ASIC. The Startup time from power application to start of PSR is TBD. The Startup time from Sleep Mode (Soft Startup) to start of PSR is 1 ms typical. Firmware support for other modes which are entered/exited via I2C communication. Control bit to force entry into sleep mode. When cleared ASIC will enter startup mode. Control bit to disable entry into sleep mode.

The PSRLV Digital will implement Alarm and Over Current functionality, similar to the previous Tronium ASIC. Alarm and Over Current Thresholds are programmable and will be stored in NVM. This will allow for programmable support for multiple applications, including Cell Phone and Lap Top applications.

The PSRLV Digital will implement Digital portions of the Primary Side Regulation (PSR) control loop. Architecture is micro-controller based. Peak Voltage, Peak Current, and Average Current are sourced from the Analog Sub-System. The determination of the regulation Window, and the PSR control loop calculations, are done in fixed logic under micro-controller supervision, and the actual PWM waveform generation is done in the Analog Sub-System. The remaining supervisory functions will be implemented in firmware running on the micro-controller. Configurable number of Window Thresholds. Up to 64. Dedicated logic for a configurable number of Window thresholds. All other thresholds will be derived from the Window threshold. The PWM DAC control word will be dithered to mitigate EMI effects.

The PSRLV Digital will implement a 12 Bit SAR ADC Controller similar to the digital controller on the prior Tronium ASIC. Include support for sensing three independent channels, namely peak voltage, peak current, and average current sensing on the Primary Side Transformer. Calibration for Gain and Offset errors under firmware control for each channel. Auto correction for Gain and Offset done in ADC Controller. 300 Khz Sample Rate to support 100 Khz sample rate for each channel. Current and Voltage conversions synchronized to Rising and Falling edges of the PWM clock respectively.

The PSRLV will support Module Calibration. Internal Temp Sensor configurably used for compensation for the PSR control loop due to external component drift. Configurably used for over temperature fault condition. External Temp Sensor configurably used for compensation for the PSR control loop due to external component drift. Configurably used for over temperature fault condition. Register for gain settings. Stored in NVM. Registers for gain/offset calibration to PSR control loop. Stored in NVM. 8 bit for 0.05% FS adjustment, +/−6.35% FS total range for 5% module. 8 bit for 0.005% FS adjustment, +/−0.635% FS total range for 0.5% module.

The PSRLV Digital generates all required clocks for the Analog and Digital functions on the PSRLV ASIC. There is only one clock with a frequency 20 Mhz TBD. The PWM Master Clock will be 100 Khz. (Fixed). LFDIV clock used by Analog Subsystem as required. HFDIV Clock with programmable frequency as required. Sleep Counter Clock will be divided down to provide programmable sleep duration in increments of 0.5 seconds up to 16 seconds.

The PSRLV supports configurability for multiple regulated output voltages. Charge Pump Voltage output configurability. Programmable number of Windows and Window Thresholds, gains, offsets.

The PSRLV Digital also implements an I$^2$C slave or similar communications interface. The I2C will also be used to support manufacturing test. The I$^2$C can be used to program the code space NVM after an initial code load. I2C communication can occur at any time and can be from external sources, like a cell phone, to turn on, turn off, or set a future time for turn on/off of an electronic device powered by the TRONIUM ASIC. The PSR control loop may be disabled when communication is active depending on PSR mode.

The PSRLV supports internal or external NVM. The NVM will support TBD number of program cycles. The NVM will have a data retention specification of TBD number of years. The NVM can be programmed in System. The NVM implements security features to prohibit the reading of NVM content by "unauthorized" persons. The NVM will implement security features to prevent inadvertent programming of the NVM. The NVM contents are encrypted by the PSRLV such that reading the contents when removed from the module will return encrypted results. The NVM can be programmed over the I2C port or UART. The NVM can be programmed using the Debug port. The NVM content will be protected using EDAC. This will be managed by the NVM. The NVM is managed by firmware such that blocks with correctable errors will be relocated in the NVM. The PSRLV implements a boot loader. The boot loader will contain boot up information to support the micro-controller boot operation with an un-programmed NVM. Detection of an un-programmed NVM will occur via reading a pre-determined NVM location and matching the contents against a correlated signature.

The PSRLV implements a debug system interface as provided by the micro-controller IP provider. The Debug port can be used to program the NVM. The Debug port can be disabled at manufacturing test.

The PSRLV will support Module Calibration: Internal Temp Sensor configurably is used for compensation for the PSR control loop due to external component drift. Configurably used for over temperature fault condition. External Temp Sensor configurably used for compensation for the PSR control loop due to external component drift. Configurably used for over temperature fault condition. Register for gain settings. Stored in NVM. Registers for gain/offset calibration to PSR control loop. Stored in NVM. 8 bit for 0.05% FS adjustment, +/−6.35% FS total range for 5% module. 8 bit for 0.005% FS adjustment, +/−0.635% FS total range for 0.5% module.

The PSRLV may either use trimming or may not require trimming on die. In the case of no trimming, internal Vref bandgap nominal less than +/−2% for 5% module accuracy. External Vref for module accuracy<5%, i.e.: use 0.2% external reference for module accuracy of 0.5%. Configurable via Register. Stored in NVM.

The PSRLV also supports manufacturing test in the following manner: The Digital will implement scan chains for the logic. The Digital will implement (MBIST, Parallel external access, JTAG) testing for the memories, i.e. RAM and possible ROM for a micro-controller based architecture. The Digital will implement test support functions to support analog testing and trimming using dedicated hardware.

The principle of Primary-Side Regulation relies on sensing the instantaneous current and voltage seen by the primary winding of the transformer. This information is then used to regulate the secondary output voltage by Pulse-Width-Modulation (PWM) of the primary-side MOSFET switch.

Figure 74:
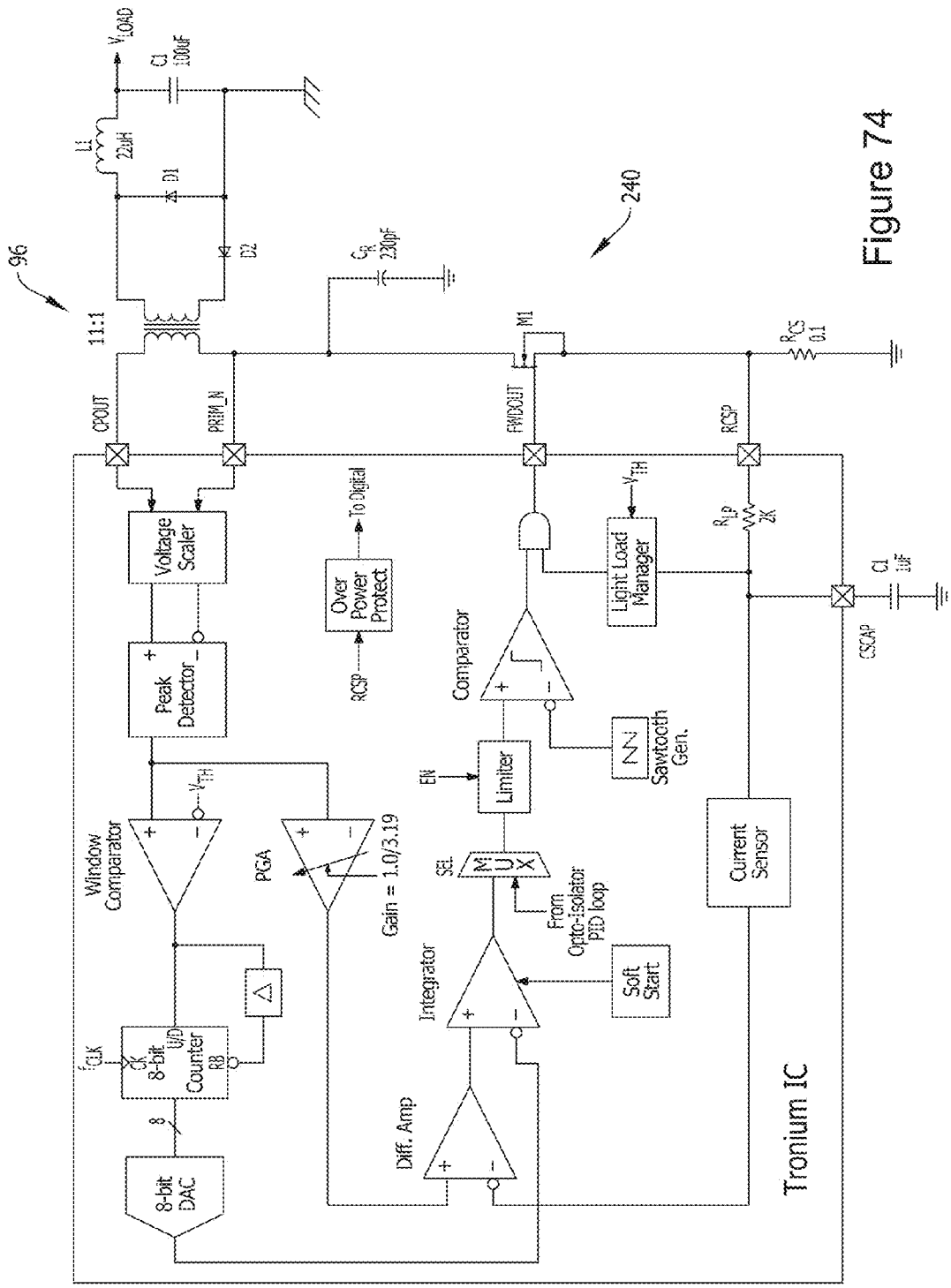
FIG. 74 is another schematic illustration of a primary side regulation circuit that may be used with the electrical power circuit shown in FIGS. 2 and 42-50, according to an embodiment of the present invention.

Referring to FIG. 74, the primary-side MOSFET switch is labeled as M1. The instantaneous voltage of the primary is sensed during the reset time of the transformer, i.e. when the primary-side MOSFET is off; while the instantaneous primary current is sensed when the MOSFET is turned on. A resonant reset of the transformer is achieved with a 230 pF external capacitor (CR) connected between The PRIM_N pin and the ground pin. The tolerance of the capacitor has been determined to be non-critical. The MOSFET M1 has a 600v allowed breakdown to allow operation at 100 KHz.

The external components required by the PSR circuit include MOSFET switch, M1, Current Sense Resistor, Rcs, Current Sense Low-Pass Cap, Clp, capacitor, C1, Primary Side Reset Capacitor, C2, Inductor, L1, Diodes, D1, D2, and transformer, T1, and complete the Forward Converter. All external components, with the exception of the transformer, are common between the cell phone and the laptop platforms. The mode pin on the Tronium IC selects one of these two platforms. There is some trim capability which can be set digitally via on-chip registers.

Primary-Side Voltage Feedback Loop. The voltage feedback loop is comprised of a peak detector and an instrumentation amplifier. Voltage feedback information is obtained by sensing the differential voltage across the primary-side terminals of the transformer. The positive primary voltage is sensed at the output of the Charge Pump at pin CPOUT and the negative primary voltage on the drain of MOSFET M1 at pin PRIM_N. A peak detector is provided to detect the peak voltage on pin PRIM_N.

The two voltages (PRIM_N & CPOUT) are subtracted and amplified by an instrumentation amplifier whose gain is set by the mode pin which defines either the cell phone or laptop mode of operation. Since the transformer turns ratio and the secondary voltage are different for these two modes of operation, two different gains are supported. They are implemented as ratio of the feedback resistor to the input resistor in the instrumentation amplifier.

A window comparator compares the output of the instrumentation amplifier with two thresholds (VTH & VTL). A logic Decoder derives an up and down signal which then drives an 8-bit R2R DAC. This DAC adjusts the reference voltage in the integrator to achieve the required output voltage regulation from 4.5 Amps to 300 mA.

Primary-Side Current Feedback Loop. The current feedback loop compares the low-pass filtered voltage on the RCSP pin using a switched-capacitor instrumentation amplifier with a digitally programmable gain. The gain accounts for a range of parasitic resistances which can be seen on the Secondary. These resistances are comprised of a) the diode series resistance for diodes D1 and D2; b) the winding resistance of the secondary side of the transformer; c) the interconnect resistance of the PCB and IC metal traces; and d) the series resistance of the 22 µH inductor. Since the maximum load current can be as high as 4.5 A, the accumulated IR drops can be significant. Furthermore, the load current can vary from 50 mA to 4.5 A producing an output voltage droop which is load dependent. As a result, this could cause the loop to fail to meet the +/−5% output regulation specification for this application. The switched-capacitor amplifier scales the incoming low pass filtered voltage, converts it to an estimate of the secondary side current, scales it with a reference voltage and then drives a continuous time differential amplifier for further processing by the low pass integrator.

Primary Side Regulation—Analog Alternative Analog Version.

An alternative to the flash Primary Side Regulation, which doesn't use flash, because the flash which operates at three megahertz for a five bit and requires 32 comparators and a resistor running at 3 megahertz, it's about a couple hundred micro amps current. This permits primary side sensing of the secondary voltage and current, which omits the opto coupler and a number of parts. Another embodiment is a counter based approach, which can be selected as an alternative.

The system could also use the flash Primary Side Sensing, as mentioned above, using the PID loop and doing remote sensing, one can have a 2 by 1 staged voltage reduction circuit. The system can select that second channel and bring the feedback in and then disable the digital part, or the digital controller.

This Primary Side Sensing approach provides (1) Improved Primary-Side Remote Sense Architecture, (2) Reduced Current Consumption by Eliminating Flash ADC's, (3) Improved Startup Mode, (4) Better Regulation Accuracy not Limited by ADC Resolution, (5) Analog Feedback allows Opto-Isolator Feedback as Backup or Alternative.

This Primary Side Sensing and Regulation is based upon Secondary Output Voltage where the expression can be calculated as shown in the calculation below:

$$V_{OUT} = \left(V_{PRIM} \frac{-V}{N\_PRIM\_P}\right) \times \frac{t_{RST}}{t_{SW}} \times \frac{2}{\pi \cdot \left(\frac{N_P}{N_S}\right)}$$

The analysis behind the regulation so this output $V_{OUT}$ is equal to, this $V_{OUT}$ is in the secondary site, so $V_{OUT}$ can be calculate where $V_{OUT}$ is a function of only the primary site parameter so this, all the parameters on the right hand side of the equation, above. That information about the secondary side is available on the primary side, and $N_P$ over $N_s$ is the turns ratio of the transformer, so that is a known and varies between different voltage output settings under the "dial-a-voltage" idea. Thus, the calculation works whether it is a cell phone or a laptop or a tablet or the like, and one can digitally select it. The above equation has three parts. There's a first part which is that V Primary Side Voltage, N minus V Prim P, that's the first part of it is that time ratio and the second part is the time ra, and then the third part that constant factor relating to the transformer ratio. So the constant factor is just a gain setting, where different gain settings, digitally programmable so between laptop and cell phone one can switch between them and select the correct regulation loop can adjust.

The TRST set and TSW is fixed, which is the switching time, which is 10 microseconds in the preferred embodiment. So that's the thing for both laptop and cell phone. TRST set is the one that gets calculated by the digital, there's a time to digital converter which converts time into a digital value and that is used to regulate. And V Prim N minus V Prim P is the differential voltage across the inductor, across the magnetizing inductor on the primary site. So there's just a PG programmable gain amplifier which will calculate. In the equation above, the 2 is a programmable number, so for a cell phone 2 over Pi and NP over NS is the turns ration which in one case is 11/1 for the cell phone and 3/1 for the laptop. So this is a programmable and adjustable sensing and regulation scheme. For instance, there is one calculation for the one number for the laptop and one number for the cell phone charger. High resolution DAC's help. In the equation above, NP over NS is a transformer ratio, so NP over NS is the turns ratio. So it's 11:1 for the cell phone and 3:2 for the laptop.

Referring to FIG. 74, in one embodiment, the primary side regulation circuit 240 may include an analog Primary Side Sensing/Regulation Scheme (APSSR) which includes a different amplifier, which measures the energy peak, which also takes a peak detector, which measures the peak of the wave. When the transformer MOSFET switch is closed, there is no information on voltage or current, which is a problem that didn't exist in the Digital Primary Side Sensing/Regulation Scheme (DPSSR) that's when the problem, the challenge here is that unlike before, where the information was always available, it didn't matter that the switches were closed or open, the output voltage can be momentarily calculated or reflected to back towards on the primary side during the off time of the switch, which is during the reset phase. During the reset phase, the voltage on the primary side goes up and so that basically the transformer is demagnetizing so the primary side inductance, so the peak detector catches the top part of the peak and then one would take that and CP out, which is set by the Buck and the Switch Cap Voltage Dividers, and the different amplifier measures that difference and then one would go into PGA which implements the gain, the constant factor (i.e. the 2 over Pi NP over NS part of the equation above) so that's the programmable part of the PGA. The modifier is inside, is shown inside the PGA, the left hand side corner block which is the PGA, in FIG. 74.

A Digital to Analog Convertor (DAC) is modified to, or increased in resolution to be able to accommodate more settings. The difference amplifier includes an alternate path which is called the window comparator and then the time to work its convertor. So one would calculate the reset time that the pulse took so you want to measure the voltage, the differential voltage, which is the Y axis, but one would also want to measure the time that it took for the inductance to be reset. Reset means that the differential voltage is zero. The differential voltage starts at zero because the MOSFET (that drives the transformer) switch is, initially when the switch is closed, you basically place 110 volts by 0 volts across the inductance, the magnetizing inductance on the primary side and when you open the switch, there is an additional voltage that is a different voltage that is generated across the inductance and that's a function of the load current, how much load is being pulled from the secondary side.

So the time of collapse has to be measured and that's where this is calculated. Thus, one may take a look at the window comparator and the time to voltage converter is like a crude ADC. So there's a comparator, the window comparator, and then a counter, and then the counter is reset and then one would start the counter and the output of the counter mimics and has a digital value which reflects the reset time. It is linearly related to the reset time. So the reset time cannot be more than the maximum reset time that you can ever have is 10 microseconds, because that the time, switching time, or the time slot, so that ratio that if you look at the back of the equation, above, the $V_{TRST}$ or the $V_{TSW}$, now you would calculate the reset time by this counter, by this window comparator/time to voltage peak counter, then one would get one number and then you already know that $V_{TSW}$ is a full scale of the counter so that, so one gets two sets of different numbers, another PGA, which is basically shown as one PGA, but you can have another PGA which basically does the division, basically calculates the ratio.

Thus, first you have converted the time into digital number; and then that digital number drives a DAC, so the system is going from Digital to Analog. Then you take the analog voltage, a ratio of analog voltages which is a function of middle part of the equation. The result is that you convert the timing, time ratio into a voltage ratio and then it is compared with the already known voltage, differential voltage that has been measured through the MOSFET peak detector across the magnetizing inductors are already known and ready to be used, then you go into a PGA and the PGA will basically multiply it and divide it depending on how it's configured and then basically that represents the $V_{OUT}$ actual on the secondary. So at the output of the PGA, you will see $V_{OUT}$ actual of the current and voltage which exists on the secondary side, what is the actual $V_{OUT}$. And then I already know what my $V_{OUT}$ desired is, which is 5 volts, so then the integrator will take the difference then there is 5 volts on one side of the integrator, because it is known that this is a 5 volt system, and then the actual voltage on the other side of the integrator, the difference is your error, and then the error gets integrated, and then digitized by the comparator, then this information is no different than the original PID loop in the DPSSR.

Thus, the integrator drives the comparator, which basically takes the header and works that into a pulse width, the pulse is of different pulse width, and that drives the transformer MOSFET switch (the gate switch) and then there's a clock generator just like before which is constantly running at 100 kilohertz. So that's, and then so in this case I, that's basically how to loop works or how the server works.

There's two different quantities that are dynamically changing, one is the magnetizing voltage, it's the V set time, depending on the load current, and the other is the time for it to demagnetize, or the time for reset.

There are no off die parts, it's all on chip, it's no different than the flash ADC as described above, instead of the window comparator and the time to hold this converter had a flash ADC and then the integrator and the PGA, they were also digitally implemented so the flash ADC would, had a digital integrator so that would take the digital difference between the actual and the desired voltage.

Thus, in the DPSSR one would need two flash ADC's, one for the feed detector path and one for the time-to-voltage converter path. In the instance of the DPSSR, one would therefore need two flash ADC's and then all the digital arithmetic, logic log to do the math, to calculate the actual $V_{OUT}$ desired and the digital format but in the instant invention, shown here as the APSSR, that that is analog, it's low power, and does not require external components, and it's also compatible with the PID, so that you can turn it off and use the opto isolation option, which provides an alternative and enhanced flexibility.

As shown in FIG. 74, on the secondary one embodiment of the circuit had transistors and the other has diodes. Because of the IR drop with diodes, in this version of the invention, MOSFETS are used. With that said, one has to manage is the IR drop on the secondary side so that's, so we took the diodes out because of the V forward voltage loss that the APSSR system is not able to calculate. Therefore, using transistors (MOSFETS) provides a much lower IR drop and so basically the IR drop is mainly limited by the inductor, ESR that transformer turns ratio ESR and then, which in this instance is about 26 milliohms and then the drop across the M2 transistor called M2 on the return side. Which is pretty small and it's not, it's like 10 or 20 millivolts, so the biggest, the biggest error is the IR drop of the ESR basically that, because the V out equation, if you look at that equation, that does not have that and does not have that information about losses from the secondary side. Before we were sensing the secondary site directly so all that IR drop was taken into account and the servo would servo it.

The system is load dependent, and it's, as the load changes on the secondary side, you get different IR losses, which are not calculated in the above equation. In addition, there's a droop in the system as it operates. Thus, voltage V out will go down, will start to droop as load current goes up.

This can be resolved in several ways. One was to compensate in the APSSR is to just to compensate it without having another servo loop. In this fashion, one would compensate for the secondary side losses (IR drops) so that we are always at the mid-point. Thus, you would compensate it for like the 1 amp instead of 4 amp, between 4 amp and 50 milliamps, so we are around 1 amp P, set that droop so that it's at one amp, it's at midpoint, so that the error is pretty much balanced at light loads and at maximum loads.

However, the information exists on the primary side. In a more complicated approach the information is obtained from the is there on the primary side, the 0.1 of RCS resistor shown below and that has the peak currents on the primary side and then so you can have another servo loop which can calculate the average current on the secondary side based on the turns ratio and then from there you can additionally determine an IR drop on the secondary side equation of the line and then basically compensate it so you basically adjust the desired voltage a little bit higher based on the current. In other words, you basically pre-distort the voltage going on the primary side to the secondary side, so that when it goes to the secondary side the IR drop is removed from the equation and is cancelled out by the increase of voltage on the primary side. Then the droop goes away and the $V_{OUT}$ stays flat and $V_{OUT}$ stays constant across different IR drop loads.

The IR drops on the secondary are thus pre-calculated into the amount of voltage and/or current sent through the transformer, so that when the voltage and/or current reaches the secondary side, the IR losses from the transformer and devices on the secondary are already calculated in, and thus, cancelled out in the final throughput current to the external device output.

In addition you can have another DACs where temperature is taken into account, such that as the voltage or current increases, there would be an assumed or measured temperature increase, for which an additional adjustment would be made to compensate for the IR losses at higher heat of the devises on the secondary side.

It's just the transistor N2 and L1. ESR L1 and ESR of that's specific to that transformer. There's a secondary winding, which in this configuration is 30 milliohms in L1 (maximum) it's 30 milliohms of resistance, and then there's also 13 milliohms in L1 and the maximum then about 10 or 20 millivolts across N2.

Because there can be a spike when the buck is energized while the Switch Capacitor Voltage Divider (Reverse Charge Pump) is in operation, steps need to be taken to reduce and eliminate the spike within the TRONIUM circuit.

Thus to eliminate the interaction between the loops it is necessary to only operate the Reverse Charge Pump in the fractional mode when the Buck Regulator is disabled. Therefore, when the Buck Regulator turns on (above 50 mA into the transformer primary is one setting) the Reverse Charge Pump is set to go into the regulated mode. This has the effect of minimizing the interaction between the Buck Regulator and the Reverse Charge Pump and provides the highest efficiency.

In this instance, the Tronium system is designed to run at the VLINE level of 260 VDC. Additionally, the current is stepped from 1 mA to 200 mA. Note that the Buck Regulator is set to regulate an output level of 110 VDC, which is optimum for energy efficiency. This is also to facilitate the voltage sag from the 100 μF cap when the input is at 127

VDC. The Reverse Charge Pump comes up first at a fractional value of 0.5 and outputs 130 Volts.

The Buck then turns on after the current step and the Reverse Charge Pump is placed into the regulate mode at 130 Volts. The Reverse Charge Pump is essentially turned OFF because of the Buck Regulator's lower RDS-ON switch resistance. As the current step occurs, the charge from the 7.5 μF hold capacitor is bled off to 110 Volts at which time the Buck then starts to supply current. Note that the output voltage shows no abrupt behavior. The current is stepped down and the Buck turns off. The Reverse Charge Pump then brings the output voltage to its fractional value of 130 Volts.

The Charge Pump 1 KHz clock (the behavioral digital is running at the default VHIGH of 1 volt) and the 5 V drive to the Buck switch running at 100 KHz. The middle trace shows the 80 mA current step. In addition, the Reverse Charge Pump must be permitted to settle. The Buck pulls a lot of current to increase the output voltage, shuts off momentarily and begins to regulate once the voltage spike has fallen to 110 VDC. The current is stepped back down and the Reverse Charge Pump comes on once again for normal operation.

Referring to FIG. 48, in one embodiment, the Switch Capacitor Voltage Divider ("SC") is functionality implemented with inexpensive and readily available components, with a different Start-up method, different discrete components and μC, different Clock generation, external crystal (XTAL) and/or a microcontroller, μC, DCO, a Clock adjustment through μC implementation, with final regulation through external high efficiency flyback converter, instead of a forward convertor. This Modular approach allows for quick prototyping and agile development of core already explained inventions.

In and alternative of the invention, the SC topology can be used with a SEPIC, BUCK, FLYBACK, CúK, PUSH/PULL or other topologies as a hybrid circuit.

Here, the Clock frequency regulation is accomplished with μC (with on-board ADC) which measures the Switch Capacitor DC-DC converter output voltage with a suitable conditioning circuit, e.g a resistive divider and μC regulates and generates the clock frequency and measures the SC DC-DC converter output voltage at the start-up without load, and adjusts the clock frequency to achieve maximum efficiency across loads, To begin with, the Main voltage selection, at startup, is analyzed by the μC which measures the open circuit voltage of the SC DC-DC converter and then the μC determines if the main voltage is 220V or 110V. Thus, at Startup the SC DC-DC is converter not active.

A low-current (few mA) 5V auxiliary supply voltage is derived directly from the rectified main voltage, e.g., with a resistive divider with eventually an LDO, and during startup μC is powered by Startup circuit.

The auxiliary output voltage is used for supplying the clock generator and for bootstrapping the SC DC-DC converter. This auxiliary supply voltage (Startup circuit) is switched off by the microcontroller when startup is complete When the SC DC-DC converter is settled, then the flyback converter is turned on. When the output voltage of the flyback converter is ready, then the auxiliary supply voltage is switched off and the Flyback converter supplies the μC and then can power the current needed.

In another aspect of the invention, under the hybrid SC/BUCK design explained above and in prior figures, the System automatically selects the proper gain setting for the Reverse Charge Pump Voltage Divider by measuring the incoming LINE voltage.

Two comparators monitor the scaled LINE voltage to determine the correct gain setting. This block can either always be on, so it uses low current, so as not to affect the vampire current or turned off and controlled by a state machine or microprocessor which is powered, so that it is off during vampire loads or no loads.

The Buck Regulator (as shown in FIG. 66) regulates the intermediate voltage on the Primary-Side of the Transformer regulates CPOUT to 110V. Turns on for load currents>50 mA, then the intelligence uses an external PMOS switch, inductor, diode, and two capacitors.

The Proportional-to-Integral and Differential (PID) Control Loop is shown with on-chip loop components. Also shown is the High-Voltage PMOS Gate Driver, 20 V LDO Regulator for PMOS Gate Drivers.

This topology uses a 12 BIT SAR ADC which incorporates a 6b+6b Segmented Architecture, with Auto-zeroed Multi-Stage Comparator, with Periodic Two Point Offset and Gain Calibration, and Single Channel ADC Conversion (Current Sensor).

The architecture also includes a Low Speed Current Sensor which has a Dedicated Current Sense for Primary-Side Transformer Current as set out above, with a Selectable Gain for Cell-Phone or Laptop Charger Modes and a Dedicated input to 12-bit ADC.

The Key Features of the Current Sensor design is Switched Capacitor Programmable Gain Amplifier with offset cancellation. Also, due to different output voltages two different gains are supported for the laptop mode and cell phone mode, and other gain setting are supported for various voltages/currents. The time constant is ~2 ms (1 tau), with 12b ADC calibration includes the Current Sensor channel and 0.1v calibration voltage–>Full Scale ADC Output for Laptop Mode, with 0.025 calibration voltage–>Full Scale ADC Output for Cell Phone Mode Vout=Vin *Gain+Vcm, where Vout is the output of the current sensor going into the 12b SAR ADC Vin is the input from the RC low pass filter Vcm=1.25v. For example the settings would be Gain=80 (cell phone), 20 (Laptop) (digitally selectable). The Error Budget as set out above, for the APSSR is: IR Drop of the ESR of the inductor+Transistors Vds*2+Transformer winding·12mΩ*4.2A+5mΩ*2*4.2A+13mΩ*4.2A–> (0.1466v/2+5v)–>~+/−1.5% accuracy taken up by the ESR.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Other aspects and features of the invention can be obtained from a study of the drawings, the disclosure, and the appended claims. The invention may be practiced otherwise than as specifically described within the scope of the appended claims. It should also be noted, that the steps and/or functions listed within the appended claims, notwithstanding the order of which steps and/or functions are listed therein, are not limited to any specific order of operation.

A controller, computing device, or computer, such as described herein, includes at least one or more processors or processing units and a system memory. The controller typically also includes at least some form of computer readable media. By way of example and not limitation, computer readable media may include computer storage media and communication media. Computer storage media may include volatile and nonvolatile, removable and non-removable media implemented in any method or technology that enables storage of information, such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art should be familiar with the modulated data signal, which has one or more of its characteristics set or changed in such a manner as to encode information in the signal. Combinations of any of the above are also included within the scope of computer readable media.

The order of execution or performance of the operations in the embodiments of the invention illustrated and described herein is not essential, unless otherwise specified. That is, the operations described herein may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

In some embodiments, a processor, as described herein, includes any programmable system including systems and microcontrollers, reduced instruction set circuits (RISC), application specific integrated circuits (ASIC), programmable logic circuits (PLC), and any other circuit or processor capable of executing the functions described herein. The above examples are exemplary only, and thus are not intended to limit in any way the definition and/or meaning of the term processor.

In some embodiments, a memory device includes a computer readable medium, such as, without limitation, random access memory (RAM), read-only memory (ROM), erasable programmable read-only memory (EPROM), flash memory, a hard disk drive, a solid state drive, a diskette, a flash drive, a compact disc, a digital video disc, and/or any suitable device that enables a processor to store, retrieve, and/or execute instructions and/or data.

In some embodiments, a database, as described herein, includes any collection of data including hierarchical databases, relational databases, flat file databases, object-relational databases, object oriented databases, and any other structured collection of records or data that is stored in a computer system. The above examples are exemplary only, and thus are not intended to limit in any way the definition and/or meaning of the term database. Examples of databases include, but are not limited to only including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

Although specific features of various embodiments of the invention may be shown in some drawings and not in others, this is for convenience only. In accordance with the principles of the invention, any feature of a drawing may be referenced and/or claimed in combination with any feature of any other drawing.

What is claimed is:

1. An electrical circuit for providing electrical power for use in powering electronic devices, comprising:
   a forward converter configured to receive an input power signal and deliver an output power signal, the forward converter including:
   a transformer; and
   a primary side regulation circuit coupled to a primary side of the transformer, the primary side regulation circuit including:
   a switching device coupled to the primary side; and
   a current sense circuit configured to sense a current level on the primary side;
   a controller configured to generate a pulse-width modulated control signal delivered to the switching device as a function of the sensed current level to regulate the transformer to deliver the output power signal at a desired voltage level; and
   a memory device coupled to the controller, the memory device configured to store a range of current values and a plurality of value windows associated with the range of current values, each of the value windows including a subset of current values within the range of current values, the controller configured to:
   select a value window from the plurality of value windows as a function of the sensed current level; and
   generate the pulse-width modulated control signal as a function of the selected value window.

2. The electrical circuit in accordance with claim 1, the primary side regulation circuit including a voltage sense circuit coupled to the primary side for sensing a voltage level of the primary side of the transformer, the controller configured to generate the pulse-width modulated control signal as a function of the sensed voltage level.

3. The electrical circuit in accordance with claim 1, the primary side regulation circuit including a temperature sense circuit for sensing a temperature of the electrical circuit, the controller configured to generate the pulse-width modulated control signal as a function of the sensed temperature.

4. The electrical circuit in accordance with claim 1, the primary side regulation circuit including a capacitor coupled to the primary side of the transformer and to ground, the capacitor configured to reset the transformer after each transformer cycle.

5. The electrical circuit in accordance with claim 4, the capacitor coupled between the switching device and a primary winding of the transformer.

6. The electrical circuit in accordance with claim 1, further comprising a voltage reduction circuit cell coupled to the forward converter.

7. The electrical circuit in accordance with claim 6, the controller configured to:
   sense a peak current level during a pulse of the switching device; and
   select the value window as a function of the peak current level.

8. The electrical circuit in accordance with claim 6, the controller configured to:
   determine a reference voltage as a function of the selected value window; and
   generate the pulse-width modulated control signal as a function of the determined reference voltage.

9. The electrical circuit in accordance with claim 8, the controller configured to:
   determine a low window value associated with the selected value window; and
   determine the reference voltage as a function of the determined low window value.

10. The electrical circuit in accordance with claim 9, the controller configured to:
sense a temperature of the electrical circuit and determine the low window value as a function of the sensed temperature.

11. The electrical circuit in accordance with claim 9, the controller configured to:
determine a high window value associated with the selected value window as a function of the low window value; and
determine the reference voltage as a function of the low window value and the high window value.

12. The electrical circuit in accordance with claim 11, the controller configured to sense a peak voltage of the primary side of the transformer and determine the reference voltage as a function of the sensed peak voltage, the low window value, and the high window value.

13. A method of operating an electrical circuit for powering electronic devices, the electrical circuit including a forward converter configured to receive an input power signal and deliver an output power signal, the forward converter including a transformer and a primary side regulation circuit including a switching device coupled to a primary side of the transformer, and a controller including a memory device for storing a range of current values and a plurality of value windows associated with the range of current values, each of the value windows including a subset of current values within the range of current values, the method including the steps of:
sensing a current level of the primary side of the transformer;
selecting, by the controller, a value window from the plurality of value windows as a function of the sensed current level;
generating, by the controller, a pulse-width modulated control signal as a function of the sensed current level and the selected value window; and
transmitting the pulse-width modulated control signal to the switching device to operate the switching device to regulate the transformer to deliver the output power signal at a desired voltage level.

14. The method in accordance with claim 13, including the steps of:
sensing a voltage level of the primary side of the transformer; and
generating the pulse-width modulated control signal as a function of the sensed voltage level.

15. The method in accordance with claim 13, including the steps of:
sensing a temperature of the electrical circuit; and
generating the pulse-width modulated control signal as a function of the sensed temperature.

16. The method in accordance with claim 13, wherein the primary side regulation circuit includes a capacitor coupled between the switching device and a primary winding of the transformer and configured to reset the transformer after each transformer cycle.

17. The method in accordance with claim 13, wherein the electrical circuit includes a voltage reduction circuit cell coupled to the forward converter.

18. The method in accordance with claim 17, including the steps of:
sensing a peak current level during a pulse of the switching device; and
selecting the value window as a function of the peak current level.

19. The method in accordance with claim 17, including the steps of:
determining a reference voltage as a function of the selected value window; and
generating the pulse-width modulated control signal as a function of the determined reference voltage.

20. The method in accordance with claim 19, including the steps of:
determining a low window value associated with the selected value window; and
determining the reference voltage as a function of the determined low window value.

21. The method in accordance with claim 20, including the steps of:
sensing a temperature of the electrical circuit; and
determining the low window value as a function of the sensed temperature.

22. The method in accordance with claim 20, including the steps of:
determining a high window value associated with the selected value window as a function of the low window value; and
determining the reference voltage as a function of the low window value and the high window value.

23. The method in accordance with claim 22, including the steps of:
sensing a peak voltage of the primary side of the transformer; and
determining the reference voltage as a function of the sensed peak voltage, the low window value, and the high window value.

24. An apparatus for providing electrical power for use in powering electronic devices, comprising:
a transformer for receiving an input power signal and delivering an output power signal;
a capacitor coupled to a primary side of the transformer and to ground, the capacitor configured to reset the transformer after each transformer cycle; and
a semiconductor chip including:
a transformer terminal formed on the semiconductor chip;
a switching device formed on the semiconductor chip and coupled to the primary side of the transformer with the transformer terminal;
a controller formed on the semiconductor chip; and
a memory device coupled to the controller, the memory device configured to store a range of current values and a plurality of value windows associated with the range of current values, each of the value windows including a subset of current values within the range of current values, the controller configured to sense a current level of the primary side of the transformer, select a value window from the plurality of value windows as a function of the sensed current level, and generate a pulse-width modulated control signal delivered to the switching device as a function of the sensed current level and the selected value window to regulate the transformer to deliver the output power signal at a desired voltage level.

* * * * *